(12) United States Patent
Busche

(10) Patent No.: US 11,204,206 B2
(45) Date of Patent: *Dec. 21, 2021

(54) THERMAL SWITCH

(71) Applicant: ENVERTIC THERMAL SYSTEMS, LLC, Santa Clara, CA (US)

(72) Inventor: Matthew Busche, Santa Clara, CA (US)

(73) Assignee: ENVERTIC THERMAL SYSTEMS, LLC, Santa Clara, CA (US)

( * ) Notice: Subject to any disclaimer, the term of this patent is extended or adjusted under 35 U.S.C. 154(b) by 20 days.

This patent is subject to a terminal disclaimer.

(21) Appl. No.: 16/877,313

(22) Filed: May 18, 2020

(65) Prior Publication Data

US 2020/0333091 A1 Oct. 22, 2020

(51) Int. Cl.
*F28F 27/00* (2006.01)
*F28F 13/00* (2006.01)
(Continued)

(52) U.S. Cl.
CPC ........... *F28F 13/00* (2013.01); *H05K 7/2039* (2013.01); *F25D 19/006* (2013.01);
(Continued)

(58) Field of Classification Search
CPC ................. F28F 13/00; F28F 2013/001; F28F 2013/005; F28F 2013/006;
(Continued)

(56) References Cited

U.S. PATENT DOCUMENTS

| 1,535,479 A | 4/1925 | Kellogg |
| 1,703,803 A | 2/1929 | Widstrom |

(Continued)

FOREIGN PATENT DOCUMENTS

| DE | 3017252 A1 | 11/1981 |
| WO | 2008020668 A1 | 2/2008 |
| WO | 2017216519 A1 | 12/2017 |

OTHER PUBLICATIONS

Sensors and Transducers—All about it—The Bimetallic Strip—Sensors and Transducers (Feb. 2012); 3 pages.

(Continued)

*Primary Examiner* — Davis D Hwu
(74) *Attorney, Agent, or Firm* — Howard & Howard Attorneys PLLC

(57) ABSTRACT

A thermal switch having an on-state and an off-state is provided. First and second plates are composed from a thermally conductive material. The first and second plates are connected to form an internal cavity having a channel defining a gap between the first and second plate. The first reservoir is coupled to the channel and contains a thermally conductive liquid. The actuator is coupled to the first reservoir and the channel and is moveable between a first state and a second state corresponding to the on-state and the off-state of the thermal switch, respectively. Thermally conductive liquid is allowed to flow from the first reservoir to the channel when the actuator is in the first state and allowed to flow from the channel to the first reservoir when the actuator is in the second state.

32 Claims, 61 Drawing Sheets

(51) Int. Cl.
*H05K 7/20* (2006.01)
*F25D 19/00* (2006.01)
*G05D 23/02* (2006.01)
*H01H 37/00* (2006.01)

(52) U.S. Cl.
CPC ... *F28F 2013/001* (2013.01); *F28F 2013/005* (2013.01); *F28F 2013/006* (2013.01); *F28F 2013/008* (2013.01); *G05D 23/02* (2013.01); *H01H 37/00* (2013.01)

(58) Field of Classification Search
CPC ............. F28F 2013/008; H05K 7/2039; F25D 19/006; G05D 23/02; H01H 37/00
USPC .......................................................... 165/276
See application file for complete search history.

(56) References Cited

U.S. PATENT DOCUMENTS

| | | | |
|---|---|---|---|
| 1,870,684 | A | 8/1932 | Killeffer |
| 2,002,309 | A | 5/1935 | Carpenter |
| 2,010,180 | A | 8/1935 | De Ferranti |
| 2,671,441 | A | 3/1954 | Harris |
| 2,667,245 | A | 5/1954 | Edmondson |
| 2,780,074 | A | 2/1957 | Haanan |
| 3,177,933 | A | 4/1965 | Webb |
| 3,225,820 | A | 12/1965 | Riordan |
| 3,229,755 | A | 1/1966 | Komarow |
| 3,302,703 | A | 2/1967 | Kelly |
| 3,372,737 | A | 3/1968 | Schnell |
| 3,391,728 | A | 7/1968 | Kelly |
| 3,399,717 | A | 9/1968 | Cline |
| 3,450,196 | A | 6/1969 | Bauer |
| 3,461,954 | A | 8/1969 | Banks et al. |
| 3,463,224 | A | 8/1969 | Myers |
| 3,478,819 | A | 11/1969 | Reinke |
| 3,500,899 | A | 3/1970 | Shane, Jr. |
| 3,525,229 | A | 8/1970 | Denhoy |
| 3,531,752 | A | 9/1970 | Gourley |
| 3,643,734 | A | 2/1972 | Deschamps |
| 3,796,254 | A | 3/1974 | Stooksberry et al. |
| 3,807,188 | A | 4/1974 | Lagodmos |
| 4,137,964 | A | 2/1979 | Buckley |
| 4,161,212 | A | 7/1979 | Hightower |
| 4,192,290 | A | 3/1980 | Jensen |
| 4,194,119 | A | 3/1980 | MacKenzie |
| 4,212,346 | A * | 7/1980 | Boyd .................... F25D 19/006 165/185 |
| 4,273,183 | A | 6/1981 | Altoz et al. |
| 4,281,708 | A * | 8/1981 | Wing ...................... F28F 27/00 165/277 |
| 4,304,294 | A | 12/1981 | Reisman et al. |
| 4,366,680 | A | 1/1983 | Tward |
| 4,388,965 | A * | 6/1983 | Cunningham ....... G05D 23/192 165/185 |
| 4,454,910 | A | 6/1984 | Miyazaki |
| 4,609,037 | A | 9/1986 | Wheeler et al. |
| 4,676,300 | A | 6/1987 | Miyazaki |
| 4,770,004 | A | 9/1988 | Lagodmos |
| 4,842,050 | A | 6/1989 | Harper |
| 5,320,982 | A | 6/1994 | Tsubone et al. |
| 5,379,601 | A | 1/1995 | Gillett |
| 5,516,600 | A | 5/1996 | Cherng |
| 5,535,815 | A | 7/1996 | Hyman |
| 5,567,267 | A | 10/1996 | Kazama et al. |
| 5,676,205 | A | 10/1997 | White |
| 5,775,416 | A | 7/1998 | Heimanson et al. |
| 5,847,366 | A | 12/1998 | Grunfeld |
| 6,019,166 | A | 2/2000 | Viswanath et al. |
| 6,072,163 | A | 6/2000 | Armstrong et al. |
| 6,140,612 | A | 10/2000 | Hussain et al. |
| 6,247,524 | B1 | 6/2001 | Slasky |
| 6,351,383 | B1 | 2/2002 | Payton |
| 6,404,636 | B1 | 6/2002 | Staggers et al. |
| 6,420,002 | B1 | 7/2002 | Aggas et al. |
| 6,461,801 | B1 | 10/2002 | Wang |
| 6,471,913 | B1 | 10/2002 | Weaver et al. |
| 6,559,420 | B1 | 5/2003 | Zarev |
| 6,622,515 | B2 | 9/2003 | Baker, III |
| 6,639,189 | B2 | 10/2003 | Ramanan et al. |
| 6,705,394 | B1 | 3/2004 | Moslehi et al. |
| 6,771,086 | B2 | 8/2004 | Lutz et al. |
| 6,959,554 | B1 | 11/2005 | Shirron et al. |
| 7,154,369 | B2 | 12/2006 | Dietz et al. |
| 7,191,823 | B2 | 3/2007 | Harker et al. |
| 7,230,204 | B2 | 6/2007 | Mitrovic et al. |
| 7,235,914 | B2 | 6/2007 | Richards et al. |
| 7,347,060 | B2 | 3/2008 | Krempel |
| 7,411,792 | B2 | 8/2008 | Richards et al. |
| 7,497,123 | B1 | 3/2009 | Behm et al. |
| 7,652,227 | B2 | 1/2010 | Inagawa |
| 7,701,716 | B2 | 4/2010 | Blanco, Jr. et al. |
| 7,752,866 | B2 * | 7/2010 | Vaidyanathan ........ F25D 19/006 62/383 |
| 7,755,899 | B2 | 7/2010 | Stenmark |
| 8,069,675 | B2 | 12/2011 | Radovinsky et al. |
| 8,286,696 | B2 | 10/2012 | Grayson et al. |
| 8,313,610 | B2 | 11/2012 | Dhindsa |
| 8,339,787 | B2 | 12/2012 | Tsai |
| 8,410,393 | B2 | 4/2013 | Ricci et al. |
| 8,529,729 | B2 | 9/2013 | Stevenson et al. |
| 8,640,455 | B2 | 2/2014 | Pinto, IV et al. |
| 8,659,903 | B2 | 2/2014 | Schwartz |
| 9,010,409 | B2 | 4/2015 | De Bruyker et al. |
| 9,057,568 | B2 | 6/2015 | Malik et al. |
| 9,080,820 | B2 | 7/2015 | Bolton |
| 9,103,572 | B2 | 8/2015 | Edwards et al. |
| 9,310,145 | B2 | 4/2016 | Colongo et al. |
| 9,404,692 | B2 | 8/2016 | Grayson et al. |
| 9,704,773 | B2 | 7/2017 | Koehler et al. |
| 9,719,736 | B1 | 8/2017 | Pourrahimi et al. |
| 9,879,924 | B2 | 1/2018 | Quinn et al. |
| 9,916,923 | B2 | 3/2018 | Barron et al. |
| 9,921,265 | B2 | 3/2018 | Lopez et al. |
| 9,939,141 | B2 | 4/2018 | Surdeanu et al. |
| 9,982,661 | B1 | 5/2018 | Trigwell et al. |
| 10,100,520 | B2 | 10/2018 | Abe |
| 10,292,307 | B1 | 5/2019 | Wyland |
| 10,670,323 | B2 | 6/2020 | Alexander et al. |
| 10,866,036 | B1 * | 12/2020 | Busche ................ H05K 7/2039 |
| 2002/0014894 | A1 | 2/2002 | Yonezawa et al. |
| 2005/0008983 | A1 | 1/2005 | Wang |
| 2006/0141308 | A1 | 6/2006 | Becerra et al. |
| 2007/0205473 | A1 | 9/2007 | Youngner et al. |
| 2007/0257766 | A1 | 11/2007 | Richards et al. |
| 2008/0049398 | A1 | 2/2008 | Griffiths et al. |
| 2009/0283251 | A1 | 11/2009 | Colongo et al. |
| 2010/0025845 | A1 | 2/2010 | Merz et al. |
| 2011/0068084 | A1 | 3/2011 | Tatsuhiko et al. |
| 2012/0315409 | A1 | 12/2012 | Jones |
| 2013/0126003 | A1 | 5/2013 | De Bruyker et al. |
| 2014/0034218 | A1 | 2/2014 | Hogan et al. |
| 2014/0137570 | A1 | 5/2014 | Hauck et al. |
| 2014/0158334 | A1 | 6/2014 | Dellea et al. |
| 2015/0090436 | A1 | 4/2015 | Andres |
| 2015/0101352 | A1 | 4/2015 | Kwak et al. |
| 2017/0038159 | A1 | 2/2017 | Wood et al. |
| 2018/0095481 | A1 | 4/2018 | Swint et al. |
| 2019/0179351 | A1 | 6/2019 | Andres |

OTHER PUBLICATIONS

Hirsa, Amir et al.; "Thermal control using liquid-metal bridge switches", https://ntrs.nasa.gov/search.jsp?R=20140002749 2019-05-09T22:28:24+00:00Z, 28 pages.

Yang, Tianyu et al., "Millimeter-scale liquid metal droplet thermal switch", Phys.Lett.112,063505(2018);https://doi.org/10.1063/1.5013623. Published Online: Feb. 9, 2018, 6 pages.

(56) References Cited

OTHER PUBLICATIONS

International Search Report and Written Opinion in related International Patent Application No. PCT/US21/31933 dated Aug. 11, 2021; 11 pages.

* cited by examiner

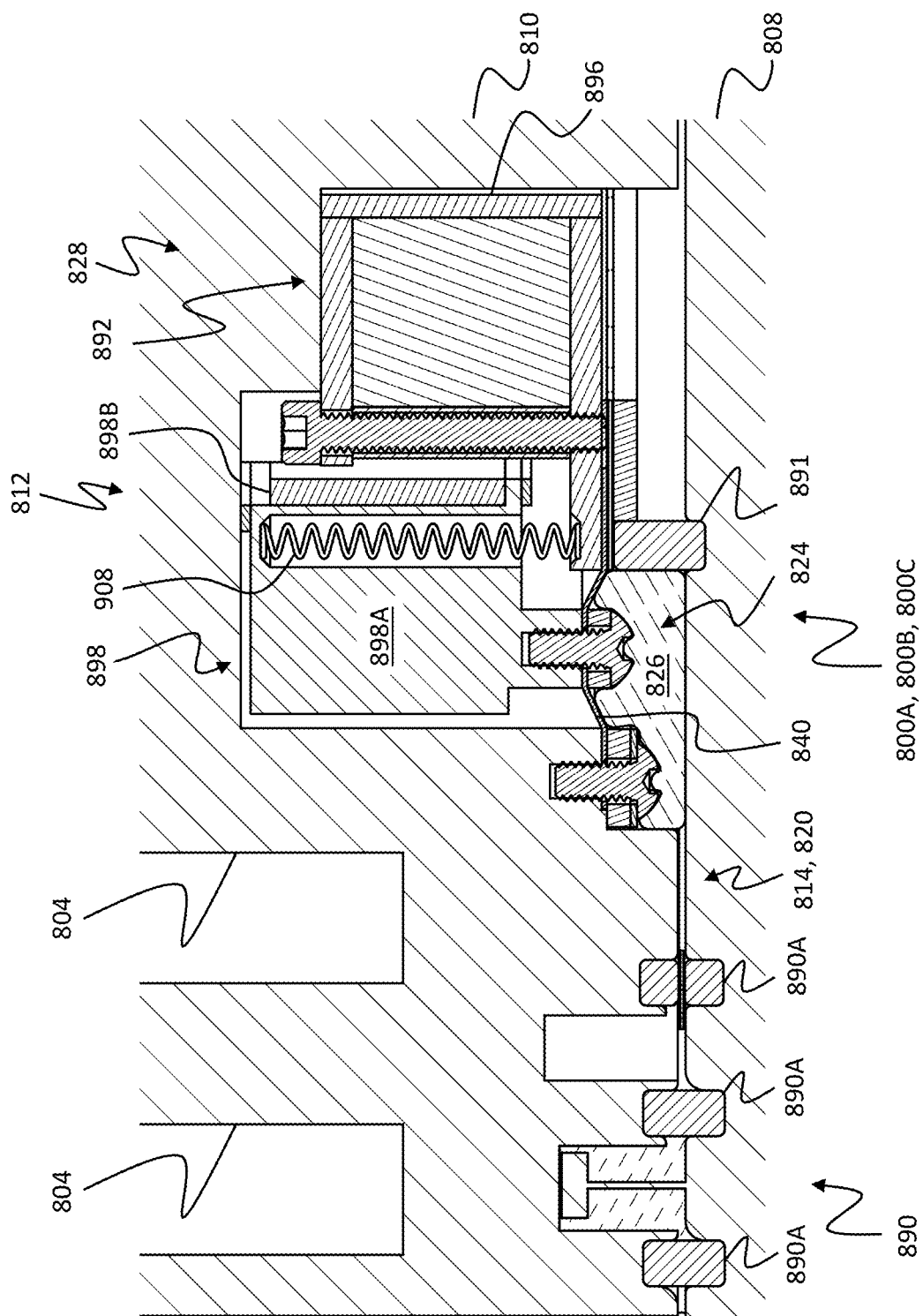

THERMAL SWITCH

FIELD OF THE INVENTION

The invention relates generally to thermal switches, and more particularly, to a controllable thermal switch that utilizes liquid metal to vary thermal conductivity between a heat source and a heat sink.

BACKGROUND OF THE INVENTION

Controlling the temperature of machine components or workpieces is an important and common challenge in industry. Components such as sensors, electronics, vessels for chemical reaction, and batteries often operate optimally at a specific temperature. Temperature dependent manufacturing processes, such as those employed in semiconductor manufacturing, rely on precise control of the temperature of a workpiece to achieve optimal results.

Temperature control is generally achieved by one or both of: regulating heat generation, such as with an electric heater, and regulating the transfer of heat into and out of a system by convection, radiation, and conduction. Of these three modes of heat transfer, thermal conduction is often the most difficult to control, as it is usually determined only by the thermal properties of components and the thermal couplings between components, which typically cannot be changed during operation. An inability to control thermal conduction means commonly employed thermal control systems face limitations in efficiency, rate of temperature change, maximum heat load, or other system performance characteristics.

These limitations may be significant in thermal systems which experience fluctuating heat loads. Fluctuating heat loads may be caused by a variety of factors, including but not limited to: (a) varying external environmental heat sources, such as a satellite moving in and out of sunlight, (b) the thermal system operates over a wide range of temperatures, (c) the thermal system generates a varying heat load (e.g. the battery and inverter of an electric vehicle), (d) the thermal system rapidly changes the temperature of a component (e.g. some types of thermal processing or testing), (e) the thermal system is used to alternately heat and cool a component, and (f) the thermal system requires a high degree of control precision (e.g. semiconductor manufacturing equipment). For example, some temperature control systems may employ a combination of modulated heating with constant cooling, an inefficient control method which limits the performance of a thermal system.

Some prior art temperature control systems have utilized various means of changing thermal conduction between machine components. Such devices have often been referred to as thermal switches. Generally, these prior art thermal switch have operated by one of: making and breaking physical contact between two surfaces, changing the thermal conductivity across a gas-filled gap (most often by manipulating gas pressure), affecting a change in the thermal conductivity of a special material, or moving a thermally conductive liquid.

However, the thermal switches found in prior art have shortcomings in one or more of: thermal performance, cost, reliability, and ease of implementation. The present invention is aimed at one or more of the problems identified above.

SUMMARY OF THE INVENTION

In some embodiments, thermal devices and systems incorporating features of the present invention may exhibit improved efficiency and performance. In such thermal devices and systems, precise, rapid, proportional control of thermal conduction may be provided. Devices and systems incorporating features of the present invention are highly reliable by virtue of a liquid interface, and achieve a wide range of controlled thermal conductivity, with rangeability as high as 600:1. Such devices can support structural loads and exhibit no external movement, which eases implementation.

In a first aspect of the present, a thermal switch having an on-state and an off-state is provided. The first and second plates are composed from a thermally conductive material. The first and second plates are connected to form an internal cavity having a channel defining a gap between the first and second plate. The first reservoir is coupled to the channel and contains a thermally conductive liquid. The actuator is coupled to the first reservoir and the channel and is moveable between a first state and a second state corresponding to the on-state and the off-state of the thermal switch, respectively. Thermally conductive liquid is allowed to flow from the first reservoir to the channel when the actuator is in the first state and allowed to flow from the channel to the first reservoir when the actuator is in the second state In a second aspect of the present invention, a thermal switch is provided. The thermal switch includes first and second plates, a dividing plate, first and second reservoir, an actuator. The first plate and second plates are composed from a thermally conductive material and are connected to form an internal cavity having a channel forming a gap between the first and second plates. The channel has a first end and a second end. The dividing plate is positioned between the first and second plate and is configured to divide the channel into a plurality of conduction zones. Each conduction zone has at least one gas entry/exit point. The first reservoir is coupled to the first end of the channel and contains a liquid metal. The second reservoir is coupled to the channel and contains a gas. The actuator is coupled to the first reservoir and the first end of the channel and is moveable between first and second states. The first and second reservoirs and the channel form part of a closed system. The membrane is positioned between the actuator and the channel and has a first position and a second position associated with the first and second states of the actuator, respectively. The membrane is moveable between the first and second positions in response to the actuator being switched from the first state to the second state, The liquid metal is pushed into the conduction zones from the first reservoir as the membrane is moved from the second position to the first position, The liquid metal flows from the conduction zones to the first reservoir and the gas in the second reservoir flows into the conduction zones in response to the membrane being moved from the first position to the second position.

In a third aspect of the present invention, a method is provided. In a first step, a thermal switch is provided. The thermal switch includes a first plate, a second plate, a first reservoir and an actuator. The first and second plates are composed from a thermally conductive material and are connected to form an internal cavity having a channel defining a gap between the first and second plate. The first reservoir is coupled to the channel and contains a thermally conductive liquid. The actuator is coupled to the first reservoir and the channel and is moveable between first and second states. The method further includes the steps of switching the actuator from the second state to the first state to push the thermally conductive liquid to flow from the first reservoir to the channel and switching the actuator from the first state to the second state to allow the thermally conductive liquid to flow from the channel to the first reservoir.

In a fourth aspect of the present invention, a thermal switch is provided. The thermal switch includes a first plate, a second plate, a post, a channel, a first reservoir, a second reservoir, an actuator and a membrane. The first plate is composed from a thermally conductive material and forms a first side of the thermal switch. The second plate is composed from a thermally conductive material and forms a second side of the thermal switch. The second plate is coupled to the first plate by a plurality of fasteners. The second side, an outer wall extending from the second side, and the first side, surround an internal cavity and form a housing. The post extends from an internal surface of the second side towards the first side. The post, outer wall and second side defining a trench. The channel has a first end and a second end and is located between an internal surface of the first side and an upper surface of the post. The channel defines a gap between the first and second plates. The first reservoir is coupled to the first end of the channel and contains a thermally conductive liquid. The second reservoir is coupled to the second end of the channel and contains a gas. The actuator is coupled to the first reservoir and the first end of the channel. The membrane is positioned between the actuator and the first end of the channel and is located within the trench. The membrane has a first position and a second position associated with the first and second states of the actuator, respectively. The membrane is moveable between the first and second positions in response to the actuator being switched from the first state to the second state. The liquid metal is pushed into the gap from the first reservoir and the gas is pushed from the gap to the second reservoir as the membrane is moved from the second position to the first position. The liquid metal flows from the gap to the first reservoir and the gas in the second reservoir flows into the gap in response to the membrane being moved from the first position to the second position.

In a fifth aspect of the present invention, a thermal switch is provided. The thermal switch includes a first plate, a second plate, a shim, an oxygen seal, a post, a channel, a gas entry/exit point, a first reservoir, a second reservoir, a dividing plate, an actuator and a membrane. The first plate is composed from a thermally conductive material and forms a first side of the thermal switch. The second plate is composed from a thermally conductive material and is coupled to the first plate by a plurality of fasteners. The second plate forms a second side of the thermal switch. An outer wall extends from the second side. The first side, the second side and the outer wall surround an internal cavity and form a housing. The fasteners are located partially in the outer wall of the second plate. The shim is located between the first and second plates configured to provide thermal isolation therebetween. The oxygen seal is located between the interior surface of the first plate and an upper surface of the outer wall and is adjacent the fasteners. The post extends from an internal surface of the second side towards the first side. The post, outer wall and second side define a trench. The channel has a first end and a second end and is located between an internal surface of the first plate and an upper surface of the post. The channel defines a gap between the first and second plates. The gas entry/exit point is located between the interior surface of the first plate and an upper surface of the post. A height of the gas entry/exit point is less than a height of the gap. The first reservoir is coupled to the first end of the channel and contains a thermally conductive liquid. The second reservoir is coupled to the second end of the channel and contains a gas. The dividing plate is positioned between the first and second plates and is configured to divide the channel into a plurality of conduction zones. The actuator is coupled to the first reservoir and the first end of the channel. The actuator is located within the trench and surrounds the post. The membrane is positioned between the actuator and the first end of the channel and is located within the trench. The membrane has a first position and a second position associated with the first and second states of the actuator, respectively. The membrane is moveable between the first and second positions in response to the actuator being switched from the first state to the second state. The thermally conductive liquid is pushed into the gap from the first reservoir as the membrane is moved from the second position to the first position, wherein the thermally conductive liquid flows from the gap to the first reservoir and the gas in the second reservoir flows into the gap in response to the membrane being moved from the first position to the second position.

In a sixth aspect of the present invention, a thermal switch is provided. The thermal switch includes a first plate, a second plate, a shim, an oxygen seal, a post, a channel, a gas entry/exit point, a first reservoir, a second reservoir, a dividing plate, an actuator and a membrane. The first plate is composed from a thermally conductive material and forms a first side of the thermal switch. The second plate is composed from a thermally conductive material and is coupled to the first plate by a plurality of fasteners. The second plate forms a second side of the thermal switch. An outer wall extends from the second side. The first side, the second side and the outer wall surround an internal cavity and form a housing. The fasteners are located partially in the outer wall of the second plate. The shim is located between the first and second plates and is configured to provide thermal isolation therebetween. The oxygen seal is located between the interior surface of the first plate and an upper surface of the outer wall and adjacent the fasteners. The post extends from an internal surface of the second side towards the first side. The post, outer wall and second side define a trench. The channel has a first end and a second end and is located between an internal surface of the first plate and an upper surface of the post. The channel defines a gap between the first and second plates. The gas entry/exit point is located between the interior surface of the first plate and an upper surface of the post. A height of the gas entry/exit point is less than a height of the gap. The first reservoir is coupled to the first end of the channel and contains a thermally conductive liquid. The second reservoir is coupled to the second end of the channel and contains a gas. The dividing plate is positioned between the first and second plates and is configured to divide the channel into a plurality of conduction zones. The actuator is coupled to the first reservoir and the first end of the channel. The actuator is located within the trench and surrounds the post. The membrane is positioned between the actuator and the first end of the channel and is located within the trench. The membrane has a first position and a second position associated with the first and second states of the actuator, respectively. The membrane is moveable between the first and second positions in response to the actuator being switched from the first state to the second state. The thermally conductive liquid is pushed into the gap from the first reservoir as the membrane is moved from the second position to the first position. The thermally conductive liquid flows from the gap to the first reservoir and the gas in the second reservoir flows into the gap in response to the membrane being moved from the first position to the second position.

In a seventh aspect of the present invention, a method is provided. The method includes the step of providing a thermal switch. The thermal switch includes first and second plates, a post, a channel, first and second reservoirs, an actuator and a membrane. The first plate is composed from a thermally conductive material and forms a first side of the thermal switch. The second plate is composed from a thermally conductive material and forms a second side of the thermal switch. The second plate is coupled to the first plate by a plurality of fasteners. The second side, an outer wall extending from the second side, and the first side, surround an internal cavity and form a housing. The post extends from an internal surface of the second side towards the first side. The post, the outer wall and the second side define a trench. The channel has a first end and a second end and is located between an internal surface of the first side and an upper surface of the post. The channel defines a gap between the first and second plates. The first reservoir is coupled to the first end of the channel and contains a thermally conductive liquid. The second reservoir is coupled to the second end of the channel and contains a gas. The actuator is coupled to the first reservoir and the first end of the channel. The membrane is positioned between the actuator and the first end of the channel and is located within the trench. The membrane has a first position and a second position associated with the first and second states of the actuator, respectively. The membrane is moveable between the first and second positions in response to the actuator being switched from the first state to the second state. The thermally conductive liquid is pushed into the gap from the first reservoir and the gas is pushed from the gap to the second reservoir as the membrane is moved from the first position to the second position. The thermally conductive liquid flows from the gap to the first reservoir and the gas in the second reservoir flows into the gap in response to the membrane being moved from the second position to the first position. The method further includes the step of switching the actuator from the second state to the first state to push the thermally conductive liquid into the gap from the first reservoir, wherein the gas is pushed from the gap to the second reservoir as the membrane is moved from the second position to the first position. The method also includes the step of switching the actuator from the first state to the second state to allow the thermally conductive liquid to flow from the gap to the first reservoir, wherein the gas in the second reservoir flows into the gap in response to the membrane being moved from the first position to the second position.

In an eighth aspect of the present invention, a seal for use with a device having a housing forming an internal cavity is provided. The housing has an interface that connects the internal cavity to an external environment. The seal includes a sealing component and an absorbing component. The sealing component is located within the housing and is coupled to the interface. The sealing component is configured to restrict entry of a gas from the external environment to the internal cavity. The absorbing component is located within the housing between the sealing component and the internal cavity and is configured to absorb any gas that passes the sealing component.

In a ninth aspect of the present invention, a seal for use with a thermal device having first and second plates that form a housing is provided. The housing forms an internal cavity. The housing has an interface that connects the internal cavity to an external environment and is formed by a seam between the first and second plates. The seam traverses an outer perimeter of the housing. The seal includes a sealing component and an absorbing component. The sealing component is located within the housing and is coupled to the interface. The sealing component is configured to restrict entry of a gas from the external environment to the internal cavity and includes a first trench within the housing and an isolating element. The first trench is coupled to the interface and surrounds the internal cavity. The first trench contains a gas blocking material. The isolating element extends from the one of the first and second plates into the first trench forming a gap between the isolating element and the other one of the first and second plates. The absorbing component is located within the housing between the sealing component and the internal cavity and is configured to absorb any gas that passes the sealing component. The absorbing component includes a second trench within the housing. The second trench is coupled to the interface and surrounds the internal cavity.

In a tenth aspect of the present invention, a thermal device having first and second plates is provided. The second plate is coupled to the first plate forming a housing. The housing forms an internal cavity and has an interface that connects the internal cavity to an external environment. The interface is formed by a seam between the first and second plates and traverses an outer perimeter of the housing. The sealing component is located within the housing and is coupled to the interface. The sealing component is configured to restrict entry of a gas from the external environment to the internal cavity. The absorbing component is located within the housing between the sealing component and the internal cavity and is configured to absorb any gas that passes the sealing component.

In an eleventh aspect of the present invention, a thermal device is provided. The thermal device includes a first plate, a second plate, a sealing component and an absorbing component. The second plate is coupled to the first plate forming a housing. The housing forms an internal cavity and has an interface that connects the internal cavity to an external environment. The interface is formed by a seam between the first and second plates. The seam traverses an outer perimeter of the housing. The sealing component is located within the housing, coupled to the interface and configured to restrict entry of a gas from the external environment to the internal cavity. The sealing component includes a first trench within the housing and an isolating element. The first trench is coupled to the interface and surrounds the internal cavity. The first trench contains a gas blocking material. The isolating element extends from the one of the first and second plates into the first trench forming a gap between the isolating element and the other one of the first and second plates. The absorbing component is located within the housing between the sealing component and the internal cavity and is configured to absorb any gas that passes the sealing component. The absorbing component includes a second trench within the housing. The second trench is coupled to the interface and surrounds the internal cavity.

In a twelfth aspect of the present invention, a thermal device for controlling a temperature associated with a controlled component is provided. The thermal device includes a thermal switch and a heat sink. The thermal switch having an on-state and an off-state and including a first plate and a second plate. The first plate is thermally coupled to the controlled component. The heat sink is coupled to the second plate. The first plate and second plates are composed from a thermally conductive material. The first and second plates are connected to form an internal cavity having a channel defining a gap between the first and second plates. The thermal switch further includes a first reservoir and an actuator. The first reservoir is coupled to the channel and contains a thermally conductive liquid. The actuator is coupled to the first reservoir and the channel and is being moveable between a first state and a second state corresponding to the on-state and the off-state of the thermal switch, respectively. The actuator is configured to allow the thermally conductive liquid to flow from the reservoir to the channel when the actuator is in the first state and to allow the thermally conductive liquid to flow from the channel to the first reservoir when the actuator is in the second state.

In a thirteenth aspect of the present invention, a thermal device including a thermoelectric cooler, a thermal switch, a heat sink, a first reservoir and an actuator is provided. The thermal switch has an on-state and an off-state and includes a first plate and a second plate composed from a thermally conductive material. The first plate is thermally coupled to the thermoelectric cooler. The heat sink is coupled to the second plate. The first and second plates are connected to form an internal cavity having a channel defining a gap between the first and second plates. The first reservoir is coupled to the channel and contains a thermally conductive liquid. The actuator is coupled to the first reservoir and the channel and is moveable between a first state and a second state corresponding to the on-state and the off-state of the thermal switch, respectively. The actuator is configured to allow the thermally conductive liquid to flow from the reservoir to the channel when the actuator is in the first state and to allow the thermally conductive liquid to flow from the channel to the first reservoir when the actuator is in the second state.

In a fourteenth aspect of the present invention, a thermal device for controlling a temperature associated with a heat source is provided. The thermal device includes a thermal switch which has an on-state and an off-state and first and second plates composed from a thermally conductive material. The first plate is coupled to the heat source. The thermal device includes a plurality of cooling channels in the second plate acting as a heat sink. The first and second plates are connected to form an internal cavity having a channel defining a gap between the first and second plates. The thermal switch includes a first reservoir and an actuator. The first reservoir is coupled to the channel and contains a thermally conductive liquid. The actuator is coupled to the first reservoir and the channel and is moveable between a first state and a second state corresponding to the on-state and the off-state of the thermal switch, respectively, and is configured to allow the thermally conductive liquid to flow from the reservoir to the channel when the actuator is in the first state and to allow the thermally conductive liquid to flow from the channel to the first reservoir when the actuator is in the second state.

In a fifteenth aspect of the present invention, a thermal device for controlling a temperature associated with a workpiece is provided. The thermal device includes a heating device and a thermal switch. The heating device is coupled to the workpiece. The thermal switch has an on-state and an off-state and includes a first plate and a second plate composed from a thermally conductive material. The first plate is thermally coupled to the heating device. The thermal switch further includes a plurality of cooling channels, a first reservoir and an actuator. The plurality of cooling channels are located in the second plate and act as a heat sink. The first and second plates are connected to form an internal cavity having a channel defining a gap between the first and second plate. The first reservoir is coupled to the channel and contains a thermally conductive liquid. The actuator is coupled to the first reservoir and the channel and is moveable between a first state and a second state corresponding to the on-state and the off-state of the thermal switch, respectively, and is configured to allow the thermally conductive liquid to flow from the reservoir to the channel when the actuator is in the first state and to allow the thermally conductive liquid to flow from the channel to the first reservoir when the actuator is in the second state.

In a sixteenth aspect of the present invention, a thermal device is provided. The thermal device includes a thermal switch and a first liquid-based thermal coupling device. The thermal switch has an on-state and an off-state and includes first and second plates. The first liquid-based thermal coupling device is coupled to the first plate. The first and second plates are connected to form an internal cavity having a channel defining a gap between the first and second plate. The thermal switch further includes a first reservoir, an actuator and a second liquid-based thermal coupling device. The first reservoir is coupled to the channel and contains a thermally conductive liquid. The actuator is coupled to the first reservoir and the channel and is moveable between a first state and a second state corresponding to the on-state and the off-state of the thermal switch, respectively, and is configured to allow the thermally conductive liquid to flow from the reservoir to the channel when the actuator is in the first state and to allow the thermally conductive liquid to flow from the channel to the first reservoir when the actuator is in the second state. The second liquid-based thermal coupling device is coupled to the second plate. The first and second liquid-based thermal coupling devices and the thermal switch form a variable liquid-liquid heat exchanger.

In a seventeenth aspect of the present invention, a thermal device for controlling a temperature associated with a working surface is provided. The thermal device includes first and second plates composed from a thermally conductive material, the first and second plates are connected to form first and second internal cavities. One of the first and second plates includes an outer surface that forms the working surface. A thermal switch is located within each internal cavity. Each thermal switch has an on-state and an off-state and at least one of the switches includes a channel, a first reservoir and an actuator. The channel defines a gap in the respective internal cavity between the first and second plates. The first reservoir is coupled to the channel and contains a thermally conductive liquid. The actuator is coupled to the first reservoir and the channel and is moveable between a first state and a second state corresponding to the on-state and the off-state of the thermal switch, respectively. The actuator is configured to allow the thermally conductive liquid to flow from the reservoir to the channel when the actuator is in the first state and to allow the thermally conductive liquid to flow from the channel to the first reservoir when the actuator is in the second state.

In an eighteenth aspect of the present invention, a thermal device is provided. The thermal device includes first and second plates composed from a thermally conductive material. The first and second plates are connected by a plurality of fasteners to form first and second internal cavities. One of the first and second plates includes an outer surface that forms the working surface. The thermal device further includes a thermal switch located in each internal cavity. Each thermal switch has an on-state and an off-state and first and second sides, at least one of the thermal switches including:

a post extending from an internal surface of the second side towards the first side, the post and the second side defining a trench;

a channel having a first end and a second end and being located between an internal surface of the first side and an upper surface of the post, the channel defining a gap between the first and second plates;

a first reservoir coupled to the first end of the channel and containing a thermally conductive liquid;

a second reservoir coupled to the second end of the channel and containing a gas;

an actuator coupled to the first reservoir and the first end of the channel; and a membrane positioned between the actuator and the first end of the channel and being located within the trench, the membrane having a first position and a second position associated with the first and second states of the actuator, respectively, the membrane being moveable between the first and second positions in response to the actuator being switched from the first state to the second state, wherein the thermally conductive liquid is pushed into the gap from the first reservoir and the gas is pushed from the gap to the second reservoir as the membrane is moved from the second position to the first position, wherein the thermally conductive liquid flows from the gap to the first reservoir and the gas in the second reservoir flows into the gap in response to the membrane being moved from the first position to the second position.

In a nineteen aspect of the present invention, a thermal device is provided. The thermal device includes first and second plates composed from a thermally conductive material. The first and second plates are connected by a plurality of fasteners to form first and second internal cavities. One of the first and second plates includes an outer surface that forms the working surface. The thermal device further includes a thermal switch in each of the internal cavities, a shim located between the first and second plates configured to provide thermal isolation therebetween and an oxygen seal located between the interior surface of the first plate and an upper surface of an outer wall and adjacent the fasteners. Each thermal switch has an on-state and an off-state and first and second sides. At least one of the thermal switches including:

a post extending from an internal surface of the second side towards the first side, the post, outer wall and second side defining a trench;

a channel having a first end and a second end and being located between an internal surface of the first plate and an upper surface of the post, the channel defining a gap between the first and second plates;

a gas entry/exit point located between the interior surface of the first plate and an upper surface of the post, wherein a height of the gas entry/exit point is less than a height of the gap, a first reservoir coupled to the first end of the channel and containing a thermally conductive liquid;

a second reservoir coupled to the second end of the channel and containing a gas;

a dividing plate positioned between the first and second plates and configured to divide the channel into a plurality of conduction zones;

an actuator coupled to the first reservoir and the first end of the channel, the actuator being located within the trench and surrounding the post;

a membrane positioned between the actuator and the first end of the channel and being located within the trench, the membrane having a first position and a second position associated with the first and second states of the actuator, respectively, the membrane being moveable between the first and second positions in response to the actuator being switched from the first state to the second state, wherein the thermally conductive liquid is pushed into the gap from the first reservoir as the membrane is moved from the second position to the first position, wherein the thermally conductive liquid flows from the gap to the first reservoir and the gas in the second reservoir flows into the gap in response to the membrane being moved from the first position to the second position.

In a twentieth aspect of the present invention, a thermal device is provided. The thermal device includes first and second plates composed from a thermally conductive material. The first and second plates are connected by a plurality of fasteners to form first and second internal cavities. One of the first and second plates includes an outer surface that forms the working surface. The thermal device further includes a shim, an oxygen seal and a thermal switch located in each internal cavity. The shim is located between the first and second plates and is configured to provide thermal isolation therebetween. The oxygen seal is located between the interior surface of the first plate and an upper surface of an outer wall and adjacent the fasteners. Each thermal switch has an on-state and an off-state and first and second sides. At least one of the thermal switches including:

a post extending from an internal surface of the second side towards the first side, the post, outer wall and second side defining a trench;

a channel having a first end and a second end and being located between an internal surface of the first plate and an upper surface of the post, the channel defining a gap between the first and second plates;

a gas entry/exit point located between the interior surface of the first plate and an upper surface of the post, wherein a height of the gas entry/exit point is less than a height of the gap;

a first reservoir coupled to the first end of the channel and containing a thermally conductive liquid;

a second reservoir coupled to the second end of the channel and containing a gas;

a dividing plate positioned between the first and second plates and configured to divide the channel into a plurality of conduction zones;

an actuator coupled to the first reservoir and the first end of the channel, the actuator being located within the trench and surrounding the post; and, a membrane positioned between the actuator and the first end of the channel and being located within the trench, the membrane having a first position and a second position associated with the first and second states of the actuator, respectively, the membrane being moveable between the first and second positions in response to the actuator being switched from the first state to the second state, wherein the thermally conductive liquid is pushed into the gap from the first reservoir as the membrane is moved from the second position to the first position, wherein the thermally conductive liquid flows from the gap to the first reservoir and the gas in the second reservoir flows into the gap in response to the membrane being moved from the first position to the second position.

In a twenty-first aspect of the present invention, a thermal switch having first and second plates, a first reservoir and a pneumatic actuator is provided. The first and second plates are composed from a thermally conductive material and are connected to form an internal cavity. The internal cavity has a channel defining a gap between the first and second plate. The first reservoir is coupled to the channel and contains a thermally conductive liquid. The pneumatic actuator is coupled to the first reservoir and the channel and is moveable between a first state and a second state corresponding to the on-state and the off-state of the thermal switch, respectively. The pneumatic actuation is configured to allow the thermally conductive liquid to flow from the first reservoir to the channel when the pneumatic actuator is in the first state and to allow the thermally conductive liquid to flow from the channel to the first reservoir when the actuator is in the second state.

In a twenty-second aspect of the present invention, a thermal switch is provided. The thermal switch includes first and second plates composed from a thermally conductive material. The first and second plates are connected to form an internal cavity having a channel forming a gap between the first and second plates. The channel has a first end and a second end. The thermal switch further includes a dividing plate, first and second reservoirs, a pneumatic actuator and a membrane. The dividing plate is positioned between the first and second plates and is configured to divide the channel into a plurality of conduction zones. Each conduction zone having at least one gas entry/exit point. The first reservoir is coupled to the first end of the channel and contains a liquid metal. The second reservoir is coupled to the channel and contains a gas. The pneumatic actuator is coupled to the first reservoir and the first end of the channel. The actuator is moveable between first and second states. The first reservoir, second reservoir and the channel form part of a closed system. The membrane is positioned between the actuator and the channel and has a first position and a second position associated with the first and second states of the pneumatic actuator, respectively. The membrane is moveable between the first and second positions in response to the pneumatic actuator being switched from the first state to the second state. The liquid metal is pushed into the conduction zones from the first reservoir as the membrane is moved from the second position to the first position. The liquid metal flows from the conduction zones to the first reservoir and the gas in the second reservoir flows into the conduction zones in response to the membrane being moved from the first position to the second position.

In a twenty-third aspect of the present invention, a process module having a processing chamber and a thermal switch is provided. The processing chamber receives a semiconductor wafer. The thermal switch is coupled to the processing chamber and includes first and second plates, a first reservoir and an actuator. The first and second plates are composed from a thermally conductive material and are connected to form an internal cavity having a channel defining a gap between the first and second plate. The first reservoir is coupled to the channel and contains a thermally conductive liquid. The actuator is coupled to the first reservoir and the channel and is moveable between a first state and a second state corresponding to the on-state and the off-state of the thermal switch, respectively. The actuator is configured to allow the thermally conductive liquid to flow from the first reservoir to the channel when the actuator is in the first state and to allow the thermally conductive liquid to flow from the channel to the first reservoir when the actuator is in the second state.

In a twenty-fourth aspect of the present invention, an inductively coupled plasma process module is provided. The inductively coupled plasma process module includes a processing chamber and a retention device. The processing chamber is configured to receive a semiconductor wafer and has a vessel and a ceramic plate. The vessel and the ceramic plate form an internal plasma cavity. The retention device is located within the internal plasma cavity and configured to hold and/or support the semiconductor wafer in place. The retention device includes a retention device temperature control assembly having a thermal switch coupled to the processing chamber. The thermal switch includes first and second plates composed from a thermally conductive material, a first reservoir and an actuator. The first and second plates are connected to form an internal cavity having a channel defining a gap between the first and second plates. The first reservoir is coupled to the channel and contains a thermally conductive liquid. The actuator is coupled to the first reservoir and the channel and is moveable between a first state and a second state corresponding to the on-state and the off-state of the thermal switch, respectively. The actuator is configured to allow the thermally conductive liquid to flow from the first reservoir to the channel when the actuator is in the first state and to allow the thermally conductive liquid to flow from the channel to the first reservoir when the actuator is in the second state.

In a twenty-fifth aspect of the present invention, a capacitively coupled plasma process module is provided. The capacitively coupled plasma process module includes a processing chamber, a top electrode and a retention device. The processing chamber has an internal plasma cavity and is configured to receive a semiconductor wafer. The top electrode is located within the internal plasma cavity and has a top electrode temperature control assembly. The retention device is located within the internal plasma cavity and is configured to hold the semiconductor wafer in place. The retention device includes a retention device temperature control assembly. Either or both of the top electrode temperature control assembly and the retention device temperature control assembly include a thermal switch. Each of the of the thermal switches includes first and second plates composed from a thermally conductive material, a first reservoir and an actuator. The first and second plates are connected to form an internal cavity having a channel defining a gap between the first and second plates. The first reservoir is coupled to the channel and contains a thermally conductive liquid. The actuator is coupled to the first reservoir and the channel and is moveable between a first state and a second state corresponding to the on-state and the off-state of the thermal switch, respectively. The actuator is configured to allow the thermally conductive liquid to flow from the first reservoir to the channel when the actuator is in the first state and to allow the thermally conductive liquid to flow from the channel to the first reservoir when the actuator is in the second state.

In a twenty-sixth aspect of the present invention, a thermal switch having an on-state and an off-state is provided. The thermal switch includes first and second plates, a first reservoir, an actuation reservoir and a membrane. The first and second plates are composed from a thermally conductive material. The first and second plates are connected to form an interior cavity having a channel defining a gap between the first and second plate. The first reservoir is coupled to the channel and contains a thermally conductive liquid. The actuation reservoir contains an actuating material. The membrane is connected to the first and/or second plate and separates the first reservoir and actuating reservoir. The membrane is moveable between a first state and a second state corresponding to the on-state and the off-state of the thermal switch, respectively. The actuating material expands when heated and expansion of the actuating material causes the membrane to move from the first state to the second state. The thermally conductive liquid flows from the first reservoir to the channel when the actuator is in the first state and the thermally conductive liquid flows from the channel to the first reservoir when the actuator is in the second state.

In a twenty-seventh aspect of the present invention, a thermal switch is provided. The thermal switch includes:

a first plate being composed from a thermally conductive material;

a second plate being composed from a thermally conductive material, the first and second plates being connected to form an internal cavity having a channel forming a gap between the first and second plates, the channel having a first end and a second end;

a dividing plate positioned between the first and second plates and being configured to divide the channel into a plurality of conduction zones, each conduction zone having at least one gas entry/exit point;

a first reservoir coupled to the first end of the channel, the first reservoir containing a liquid metal;

a second reservoir coupled to the channel, the second reservoir containing a gas;

a passive actuator coupled to the first reservoir and the first end of the channel, the passive actuator being moveable between first and second states, the first reservoir, second reservoir and the channel forming part of a closed system; and, a membrane positioned between the actuator and the channel and having a first position and a second position associated with the first and second states of the passive actuator, respectively, the membrane being moveable between the first and second positions in response to the passive actuator being switched from the first state to the second state, wherein the liquid metal is pushed into the conduction zones from the first reservoir as the membrane is moved from the second position to the first position, wherein the liquid metal flows from the conduction zones to the first reservoir and the gas in the second reservoir flows into the conduction zones in response to the membrane being moved from the first position to the second position.

Clauses

Thermal Switch Clauses

1. A thermal switch, comprising:

a first plate being composed from a thermally conductive material and forming a first side of the thermal switch;

a second plate being composed from a thermally conductive material and forming a second side of the thermal switch, the second plate being coupled to the first plate by a plurality of fasteners, wherein the second side, an outer wall extending from the second side, and the first side, surround an internal cavity and form a housing;

a post extending from an internal surface of the second side towards the first side, the post, outer wall and second side defining a trench;

a channel having a first end and a second end and being located between an internal surface of the first side and an upper surface of the post, the channel defining a gap between the first and second plates;

a first reservoir coupled to the first end of the channel and containing a thermally conductive liquid;

a second reservoir coupled to the second end of the channel and containing a gas;

an actuator coupled to the first reservoir and the first end of the channel; and a membrane positioned between the actuator and the first end of the channel and being located within the trench, the membrane having a first position and a second position associated with the first and second states of the actuator, respectively, the membrane being moveable between the first and second positions in response to the actuator being switched from the first state to the second state, wherein the thermally conductive liquid is pushed into the gap from the first reservoir and the gas is pushed from the gap to the second reservoir as the membrane is moved from the second position to the first position, wherein the thermally conductive liquid flows from the gap to the first reservoir and the gas in the second reservoir flows into the gap in response to the membrane being moved from the first position to the second position.

2. A thermal switch, as set forth in clause 1, further comprising a shim located between the first and second plates configured to provide thermal isolation therebetween.

3. A thermal switch, as set forth in clause 1, wherein the fasteners are located partially in the outer wall of the second plate, the thermal switch further comprising an oxygen seal located between the interior surface of the first plate and an upper surface of the outer wall and adjacent the fasteners opposite the outer wall.

4. A thermal switch, as set forth in clause 1, wherein the second reservoir is located within the post.

5. A thermal switch, as set forth in clause 1, further comprising a gas entry/exit point between the second reservoir and the channel.

6. A thermal switch, as set forth in clause 5, wherein the gas entry/exit point is located between the interior surface of the first plate and an upper surface of the post.

7. A thermal switch, as set forth in clause 6, wherein a height of the gas entry/exit point is less than a height of the gap.

8. A thermal switch, as set forth in clause 1, wherein the gap defines at least one conduction zone within the channel, the at least one conduction zone has a length of less than or equal to 0.5 inches.

9. A thermal switch, as set forth in clause 1, wherein the gap defines at least one conduction zone within the channel, the at least one conduction zone has a length of less than or equal to 0.2 inches.

10. A thermal switch, as set forth in clause 1, wherein the gap defines at least one conduction zone within the channel, the at least one conduction zone has a length of less than or equal to 0.1 inches.

11. A thermal switch, as set forth in clause 1, wherein the gap has a height of less than or equal to 0.2 inches.

12. A thermal switch, as set forth in clause 1, further comprising a dividing plate positioned between the first and second plates and configured to divide the channel into a plurality of conduction zones, each conduction zone having at least one gas entry/exit point, each of the at least one gas entry/exit points being configured to minimize entry of the thermally conductive liquid into the at least one gas entry/exit point.

13. A thermal switch, as set forth in clause 1, wherein the actuator includes an electric solenoid.

14. A thermal switch, as set forth in clause 1, wherein the actuator includes a pneumatic actuator.

15. A thermal switch, comprising:

a first plate being composed from a thermally conductive material and forming a first side of the thermal switch;

a second plate being composed from a thermally conductive material and being coupled to the first plate by a plurality of fasteners, the second plate forming a second side of the thermal switch and an outer wall extending from the second side, wherein the first side, the second side and the outer wall surround an internal cavity and form a housing, wherein the fasteners are located partially in the outer wall of the second plate;

a shim located between the first and second plates configured to provide thermal isolation therebetween;

an oxygen seal located between the interior surface of the first plate and an upper surface of the outer wall and adjacent the fasteners.

a post extending from an internal surface of the second side towards the first side, the post, outer wall and second side defining a trench;

a channel having a first end and a second end and being located between an internal surface of the first plate and an upper surface of the post, the channel defining a gap between the first and second plates;

a gas entry/exit point located between the interior surface of the first plate and an upper surface of the post, wherein a height of the gas entry/exit point is less than a height of the gap, a first reservoir coupled to the first end of the channel and containing a thermally conductive liquid;

a second reservoir coupled to the second end of the channel and containing a gas;

a dividing plate positioned between the first and second plates and configured to divide the channel into a plurality of conduction zones;

an actuator coupled to the first reservoir and the first end of the channel, the actuator being located within the trench and surrounding the post;

a membrane positioned between the actuator and the first end of the channel and being located within the trench, the membrane having a first position and a second position associated with the first and second states of the actuator, respectively, the membrane being moveable between the first and second positions in response to the actuator being switched from the first state to the second state, wherein the thermally conductive liquid is pushed into the gap from the first reservoir as the membrane is moved from the second position to the first position, wherein the thermally conductive liquid flows from the gap to the first reservoir and the gas in the second reservoir flows into the gap in response to the membrane being moved from the first position to the second position.

16. A thermal switch, as set forth in clause 15, wherein the trench extends around a periphery of the second plate and surrounds the post, wherein the actuator is located within the trench.

17. A thermal switch, as set forth in clause 16, wherein the actuator includes an electric solenoid having a solenoid coil and a circular plunger, wherein the solenoid coil surrounds and is concentric with the post, the circular plunger being located adjacent, and being concentric with, the solenoid coil.

18. A thermal switch, as set forth in clause 16, wherein the actuator is a pneumatic actuator including a plunger, a bellows coupled to the plunger and to a source of pressurized air.

19. A thermal switch, as set forth in clause 15, wherein the second reservoir is located within the post.

20. A thermal switch, as set forth in clause 15, wherein the gap defines at least one conduction zone within the channel, the at least one conduction zone has a length of less than or equal to 0.5 inches.

21. A thermal switch, as set forth in clause 15, wherein the gap has a height of less than or equal to 0.2 inches.

22. A thermal switch, comprising:

a first plate being composed from a thermally conductive material and forming a side of the thermal switch;

a second plate being composed from a thermally conductive material and being coupled to the first plate by a plurality of fasteners, the second plate forming a second side of the thermal switch and an outer wall extending from the second side, wherein the first side, the second side and the outer wall surround an internal cavity and form a housing, wherein the fasteners are located partially in the outer wall of the second plate;

a shim located between the first and second plates configured to provide thermal isolation therebetween;

an oxygen seal located between the interior surface of the first plate and an upper surface of the outer wall and adjacent the fasteners.

a post extending from an internal surface of the second side towards the first side, the post, outer wall and second side defining a trench, the trench being located within a central area of the thermal switch, the post surrounding the trench;

a channel having a first end and a second end and being located between an internal surface of the first plate and an upper surface of the post, the channel defining a gap between the first and second plates;

a gas entry/exit point located between the interior surface of the first plate and an upper surface of the post, wherein a height of the gas entry/exit point is less than a height of the gap, a first reservoir coupled to the first end of the channel and containing a thermally conductive liquid;

a second reservoir coupled to the second end of the channel and containing a gas;

a dividing plate positioned between the first and second plates and configured to divide the channel into a plurality of conduction zones;

an actuator coupled to the first reservoir and the first end of the channel, the actuator being located within the trench; and, a membrane positioned between the actuator and the first end of the channel and being located within the trench, the membrane having a first position and a second position associated with the first and second states of the actuator, respectively, the membrane being moveable between the first and second positions in response to the actuator being switched from the first state to the second state, wherein the thermally conductive liquid is pushed into the gap from the first reservoir as the membrane is moved from the second position to the first position, wherein the thermally conductive liquid flows from the gap to the first reservoir and the gas in the second reservoir flows into the gap in response to the membrane being moved from the first position to the second position.

23. A thermal switch, as set forth in clause 22, wherein the trench extends around a periphery of the second plate and surrounds the post, wherein the actuator is located within the trench.

24. A thermal switch, as set forth in clause 23, wherein the actuator includes an electric solenoid having a solenoid coil and a circular plunger, wherein the solenoid coil surrounds and is concentric with the post, the circular plunger being located adjacent, and being concentric with, the solenoid coil.

25. A thermal switch, as set forth in clause 23, wherein the actuator is a pneumatic actuator including a plunger, a bellows coupled to the plunger and to a source of pressurized air.

26. A thermal switch, as set forth in clause 23, wherein the second reservoir is located within the post.

27. A thermal switch, as set forth in clause 22, wherein the gap defines at least one conduction zone within the channel, the at least one conduction zone has a length of less than or equal to 0.5 inches.

28. A thermal switch, as set forth in clause 22, wherein the gap has a height of less than or equal to 0.2 inches.

29. A method, including the steps of:

providing a thermal switch, the thermal switch include first and second plates, a post, a channel, first and second reservoirs, an actuator and a membrane, the first plate being composed from a thermally conductive material and forming a first side of the thermal switch, the second plate being composed from a thermally conductive material and forming a second side of the thermal switch, the second plate being coupled to the first plate by a plurality of fasteners, wherein the second side, an outer wall extending from the second side, and the first side, surround an internal cavity and form a housing, the post extending from an internal surface of the second side towards the first side, the post, the outer wall and the second side defining a trench, the channel having a first end and a second end and being located between an internal surface of the first side and an upper surface of the post, the channel defining a gap between the first and second plates, the first reservoir being coupled to the first end of the channel and containing a thermally conductive liquid, the second reservoir coupled to the second end of the channel and containing a gas, the actuator coupled to the first reservoir and the first end of the channel, the membrane positioned between the actuator and the first end of the channel and being located within the trench, the membrane having a first position and a second position associated with the first and second states of the actuator, respectively, the membrane being moveable between the first and second positions in response to the actuator being switched from the first state to the second state, wherein the thermally conductive liquid is pushed into the gap from the first reservoir and the gas is pushed from the gap to the second reservoir as the membrane is moved from the first position to the second position, wherein the thermally conductive liquid flows from the gap to the first reservoir and the gas in the second reservoir flows into the gap in response to the membrane being moved from the second position to the first position;

switching the actuator from the second state to the first state to push the thermally conductive liquid into the gap from the first reservoir, wherein the gas is pushed from the gap to the second reservoir as the membrane is moved from the second position to the first position; and switching the actuator from the first state to the second state to allow the thermally conductive liquid to flow from the gap to the first reservoir, wherein the gas in the second reservoir flows into the gap in response to the membrane being moved from the first position to the second position.

Oxygen Seal Clauses

1. A seal for use with a device having a housing forming an internal cavity, the housing having an interface that connects the internal cavity to an external environment, comprising:

a sealing component located within the housing and being coupled to the interface and being configured to restrict entry of a gas from the external environment to the internal cavity; and, an absorbing component located within the housing between the sealing component and the internal cavity and configured to absorb any gas that passes the sealing component.

2. A seal, as set forth in clause 1, wherein the device is a thermal device and the housing is formed from a first plate and a second plate, wherein the first plate may operate at a higher temperature than the second plate.

3. A seal, as set forth in clause 2, wherein the thermal device is a thermal switch.

4. A seal, as set forth in clause 2, wherein the interface is formed by a seam between the first and second plates.

5. A seal, as set forth in clause 4, wherein the sealing component includes a first cavity within the housing, wherein the first cavity is coupled to the interface.

6. A seal, as set forth in clause 1, wherein the first cavity contains a gas blocking material.

7. A seal, as set forth in clause 6, wherein the gas blocking material is grease.

8. A seal, as set forth in clause 6, wherein the gas blocking material is vacuum grease.

9. A seal, as set forth in clause 6, wherein the absorbing component includes a second cavity within the housing, wherein the second cavity is coupled to the interface.

10. A seal, as set forth in clause 9, wherein the second cavity contains a gas absorbing material.

11. A seal, as set forth in clause 10, wherein the sealing component includes an isolating element extending from one of the first and second plates into the first cavity forming a gap between the isolating element and another one of the first and second plates.

12. A seal, as set forth in clause 11, wherein the isolating element includes a fin extending from the one of the first and second plates and a flange connected to the fin, the gap being between the flange and the other one of the first and second plates.

13. A seal, as set forth in clause 9 wherein the first and second cavities are respective ring-shaped trenches that surround the internal cavity.

14. A seal, as set forth in clause 1, wherein the gas is oxygen.

15. A seal, as set forth in clause 1, further including a cavity within the housing, wherein the cavity is coupled to the interface and surrounds the internal cavity, wherein the sealing component includes a gas blocking material within the cavity and the absorbing component includes a gas absorbing material within the cavity.

16. A seal, as set forth in clause 15, wherein the gas blocking material is a grease and the gas absorbing material is mixed with the grease.

17. A seal, as set forth in clause 15, wherein the cavity is a ring-shaped trench that surrounds the internal cavity.

18. A seal for use with a thermal device having first and second plates forming a housing, the housing forming an internal cavity, the housing having an interface that connects the internal cavity to an external environment, the interface being formed by a seam between the first and second plates, comprising:

a sealing component located within the housing and being coupled to the interface and being configured to restrict entry of a gas from the external environment to the internal cavity, the sealing component including a first cavity within the housing and an isolating element, wherein the first cavity is coupled to the interface and surrounds the internal cavity, the first cavity containing a gas blocking material, the isolating element extending from one of the first and second plates into the first cavity forming a gap between the isolating element and another one of the first and second plates.

19. A seal, as set forth in clause 18, the seal further comprising:
an absorbing component located within the housing between the sealing component and the internal cavity and configured to absorb any gas that passes the sealing component, the absorbing component including a second cavity within the housing, the second cavity being coupled to the interface and surrounding the internal cavity.

20. A seal, as set forth in clause 19, wherein the first and second cavities are respective ring-shaped trenches that surround the internal cavity.

21. A seal, as set forth in clause 18, wherein the thermal device is a thermal switch.

22. A seal, as set forth in clause 18, wherein the gas blocking material is grease.

23. A seal, as set forth in clause 18, wherein the gas blocking material is vacuum grease.

24. A seal, as set forth in clause 19, wherein second trench contains a gas absorbing material.

25. A seal, as set forth in clause 16, wherein the gas is oxygen.

26. A seal, as set forth in clause 16, wherein the isolating element includes a fin extending from the one of the first and second plates and a flange connected to the fin, the gap being between the flange and the other one of the first and second plates.

27. A thermal device, comprising:
a first plate;
a second plate coupled to the first plate forming a housing, the housing forming an internal cavity, the housing having an interface that connects the internal cavity to an external environment, the interface being formed by a seam between the first and second plates;
a sealing component located within the housing and being coupled to the interface and being configured to restrict entry of a gas from the external environment to the internal cavity; and,
an absorbing component located within the housing between the sealing component and the internal cavity and configured to absorb any gas that passes the sealing component.

28. A thermal device, comprising:
a first plate;
a second plate coupled to the first plate forming a housing, the housing forming an internal cavity, the housing having an interface that connects the internal cavity to an external environment, the interface being formed by a seam between the first and second plates, the seam traversing an outer perimeter of the housing;
a sealing component located within the housing and being coupled to the interface and being configured to restrict entry of a gas from the external environment to the internal cavity, the sealing component including a first trench within the housing and an isolating element, wherein the first trench is coupled to the interface and surrounds the internal cavity, the first trench containing a gas blocking material, the isolating element extending from the one of the first and second plates into the first trench forming a gap between the isolating element and the other one of the first and second plates; and,
an absorbing component located within the housing between the sealing component and the internal cavity and configured to absorb any gas that passes the sealing component, the absorbing component including a second trench within the housing, the second trench being coupled to the interface and surrounding the internal cavity.

Thermal Device Clauses

1. A thermal device for controlling a temperature associated with a controlled component, comprising:
a thermal switch having an on-state and an off-state; and,
a heat sink, the thermal switch further including:
a first plate being composed from a thermally conductive material and being thermally coupled to the controlled component;
a second plate being composed from a thermally conductive material, the first and second plates being connected to form an internal cavity having a channel defining a gap between the first and second plate, the heat sink being coupled to the second plate;
a first reservoir coupled to the channel, the first reservoir containing a thermally conductive liquid; and,
an actuator coupled to the first reservoir and the channel, the actuator being moveable between a first state and a second state corresponding to the on-state and the off-state of the thermal switch, respectively, and being configured to allow the thermally conductive liquid to flow from the reservoir to the channel when the actuator is in the first state and to allow the thermally conductive liquid to flow from the channel to the first reservoir when the actuator is in the second state.

2. A thermal device, as set forth in clause 1, wherein the heat sink is an external heat sink fastened to an external surface of the second plate.

3. A thermal device, as set forth in clause 2, wherein the heat sink is air cooled.

4. A thermal device, as set forth in clause 2, wherein the heat sink is liquid cooled.

5. A thermal device, as set forth in clause 1, wherein the controlled component is a thermoelectric cooler connected an external surface of the first plate.

6. A thermal device, as set forth in clause 1, wherein the controlled component is a heat source.

7. A thermal device, as set forth in clause 6, wherein the controlled component is a heat pipe.

8. A thermal device, as set forth in clause 1, wherein the controlled component is a liquid-based thermal coupling device.

9. A thermal device, as set forth in clause 1, wherein the heat sink includes one or more cooling channels embedded in the second plate.

10. A thermal device, as set forth in clause 1, wherein the controlled component is a heat generating component.

11. A thermal device, as set forth in clause 1, further comprising a heating device coupled between the first plate and the controlled component.

12. A thermal device as set forth in clause 11, wherein the heating device is one of a film heater, a strip heater and a cast heater.

13. A thermal device, as set forth in clause 1, further comprising a first liquid based coupling device coupled to the first plate, wherein the heat sink includes a second liquid based coupling device coupled to the second plate, the first and second liquid based coupling devices and the thermal switch forming a variable liquid-liquid heat exchanger.

14. A thermal device, comprising:
a thermoelectric cooler;
a thermal switch having an on-state and an off-state; and,
a heat sink, the thermal switch further including:
a first plate being composed from a thermally conductive material and being thermally coupled to the thermoelectric cooler;
a second plate being composed from a thermally conductive material, the first and second plates being connected to form an internal cavity having a channel defining a gap between the first and second plate and being coupled to the heat sink;

a first reservoir coupled to the channel, the first reservoir containing a thermally conductive liquid; and, an actuator coupled to the first reservoir and the channel, the actuator being moveable between a first state and a second state corresponding to the on-state and the off-state of the thermal switch, respectively, and being configured to allow the thermally conductive liquid to flow from the reservoir to the channel when the actuator is in the first state and to allow the thermally conductive liquid to flow from the channel to the first reservoir when the actuator is in the second state.

15. A thermal device for controlling a temperature associated with a heat source, comprising:

a thermal switch having an on-state and an off-state; and, a plurality of cooling channels in the second plate acting as a heat sink, the thermal switch further including:

a first plate being composed from a thermally conductive material and being coupled to the heat source;

a second plate being composed from a thermally conductive material, the first and second plates being connected to form an internal cavity having a channel defining a gap between the first and second plate, the plurality of cooling channels being located within the second plate and acting as a heat sink;

a first reservoir coupled to the channel, the first reservoir containing a thermally conductive liquid;

an actuator coupled to the first reservoir and the channel, the actuator being moveable between a first state and a second state corresponding to the on-state and the off-state of the thermal switch, respectively, and being configured to allow the thermally conductive liquid to flow from the reservoir to the channel when the actuator is in the first state and to allow the thermally conductive liquid to flow from the channel to the first reservoir when the actuator is in the second state.

16. A thermal device for controlling a temperature associated with a workpiece, comprising:

a heating device coupled to the workpiece;

a thermal switch having an on-state and an off-state; and, a plurality of cooling channels, the thermal switch further including:

a first plate being composed from a thermally conductive material and being coupled to the heating device;

a second plate being composed from a thermally conductive material, the first and second plates being connected to form an internal cavity having a channel defining a gap between the first and second plate, the plurality of cooling channels being located within the second plate and acting as a heat sink;

a first reservoir coupled to the channel, the first reservoir containing a thermally conductive liquid;

an actuator coupled to the first reservoir and the channel, the actuator being moveable between a first state and a second state corresponding to the on-state and the off-state of the thermal switch, respectively, and being configured to allow the thermally conductive liquid to flow from the reservoir to the channel when the actuator is in the first state and to allow the thermally conductive liquid to flow from the channel to the first reservoir when the actuator is in the second state.

17. A thermal device, as set forth in clause 16, wherein the heating device is one of a film heater, a strip heater and a cast heater.

18. A thermal device, comprising:

a thermal switch having an on-state and an off-state; and, a first liquid-based thermal coupling device, the thermal switch further including:

a first plate being composed from a thermally conductive material and being thermally coupled to the first liquid-based thermal coupling device;

a second plate being composed from a thermally conductive material, the first and second plates being connected to form an internal cavity having a channel defining a gap between the first and second plate;

a first reservoir coupled to the channel, the first reservoir containing a thermally conductive liquid; and, an actuator coupled to the first reservoir and the channel, the actuator being moveable between a first state and a second state corresponding to the on-state and the off-state of the thermal switch, respectively, and being configured to allow the thermally conductive liquid to flow from the reservoir to the channel when the actuator is in the first state and to allow the thermally conductive liquid to flow from the channel to the first reservoir when the actuator is in the second state; and, a second liquid-based thermal coupling device coupled to the second plate, the first and second liquid-based thermal coupling devices and the thermal switch forming a variable liquid-liquid heat exchanger.

Thermal Device with Multiple Thermal Switch Clauses

1. A thermal device for controlling a temperature associated with a working surface, comprising:

a first plate being composed from a thermally conductive material;

a second plate being composed from a thermally conductive material, the first and second plates being connected to form first and second internal cavities, one of the first and second plates includes an outer surface that forms the working surface; and a thermal switch located in each internal cavity, each thermal switch having an on-state and an off-state, wherein at least one of the switches includes:

a channel in the respective internal cavity defining a gap between the first and second plates, a first reservoir coupled to the channel, the first reservoir containing a thermally conductive liquid, and, an actuator coupled to the first reservoir and the channel, the actuator being moveable between a first state and a second state corresponding to the on-state and the off-state of the thermal switch, respectively, and being configured to allow the thermally conductive liquid to flow from the reservoir to the channel when the actuator is in the first state and to allow the thermally conductive liquid to flow from the channel to the first reservoir when the actuator is in the second state.

2. A thermal device, as set forth in clause 1, further comprising a heating element embedded in the first plate.

3. A thermal switch, as set forth in clause 1, wherein the first reservoir and the channel of the at least one of the switches are part of a closed system, wherein the thermally conductive liquid is pushed into the channel from the first reservoir as the actuator is moved from the second state to the first state.

4. A thermal device, as set forth in clause 3, wherein the channel has a first end and a second end, the actuator being coupled to the first end of the channel, further comprising a second reservoir coupled to the second end of the channel, the second reservoir containing a gas.

5. A thermal device, as set forth in clause 4, wherein each switch further comprises a gas entry/exit point between the second reservoir and the channel, wherein a height of the entry/exit point is less than a height of the gap.

6. A thermal device, as set forth in clause 1, wherein the at least one of the switches further comprises a membrane positioned between the actuator and the channel and having a first position and a second position associated with the first and second states of the actuator, respectively, the membrane being moveable between the first and second positions in response to the actuator being switched from the first state to the second state.

7. A thermal device, as set forth in clause 6, wherein the first reservoir, the second reservoir and the channel form part of a closed system, wherein the thermally conductive liquid is pushed into the channel from the first reservoir as the membrane is moved from the second position to the first position.

8. A thermal device, as set forth in clause 7, wherein the thermally conductive liquid flows from the channel to the first reservoir and the gas in the second reservoir flows into the channel in response to the membrane being moved from the position to the second position.

9. A thermal device, as set forth in clause 1, wherein the thermally conductive liquid is a liquid metal.

10. A thermal device, as set forth in clause 1, wherein the at least one of the switches further comprises a dividing plate positioned between the first and second plates and configured to divide the channel into a plurality of conduction zones, each conduction zone having at least having at least one gas entry/exit point, each of the at least one gas entry/exit points configured to minimize entry of the thermally conductive liquid into the at least one gas entry/exit point.

11. A thermal device, as set forth in clause 1, wherein the at least one of the thermal switches is ring-shaped.

12. A thermal device, comprising:
a first plate being composed from a thermally conductive material;
a second plate being composed from a thermally conductive material, the first and second plates being connected by a plurality of fasteners to form first and second internal cavities, one of the first and second plates includes an outer surface that forms the working surface; and
a thermal switch located in each internal cavity, each thermal switch having an on-state and an off-state and first and second sides, at least one of the thermal switches including:
a post extending from an internal surface of the second side towards the first side, the post and the second side defining a trench;
a channel having a first end and a second end and being located between an internal surface of the first side and an upper surface of the post, the channel defining a gap between the first and second plates;
a first reservoir coupled to the first end of the channel and containing a thermally conductive liquid;
a second reservoir coupled to the second end of the channel and containing a gas;
an actuator coupled to the first reservoir and the first end of the channel; and
a membrane positioned between the actuator and the first end of the channel and being located within the trench, the membrane having a first position and a second position associated with the first and second states of the actuator, respectively, the membrane being moveable between the first and second positions in response to the actuator being switched from the first state to the second state, wherein the thermally conductive liquid is pushed into the gap from the first reservoir and the gas is pushed from the gap to the second reservoir as the membrane is moved from the second position to the first position, wherein the thermally conductive liquid flows from the gap to the first reservoir and the gas in the second reservoir flows into the gap in response to the membrane being moved from the first position to the second position.

13. A thermal device, as set forth in clause 12, further comprising a shim located between the first and second plates configured to provide thermal isolation therebetween.

14. A thermal device, as set forth in clause 12, wherein the fasteners are located partially in an outer wall of the second plate, the thermal device further comprising an oxygen seal located between the interior surface of the first plate and an upper surface of the outer wall and adjacent the fasteners opposite the outer wall.

15. A thermal device, comprising:
a first plate being composed from a thermally conductive material;
a second plate being composed from a thermally conductive material, the first and second plates being connected by a plurality of fasteners to form first and second internal cavities, one of the first and second plates includes an outer surface that forms the working surface;
a shim located between the first and second plates configured to provide thermal isolation therebetween;
an oxygen seal located between the interior surface of the first plate and an upper surface of an outer wall and adjacent the fasteners; and
a thermal switch located in each internal cavity, each thermal switch having an on-state and an off-state and first and second sides, at least one of the thermal switches including:
a post extending from an internal surface of the second side towards the first side, the post, outer wall and second side defining a trench;
a channel having a first end and a second end and being located between an internal surface of the first plate and an upper surface of the post, the channel defining a gap between the first and second plates;
a gas entry/exit point located between the interior surface of the first plate and an upper surface of the post, wherein a height of the gas entry/exit point is less than a height of the gap,
a first reservoir coupled to the first end of the channel and containing a thermally conductive liquid;
a second reservoir coupled to the second end of the channel and containing a gas;
a dividing plate positioned between the first and second plates and configured to divide the channel into a plurality of conduction zones;
an actuator coupled to the first reservoir and the first end of the channel, the actuator being located within the trench and surrounding the post;
a membrane positioned between the actuator and the first end of the channel and being located within the trench, the membrane having a first position and a second position associated with the first and second states of the actuator, respectively, the membrane being moveable between the first and second positions in response to the actuator being switched from the first state to the second state, wherein the thermally conductive liquid is pushed into the gap from the first reservoir as the membrane is moved from the second position to the first position, wherein the thermally conductive liquid flows from the gap to the first reservoir and the gas in the second reservoir flows into the gap in response to the membrane being moved from the first position to the second position.

16. A thermal device, as set forth in clause 15, wherein the trench extends around a periphery of the second plate and surrounds the post, wherein the actuator is located within the trench.

17. A thermal device, as set forth in clause 16, wherein the actuator includes an electric solenoid having a solenoid coil and a circular plunger, wherein the solenoid coil surrounds and is concentric with the post, the circular plunger being located adjacent, and being concentric with, the solenoid coil.

18. A thermal switch, as set forth in clause 16, wherein the actuator is a pneumatic actuator including a plunger, a bellows coupled to the plunger and to a source of pressurized air.

19. A thermal device having, comprising:
a first plate being composed from a thermally conductive material;
a second plate being composed from a thermally conductive material, the first and second plates being connected by a plurality of fasteners to form first and second internal cavities, one of the first and second plates includes an outer surface that forms the working surface, wherein the first side, the second side and the outer wall surround the internal cavities and form a housing, wherein the fasteners are located partially in the outer wall of the second plate;
a shim located between the first and second plates configured to provide thermal isolation therebetween;
an oxygen seal located between the interior surface of the first plate and an upper surface of the outer wall and adjacent the fasteners;
a thermal switch located in each internal cavity, each thermal switch having an on-state and an off-state and first and second sides, at least one of the thermal switches including:
a post extending from an internal surface of the second side towards the first side, the post, outer wall and second side defining a trench, the trench being located within a central area of the thermal switch, the post surrounding the trench;
a channel having a first end and a second end and being located between an internal surface of the first plate and an upper surface of the post, the channel defining a gap between the first and second plates;
a gas entry/exit point located between the interior surface of the first plate and an upper surface of the post, wherein a height of the gas entry/exit point is less than a height of the gap,
a first reservoir coupled to the first end of the channel and containing a thermally conductive liquid;
a second reservoir coupled to the second end of the channel and containing a gas;
a dividing plate positioned between the first and second plates and configured to divide the channel into a plurality of conduction zones;
an actuator coupled to the first reservoir and the first end of the channel, the actuator being located within the trench;
a membrane positioned between the actuator and the first end of the channel and being located within the trench, the membrane having a first position and a second position associated with the first and second states of the actuator, respectively, the membrane being moveable between the first and second positions in response to the actuator being switched from the first state to the second state, wherein the thermally conductive liquid is pushed into the gap from the first reservoir as the membrane is moved from the second position to the first position, wherein the thermally conductive liquid flows from the gap to the first reservoir and the gas in the second reservoir flows into the gap in response to the membrane being moved from the first position to the second position.

Thermal Switch with Pneumatic Actuator Clauses

1. A thermal switch, comprising:
a first plate being composed from a thermally conductive material;
a second plate being composed from a thermally conductive material, the first and second plates being connected to form an internal cavity having a channel defining a gap between the first and second plate;
a first reservoir coupled to the channel, the first reservoir containing a thermally conductive liquid; and,
a pneumatic actuator coupled to the first reservoir and the channel, the pneumatic actuator being moveable between a first state and a second state corresponding to the on-state and the off-state of the thermal switch, respectively, and being configured to allow the thermally conductive liquid to flow from the first reservoir to the channel when the pneumatic actuator is in the first state and to allow the thermally conductive liquid to flow from the channel to the first reservoir when the actuator is in the second state.

2. A thermal switch, as set forth in clause 1, wherein the pneumatic actuator includes a source of pressurized air, a bellows, and plunger, the source of pressurized air controllably coupled to the bellows, the plunger being coupled to the bellows and being moveable between first and second positions corresponding to the first and second states of the pneumatic actuators respectively.

3. A thermal switch, as set forth in clause 2, wherein the bellows acts on the plunger to move the plunger from the first position to the second plunger when pressurized air from the source of pressurized air is applied to the bellows.

4. A thermal switch, as set forth in clause 3, further comprising a return spring coupled to the bellows and being configured to move the plunger from the second position to the first position when the source of pressurized air is removed from the bellows.

5. A thermal switch, as set forth in clause 1, wherein the first reservoir and the channel form part of a closed system, wherein the thermally conductive liquid is pushed into the channel from the first reservoir as the pneumatic actuator is moved from the second state to the first state.

6. A thermal switch, as set forth in clause 1, wherein the channel has a first end and a second end, the pneumatic actuator being coupled to the first end of the channel, further comprising a second reservoir coupled to the second end of the channel, the second reservoir containing a gas.

7. A thermal switch, as set forth in clause 6, further comprising a gas entry/exit point between the second reservoir and the channel, wherein a height of the entry/exit point is less than a height of the gap.

8. A thermal switch, as set forth in clause 6, further comprising a membrane positioned between the pneumatic actuator and the channel and having a first position and a second position associated with the first and second states of the actuator, respectively, the membrane being moveable between the first and second positions in response to the pneumatic actuator being switched from the first state to the second state.

9. A thermal switch, as set forth in clause 8, wherein the first reservoir, the second reservoir and the channel form part of a closed system, wherein the thermally conductive liquid is pushed into the channel from the first reservoir as the membrane is moved from the second position to the first position.

10. A thermal switch, as set forth in clause 9, wherein the thermally conductive liquid flows from the channel to the first reservoir and the gas in the second reservoir flows into the channel in response to the membrane being moved from the position to the second position.

11. A thermal switch, as set forth in clause 1, wherein the gap defines at least one conduction zone within the channel.

12. A thermal switch, as set forth in clause 10, wherein the at least one conduction zone has a length of less than or equal to 0.5 inches.

13. A thermal switch, as set forth in clause 10, wherein the at least one conduction zone has a length of less than or equal to 0.2 inches.

14. A thermal switch, as set forth in clause 10, wherein the at least one conduction zone has a length of less than or equal to 0.1 inches.

15. A thermal switch, as set forth in clause 10, wherein the at least one conduction zone has a width of less than 1 inch.

16. A thermal switch, as set forth in clause 1, wherein the gap has a height of less than or equal to 0.2 inches.

17. A thermal switch, as set forth in clause 1, wherein the gap has a height of less than or equal to 0.1 inches.

18. A thermal switch, as set forth in clause 1, wherein the gap has a height of less than or equal to 0.02 inches.

19. A thermal switch as set forth in clause 1, further comprising a dividing plate positioned between the first and second plates and configured to divide the channel into a plurality of conduction zones, each conduction zone having at least one gas entry/exit point, each of the at least one gas entry/exit points configured to minimize entry of the thermally conductive liquid into the at least one gas entry/exit point.

20. A thermal switch, as set forth in clause 1, wherein the thermally conductive liquid is a liquid metal.

21. A thermal switch, comprising:
a first plate being composed from a thermally conductive material;
a second plate being composed from a thermally conductive material, the first and second plates being connected to form an internal cavity having a channel forming a gap between the first and second plates, the channel having a first end and a second end;
a dividing plate positioned between the first and second plates and being configured to divide the channel into a plurality of conduction zones, each conduction zone having at least one gas entry/exit point;
a first reservoir coupled to the first end of the channel, the first reservoir containing a liquid metal;
a second reservoir coupled to the channel, the second reservoir containing a gas;
a pneumatic actuator coupled to the first reservoir and the first end of the channel, the actuator being moveable between first and second states, the first reservoir, second reservoir and the channel forming part of a closed system; and,
a membrane positioned between the actuator and the channel and having a first position and a second position associated with the first and second states of the pneumatic actuator, respectively, the membrane being moveable between the first and second positions in response to the pneumatic actuator being switched from the first state to the second state, wherein the liquid metal is pushed into the conduction zones from the first reservoir as the membrane is moved from the second position to the first position, wherein the liquid metal flows from the conduction zones to the first reservoir and the gas in the second reservoir flows into the conduction zones in response to the membrane being moved from the first position to the second position.

Semiconductor Manufacturing/Testing Related Clauses

1. A process module, comprising:
a processing chamber for receiving a semiconductor wafer; and,
a thermal switch coupled to the processing chamber, the thermal switch including: a first plate being composed from a thermally conductive material;
a second plate being composed from a thermally conductive material, the first and second plates being connected to form an internal cavity having a channel defining a gap between the first and second plate;
a first reservoir coupled to the channel, the first reservoir containing a thermally conductive liquid; and,
an actuator coupled to the first reservoir and the channel, the actuator being moveable between a first state and a second state corresponding to the on-state and the off-state of the thermal switch, respectively, and being configured to allow the thermally conductive liquid to flow from the first reservoir to the channel when the actuator is in the first state and to allow the thermally conductive liquid to flow from the channel to the first reservoir when the actuator is in the second state.

2. A process module, as set forth in clause 1, wherein the semiconductor wafer is a silicon wafer.

3. A process module, as set forth in clause 1, wherein the temperature of the semiconductor wafer is controlled during a testing or manufacturing process.

4. A process module, as set forth clause 3, wherein the process module includes a heat source for heating the semiconductor wafer.

5. A process module, as set forth in clause 4, wherein the heat source is one or more of a plasma, radiant heater, heat pipe, film heater, strip heater, cast heater, hot gas or liquid, laser, exothermic chemical reaction and other suitable source.

6. A process module, as set forth in clause 4, wherein the thermal switch is configured as a cooling plate.

7. A process module, as set forth in clause 6, further comprising a heat sink coupled to the second plate.

8. A process module, as set forth in clause 7, wherein the heat sink includes one or more cooling channels.

9. A process module, as set forth in clause 7, wherein the heat sink is integrally formed in the second plate.

10. A process module, as set forth in clause 7, wherein the heat sink is thermally coupled to the second plate.

11. A process module, as set forth in clause 6, wherein the heat source is embedded within the first plate.

12. A process module, as set forth in clause 11, further including a top electrode assembly coupled to the first plate, wherein the thermal switch is thermally coupled to the top electrode assembly.

13. A process module, as set forth in clause 6, further comprising a ceramic plate coupled to the first plate.

14. A process module, as set forth in clause 13, wherein the heat source is embedded in the ceramic plate.

15. A process module, as set forth in clause 13, wherein the heat source is between the first plate and the ceramic plate.

16. An inductively coupled plasma process module, comprising:
a processing chamber for receiving a semiconductor wafer and having a vessel and a ceramic component, the vessel and the ceramic component forming an internal plasma cavity; and,
a retention device located within the internal plasma cavity and configured to support and/or hold the semiconductor wafer in place, the retention device including a retention device temperature control assembly having a thermal switch coupled to the processing chamber, the thermal switch including:
a first plate composed from a thermally conductive material;
a second plate being composed from a thermally conductive material, the first and second plates being connected to form an internal cavity having a channel defining a gap between the first and second plate;
a first reservoir coupled to the channel, the first reservoir containing a thermally conductive liquid; and,
an actuator coupled to the first reservoir and the channel, the actuator being moveable between a first state and a second state corresponding to the on-state and the off-state of the thermal switch, respectively, and being configured to allow the thermally conductive liquid to flow from the first reservoir to the channel when the actuator is in the first state and to allow the thermally conductive liquid to flow from the channel to the first reservoir when the actuator is in the second state.

17. An inductively coupled plasma process module, as set forth in clause 16, including a junction between the vessel and the ceramic component, wherein the thermal switch is coupled to the junction.

18. An inductively coupled plasma process module, as set forth in clause 16, wherein the retention device is an electrostatic chuck (ESC).

19. An inductively coupled plasma process module, as set forth in clause 16, wherein the retention device is a vacuum chuck.

20. An inductively coupled plasma process module, as set forth in clause 16, wherein the retention device includes a wafer support.

21. A capacitively coupled plasma process module, comprising:
a processing chamber having an internal plasma cavity and configured to receive a semiconductor wafer; and,
a top electrode located within the internal plasma cavity and having a top electrode temperature control assembly;
a retention device located within the internal plasma cavity and being configured to hold and/or support the semiconductor wafer in place, the retention device including a retention device temperature control assembly, at least one of the top electrode temperature control assembly and the retention device temperature control assembly including a thermal switch, each of the of the thermal switches including:
a first plate composed from a thermally conductive material;
a second plate being composed from a thermally conductive material, the first and second plates being connected to form an internal cavity having a channel defining a gap between the first and second plate;
a first reservoir coupled to the channel, the first reservoir containing a thermally conductive liquid; and,
an actuator coupled to the first reservoir and the channel, the actuator being moveable between a first state and a second state corresponding to the on-state and the off-state of the thermal switch, respectively, and being configured to allow the thermally conductive liquid to flow from the first reservoir to the channel when the actuator is in the first state and to allow the thermally conductive liquid to flow from the channel to the first reservoir when the actuator is in the second state.

Thermal Switch with Passive Actuator Clauses

1. A thermal switch having an on-state and an off-state, comprising:
a first plate being composed from a thermally conductive material;
a second plate being composed from a thermally conductive material, the first and second plates being connected to form an interior cavity having a channel defining a gap between the first and second plate;
a first reservoir coupled to the channel, the first reservoir containing a thermally conductive liquid;
an actuation reservoir containing an actuating material; and,
a membrane connected to the first and/or second plate and separating the first reservoir and actuating reservoir, the membrane being moveable between a first state and a second state corresponding to the on-state and the off-state of the thermal switch, respectively, wherein the actuating material expands when heated and expansion of the actuating material causes the membrane to move from the first state to the second state, wherein the thermally conductive liquid flows from the first reservoir to the channel when the actuator is in the first state and to the thermally conductive liquid flows from the channel to the first reservoir when the actuator is in the second state.

2. A thermal switch, as set forth in clause 1, wherein the channel has a first end and a second end, the first reservoir being coupled to the first end of the channel, further comprising a second reservoir coupled to the second end of the channel, the second reservoir containing a gas.

3. A thermal switch, as set forth in clause 2, further comprising a gas entry/exit point between the second reservoir and the channel, wherein a height of the entry/exit point is less than a height of the gap.

4. A thermal switch, as set forth in clause 1, wherein the thermally conductive liquid is a liquid metal.

5. A thermal switch, as set forth in clause 4, wherein the liquid metal is mercury.

6. A thermal switch, as set forth in clause 1, wherein the liquid metal is an alloy composed of gallium, indium and tin.

7. A thermal switch, as set forth in clause 1, wherein the actuating material is a hydrocarbon grease.

8. A thermal switch, as set forth in clause 1, wherein the actuating material is a paraffin wax.

9. A thermal switch, as set forth in clause 1, wherein the first and second plates form a housing, the thermal switch further including at least one oxygen seal located between the first and second plates.

10. A thermal switch, comprising:
a first plate being composed from a thermally conductive material;
a second plate being composed from a thermally conductive material, the first and second plates being connected to form an internal cavity having a channel forming a gap between the first and second plates, the channel having a first end and a second end;
a dividing plate positioned between the first and second plates and being configured to divide the channel into a plurality of conduction zones, each conduction zone having at least one gas entry/exit point;

a first reservoir coupled to the first end of the channel, the first reservoir containing a liquid metal;

a second reservoir coupled to the channel, the second reservoir containing a gas;

a passive actuator coupled to the first reservoir and the first end of the channel, the passive actuator being moveable between first and second states, the first reservoir, second reservoir and the channel forming part of a closed system; and, a membrane positioned between the actuator and the channel and having a first position and a second position associated with the first and second states of the passive actuator, respectively, the membrane being moveable between the first and second positions in response to the passive actuator being switched from the first state to the second state, wherein the liquid metal is pushed into the conduction zones from the first reservoir as the membrane is moved from the second position to the first position, wherein the liquid metal flows from the conduction zones to the first reservoir and the gas in the second reservoir flows into the conduction zones in response to the membrane being moved from the first position to the second position.

11. A thermal switch, as set forth in clause 10, wherein the liquid metal is mercury.

12. A thermal switch, as set forth in clause 10, wherein the liquid metal is an alloy composed of gallium, indium and tin.

13. A thermal switch, as set forth in clause 12, wherein the alloy is 68.5% gallium, 21.5% indium and 10% tin.

14. A thermal switch, as set forth in clause 10, wherein a height of the entry/exit point is less than a height of the gap.

15. A thermal switch, as set forth in clause 10, wherein the passive actuator includes an actuation reservoir containing an actuating material.

16. A thermal switch, as set forth in clause 10, wherein the membrane separates the first reservoir and actuating reservoir.

17. A thermal switch, as set forth in clause 10, wherein the passive actuator includes a bimetallic element.

18. A thermal switch, as set forth in clause 10, wherein the passive actuator is composed from a shape memory alloy.

19. A thermal switch, as set forth in clause 10, wherein the passive actuator is composed from a phase changing material.

20. A thermal switch, as set forth in clause 19, wherein the phase changing material is a melting wax.

BRIEF DESCRIPTION OF THE DRAWINGS

Other advantages of the present invention will be readily appreciated as the same becomes better understood by reference to the following detailed description when considered in connection with the accompanying drawings.

FIG. 7E-1 is a partial perspective view of a second plate of the seal of FIG. 7E.

FIG. 7H is a partial cross-sectional view of a seal, according to a seventh embodiment of.

FIG. 16B is a first enlarged view of a thermal switch of the top electrode temperature control assembly of FIG. 16A;

DETAILED DESCRIPTION OF INVENTION

Figure 1:
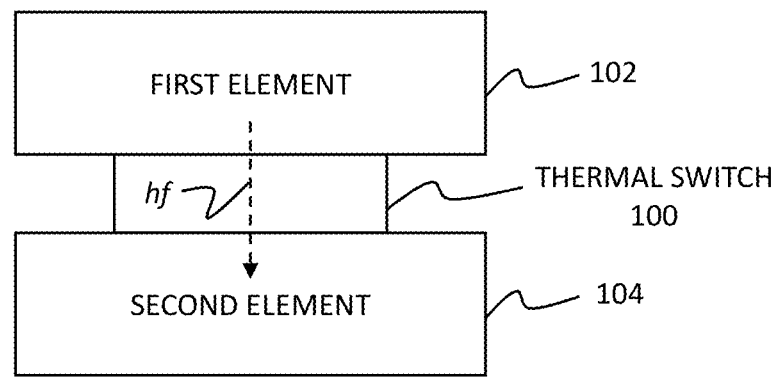
FIG. 1 is a first environmental view of a thermal switch, according to an embodiment of the present invention.

Referring to the Figures, wherein like numerals indicate like or corresponding parts throughout the several views, a thermal switch or liquid metal switch 100 is utilized to control the thermal flux (or heat flux) between a first element 102 and a second element 104. Generally, thermal flux (also referred to as heat flux, heat flux density, heat-flow density or heat flow rate intensity) is a flow of energy per unit of area per unit of time, e.g., watts per square meter. Thermal flux has both a direction and a magnitude, and so it is a vector quantity. In the illustration of FIG. 1, the first element 102 will have a higher temperature than the second element 104 and the thermal switch 100 will be utilized to control the thermal flux from the first element 102 to the second element 104 as indicated by arrow, hf. The thermal switch 100 may be passively actuated, as shown in FIG. 1.

Figure 2:
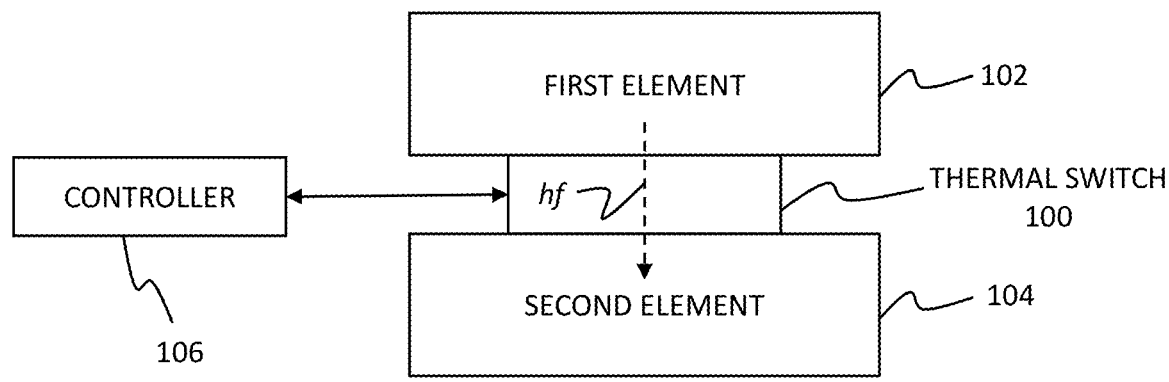
FIG. 2 is a second environmental view of a thermal switch, according to an embodiment of the present invention.

With reference to FIG. 2, the thermal switch 100 may require active actuation. As shown, a controller 106 may be used to control the thermal switch 100, and thus, the heat flux between the first and second elements 102, 104. The controller 106 may be used for many different purposes, including but not limited to, controlling a temperature of the first and/or second elements 102,104. For example, the first element 102 may be a workpiece and the controller 106 may be used to control a temperature of the workpiece 102 during a manufacturing process to a specific or desired temperature or thermal profile. The thermal switch 100 of the present invention may be scaled to work with workpiece(s) 102 of different sizes as discussed or shown in more detail below. The controller 106 may be configured to specifically control the thermal switch 100, or as part of a control system (not shown) that is configured to control a larger system, e.g., a manufacturing process, including control of the thermal switch 100.

The thermal switch 100 may be controlled passively (see below) or may be controlled electronically or pneumatically, and thus, the controller 106 may be configured to deliver appropriate signals to the thermal switch 100 (see below) based on the desired temperature or thermal profile.

First Embodiment

With reference to FIGS. 3A-3J, a thermal switch 100 according to a first embodiment is shown. In the illustrated embodiment, the thermal switch 100 includes a first plate 108, a second plate 110, a first reservoir 124, and an actuator 128. The actuator 128 may be an active actuator or a passive actuator. In general, an active actuator changes state in response to a control signal. Examples of active actuators include, but are not limited to, electric solenoids, pneumatic actuators, electric motors, piezoelectric actuators, MEMs actuators, electrostatic actuators and the like. In general, passive actuators change state based on an intrinsic thermal response of the actuator. Examples of passive actuators include, but are not limited to, actuators based on thermal expansion such as fluid in a piston or bellows, bimetallic elements, shape memory alloys and phase changing materials (such as melting wax in a piston). Passive actuators will generally have a fixed response (set at the time of assembly), whereas active actuators have greater versatility. Various active and passive actuators are discussed in further detail below.

The first plate 108 is composed from a thermally conductive material, such as aluminum. In use, the first element 102 is thermally coupled to the first plate 108. For example, the first plate 108 may include a number of threaded apertures (see below) and the first element 102 may be bolted or otherwise fastened to the first plate 108. It should be noted that the first element 102 may be otherwise thermally coupled to the first plate 108 including but not limited to via a thermally conductive interface or material, for example, thermal grease or other suitable means.

The second plate 110 is composed from a thermally conductive material, such as aluminum. In use the second element 104 is thermally coupled to the second plate 110. For example, the second plate 110 may include a number of (threaded) apertures (see below) and the second element 104 may be bolted or otherwise fastened to the second plate 110. It should be noted that the second element 104 may be otherwise thermally coupled to the second plate 110 including but not limited to via a thermally conductive interface or material, for example, thermal grease or other suitable means.

Figure 3A:
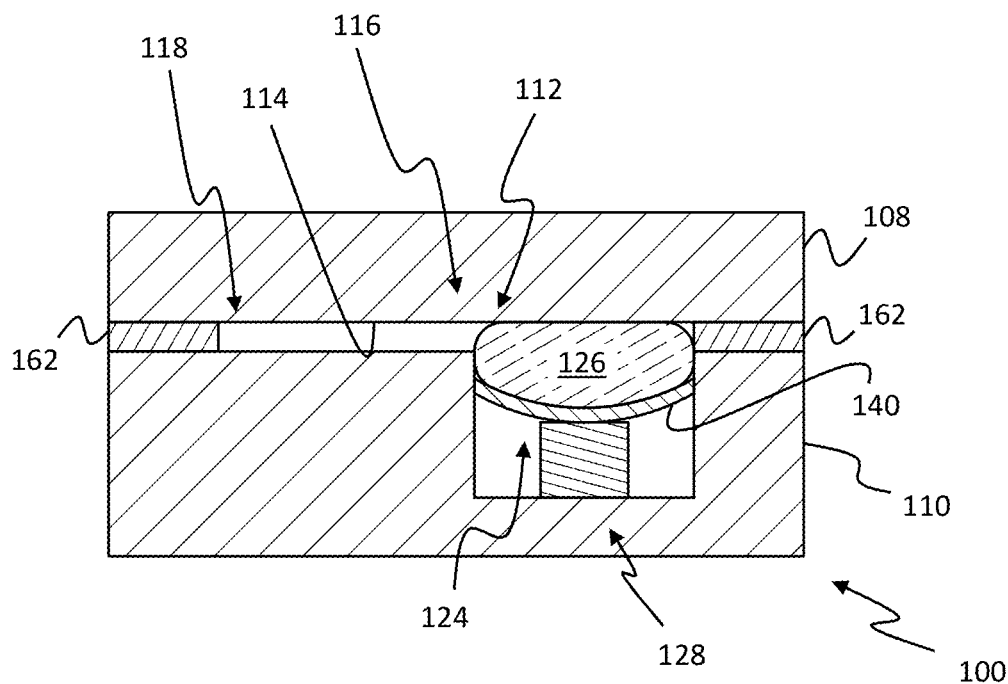
FIG. 3A is a diagrammatic illustration of a thermal switch in an off-state and having first and second plates, a first reservoir and actuator, according to a first embodiment of the present invention.
Figure 3B:
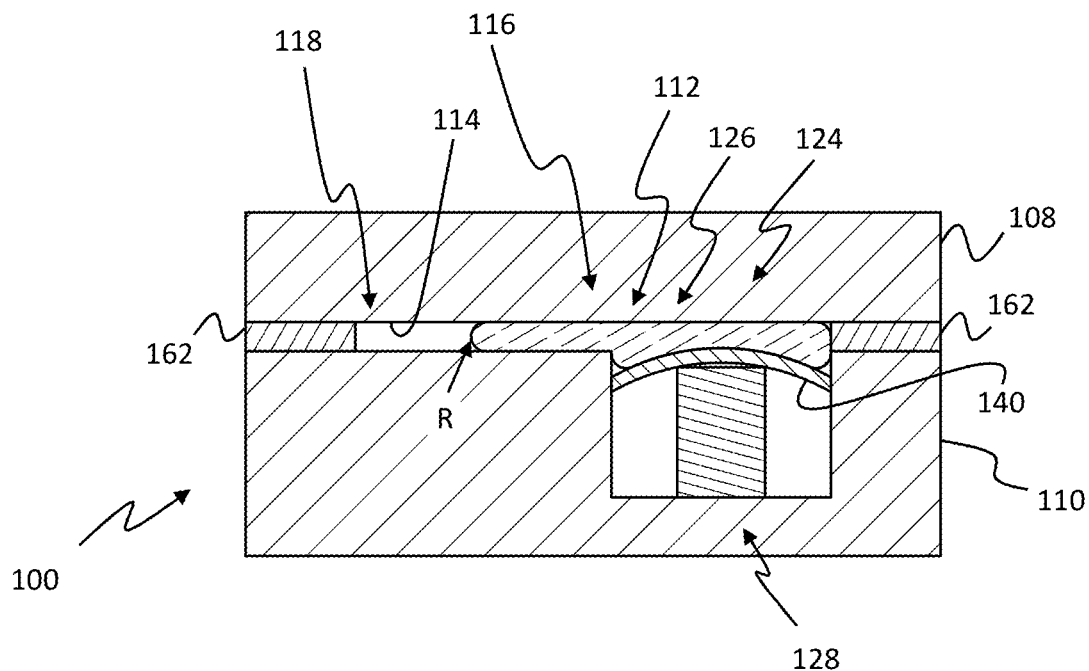
FIG. 3B is a diagrammatic illustration of the thermal switch of FIG. 3A in an on-state.

As explained in more depth below, the thermal switch 100 has an off-state, as shown in FIG. 3A, and an on-state, as shown in FIG. 3B. Generally, the first and second plates 108, 110 are thermally isolated when the thermal switch 100 is in the off-state and the first and second plates 108, 110 are thermally coupled allowing the flow of heat flux therebetween when the thermal switch 100 is in the on-state. It should be noted, that the thermal switch 100 may have a full on-state, i.e., given the thermal properties and current parameters, e.g., temperature, of the thermal switch 100 and the first and second elements 102, 104, a maximum amount of heat flux passes through the thermal switch 100. However, the thermal switch 100 may have an infinite number of on-states in between the off-state and the full on-state in which a variable amount of heat flux passes through the thermal switch 100.

The first and second plates 108, 110 are connected to form an internal cavity 112. The internal cavity 112 has a channel 114 that defines a gap 120 between the first and second plates 108, 110.

The first reservoir 124 is coupled to the channel 114 and contains a thermally conductive liquid 126, for example, a liquid metal. In one embodiment of the present invention, the liquid metal is mercury. In another embodiment of the present invention, the liquid metal is a eutectic alloy, i.e., a mixture of metals having a melting point lower than that of any of its components. For example, the liquid metal may be an alloy composed of gallium, indium and tin. In a specific embodiment, the liquid metal is an alloy composed of 68.5% gallium, 21.5% indium and 10% tin. In another specific embodiment, the liquid metal is an alloy composed of 61% gallium, 25% indium, 13% tin and 1% zinc. However, it should be noted that other thermally conductive liquid mays be used without departing from the spirit of the invention.

It should be noted that such alloys, i.e., that include gallium, may be corrosive to certain types of metals, including aluminum. Thus, any components of the thermal switch 100 that may be exposed to, or come in contact, with the thermally conductive liquid may have to be comprised of a material to which the thermal liquid is non-corrosive or be coated with a protective material, such as a polymer or ceramic material. In one embodiment, the internal surfaces of aluminum components in contact with the alloy of gallium are protected by a vapor deposited titanium nitride coating.

The actuator 128 is coupled to the first reservoir 124 and the channel 114. The actuator is moveable between a first state (shown in FIG. 3B and a second state (shown in FIG. 3A) corresponding to the on-state and the off-state of the thermal switch, respectively. As discussed in more detail below, the actuator 128 is configured to allow the thermally conductive liquid 126 to flow from the first reservoir 124 to the channel 114 when the actuator 128 is in the first state and to allow the thermally conductive liquid 126 to flow from the channel 114 to the first reservoir 124 when the actuator 128 is in the second state.

The channel 114 has a first end 116 and a second end 118. In one aspect of the present invention, the gap 120 may be divided into one or more conduction zones (see below). In the first embodiment, shown in FIGS. 3A-3J, the gap 120 of the first embodiment has a single conduction zone. In the illustrated embodiment, a shim 162 may be located at the second end 118 of the channel 114. The shim 162 may be composed of a plastic material with a low coefficient of friction to allow relative movement between the first and second plates 108, 110.

As shown in FIG. 3A, when the thermal switch 100 is in the off-state, the thermally conductive liquid 126 is contained within the first reservoir 124. When the thermal switch 100 is in the off-state and the actuator 128 is in the second state, and the gap 120 is essentially clear of the thermally conduction liquid 126. Thus, there is minimal heat flux between the first and second plates 108, 110 through the gap 120. In other words, the first and second plates 108, 110 are thermally isolated.

Figure 3C:
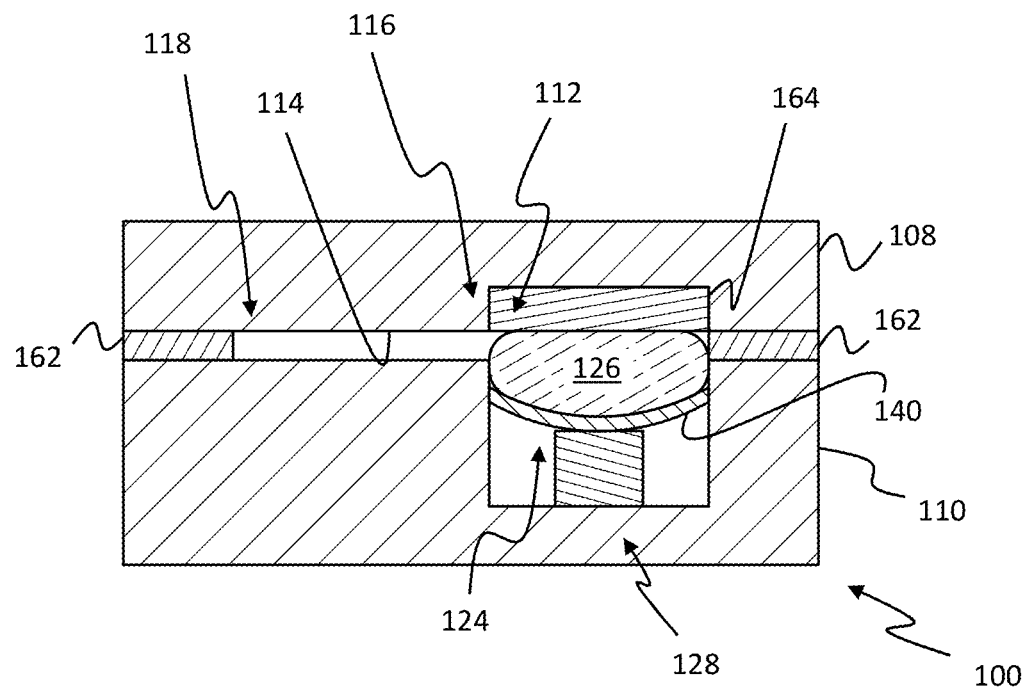
FIG. 3C is a diagrammatic illustration of the thermal switch, in an off-state, of FIG. 3A including an insulator between the first reservoir and the first plate.
Figure 3D:
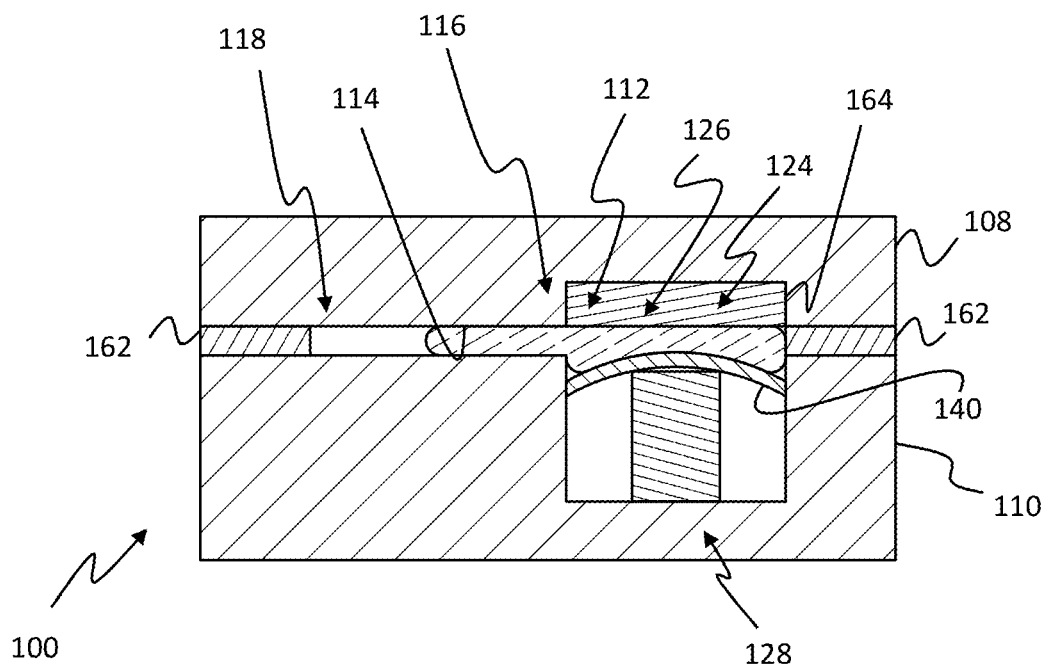
FIG. 3D is a diagrammatic illustration of the thermal switch, in an on-state, of FIG. 3C.

As shown in FIGS. 3C-3D, a layer of thermally insulating material or insulator 164 may be placed between the first reservoir 124 and the first plate 108 to prevent or minimize a path for heat flux therethrough.

As shown in FIG. 3B, when the thermal switch 100 is in the on-state, the gap 120 is at least partially filled with the thermally conductive liquid 126. Due to the thermal properties of the thermally conductive liquid 126, energy, in the form of heat, is transferred from the first plate 108 to the second plate 110. In other words, the first and second plates 108, 110 are thermally coupled via the thermally conductive liquid 126 when the thermal switch 100 is in the on-state.

In the illustrated embodiment, the first reservoir 124 and the channel 114 are part of a closed system. As the actuator 128 is moved from the second state to the first state, the thermally conductive liquid 126 is pushed into the channel 114 from the first reservoir 124.

As stated above, after the actuator 128 is moved from the first state to the second state, the thermal switch 100 is in the off-state. In one embodiment, the gap 120 is configured such that the thermally conductive liquid 126 flows from the channel 114 to the first reservoir 124 at least in part by surface tension in the thermally conductive liquid 126. In another words, other forces may also be acting on the thermally conductive liquid 126. In another embodiment, the gap 120 is configured such that the thermally conductive liquid 126 flows from the channel 114 to the first reservoir 124 primarily as a result of surface tension in the thermally conductive liquid 126.

Surface tension is the tendency of fluid surfaces to shrink into the minimum surface area possible. At liquid-gas interfaces, surface tension results from the greater attraction of liquid molecules to each other than to the molecules in the gas. The net effect is an inward force at the surface that causes the liquid to behave as if its surface were covered with a stretched elastic membrane.

In the disclosed embodiments of the present invention, surface tension will act to force the thermally conductive liquid out of the gap 120. For the thermally conductive liquid to enter the gap 120, the radius of curvature (indicated by R in FIG. 3B) must be less than or equal to half the gap height. The pressure, P, required for the liquid to assume this curvature may be calculated with the Young-Laplace equation:

$P=2\gamma/h$, where $\gamma$ is the surface tension of the liquid and $h$ is the gap height.

If the liquid pressure drops below this value (as when the actuator is moved from the first position to the second position), a net force of surface tension will act to pull, or assist in pulling, the liquid from the gap 120.

The actuator 128 is coupled to the first end 116 of the channel 114. As shown in FIGS. 3E-3J, the thermal switch 100 may include a second reservoir 136 coupled to the second end 118 of the channel 114. In the simplest embodiment, the second reservoir 136 is a portion of the second end 118 of the channel 114. The second reservoir 136 may be filled with a gas. In one aspect of the present invention, any gas or gas mixture free of oxygen may be used to avoid oxidation of the thermally conductive liquid 126. Suitable gases are nitrogen or argon, or mixtures containing nitrogen and/or argon.

As shown, in the illustrated embodiment, the thermal switch 100 may further comprise a membrane or diaphragm 140 positioned between the actuator 128 and the channel 114. The membrane 140 has a first position and a second position associated with the first and second states of the actuator 128, respectively. The membrane 140 is moved between the first and second positions in response to the actuator 128 being switched from the first state to the second state. The first reservoir 124, the second reservoir 136 and the channel 114 are part of a closed system. It should be noted, that in some embodiments, the gas may be distributed to other parts of the internal cavity 112, i.e., outside of the second reservoir 136 and the channel 114. As the actuator 128 is moved from the second state to the first state, the membrane 140 is moved from the second position to the first position and the thermally conductive liquid 126 is pushed into the channel 114 from the first reservoir 124. The membrane 140 may be composed from a suitable flexible material, including, but not limited to, silicone, other elastomers, and metal.

As the actuator 128 is moved from the first state to the second state, the membrane 140 is moved from the first position to the second position and the thermally conductive liquid 126 flows from the channel 114 to the first reservoir 124 and gas 138 in the second reservoir 136 flows into the channel 114.

In the embodiments shown in FIGS. 3E-3L, the second reservoir 136 is separate from the channel 114. In the illustrated embodiment, the gap 120 (or conduction zone) has a length of $l_{cz}$ and a height of $h_{cz}$. In one embodiment, the length, $l_{cz}$, of each conduction zone 122 is less than or equal to 0.5 inches. In another embodiment, the length, $l_{cz}$, of each conduction zone 122 is less than or equal to 0.2 inches. In still another embodiment, the length, $l_{cz}$, of each conduction zone 122 is less than or equal to 0.1 inches.

In one embodiment, the height, $h_{cz}$, of each conduction zone 122 is less than or equal to 0.2 inches. In another embodiment, the height, $h_{cz}$, of each conduction zone 122 is less than or equal to 0.1 inches. In still another embodiment, the height, $h_{cz}$, of each conduction zone 122 is less than or equal to 0.02 inches.

As shown, in these embodiments the thermal switch 100 includes a gas entry/exit point 144 between the second reservoir 136 and the channel 114. The gas entry/exit point 144 configured to minimize entry of the thermally conductive liquid 126 into the at least one gas entry/exit point, and thus, the second reservoir 136. For example, in one embodiment, a height of the entry/exit point 144 ($h_{gas\_gap}$) is less than a height of the gap ($h_{cz}$). As mentioned above, the pressure required to force the thermally conductive liquid 126 into a gap is inversely proportional to the height of the gap. Thus, minimizing the gap height of the gas entry/exit point may prevent the thermally conductive liquid from entering the gas gap 166. As explained in more detail below, the presence of the second reservoir 136 allows the liquid metal to flow further into the channel 114 without causing a significant increase in gas pressure within the channel 114. In these embodiments, the gas pressure in the channel 114 may not provide a significant contribution to flow of the thermally conductive liquid 126 from the gap 120 to the first reservoir 124 when the actuator 128 moves from the first position to the second position. Rather, the presence of the second reservoir 136 reduces the increase in gas pressure when the thermally conductive liquid 126 flows into the channel 114 to minimize the actuating force required.

Figure 3E:
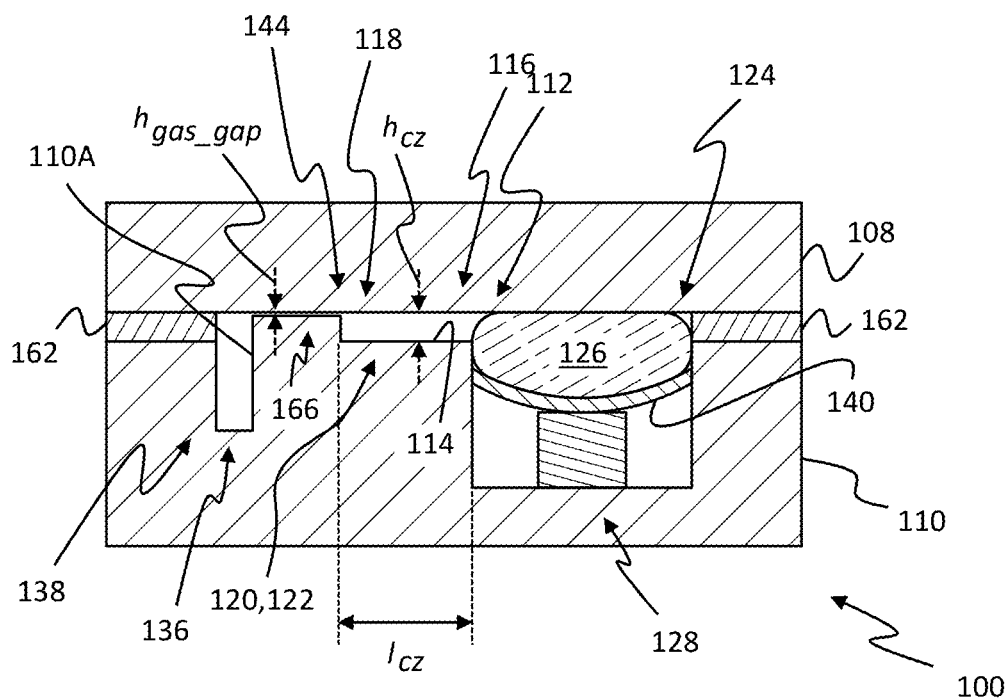
FIG. 3E is a diagrammatic illustration of the thermal switch, in an off-state, of FIG. 3A including a separate second reservoir and a gas gap, according an embodiment of the present invention.
Figure 3F:
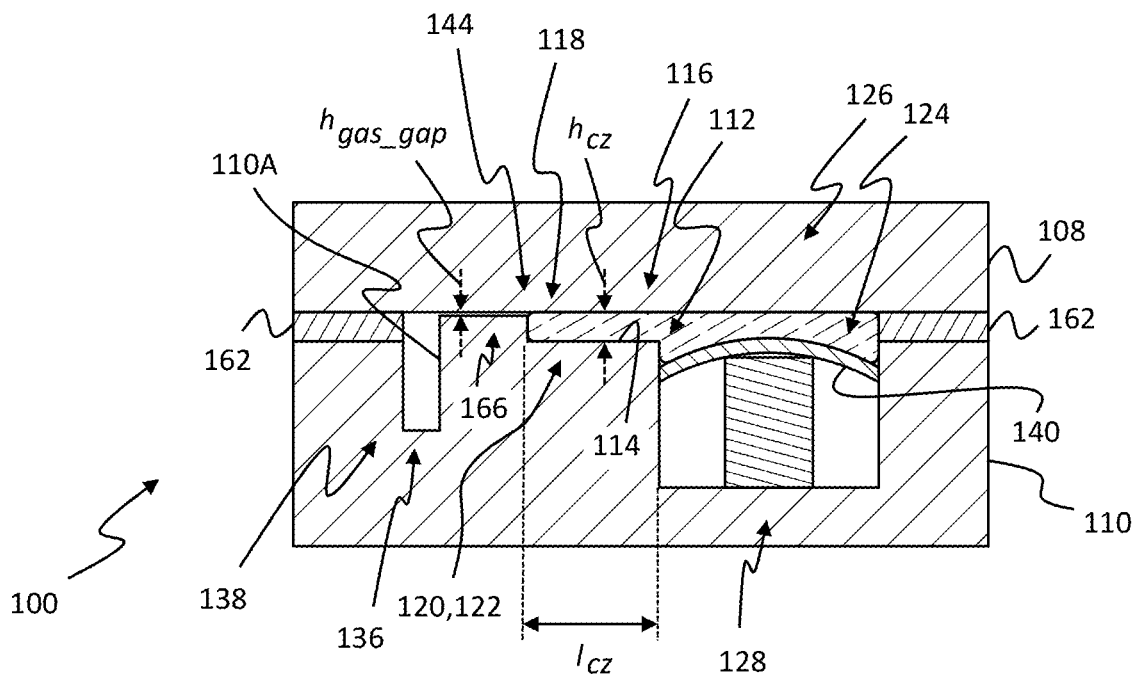
FIG. 3F is a diagrammatic illustration of the thermal switch of FIG. 3E in an on-state.

In one embodiment, shown in FIGS. 3E-3F, the second plate 110 includes a step 110A. In the illustrated embodiment, the gas gap 166 is formed between an upper surface of the step 110A and the lower surface of the first plate 108.

Figure 3G:
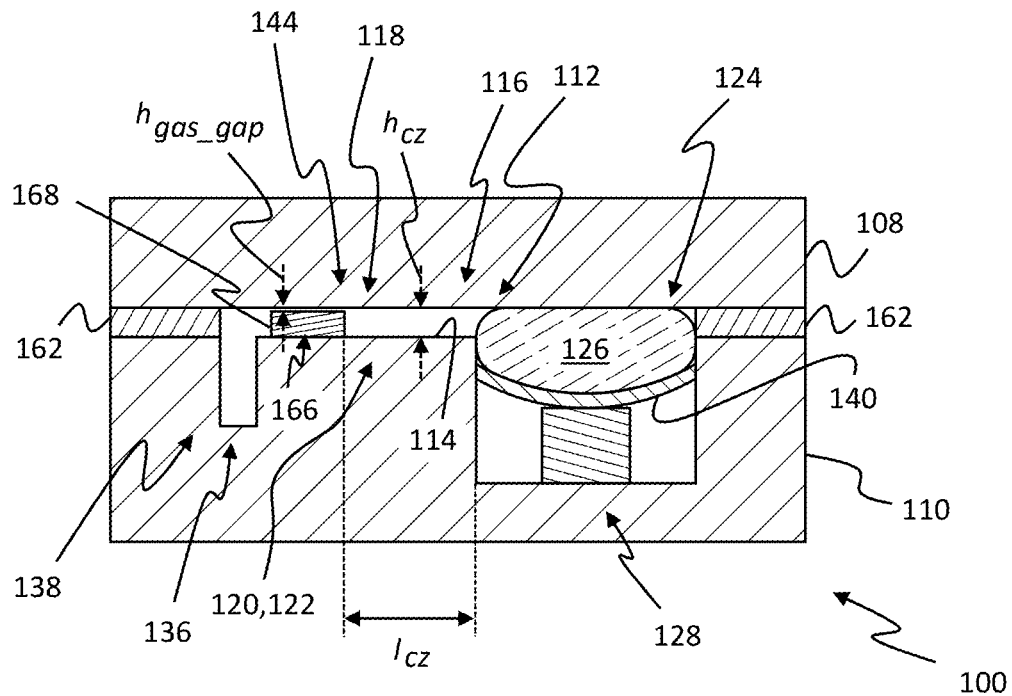
FIG. 3G is a diagrammatic illustration of the thermal switch, in an off-state, of FIG. 3A including a separate second reservoir and a gas gap, according to another embodiment of the present invention.
Figure 3H:
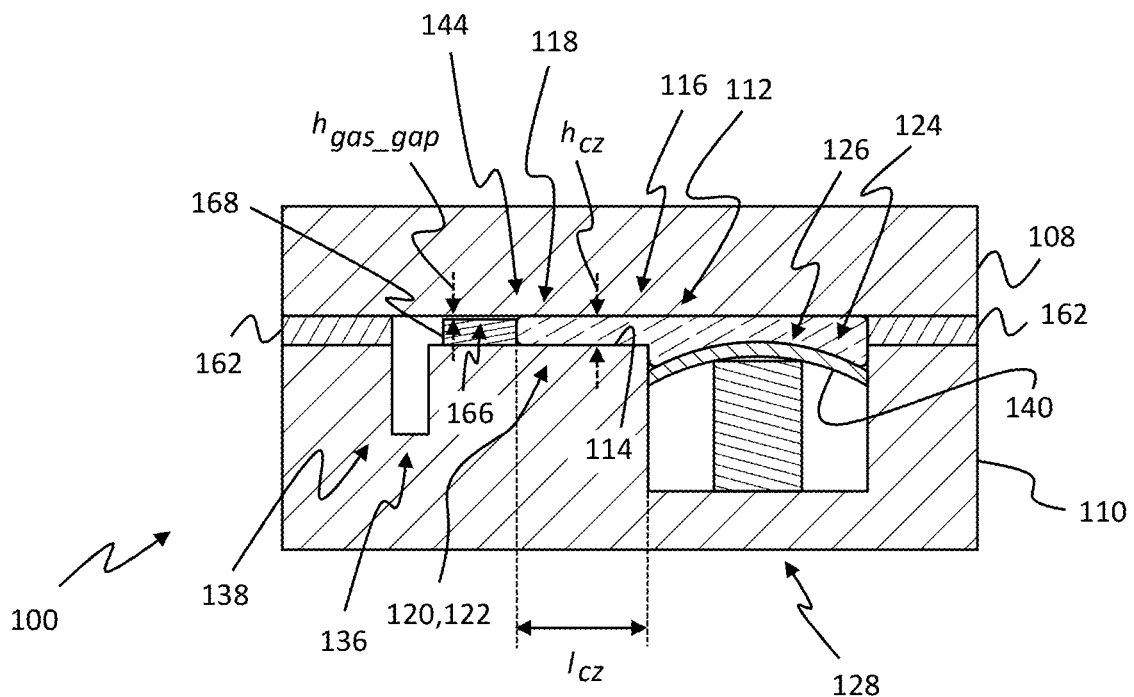
FIG. 3H is a diagrammatic illustration of the thermal switch of FIG. 3G in an on-state.

In another embodiment, shown in FIGS. 3G-3H, the gas gap 166 is formed by a gas gap (or dividing) plate 168. In the illustrated embodiment, the gas gap plate 168 is fixedly coupled to the second plate 110 but may alternatively be fixedly coupled to the first plate 108. The gas gap 166 is defined by a surface of the gas gap plate 168 and the surface of the first plate 108 (or in the alternate embodiment, the surface of the second plate 110). In one aspect of the present invention, the gas gap plate 168 may be composed from a plastic. It should be noted that the gas gap plate 168 in FIGS. 3G-3H, serves a function similar to the step 110A in FIGS. 3E-3F. In some embodiments, features or components that could be formed as part of the first or second plates 108, 110 may be replaced with a separate component formed from a plastic. This has several benefits. First, the plastic component does not have to be coated to protect it from corrosion from the thermally conductive liquid 126. Second, certain features which are located within the component, such as grooves, are more easily formed or machined in the plastic as compared with aluminum.

Figure 3I:
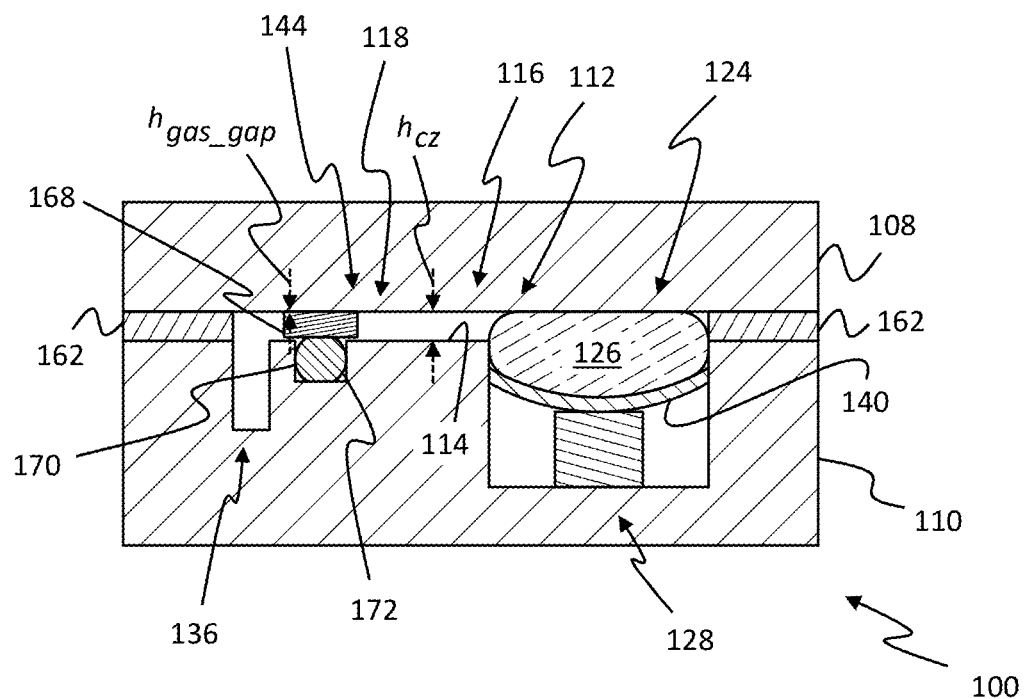
FIG. 3I is a diagrammatic illustration of the thermal switch, in an off-state, of FIG. 3A including a separate second reservoir and a gas gap, according to still another embodiment of the present invention.
Figure 3J:
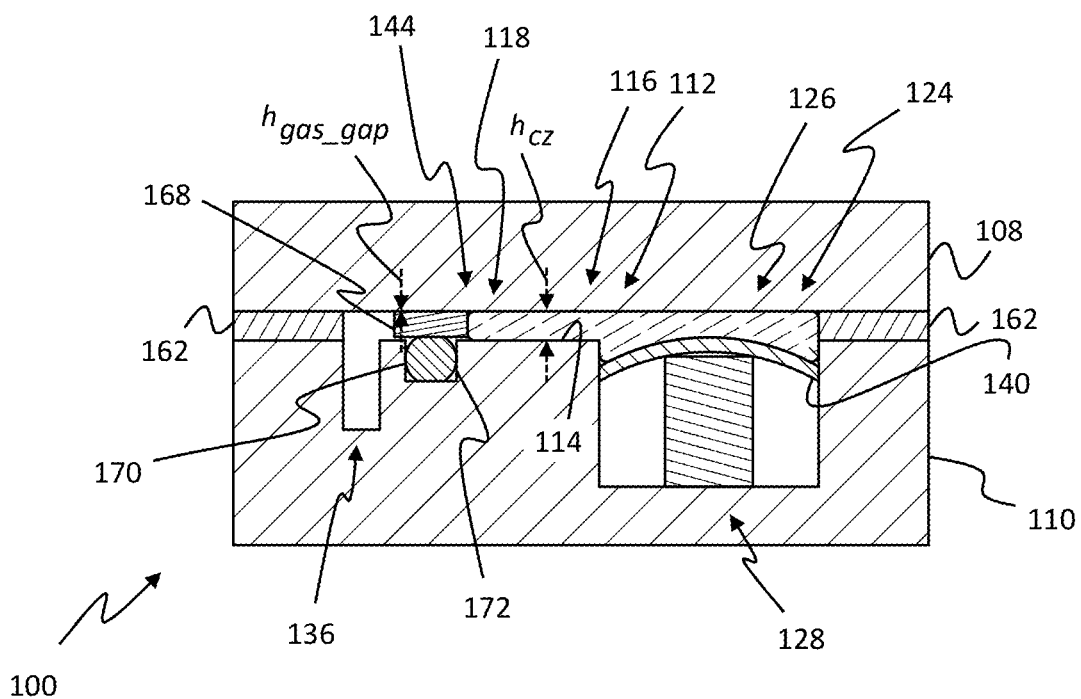
FIG. 3J is a diagrammatic illustration of the thermal switch of FIG. 3I in an on-state.

In still another embodiment, shown in FIGS. 3I-3J, the gas gap 166 is formed by a gas gap plate 168 and an elastomer biasing member 170. In the illustrated embodiment, the elastomer biasing member 170 is located within a trench 172 in the second plate 110. The elastomer biasing member 170 presses the gas gap plate 168 against the surface of the first plate 108. The seal created between the gas gap plate 168 and the first plate 108 is not airtight. This arrangement creates the smallest possible gas gap 166, i.e., the smallest gas gap height, $h_{gas\_gap}$, and thus, minimizes the risk of the thermally conductive liquid 126 entering the gas gap 166. In an alternative embodiment, grooves may be added to the top surface of the gas gap plate 168.

Figure 3K:
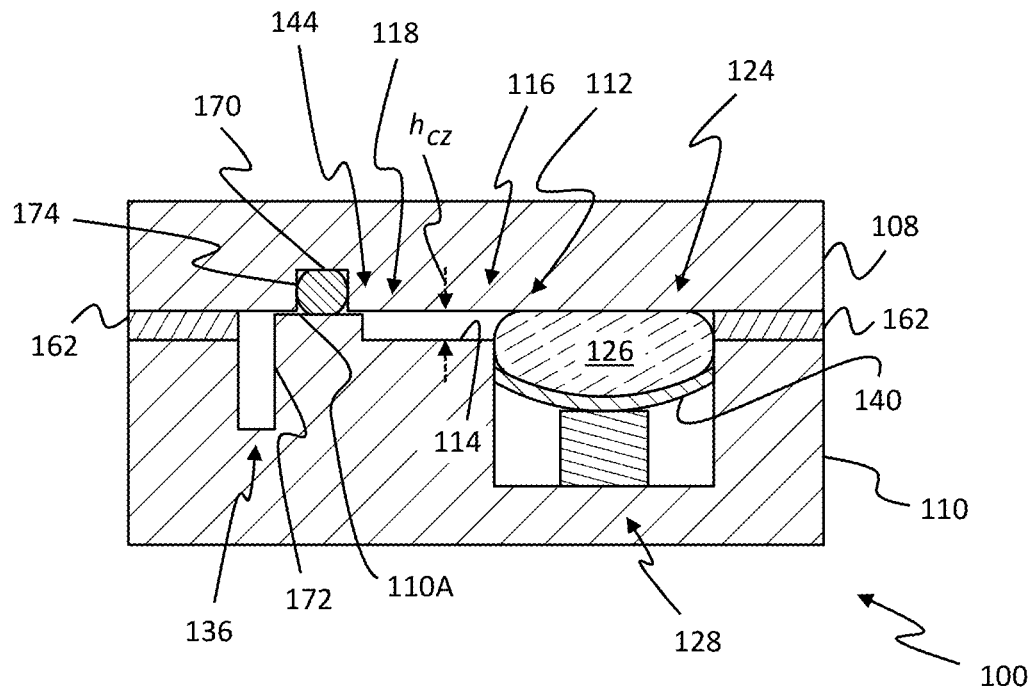
FIG. 3K is a diagrammatic illustration of the thermal switch, in an off-state, of FIG. 3A including a separate second reservoir and a gas gap, according to one more embodiment of the present invention.

In one more embodiment, shown in FIG. 3K, the gas gap 166 may be formed by shallow grooves (not shown) formed in a top surface of the step 110A in the second plate 110. The elastomer biasing member 170, located in a trench 174 in the first plate 108, helps seal the top of the grooves leaving a small gas gap 166. The shallow grooves may be machined in the top surface of the step 110A, e.g., by a laser or other means.

Figure 3L:
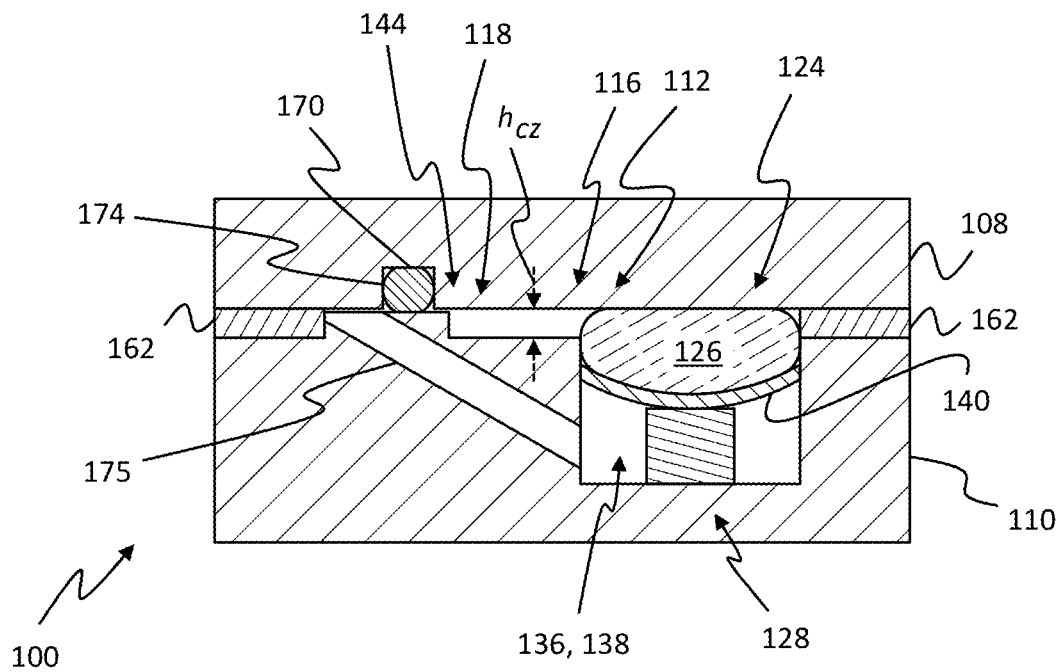
FIG. 3L is a diagrammatic illustration of the thermal switch, in an off-state, of FIG. 3A including an alternative second reservoir.

With reference to FIG. 3L, the second reservoir 136 is located around and/or adjacent the actuator 128. A gas channel 175 through the second plate 110 connects the second reservoir 136 to second end 118 of the channel 114.

In another embodiment, the gap 120 may have at least one sloped surface. In the prior embodiments, the gap 120 was of constant height. Consequently, the radius of curvature (and thus the force of surface tension) remains constant as the thermally conductive liquid 126 advances into the gap 120. When one or both of the surfaces of the gap 120 are sloped, the height of the gap 120 and the radius of curvature decreases as the thermally conductive liquid 126 advances into the gap 120. In the illustrated embodiment of FIGS. 3M-3O, a lower surface 120A of the gap 120 is sloped such that the height of the gap 120 decreases from the first end 116 of the channel 114 towards the second end 118 of the channel. Thus, the radius of curvature decreases as the thermally conductive liquid 126 advances within the gap 120. For example, the radius of curvature of the thermally conductive liquid in FIG. 3O (R2) is less than the radius of curvature of the thermally conductive liquid in FIG. 3N (R1), and consequently the force of surface tension pulling the thermally conductive liquid 126 from the gap 120 is higher. A gap configuration in which the height of the gap 120 decreases is useful in embodiments where it is desirable to minimize the risk of the thermally conductive liquid 126 remaining within the gap 120 in the off-state (see below).

Figure 3M:
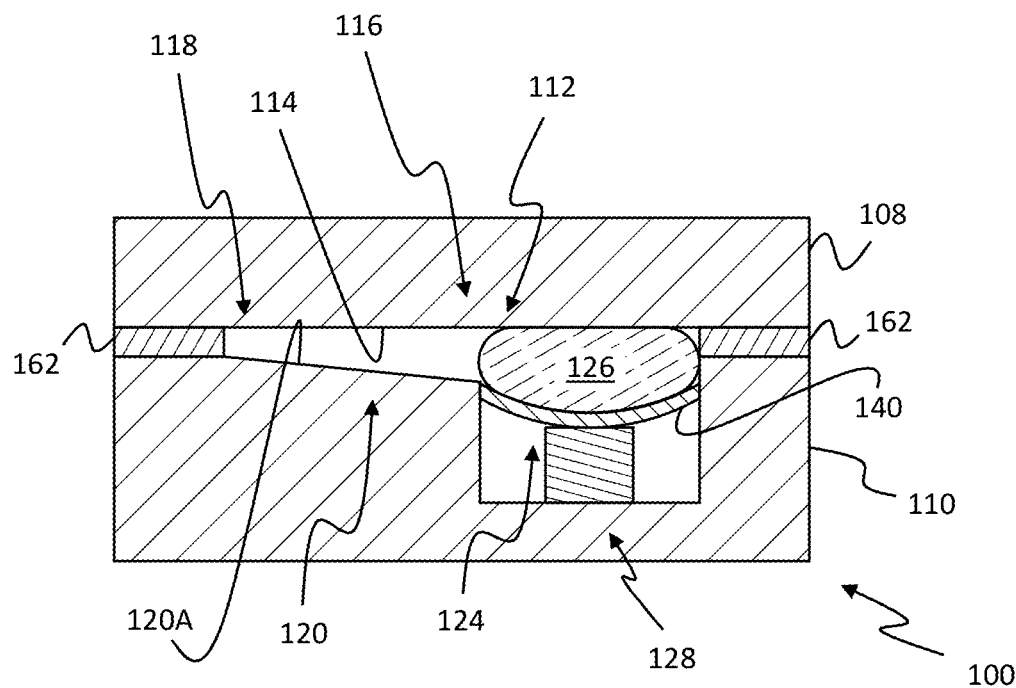
FIG. 3M is a diagrammatic illustration of a thermal switch having a sloped channel, in an off-state, according to an embodiment of the present invention.
Figure 3N:
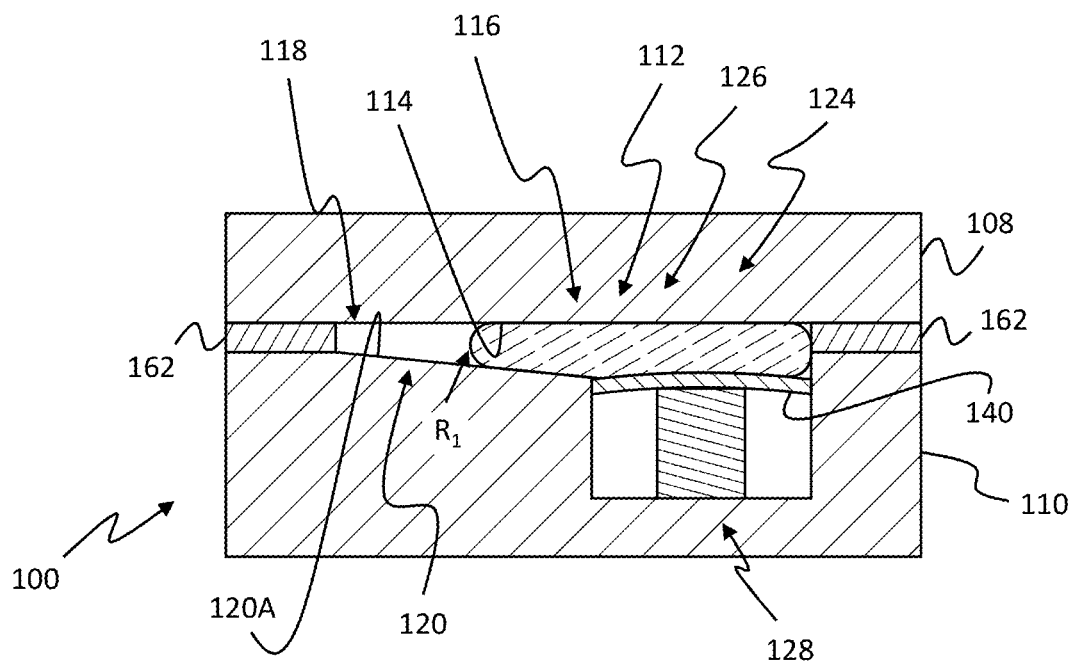
FIG. 3N is a diagrammatic illustration of the thermal switch of FIG. 3M in an intermediate state.
Figure 3O:
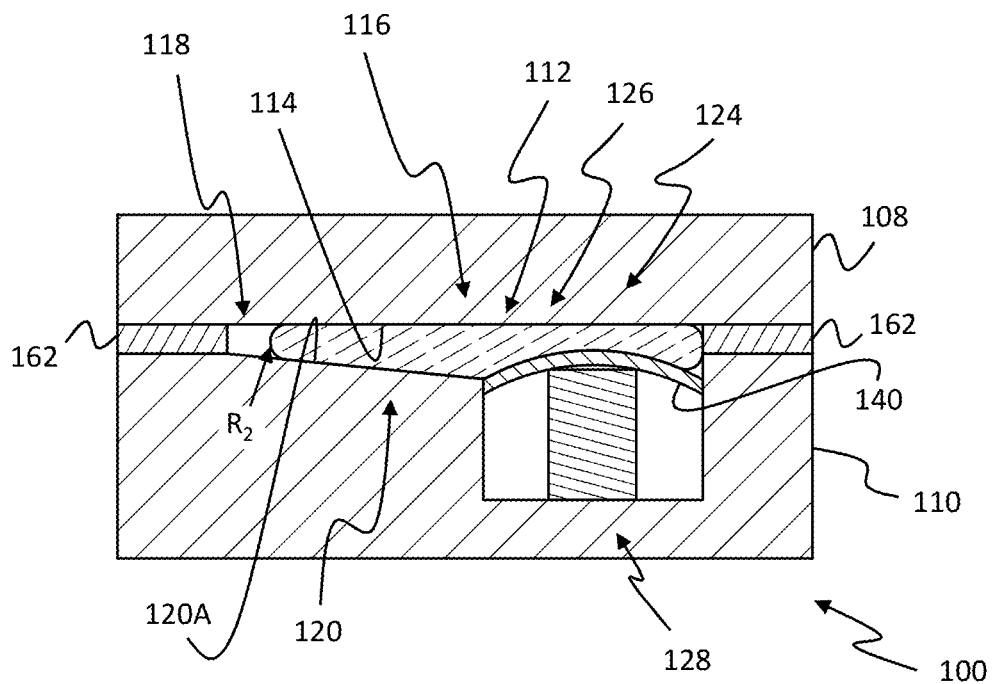
FIG. 3O is a diagrammatic illustration of the thermal switch of FIG. 3M in an on-state.
Figure 3P:
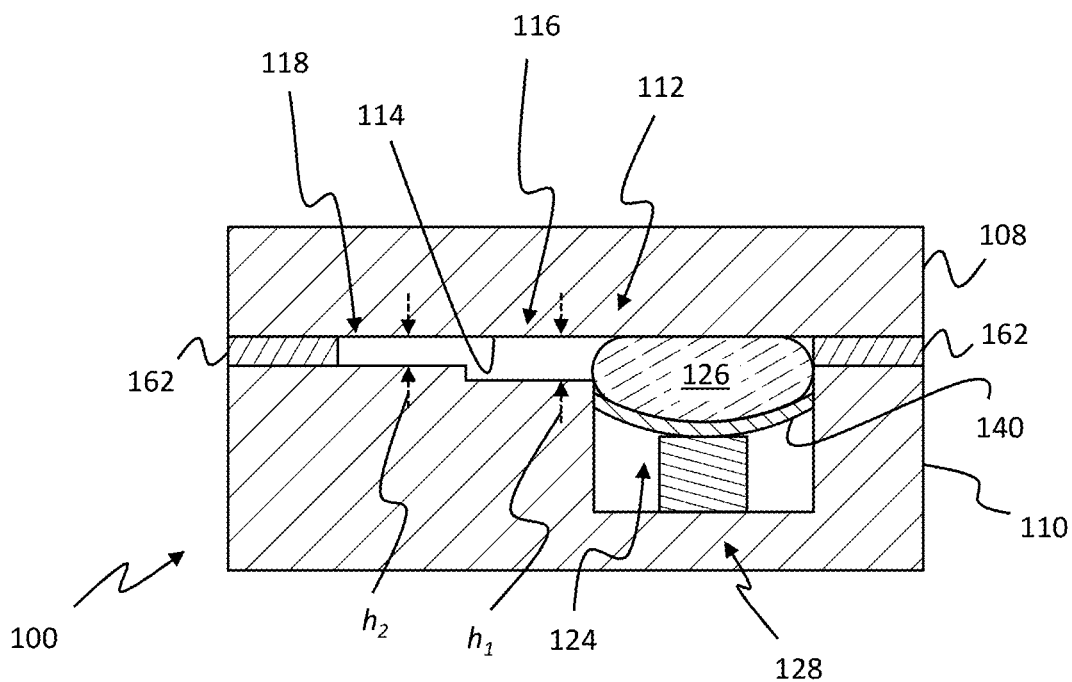
FIG. 3P is a diagrammatic illustration of a thermal switch having a stepped channel, in an off-state, according to an embodiment of the present invention.
Figure 3Q:
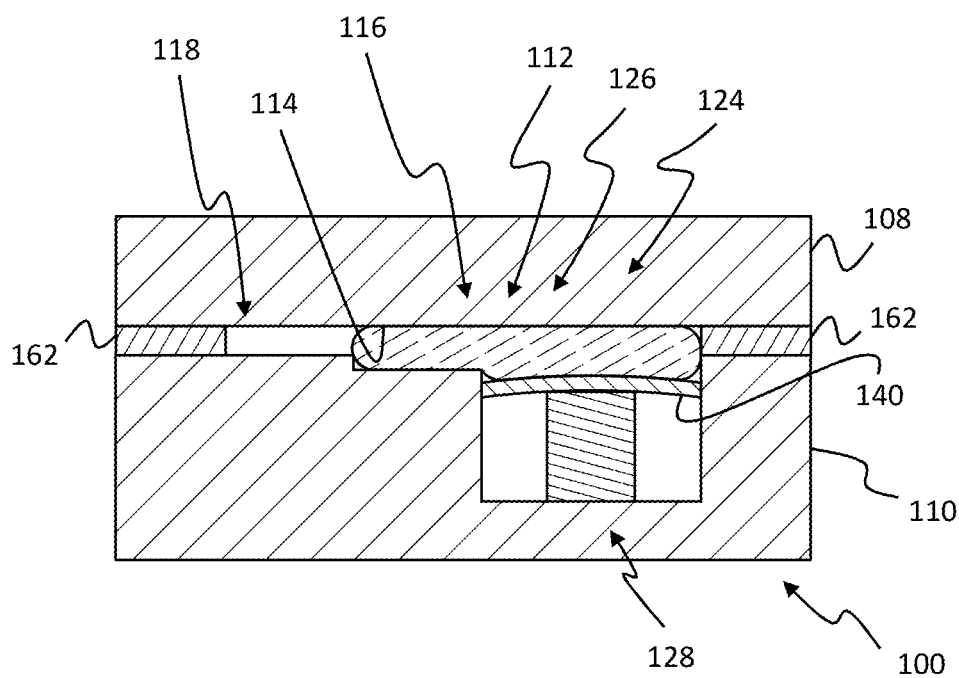
FIG. 3Q is a diagrammatic illustration of the thermal switch of FIG. 3P in an intermediate state.
Figure 3R:
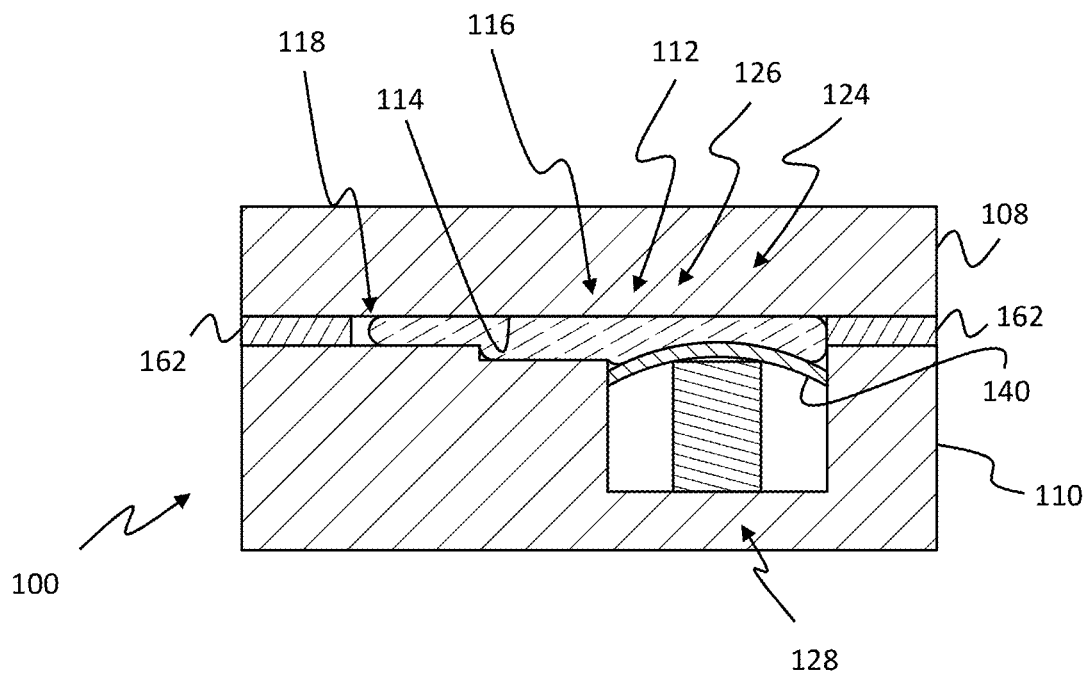
FIG. 3R is a diagrammatic illustration of the thermal switch of FIG. 3P in an on-state.

In another embodiment, as shown in FIGS. 3P-3R, the gap 120 may be configured with two or more discreet regions of differing height, indicated as h1 and h2 in FIG. 3M. This arrangement may be useful in applications where it is desirable to create a thermal switch with a definitive intermediary value of thermal conductivity (as illustrated by the intermediary switch condition of FIG. 3Q). An abrupt change in gap height creates a corresponding change in the fluid pressure required to force the thermally conductive liquid 126 past the first intermediary condition. The (active) actuator 120 may be appropriately configured to switch between an off-state, the intermediary state, and the "fully on" state.

Figure 3S:
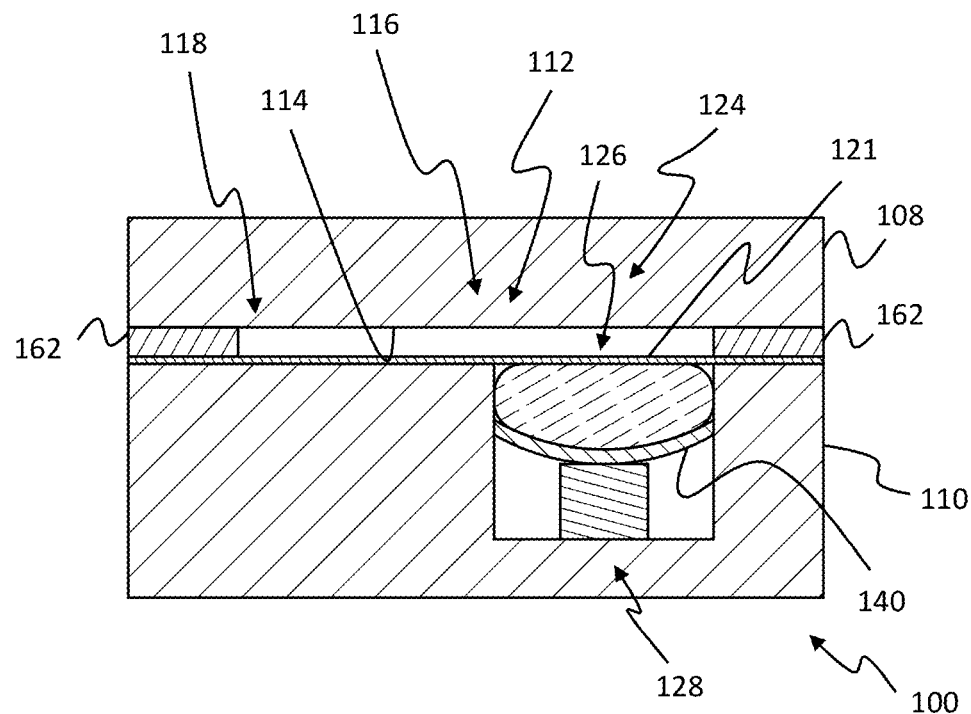
FIG. 3S is a diagrammatic illustration of a thermal switch having a gap membrane.
Figure 3T:
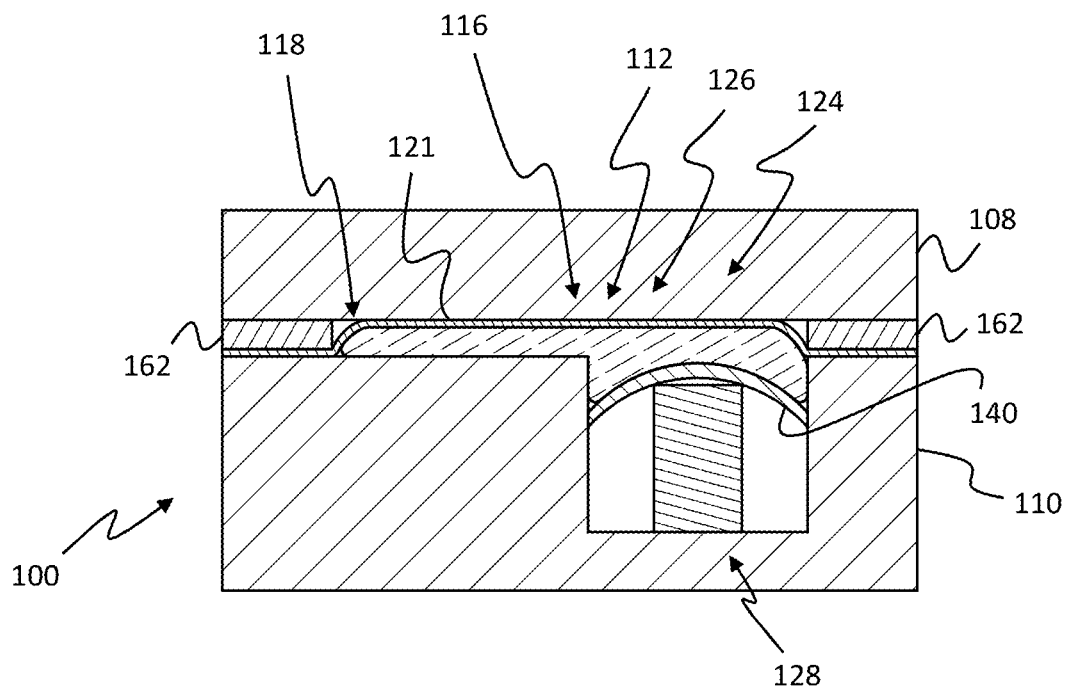
FIG. 3T is a diagrammatic illustration of the thermal switch of FIG. 3S in an on-state.

In general, the embodiments above rely on surface tension to draw the thermally conductive liquid 126 from the gap 120. In some embodiments, it may be desirable to augment or replace the force of surface tension with a second force driving the thermally conductive liquid 126 from the gap 120. In one embodiment, shown in FIGS. 3S-3T, a second membrane 121, or gap membrane, may be configured to separate the thermally conductive liquid 126 from the first plate 108. In the on-state as illustrated in FIG. 3T, the stretched gap membrane 1212 applies a force to the thermally conductive liquid 126 which will tend to expel the liquid from the gap 120 when the actuator is moved from the first to second position.

Second Embodiment

With reference to FIGS. 4A-4J, a thermal switch 100 according to a second embodiment is shown. For purposes of discussion, the same reference numbers are used to refer to elements of the second embodiment of the thermal switch 100 as using in the first embodiment, where appropriate or otherwise noted.

In the illustrated embodiment, the thermal switch 100 of the second embodiment includes a first plate 108, a second plate 110, a first reservoir 124, and an actuator 128. The first plate 108 is composed from a thermally conductive material and forms a first side 148 of the thermal switch 100. For example, the first plate 108 may include a plurality of threaded apertures (not shown) and the first element 102 may be bolted or otherwise fastened to the first plate 108. It should be noted that the first element 102 may be otherwise thermally coupled to the first plate 108 including but not limited to via a thermally conductive interface or material, for example, thermal grease or other suitable means.

The second plate 110 is composed from a thermally conductive material and forms a second side 150 of the thermal switch 100. The second plate 110 includes a plurality of threaded apertures 176 and may be coupled to the first plate 108 by a plurality of threaded fasteners 158. In one embodiment, the fasteners 158 are composed from stainless steel. In the illustrated embodiment, the second side 150, an outer wall 152 extending from the second side 150 and the first side 148, surround the internal cavity 112 and form the housing 146.

A post 154 extends from an internal surface of the second side 150 towards the first side 148. The post 154, the outer wall 152 and bottom defining a trench 156. A channel 114 has a first end 116 and a second end 118. As discussed in more detail below, the channel 114 is defined between the first side 148 or the first plate 108 and the post 154. The actuator 128 has a generally circular shape and surrounds the post 154.

However, in other embodiments the post 154 has a generally circular shape and surrounds the trench 156. The actuator 128 is located within the trench and the channel 114 is defined by the trench 156 and extends outward from the (center) post 154 (see below).

Returning to FIGS. 4A-4J, in the illustrated embodiment, the channel 114 is defined by (and between) an internal surface of the first side 148 and an upper surface of the post 154. The channel 114 defines a gap 120 between the first and second plates 108, 110.

Figure 4A:
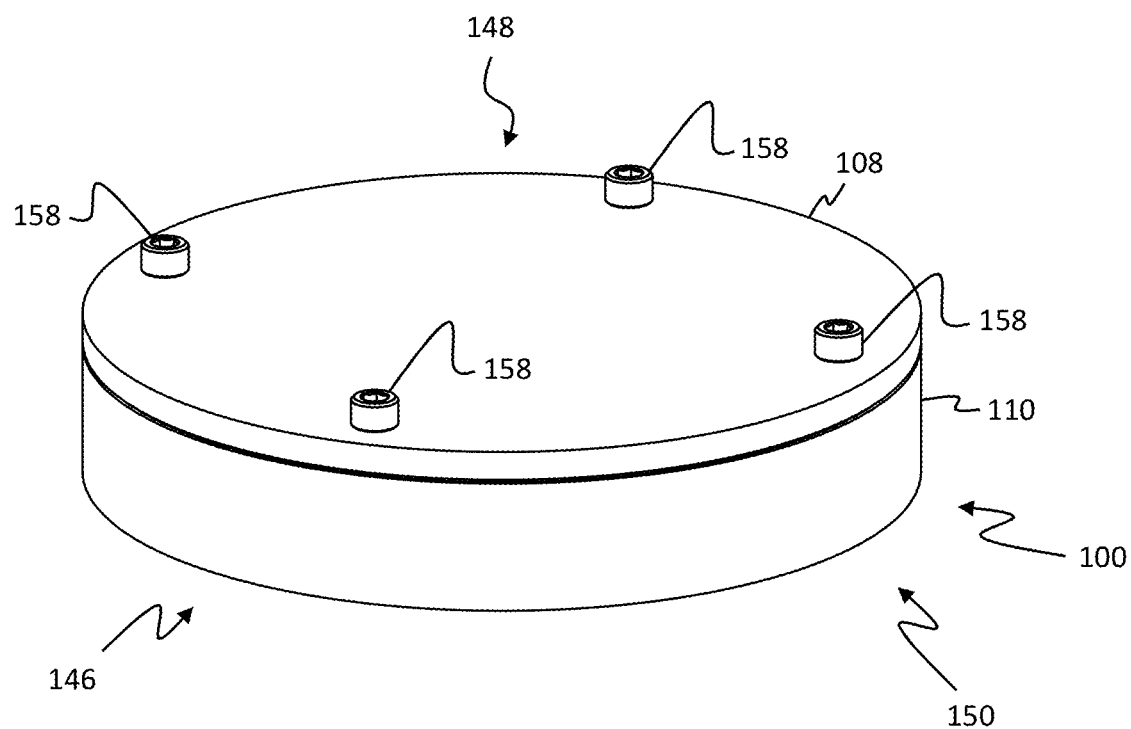
FIG. 4A is a first perspective view of a thermal switch having first and second plates, according to a second embodiment of the present invention.
Figure 4B:
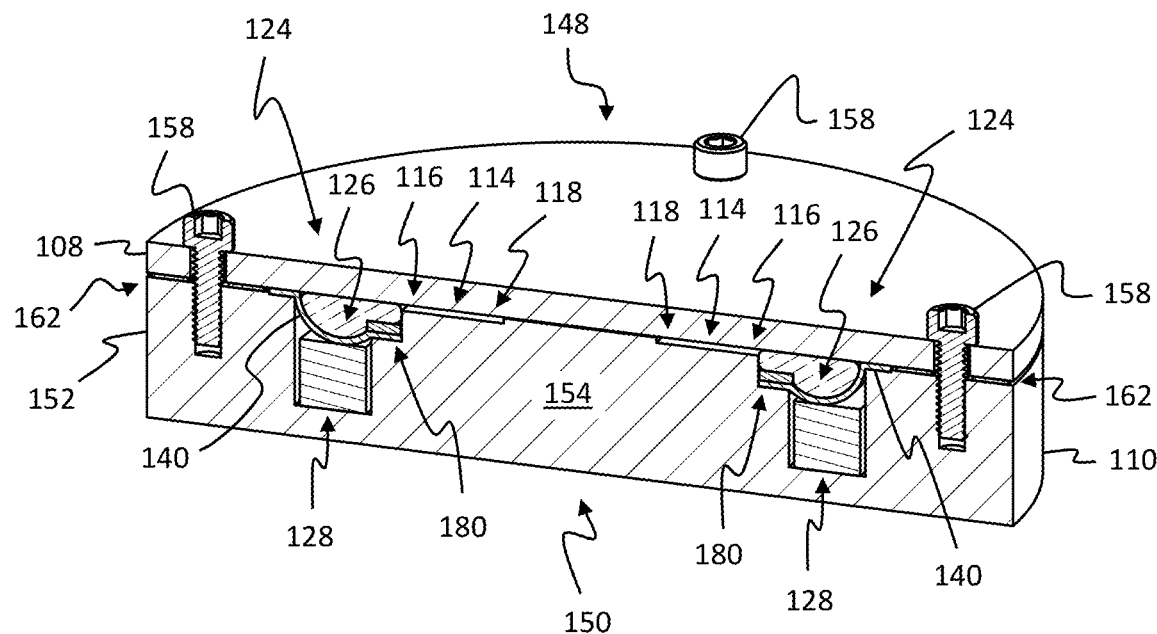
FIG. 4B is a first cutaway view of the first and second plates of the thermal switch of FIG. 4A.
Figure 4C:
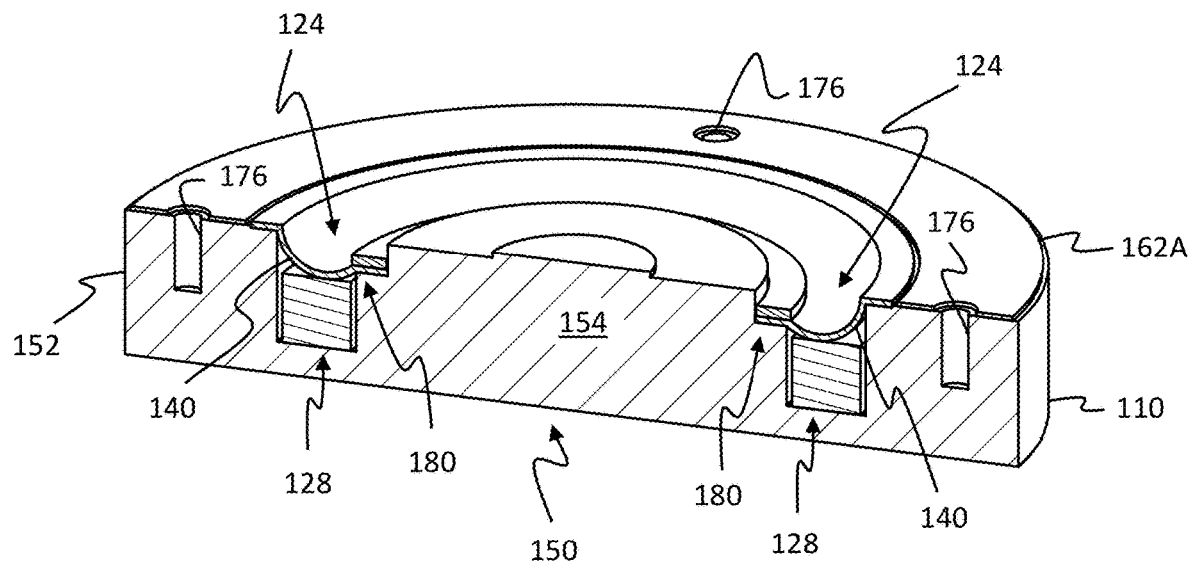
FIG. 4C is a first cutaway view of the second plate of the thermal switch of FIG. 4A with a single piece shim.
Figure 4D:
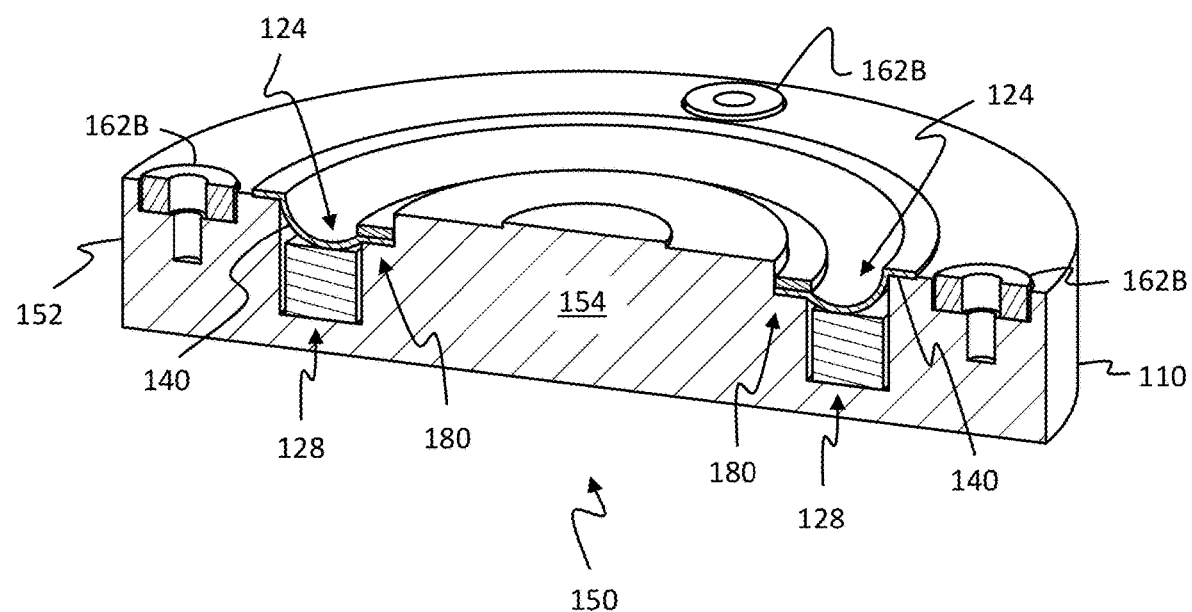
FIG. 4D is a second cutaway view of the second plate of the thermal switch of Figures with a plurality of washers.

The first reservoir 124 is coupled to the first end 116 of the channel 114 and contains a thermally conductive liquid 126 (not shown in FIGS. 4C-4D).

In the illustrated embodiment, the first and second plates 108, 110 are thermally isolated by a shim 162. In one embodiment, shown in FIG. 4C, a single plastic shim 162A covers at least a portion of the upper surface of the outer wall 152. In another embodiment, shown in FIG. 4D, a plastic washer 162B sits in each threaded aperture 176 in the second plate 110. The shim 162 provides thermal isolation between the plates 108, 110 while allowing relative movement therebetween as the first plate 108 expands and contracts.

Figure 4E:
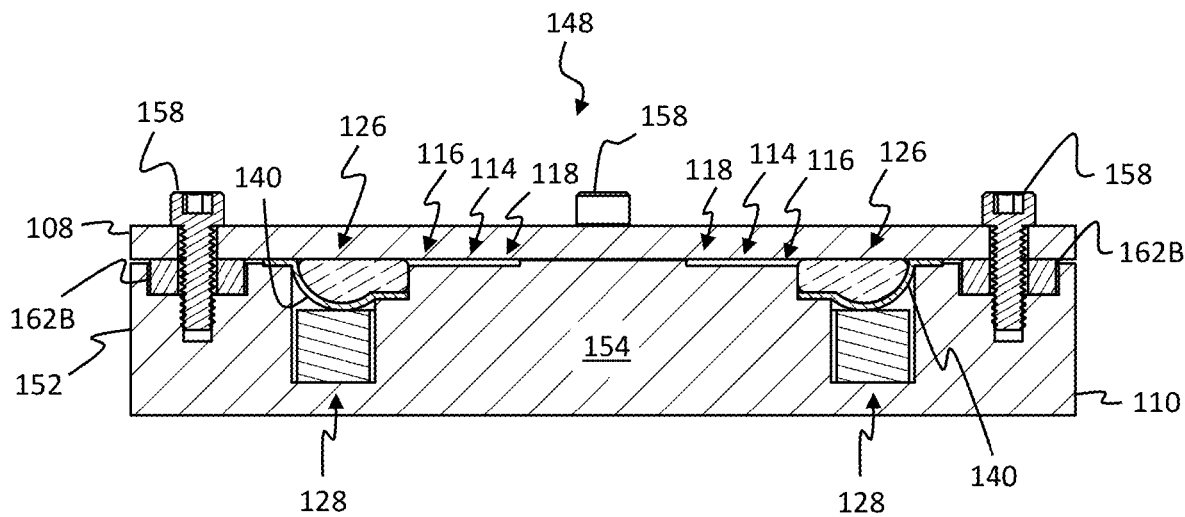
FIG. 4E is a cutaway view of the components of the thermal switch of FIG. 4A including a membrane bonded to the second plate, according to an embodiment of the present invention.
Figure 4F:
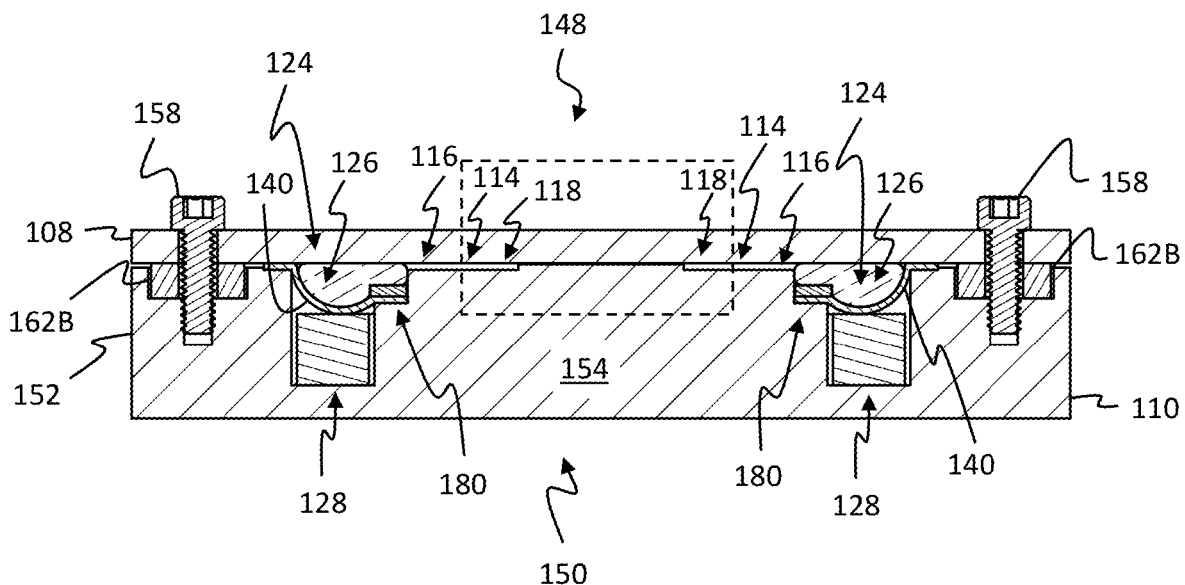
FIG. 4F is a cutaway view of the components of the thermal switch of FIG. 4A including a membrane and a clamp ring for connecting the membrane to the second plate.

As shown in FIGS. 4E and 4F, the thermal switch 100 includes a membrane 140 that is positioned adjacent an actuator 128. In the illustrated embodiment, the membrane 140 has a toroidal or ring shape and fits within the circular trench 156. An outer end or edge of the membrane 140 is clamped between the first and second plates 108, 110. An adhesive may also be used to hold or seal the outer edge of the membrane 140 between the first and second plates 108, 110 to create a seal. The inner edge of the membrane 140 may be bonded or affixed to the second plate 110. In the illustrated embodiment of FIG. 4E, the inner edge of the membrane 140 is affixed to a ledge or shelf 178 positioned within the trench 156. In the embodiment as shown in FIGS. 4B-4D and 4F, the inner edge of the membrane 140 may be clamped to the second plate 110 using a clamp ring 180. The clamp ring 180 may be secured by suitable means including fasteners or adhesive (not shown).

As discussed above, the channel 114 is formed between an internal surface of the first side 148 of the switch 100 and a surface of the (center) post 154. An enlarged view (marked by the dashed lines in FIG. 4F) of one embodiment of the channel 114 is shown in FIG. 4G.

Figure 4G:
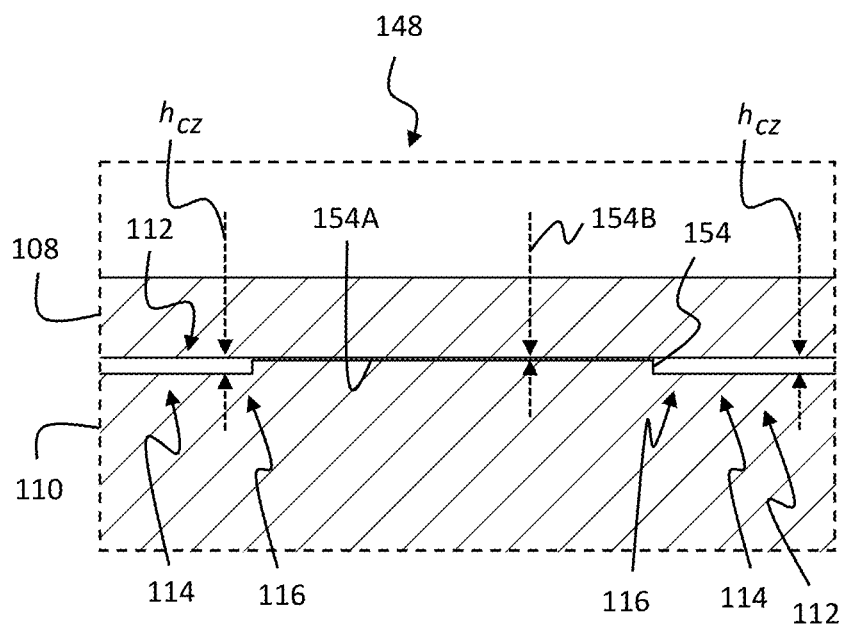
FIG. 4G is a cutaway view of a portion of the first and second plates of the thermal switch of FIG. 4A, according to an embodiment of the present invention.

In FIG. 4G, in one embodiment of the present invention, the thermal switch 100 may not include a second reservoir 136. The center post 154 includes a central step 154A that is surrounded a toroidal or ring-shaped channel 114. The channel 114 extends outwardly from the central step 154 from the second end 118 of the channel 114 towards the first end 116 of the channel 114. The first and second plates 108, 110 are separated by a small gap 154B defined at an upper surface of the central step 154A. The small gap 154B may be considered as a second reservoir. In the illustrated embodiment, the height of the small gap 154B is much smaller than the height of the channel, $h_{cz}$. For example, the height of the channel, $h_{cz}$, may be 0.010", while the height of the gap 154B may be 0.002".

Figure 4H:
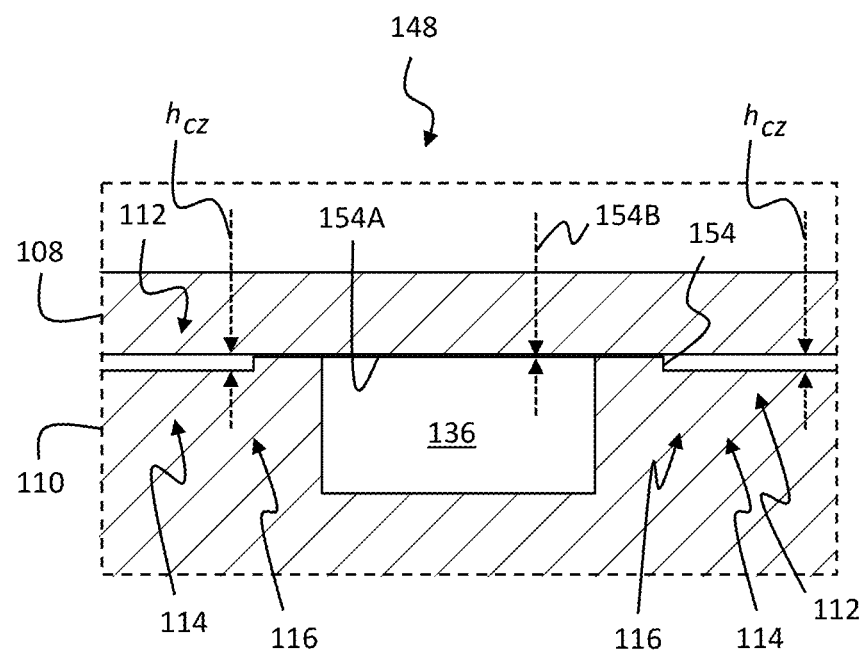
FIG. 4H is a cutaway view of a portion of the first and second plates of the thermal switch of FIG. 4A, according to another embodiment of the present invention.

As shown in FIG. 4H, a second reservoir 136 may be located within the central post 154. The small gap 154B serves as a gas gap (see above). The presence of the second reservoir 136 minimizes the increase in gas pressure in the channel 114 and the small gap 154B which may increase the depth to which the thermally conductive liquid 126 travels in the channel 114.

Figure 4I:
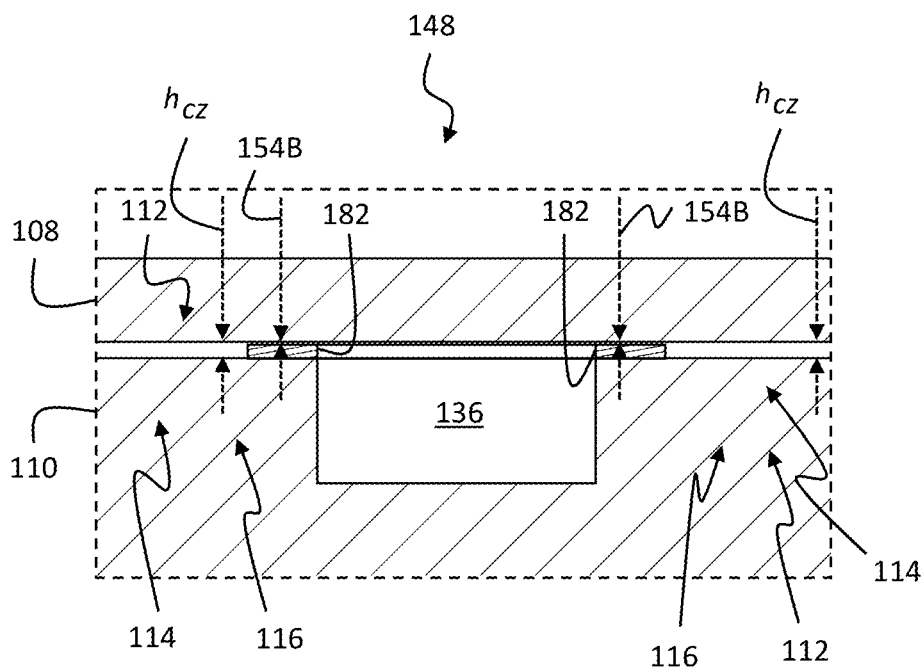
FIG. 4I is a cutaway view of a portion of the first and second plates of the thermal switch of FIG. 4A, according to still another embodiment of the present invention.

As shown in FIG. 4I, the small gap 154B may be created using a plastic ring 182 bonded to surface of the second plate 110. The ring 182 could alternatively be bonded to a surface of the first plate 108. Alternatively, the ring 182 could be held in position using one or more locating pins (not shown).

Figure 4J:
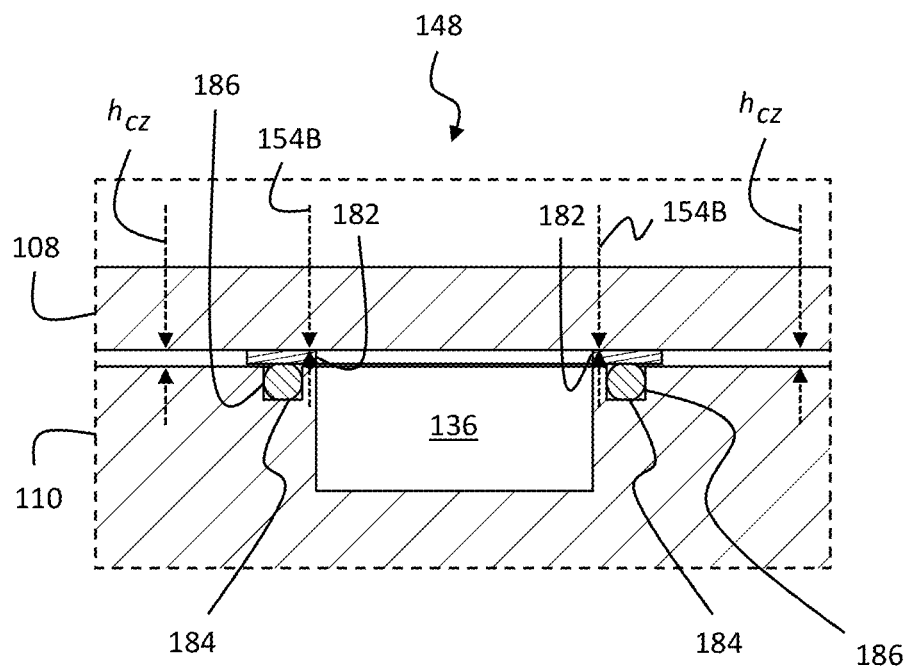
FIG. 4J is a cutaway view of a portion of the first and second plates of the thermal switch of FIG. 4A, according to still an additional embodiment of the present invention.

In an alternative embodiment shown in FIG. 4J, a very small gap 154B may be created using a plastic ring 182 that is pressed against the first plate 108 (as shown) using an O-ring 184 located in a trench 186 of the second plate 110. One or more small channels (not shown) may be located in the surface of the ring 182 adjacent the first plate 108. The channels may be laser cut into the ring 182 and may be as small as 0.0003".

The second reservoir 136 is coupled to the second end 118 of the channel 114 and contains a gas 138. The actuator 128 is coupled to the first reservoir 124 and the first end 116 of the channel 114. The membrane 140 is positioned between the actuator 128 and the first end 116 of the channel 114 and is located within the circular trench 156. The membrane 140 has a first position and a second position associated with the first and second states of the actuator 128, respectively. The membrane 140 is moveable between the first and second positions in response to the actuator 128 being switched from the first state to the second state. The thermally conductive liquid or liquid metal 126 is pushed into the gap 120 from the first reservoir 124 and gas 138 is pushed from the gap 120 to the second reservoir 136 as the membrane 140 is moved from the second position to the first position. The thermally conductive liquid or liquid metal 126 flows from the gap 120 to the first reservoir 124 and gas 138 in the second reservoir 136 flows into the gap 120 in response to the membrane 140 being moved from the first position to the second position.

In one aspect of the present invention, the size of the first and second reservoirs 124, 136 are configured to control the change in pressure in the second reservoir 136 between the on and off-states of the thermal switch 100. In general, the volume of the second reservoir 136 is much larger than the displacement of the thermally conductive liquid 126, so the increase in gas pressure in the second reservoir 136 is small. This reduces the actuator force required to actuate the thermal switch 100.

The first reservoir 124 is coupled to the channel 114 and contains a thermally conductive liquid 126, for example, a liquid metal. In one embodiment of the present invention, the liquid metal is mercury. In another embodiment of the present invention, the liquid metal is a eutectic alloy, i.e., a mixture of metals having a melting point lower than that of any of its components. For example, the liquid metal may be an alloy composed of gallium, indium and tin. In a specific embodiment, the liquid metal is an alloy composed of 68.5% gallium, 21.5% indium and 10% tin. In another specific embodiment, the liquid metal is an alloy composed of 61% gallium, 25% indium, 13% tin and 1% zinc. However, it should be noted that other thermally conductive liquid may be used without departing from the spirit of the invention.

The actuator 128 is coupled to the first reservoir 124 and the channel 114. The actuator 128 is moveable between a first state and a second state corresponding to the on-state and the off-state of the thermal switch, respectively. As discussed in more detail below, the actuator 128 is configured to allow the thermally conductive liquid 126 to flow from the first reservoir 124 to the channel 114 when the actuator 128 is in the first state and to allow the thermally conductive liquid 126 to flow from the channel 114 to the first reservoir 124 when the actuator 128 is in the second state.

The channel 114 has a first end 116 and a second end 118. In one aspect of the present invention, the gap 120 may be divided into one or more conduction zones using a dividing plate (see below). As discussed in detail below, each conduction zone 122 has a width, $w_{cz}$. In one embodiment, the width of each conduction zone 122 is less than or equal to 1 inch.

In one embodiment, the height, $h_{cz}$, of each conduction zone 122 is less than or equal to 0.2 inches. In another embodiment, the height, $h_{cz}$, of each conduction zone 122 is less than or equal to 0.1 inches. In still another embodiment, the height, $h_{cz}$, of each conduction zone 122 is less than or equal to 0.02 inches.

The gas gap 166 includes a gas entry/exit point 144 between the second reservoir 136 and the channel 114. The gas entry/exit point 144 is configured to minimize entry of the thermally conductive liquid 126 into the at least one gas entry/exit point, and thus, the second reservoir 136. For example, in one embodiment, a height of the entry/exit point 144 ($h_{gas\_gap}$) is less than a height of the gap ($h_{cz}$). As explained in more detail below, the presence of the second reservoir 136 allows the liquid metal to flow further into the channel 114 without causing a significant increase in gas pressure within the channel 114.

Third Embodiment

Figure 5A:
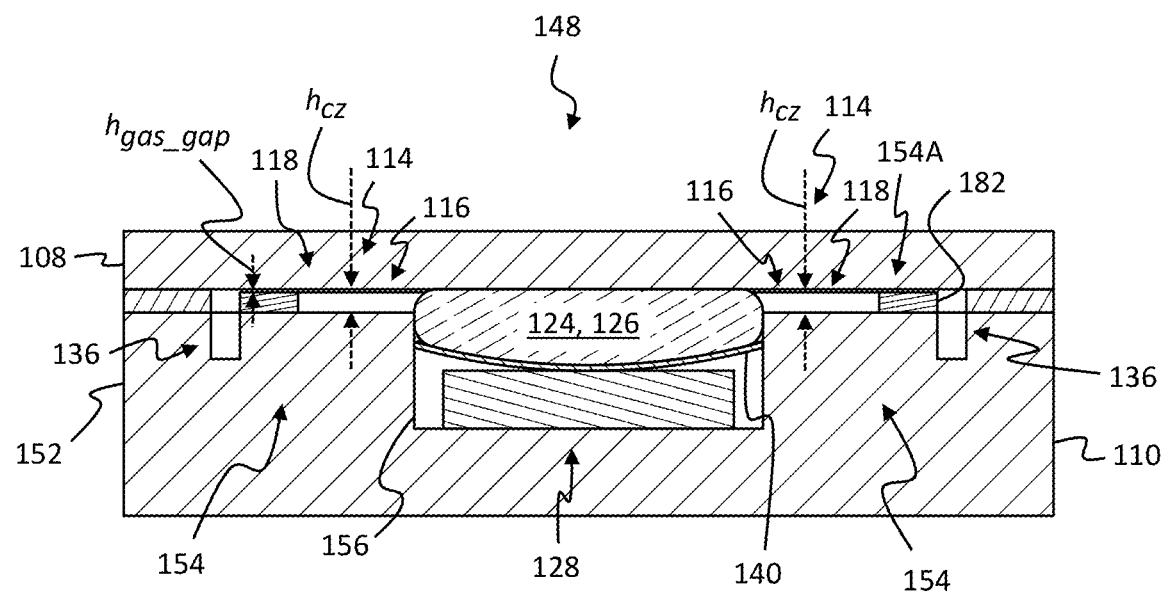
FIG. 5A is a first cutaway view of a thermal switch having first and second plates, according to a third embodiment of the present invention.
Figure 5B:
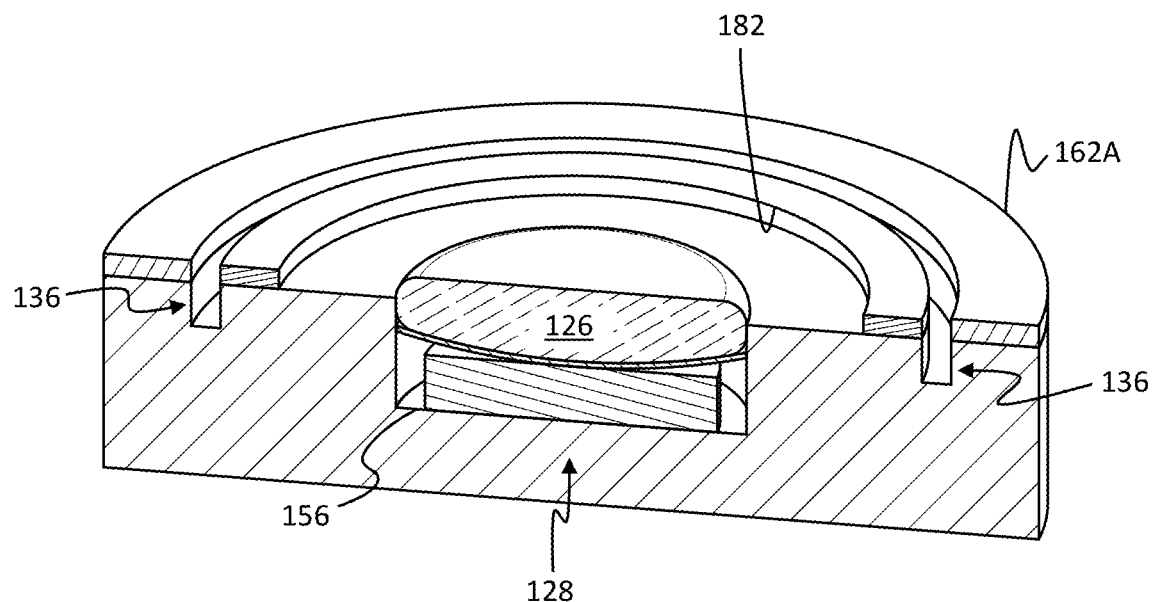
FIG. 5B is a second cutaway view of the first and second plates of the thermal switch of FIG. 5A.

With reference to FIGS. 5A-5B, a thermal switch 100 according to a third embodiment is shown. For purposes of discussion, the same reference numbers are used to refer to elements of the third embodiment of the thermal switch 100 as used in the first and second embodiments, where appropriate or otherwise noted.

Generally, the thermal switch 100 in the third embodiment is similar to the thermal switch 100 of the second embodiment, however, the actuator 128 and first reservoir 124 are located within the center of the thermal switch 100.

In the illustrated embodiment, the thermal switch 100 of the third embodiment includes a first plate 108, a second plate 110, a first reservoir 124, and an actuator 128. The first plate 108 is composed from a thermally conductive material and forms a first side 148 of the thermal switch 100.

The second plate 110 is composed from a thermally conductive material and forms a second side 150 of the thermal switch 100. In the illustrated embodiment, the second side 150, an outer wall 152 extending from the second side 150 and the first side 148, surround the internal cavity 112 and form the housing 146.

A post 154 extends from an internal surface of the second side 150 towards the first side 148. The post 154, the outer wall 152 and bottom defining a trench 156. The post 154 has a toroidal shape and surrounds the trench 156. The trench 156 is circular and is located in the center of the second plate 110. The actuator 128 is located within the trench 156.

A channel 114 has a first end 116 and a second end 118. As discussed in more detail below, the channel 114 is defined between the first side 148 or the first plate 108 and the post 154.

In the illustrated embodiment, the channel 114 is defined by (and between) an internal surface of the first side 148 and an upper surface of the post 154. The channel 114 defines a gap 120 between the first and second plates 108, 110. The first reservoir 124 is coupled to the first end 116 of the channel 114 and contains a thermally conductive liquid 126.

In the illustrated embodiment, the first and second plates 108, 110 are thermally isolated by a shim 162. As shown in FIGS. 5A and 5B, the thermal switch 100 includes a membrane 140 that is positioned adjacent the actuator 128.

As discussed above, the channel 114 may be formed between an internal surface of the first side 148 of the switch 100 and a surface of the toroidal or ring-shaped post 154.

The second reservoir 136 is located within the toroidal or ring-shaped post 154. The channel 114 extends inwardly from the post 154 towards the first reservoir 124. The first and second reservoirs 124, 136 are connected by a small gap 154B or gas gap 166. In the illustrated embodiment, the height of the small gap 154 is much smaller than the height of the channel, $h_{cz}$. For example, the height of the channel, $h_{cz}$, may be 0.010", while the height of the gap 154B may be 0.002". The gap 154B, 166 may be created between surfaces of the first and second plates 108, 110 or between one of the plates 108, 110 and a ring 182.

The second reservoir 136 is coupled to the second end 118 of the channel 114 and contains a gas 138. The actuator 128 is coupled to the first reservoir 124 and the first end 116 of the channel 114. The membrane 140 is positioned between the actuator 128 and the first end 116 of the channel 114 and is located within the trench 156. The membrane 140 has a first position and a second position associated with the first and second states of the actuator 128, respectively. The membrane 140 is moveable between the first and second positions in response to the actuator 128 being switched from the first state to the second state. The thermally conductive liquid or liquid metal 126 is pushed into the gap 120 from the first reservoir 124 and gas 138 is pushed from the gap 120 to the second reservoir 136 as the membrane 140 is moved from the second position to the first position. The thermally conductive liquid or liquid metal 126 flows from the gap 120 to the first reservoir 124 and gas 138 in the second reservoir 136 flows into the gap 120 in response to the membrane 140 being moved from the first position to the second position.

The second plate 110 is composed from a thermally conductive material, such as aluminum. The first reservoir 124 is coupled to the channel 114 and contains a thermally conductive liquid 126, for example, a liquid metal. In one embodiment of the present invention, the liquid metal is mercury. In another embodiment of the present invention, the liquid metal is a eutectic alloy, i.e., a mixture of metals having a melting point lower than that of any of its components. For example, the liquid metal may be an alloy composed of gallium, indium and tin. In a specific embodiment, the liquid metal is an alloy composed of 68.5% gallium, 21.5% indium and 10% tin. In another specific embodiment, the liquid metal is an alloy composed of 61% gallium, 25% indium, 13% tin and 1% zinc. However, it should be noted that other thermally conductive liquid mays be used without departing from the spirit of the invention.

The actuator 128 is coupled to the first reservoir 124 and the channel 114. The actuator 128 is moveable between a first state and a second state corresponding to the on-state and the off-state of the thermal switch, respectively. As discussed in more detail below, the actuator 128 is configured to allow the thermally conductive liquid 126 to flow from the first reservoir 124 to the channel 114 when the actuator 128 is in the first state and to allow the thermally conductive liquid 126 to flow from the channel 114 to the first reservoir 124 when the actuator 128 is in the second state.

The channel 114 has a first end 116 and a second end 118. In one aspect of the present invention, the gap 120 may be divided into one or more conduction zones using a dividing plate (see below).

In one embodiment, the height, $h_{cz}$, of each conduction zone 122 is less than or equal to 0.2 inches. In another embodiment, the height, $h_{cz}$, of each conduction zone 122 is less than or equal to 0.1 inches. In still another embodiment, the height, $h_{cz}$, of each conduction zone 122 is less than or equal to 0.02 inches.

The gas gap 166 includes a gas entry/exit point 144 between the second reservoir 136 and the channel 114. The gas entry/exit point 144 configured to minimize entry of the thermally conductive liquid 126 into the at least one gas entry/exit point, and thus, the second reservoir 136. For example, in one embodiment, a height of the entry/exit point 144 ($h_{gas\_gap}$) is less than a height of the gap ($h_{cz}$). As explained above, the presence of the second reservoir 136 allows the liquid metal to flow further into the channel 114 without causing a significant increase in gas pressure within the channel 114.

Fourth Embodiment

Figure 6A:
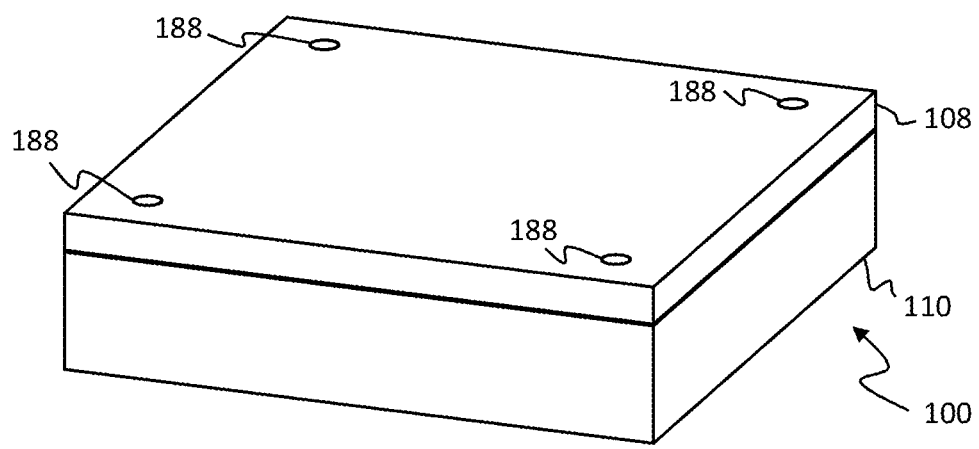
FIG. 6A is a first perspective view of a thermal switch having first and second plates, according to a fourth embodiment of the present invention.
Figure 6B:
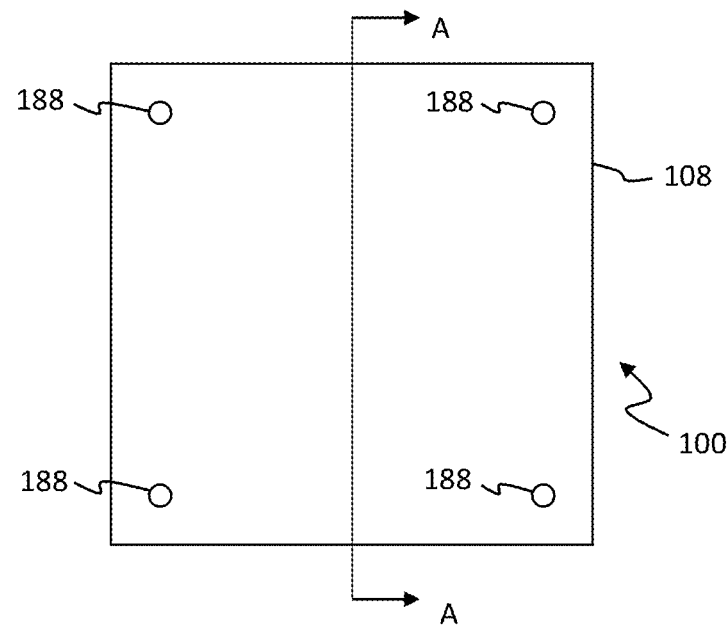
FIG. 6B is a top view of a first plate of the thermal switch of FIG. 6A.
Figure 6C:
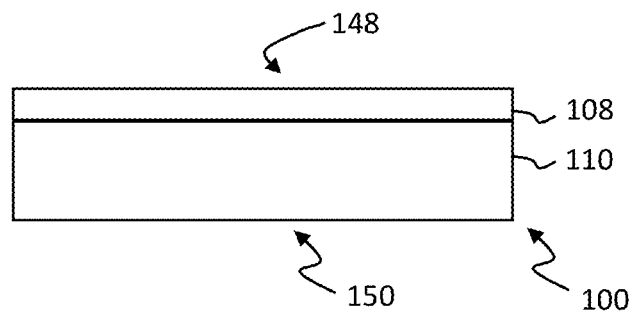
FIG. 6C is side view of the thermal switch of FIG. 6A.
Figure 6D:
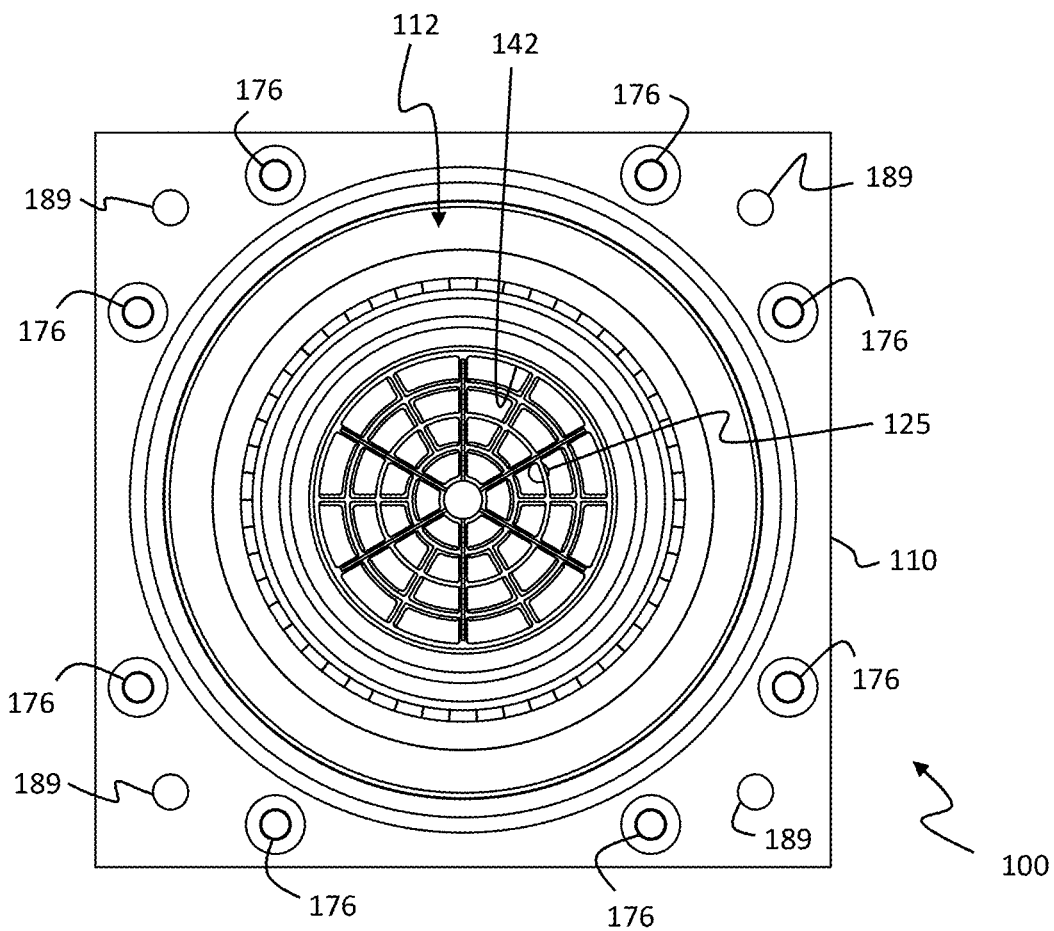
FIG. 6D is a top view of a second plate of the thermal switch of FIG. 6A.
Figure 6E:
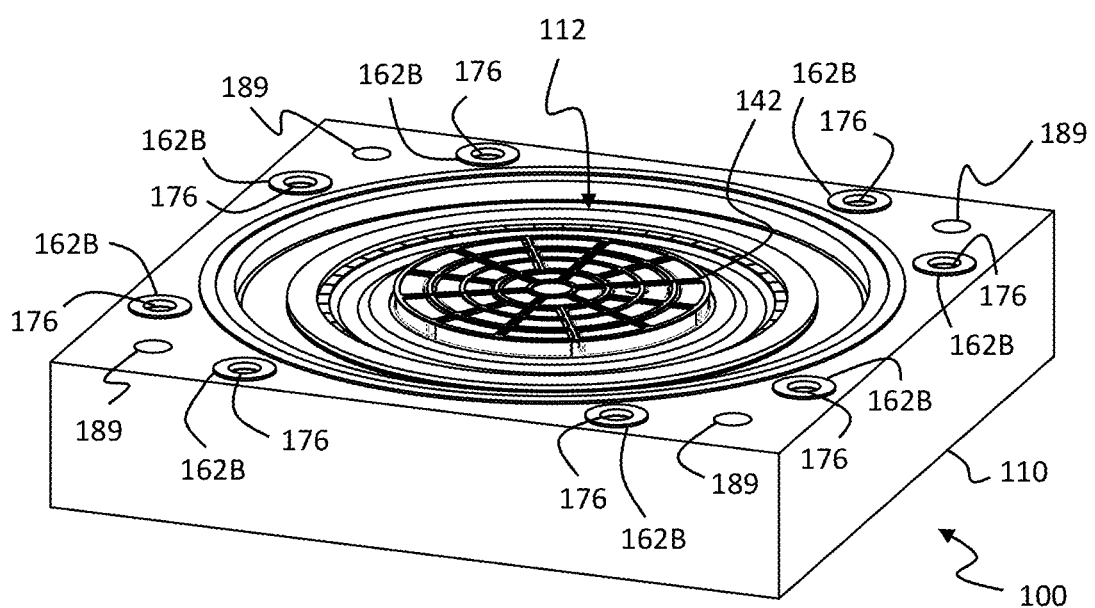
FIG. 6E is a perspective view of the second plate of the thermal switch of FIG. 6A.
Figure 6F:
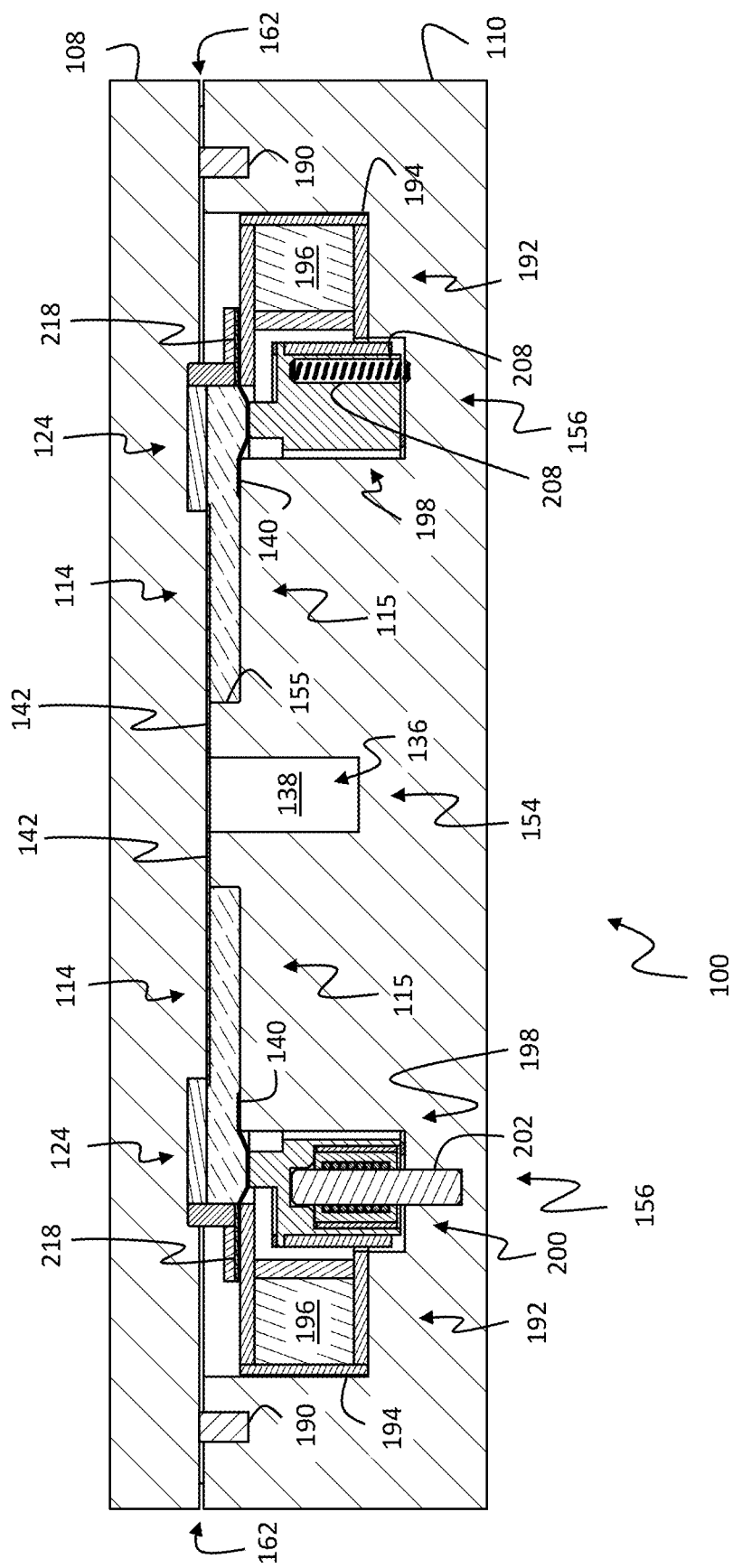
FIG. 6F is a first cutaway view of the thermal switch of FIG. 6A.
Figure 6G:
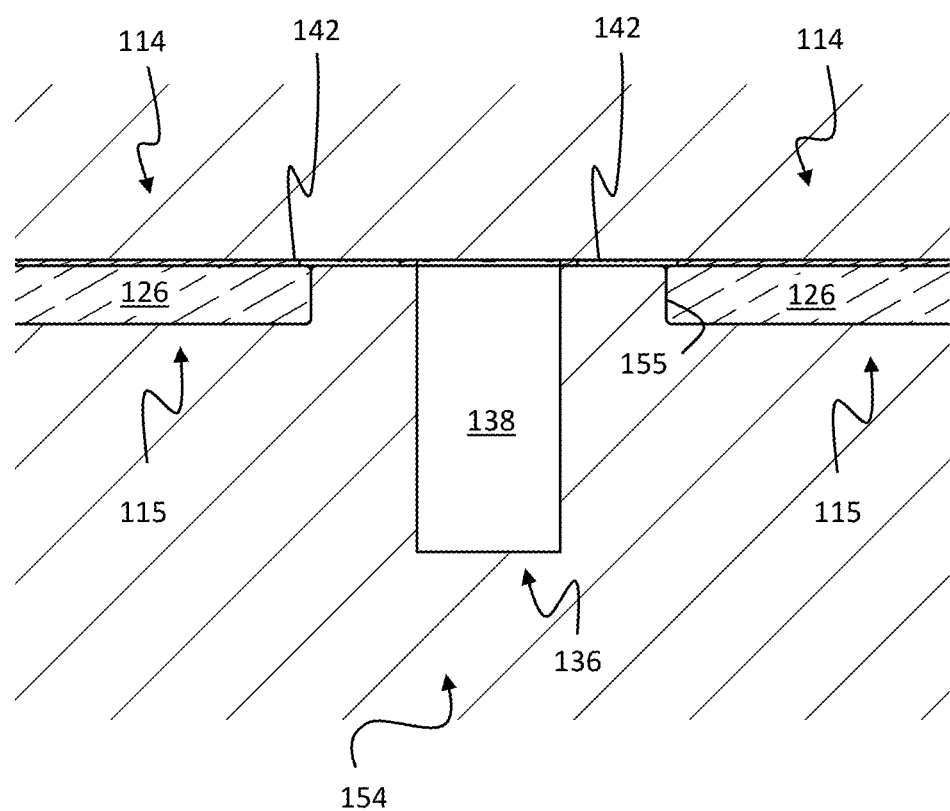
FIG. 6G is a partial cutaway view of the thermal switch of FIG. 6A.
Figure 6H:
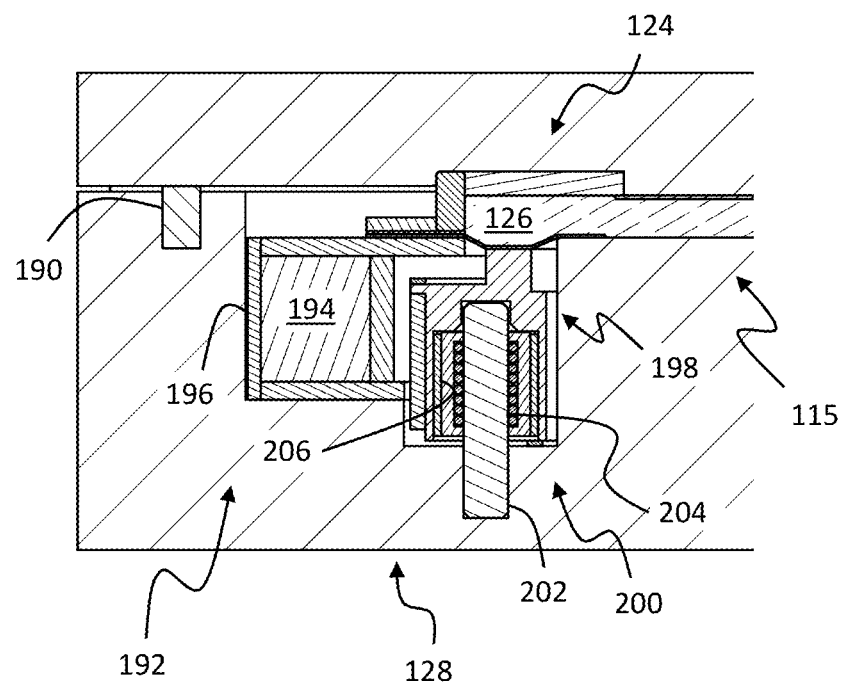
FIG. 6H is a second partial cutaway view of the thermal switch of FIG. 6A.
Figure 6I:
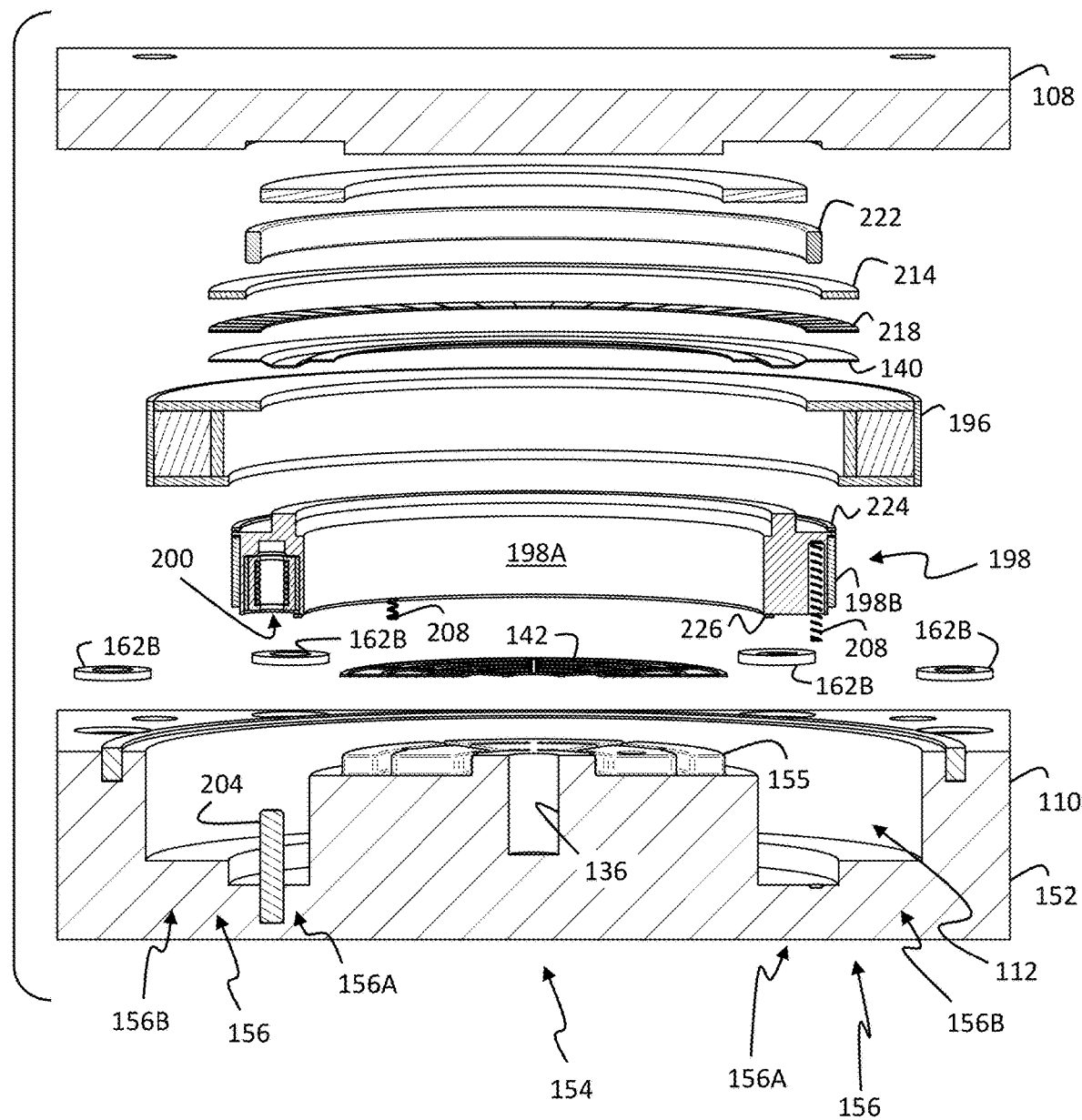
FIG. 6I is an exploded cutaway view of the thermal switch of FIG. 6A.
Figure 6J:
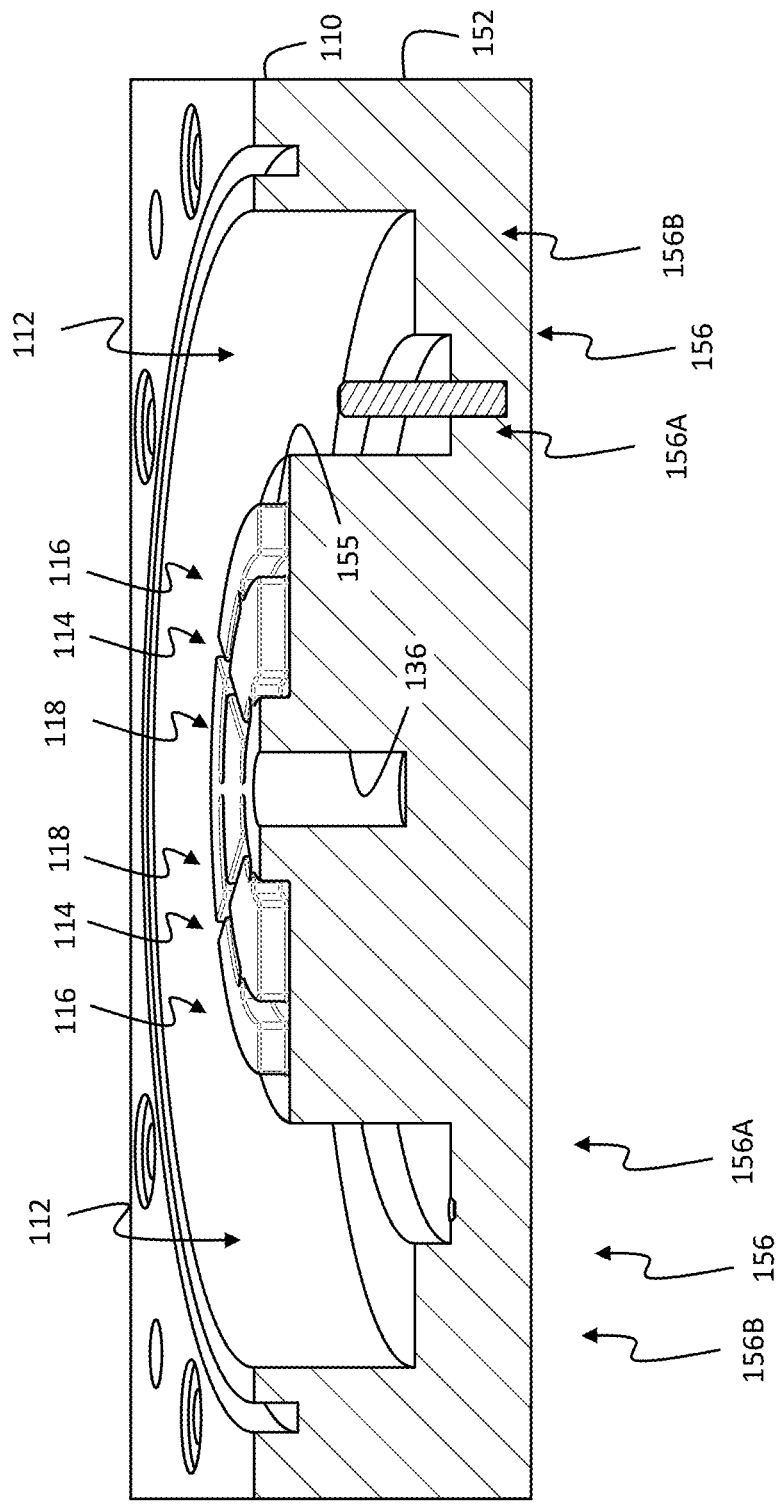
FIG. 6J is a cutaway view of the second plate of the thermal switch of FIG. 6A.
Figure 6K:
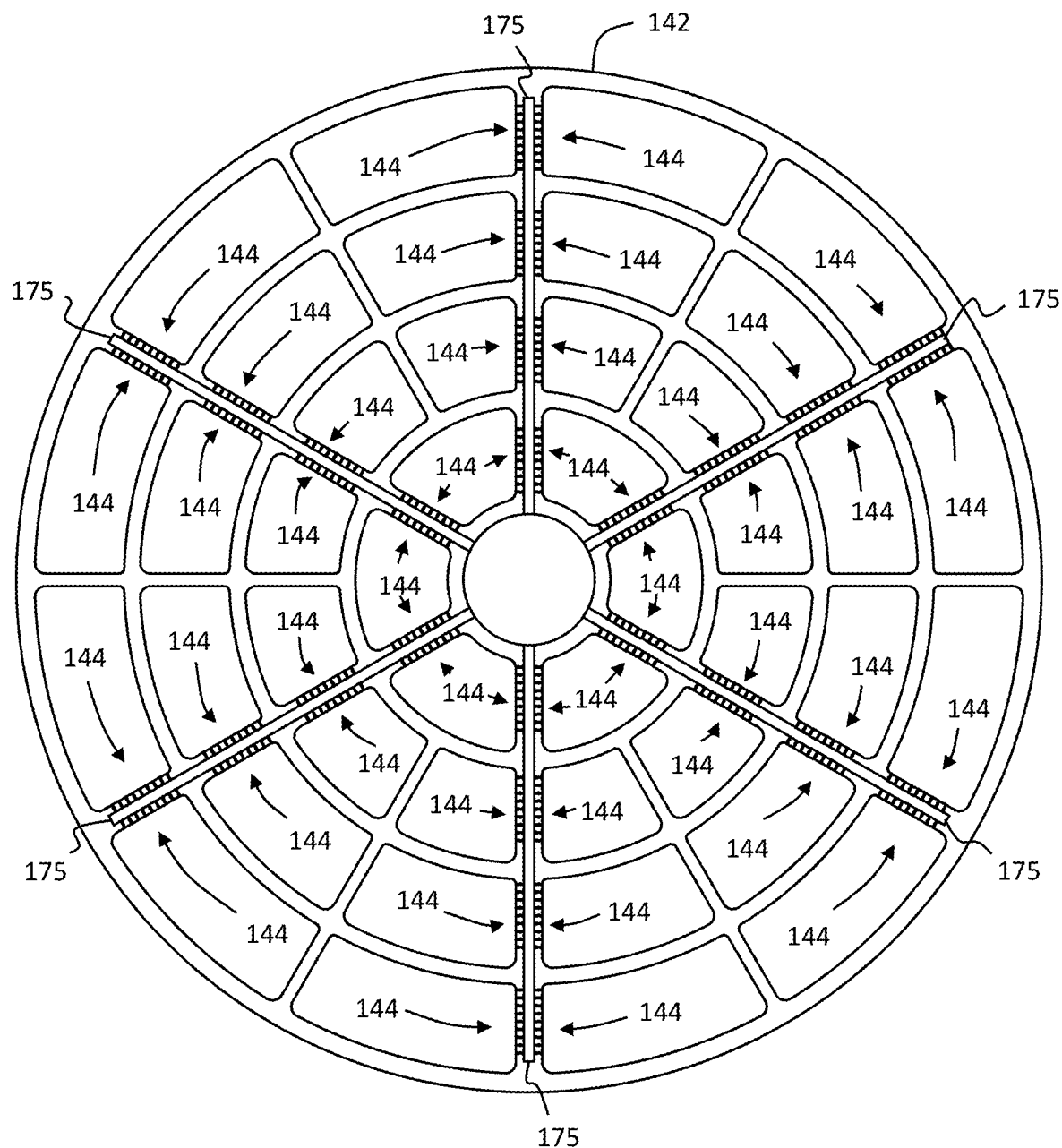
FIG. 6K is a top view of a dividing plate of the thermal switch of FIG. 6A.
Figure 6L:
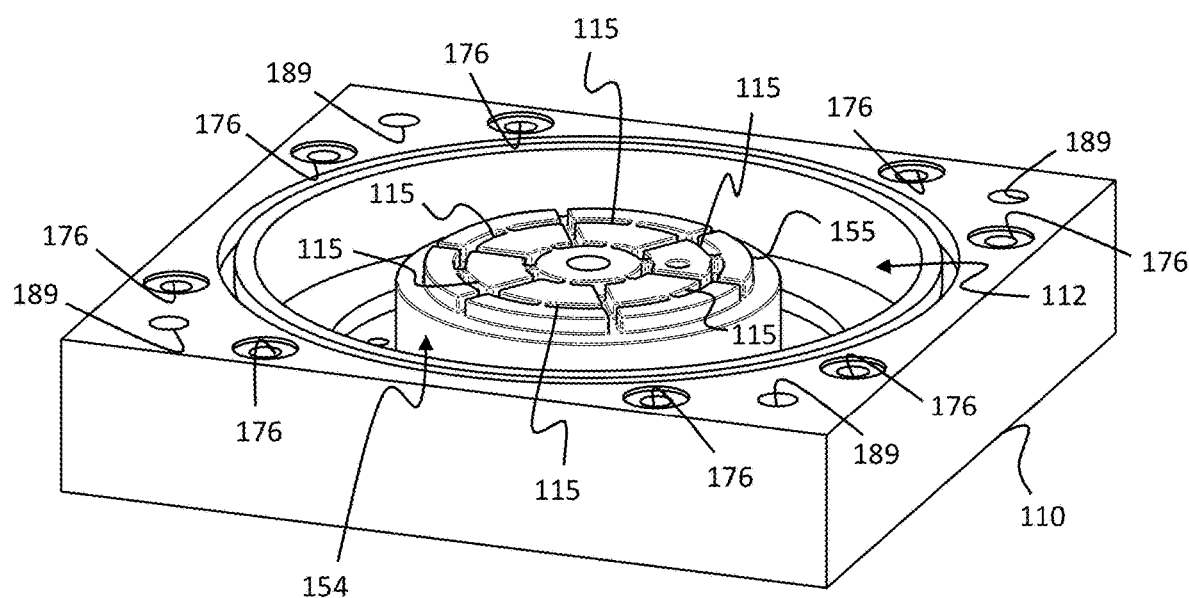
FIG. 6L is a second top view of the second plate of the thermal switch of FIG. 6A.
Figure 6M:
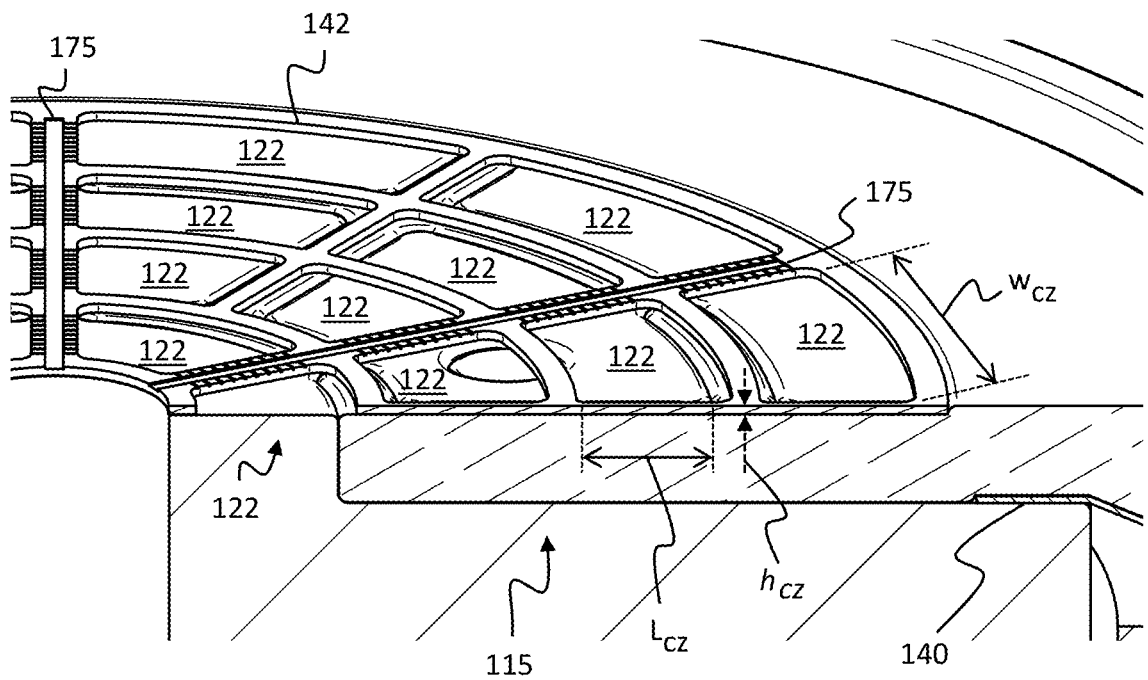
FIG. 6M is a perspective cutaway view of the second plate and the dividing plate of the thermal switch of FIG. 6A, with the thermal switch in an off-state.
Figure 6N:
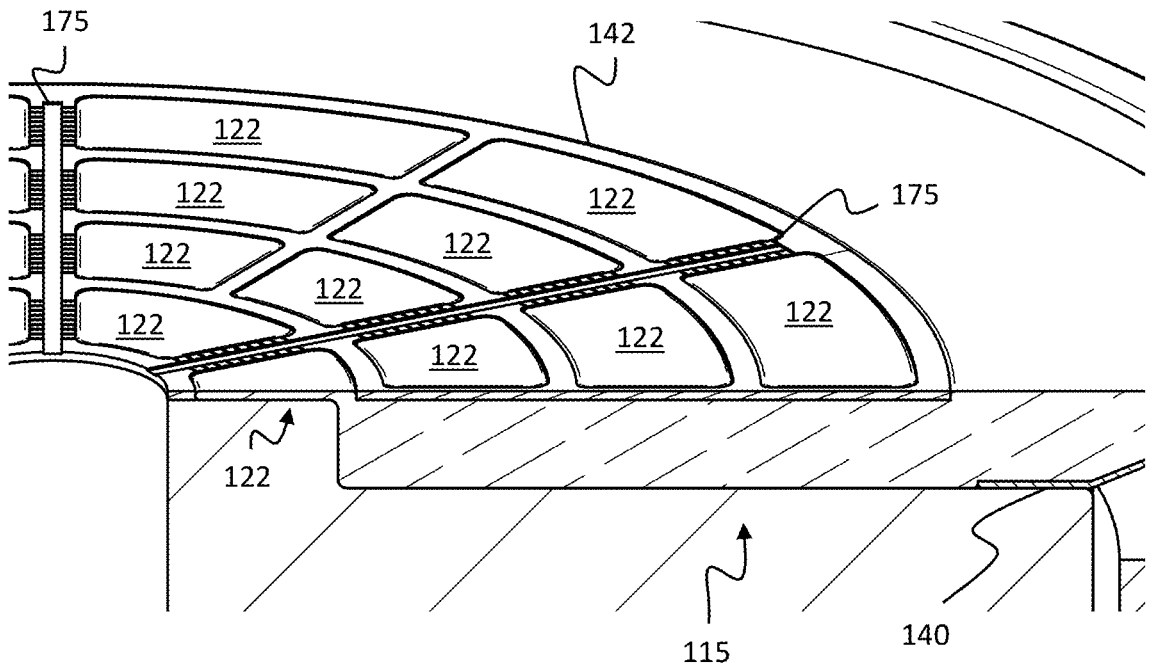
FIG. 6N is a perspective cutaway view of the second plate and the dividing plate of the thermal switch of FIG. 6A, with the thermal switch in an on-state.

With reference to FIGS. 6A-6N, a thermal switch 100 according to a fourth embodiment is shown. For purposes of discussion, the same reference numbers are used to refer to elements of the fourth embodiments as used in the first, second and/or third embodiments of the thermal switch 100, where appropriate or otherwise noted.

The thermal switch 100 of the fourth embodiment, is actuated by electrical power via an electric solenoid (see below). The thermal switch 100 is suitable in a general thermal control system, with components bolted to either side of the thermal switch 100. A variable thermal conductivity separates the two surfaces or sides of the thermal switch 100. The thermal conductivity is adjusted to a high or "on" state by energizing the switch's electrical connection and changed to low or "off" state by deenergizing the electrical power. An intermediate level of thermal conductivity may be achieved by pulsing the electrical power.

In a non-limiting example, the illustrated thermal switch 100 has a height of 1.25" and has a square profile with a width of 5.5".

In the illustrated embodiment, the thermal switch 100 of the fourth embodiment includes a first plate 108, a second plate 110, a first reservoir 124, a second reservoir 136 and an actuator 128. As discussed above, the first reservoir 124 contains a thermally conductive liquid 126, such as an alloy of gallium, indium, and tin, and the second reservoir 136 contains a gas 138. One or more ports 125 (see FIG. 6D) may be provided to allow the first reservoir 124 to be filled with the thermally conductive liquid 126 and to allow the second reservoir 136 to be filled with the gas 138. With respect to the thermally conductive liquid 126, after the first reservoir 124 is filled, the port(s) may be filled with a sealing grease, followed by a press fit aluminum plug (not shown).

The first plate 108 is composed from a thermally conductive material, such as aluminum, and forms a first side 148 of the thermal switch 100. For example, the first plate 108 may include a plurality of threaded apertures 188 and the first element 102 may be bolted or otherwise fastened to the first plate 108. It should be noted that the first element 102 may be otherwise thermally coupled to the first plate 108 including but not limited to via a thermally conductive interface or material, for example, thermal grease or other suitable means.

The second plate 110 is composed from a thermally conductive material, such as aluminum, and forms a second side 150 of the thermal switch 100. The second plate 110 includes a plurality of threaded apertures 176 and may be coupled to the first plate 108 by a plurality of threaded fasteners 158 that are threaded through threaded apertures 176 into associated receiving apertures (not shown) in the first plate 108. In the illustrated embodiment, the second side 150, an outer wall 152 extending from the second side 150 and the first side 148, surround the internal cavity 112 and form the housing 146. The second plate 110 may also include receiving apertures 189 to receive the fasteners (not shown) that fasten the second element 104 to the thermal switch 100.

The first reservoir 124 is coupled to the channel 114 and contains a thermally conductive liquid 126, for example, a liquid metal. In one embodiment of the present invention, the liquid metal is mercury. In another embodiment of the present invention, the liquid metal is a eutectic alloy, i.e., a mixture of metals having a melting point lower than that of any of its components. For example, the liquid metal may be an alloy composed of gallium, indium and tin. In a specific embodiment, the liquid metal is an alloy composed of 68.5% gallium, 21.5% indium and 10% tin. In another specific embodiment, the liquid metal is an alloy composed of 61% gallium, 25% indium, 13% tin and 1% zinc. However, it should be noted that other thermally conductive liquid mays be used without departing from the spirit of the invention.

With specific reference to FIGS. 6D, 6E, and 6I, the second plate 110 has an outer side wall 152 and an open top that forms an internal cavity 112. The first plate 108, second plate 110 and the internal cavity 112, form a housing 146 in which the remaining components of the thermal switch 100 are located.

With reference to FIGS. 6F, 6I, and 6J, the internal cavity 112, includes a post 154 that extends from an internal surface of the second side 150 towards the first side 148. The post 154, the outer wall 152 and bottom define a trench 156. The trench 156 is generally toroidal or ring-shaped and surrounds the post 154. A channel 114 has a first end 116 and a second end 118. As discussed in more detail below, the channel 114 is defined between the first side 148 or the first plate 108 and the post 154. The channel 114 is defined by (and between) an internal surface of the first side 148 and an upper surface of the post 154. The channel 114 defines a gap 120 between the first and second plates 108, 110.

In the illustrated embodiment, the channel 114 includes a plurality of pathways 115 formed in an upper portion 155 of the post 154, allowing the thermally conductive liquid 126 to flow from the first reservoir 124 to the conduction zones 122. The pathways 115 have a height greater than the height of conduction zones 122 and correspondingly lower minimum fluid pressure is required for fluid penetration. When the actuator 128 and the membrane 140 move from the first state to the second state, the thermally conductive liquid 126 withdraws only from the conduction zones 122 and remains in the pathways 115. The actuator 128 has a generally circular shape and surrounds the post 154. A dividing plate 142 (see FIGS. 6D, 6E, and 6I) is positioned between the first and second plates 108, 110 and is configured to divide the channel 114 (see below) into a plurality of conduction zones 122. The dividing plate 142 defines a plurality of gas channels 175 between the second reservoir 136 and the conduction zones 122. In one embodiment of the present invention, the dividing plate 142 is composed from a plastic material, such as polyoxymethylene and may be cut from a sheet of material using a laser cutting process.

The dividing plate 142 serves one or more of the following purposes:
  dividing the channel 114 into sections (or conduction zones) with a single flow path in and out of each respective conduction zone 122;
  separating the thermally conductive liquid 126 in the pathways 115 from the first plate 108 to decrease thermal conduction via the thermally conductive liquid 126 remaining in the pathways 115 in the off-state;
  providing a path for gas to flow out of the conduction zones 122; and,
  providing design flexibility.

Dividing the channel 114 into smaller conduction zones 122 assists in ensuring that all of the thermally conductive liquid 126 leaves or is pulled out of the channel 114 when the thermal switch 100 is in the off-state. Embodiments employing surface tension to pull the thermally conductive liquid 126 from the channel 114 rely on the surface of the volume of the thermally conductive liquid 126 remaining intact. That is, if a portion of the thermally conductive liquid 126 in the gap 120 separates from the bulk of the thermally conductive liquid 126 in the first reservoir 124, that portion will not be pulled from gap 120. Separation may be influenced by factors including adhesion between the thermally conductive liquid 126 and sides of the gap 120, a high rate of withdrawal, the geometry of the channels 114 and conduction zones 122, or the presence of multiple flow paths from a conduction zone 122 (thus the need to have only a single flow path). Dividing the channel 114 into smaller conduction zones 122 minimizes the risk of liquid separation. In one embodiment, a maximum conduction zone length of 0.2" was found to be effective to ensure all of the thermally conductive liquid 126 is withdrawn from the gap.

Further, the separate dividing plate provides design flexibility. If conduction zones were formed by steps in the second plate 110, then the conduction zone design would be fixed. A separate dividing plate 142 provides the ability to customize the size of conduction zones prior to assembling the thermal switch 100 by changing the dividing plate rather than the second plate 110 which is aluminum.

Each conduction zone 122 has at least one gas entry/exit point 144 located between the second reservoir 136 and the channel 114. The at least one gas entry/exit point 144 may be located between an interior surface of the first plate 108 and an upper surface of the post 154. For example, in the illustrated embodiment (shown in FIG. 6K), the gas entry/exit points 144 are formed within the sidewalls of the gas channels 175. The at least one gas entry/exit point 144 is configured to minimize entry of the thermally conductive liquid 126 into the at least one gas entry/exit point 144. For example, in one aspect of the present invention, a height of the at least one gas entry/exit point 144 is less than a height of the gap 120.

Returning to 6F, which is a cross-section view of A-A from FIG. 6B, the first reservoir 124 is coupled to the first end 116 of the channel 114 and contains a thermally conductive liquid 126. As shown, the first reservoir 124 is generally toroidal or ring-shaped and surrounds the center post 154.

In the illustrated embodiment, the first and second plates 108, 110 are thermally isolated by a shim 162. In the illustrated embodiment (see FIG. 6I), a plastic washer 162B sits in each threaded aperture 178 in the second plate 110. Alternatively, a single plastic shim (not shown) that covers at least a portion of the upper surface of the outer wall 152 may be used. The shim 162 or plastic washers 162B provide thermal isolation between the plates 108, 110 while allowing relative movement therebetween as the first plate 108 expands and contracts.

Returning to FIG. 6F, the thermal switch 100 of the fourth embodiment may further include an oxygen seal 190. In the illustrated embodiment, the oxygen seal 190 is located between an interior surface of the first plate 108 and an upper surface of the outer wall 152 (adjacent fasteners. The oxygen seal 190 restricts oxygen from entering the internal cavity 112 of the thermal switch 100 while allowing movement between the first and second plates 108, 110. In the illustrated embodiment, the oxygen seal 190 is positioned around the entire perimeter of the internal cavity 112 between the first and second plates 108, 110. The oxygen seal 190, including several embodiments, is described in further detail below. In one aspect of the present invention, the oxygen seal 190 keeps oxygen out of the internal cavity 112 of the thermal switch 100 or minimizes the amount of oxygen that is allowed to enter the internal cavity 112 of the thermal switch 100. In another aspect of the present invention, the oxygen seal 190 may capture any oxygen that is within the interior 112 of the thermal switch 100.

As shown in FIGS. 6F, 6H, and 6I, the actuator 128 is coupled to the first reservoir 124 and a first end 116 of the channel 114. In the illustrated embodiment, the actuator 128 includes an electric solenoid 192. The electric solenoid 192 includes a solenoid coil 194 in a solenoid case 196. Preferably, the solenoid coil 194 is composed from copper wire. The solenoid case 196 has a general circular shape and is open on an interior side (see FIGS. 6A and 6I). The solenoid case 196 and the solenoid coil 194 may be connected to the bottom of the trench 186 using fasteners, adhesive or by any suitable means. In one embodiment of the present invention, the solenoid case 196 is composed from stainless steel, such as 430 stainless steel.

The electric solenoid 192 further includes a circular or toroidal-shaped plunger 198. As shown on the left side of FIGS. 6F and 6H, the plunger 198 includes one or more internal cavities 112 for receiving a respective bearing assembly 200. The bearing assembly 200 is mounted on a bearing post 202 which is preferably composed from carbon steel. The bearing assembly 200 includes a linear ball bearing 204 which is located between the bearing post 202 and a bearing buffer 206. The bearing buffer 206 allows the linear ball bearing 204 to shift slightly within the plunger 198 (to allow for manufacturing tolerances and thermal expansion). In one embodiment, the bearing buffer 206 is composed of silicone.

Energization of the electric solenoid 192 creates a magnetic field which results in a force being applied to the plunger 198. The application of the force on the plunger and resultant movement of the plunger 198 results in the displacement of the thermally conductive liquid 126.

In one embodiment, three bearing assemblies 200 are spaced about the periphery of the plunger 198. The bearing assemblies keep the plunger centered within the solenoid case. As shown on the right side of FIG. 6F, one or more compression springs 208, preferably composed from stainless steel, located in a respective aperture 210 of the plunger 198 support the weight of the plunger 198. In one embodiment, three compression springs 208 are spaced about the periphery of the plunger 198.

As shown in FIG. 6I, in the illustrated embodiment, the plunger 198 includes a plunger core 198A and a plunger liner 198B. The plunger 198 must be magnetic so that the plunger 198 reacts to the magnetic field created by the electric solenoid 192. To reduce weight and/or cost, the plunger core 198A may be made from a non-magnetic material, such as aluminum. The plunger liner 198B may be bonded to an outer surface of the plunger core 198A (as shown) and composed from a magnetic material, such as 430 stainless steel.

In an alternate embodiment, the actuator 128 includes a pneumatic actuator (instead of an electric solenoid). In one embodiment, the pneumatic actuator includes a plunger and one or more bellows, e.g., three bellows (see below).

With reference to the exploded view of FIG. 6I, in the illustrated embodiment, the trench 156 includes an inner sub-trench 156A and an outer sub-trench 156B. The inner and outer sub-trenches 156A, 156B are concentric. The plunger 198 and the solenoid coil 194 and solenoid case 196 are concentric and fit within the inner and outer sub-trenches 156A, 156B, respectively.

As shown in FIGS. 6F and 6I, the thermal switch 100 includes a membrane 140 that is positioned adjacent the plunger 198 of the actuator 128. In the illustrated embodiment, the membrane 140 is toroidal or ring-shaped and fits within the circular trench 156. In the illustrated embodiment, an inner edge of the membrane 140 is bonded to the second plate 110. An outer edge of the membrane 140 is clamped to the solenoid case 196 by the seal 222.

A middle portion of the membrane 140 is bonded to the plunger 198. A vent ring 218 with laser scored slits allows gas, but not the thermal conduct liquid, to vent between the first reservoir 124 and solenoid/plunger area. In one embodiment, the vent ring 218 is composed from a plastic material, such as polyoxymethylene. A seal 222 creates an outer perimeter of the first reservoir 124. In one embodiment of the present invention, the seal 222 has a rectangular cross-section and is composed from synthetic rubber, such as a fluoropolymer elastomer.

An up-stop bumper 224 may be bonded to an upper surface of the plunger 198 and a down-stop bumper 226 may be bonded to a lower surface of the plunger 198 as shown to minimize impact between the plunger 198 and the first and second plates 108, 110, respectively. In one embodiment, the bumpers 224, 226 are composed from a synthetic rubber such as a fluoropolymer elastomer material.

Energization of the solenoid coil 194 creates a magnetic field which acts on the plunger 198. The membrane 140 is connected to the plunger 198 and moves with movement thereof.

As discussed above, the channel 114 is formed between an internal surface of the first side 148 of the switch 100 and a surface of the (center) post 154.

FIGS. 6M and 6N provide views of the internal cavity 112 of the thermal switch 100 when in the off and on-states, respectively. In the illustrated embodiment, the first reservoir 124 and the dividing plate 142 define the plurality of conduction zones 122. As shown, the dividing plate 142 is located above the first reservoir 124. The gas channels 175 formed by the dividing plate 142 connect the second reservoir 136 to the conduction zones 122.

As shown in FIG. 6M, when the thermal switch 100 is in the off-state, the actuator 128 is in the second state and the membrane 140 is in the second position (see above). When the thermal switch 100 is in the fully off-state, the conduction zones 122 are free from the thermally conductive liquid. Gas from the second reservoir 136 flows through the gas channels 175 and into the conduction zones 122 via the gas entry/exit points 144. In the illustrated embodiment, the gas entry/exit points 144 are laser cut into the dividing plate 142. In one embodiment, the depth of the gas entry/exit points 144 may be less than 0.001" (with a similar width) to ensure that the thermally conductive liquid 126 does not enter the gas channels 175. As the thermally conductive liquid 126 flows into the gap 120, gas flows via the gas entry/exit points 144 in the dividing plate 142 into the second reservoir 136. In one embodiment, the second reservoir 136 has a volume much larger than the thermally conductive liquid displacement volume, so the increase in gas pressure due to the movement of the thermally conductive liquid 126 is relatively small.

The membrane 140 is moveable between the first and second positions in response to the actuator 128 being switched from the first state to the second state. The thermally conductive liquid 126 is pushed into the gap 120 from the first reservoir 124 and gas 138 is pushed from the gap 120 to the second reservoir 136 as the membrane 140 is moved from the second position to the first position. The thermally conductive liquid 126 flows from the conduction zones 122 to the first reservoir 124 and gas 138 in the second reservoir 136 flows into the conduction zones 122 in response to the membrane 140 being moved from the first position to the second position.

The second reservoir 136 is coupled to the second end 118 of the channel 114 and contains a gas 138. In the illustrated embodiment, the second reservoir 136 is located within the post 154. The actuator 128 is coupled to the first reservoir 124 and the first end 116 of the channel 114.

The actuator 128 is coupled to the first reservoir 124 and the channel 114. The actuator 128 is moveable between a first state (shown in FIG. 6M) and a second state (shown in FIG. 6N) corresponding to the on-state and the off-state of the thermal switch, respectively. The actuator 128 is configured to allow the thermally conductive liquid 126 to flow from the first reservoir 124 to the channel 114 when the actuator 128 is in the first state and to allow the thermally conductive liquid 126 to flow from the channel 114 to the first reservoir 124 when the actuator 128 is in the second state.

When the electric solenoid 192 is energized, the plunger 198 and the membrane 140 are moved towards the first position (shown in FIG. 6N). Movement of the membrane 140 towards the first position forces the thermally conductive liquid 126 into the conduction zones 122. The gas that was in the conduction zones 122 is forced back through the gas entry/exit points 144, through the gas channels 175 and into the second reservoir 136. The sizing of the gas entry/exit points 144 assists in minimizing or eliminating the risk of thermally conductive liquid 126 from entering the gas channels 175. In one embodiment, the height of the gas entry/exit points 144 is less than or equal to 0.002". In another embodiment, the height of the gas entry/exit points 144 is less than or equal to 0.0003".

Each conduction zone 122 has a width, $w_{cz}$. In one embodiment, the width of each conduction zone 122 is less than or equal to 1 inch.

In one embodiment, the height, $h_{cz}$, of each conduction zone 122 is less than or equal to 0.2 inches. In another embodiment, the height, $h_{cz}$, of each conduction zone 122 is less than or equal to 0.1 inches. In still another embodiment, the height, $h_{cz}$, of each conduction zone 122 is less than or equal to 0.02 inches.

The gas gap 166 includes a gas entry/exit point 144 between the second reservoir 136 and the channel 114 (see above). The gas entry/exit point 144 configured to minimize entry of the thermally conductive liquid 126 into the at least one gas entry/exit point, and thus, the second reservoir 136. For example, in one embodiment, a height of the entry/exit point 144 ($h_{gas\_gap}$) is less than a height of the gap ($h_{cz}$). As explained above, the presence of the second reservoir 136 allows the liquid metal to flow further into the channel 114 without causing a significant increase in gas pressure within the channel 114.

In the on-state, heat is conducted through the first plate 108, then the gap 120 and conduction zones 122 (which are filled with the thermally conductive liquid 126) and finally the second plate 110. The first plate 108, the thermally conductive liquid 126 in the gap 120 and the second plate 110 contribute to the overall thermal conductivity of the thermal switch 100.

Gas Seal

As stated above, the thermally conductive liquid 126 may oxidize in the presence of oxygen. For example, if a gallium alloy is used, oxidation of gallium will result in a surface layer of gallium oxide which may interfere with the operation of the thermal switch 100. Thus, elimination or reduction of the oxygen within the internal cavity 112 of a device is desirable. The device may be a thermal device, such as a thermal switch 100, which during operation has one component that has an operating temperature higher than another component. In one or more of the embodiments of the thermal switch 100 discussed herein, a seal 190 may be used to eliminate or reduce the amount of a gas, e.g., oxygen, that is allowed to enter the internal cavity 112 and/or eliminate any gas that does pass into the internal cavity 112.

It should be noted that while the below embodiments are discussed with respect to the thermal switch 100, the embodiments of the oxygen seal 190 may be utilized in any device in which it is desirable to eliminate or reduce the amount of a gas, such as oxygen, that is within or enters an internal cavity.

When a gas needs to be excluded from a vessel, a typical solution would be to form a hermetic seal by any of the many ways known in the art, such as welding or sealing with glass. However, since the thermal switch 100 is being used to control conductive heat transfer, one side of the thermal switch 100 will generally have a higher temperature than the other side. The resulting (repeated) differential thermal expansion of one of the sides of the thermal device poses a significant challenge to maintaining the integrity of the thermal switch 100.

Thermal expansion is the tendency of material to increase in volume in response to an increase in temperature. The amount of expansion varies with temperature but is often approximated by a linear coefficient of thermal expansion (CTE). The CTE of aluminum is 23.4×10-6/° C. As an example, a thermal switch 100 may be circular, composed of aluminum and have a diameter of 18". In this example, if the hot side is heated to 120° C., while the cold side cooled to 25° C., the hot side expands relative to the cold side by 0.040". So, at the outer diameter of the thermal switch 100, a seal or joint will experience 0.020" of radial movement. The fatigue created by repeated cycles of thermal expansion and contraction will result in failure of prior art hermetic seals.

It should be noted that the seal 190 described below may be useful in any device having an internal cavity in which it is desirable to restrict entry and/or eliminate the presence of a gas from the internal cavity 112. Further, in the described embodiment, the gas to be restricted/eliminated is oxygen. However, the seal 190 described below may be adapted to restrict entry and/or eliminate the presence of any gas. In one aspect, the seal 190 includes a sealing component 240 and an absorbing component 242. In the illustrated embodiment, the device 100 includes first and second plates 108, 110 which form a housing 146. The housing 146 includes an interface 244 formed between the first and second plates 108,110. The sealing component 240 is located within the housing 146 and is coupled to the interface 244 and configured to restrict entry of a gas from the external environment to the internal cavity 112. The absorbing component 242 is located within the housing 146 between the sealing component 240 and the internal cavity 112 and is configured to absorb a specific gas or gases that pass the sealing component 240.

Figure 7A:
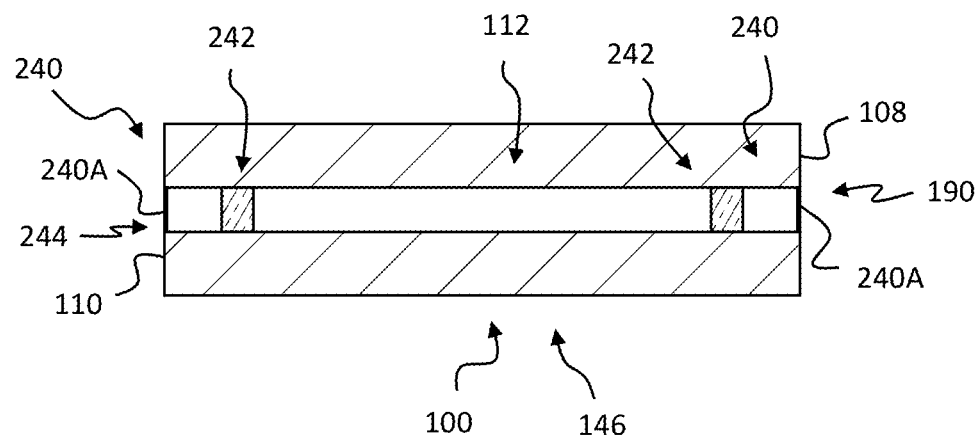
FIG. 7A is a simplified view of a seal, according to a first embodiment.
Figure 7B:
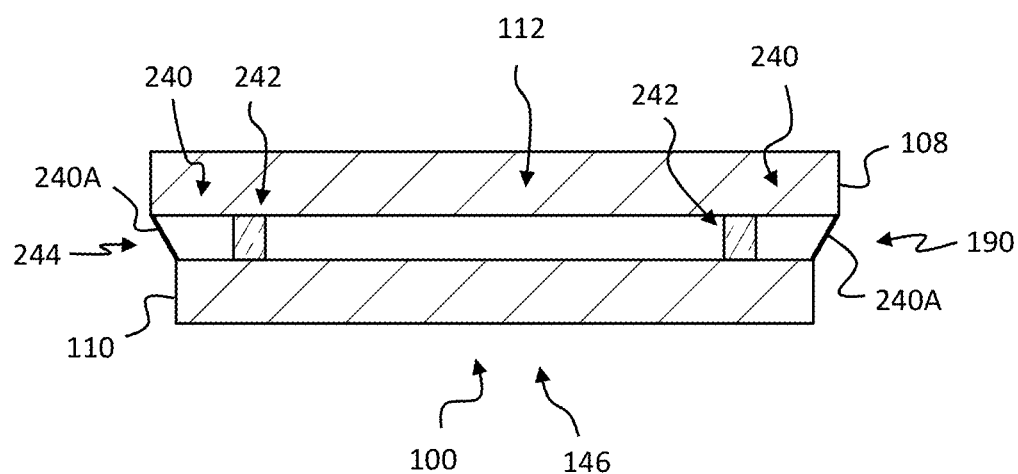
FIG. 7B is a second simplified view of the seal of FIG. 7A.

In a first embodiment as shown in FIG. 7A, a simplified view of the first and second plates 108, 110 of an exemplary device 100 is shown. In FIG. 7A, the first and second plates 108, 110 are shown at approximately the same temperature, and thus, are the same size. In FIG. 7B, the first plate 108 is at a higher temperature than the second plate 110, and thus, is shown at a larger size. In the first embodiment, the sealing component 240 includes a flexible seal 240A. The flexible seal 240A connects the first and second plates 108, 110 at an outer circumference thereof. The flexible seal 240A may be made of a flexible material.

Figure 7C:
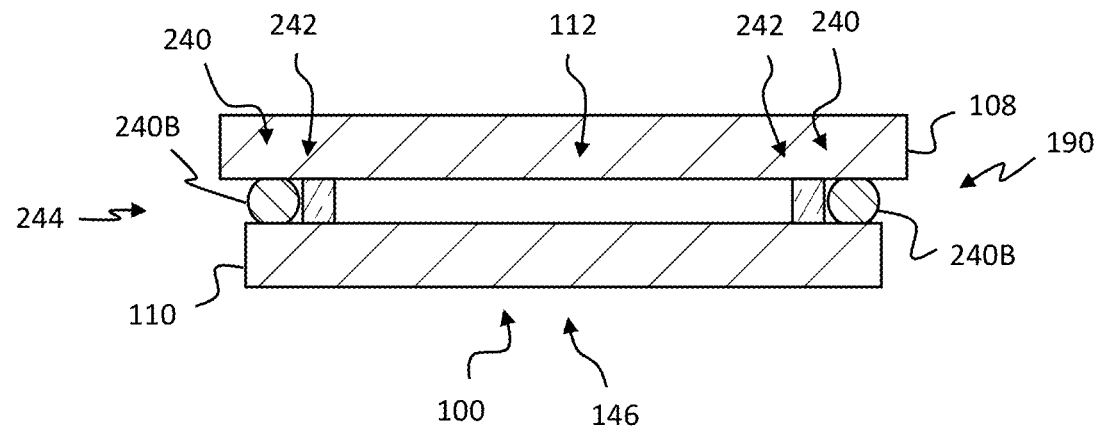
FIG. 7C is a simplified view of a seal, according to a second embodiment.
Figure 7D:
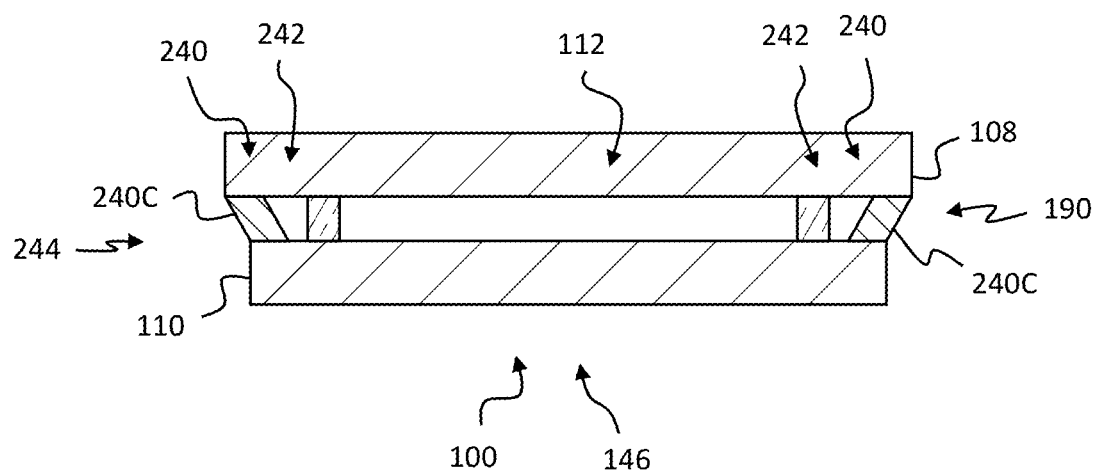
FIG. 7D is a simplified view of a seal, according to a third embodiment.

In a second embodiment, shown in FIG. 7C, the sealing component 240 may include an O-ring 240B. The O-ring 240B may be located within a trench in one or both of the first and second plates 108, 110 (not shown).

In a third embodiment, the sealing component 240 may include a seal 240C made from an elastomer which is bonded to the first and second plates 108, 110. In the first three embodiments, the sealing elements 240A, 240B, or 240C are in direct contact with the first plate 108. Consequently, the temperature of the sealing element is elevated during operation of the thermal switch. Elevated temperature may contribute to a high level of gas permeation through the sealing element.

Gas permeation is the penetration of a gas through a solid. It results from the diffusion of a permeant gas through the solid material. The rate of diffusion as a function of temperature generally follows an Arrhenius relationship. Consequently, the rate of permeation increases in a roughly exponentially manner with increasing temperature, with a lesser effect contributed by any temperature dependence of gas solubility. Elastomer materials, whose flexibility would otherwise make them a desirable seal material, are particularly susceptible to gas permeation. The elevated elastomer temperature present in the previous seal embodiments makes them unacceptable for some uses of a thermal switch.

Figure 7E:
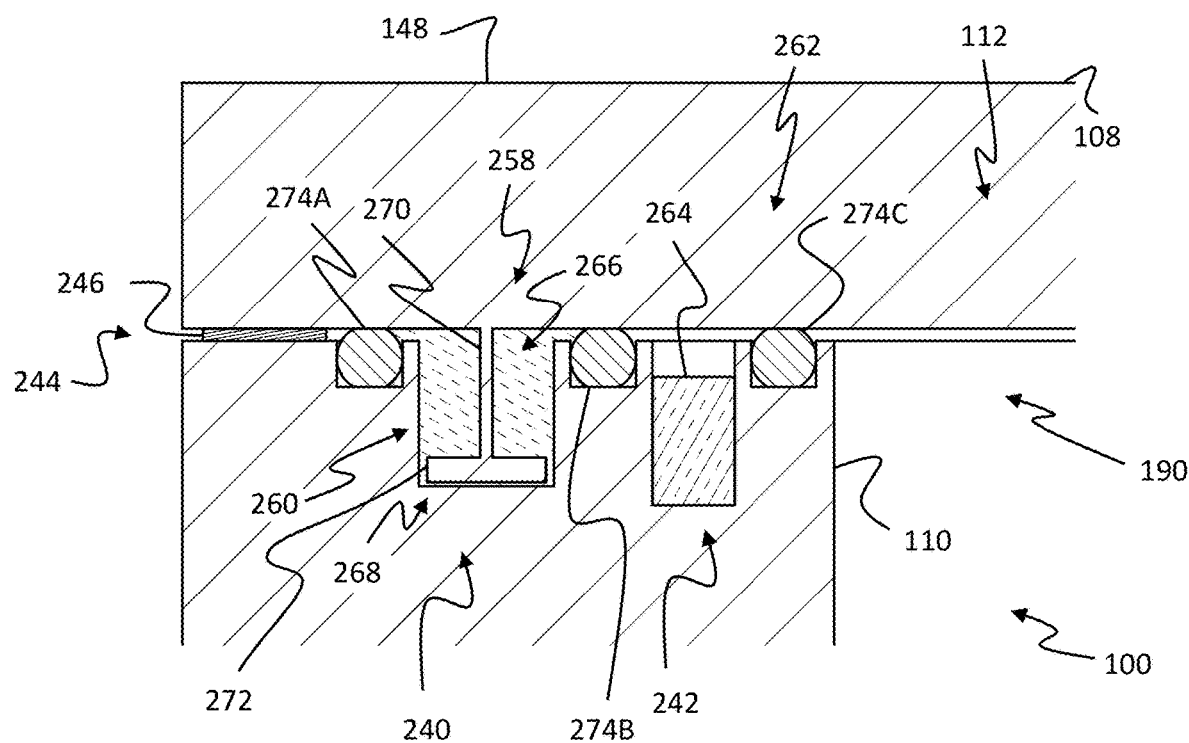
FIG. 7E is a partial cross-sectional view of a seal, according to a fourth embodiment.

With reference FIGS. 7E and 7E-1, a fourth embodiment of the seal 190 is shown. In the fourth embodiment, the seal 190 is utilized in a thermal device, such as a thermal switch 100. The thermal switch 100 has a housing 146 formed from a first plate 108 and a second plate 110 which are coupled together using a plurality of fasteners, such as bolts (not shown). The housing 146 has a first side 148 and a second side 150 and may have a square or circular cross-section (or footprint), see FIGS. 4A and 6A. A partial cross-section of the thermal device 100 is shown in FIG. 7E.

The first and second plates 108, 110 are separated by a plastic shim 246 forming an interface 244 between an internal cavity 112 and the exterior environment. The plastic shim 246 supports the bolt load, spaces the first and second plates 108, 110 at a desired separation, and allows sliding movement as the first plate 108 expands thermally.

The seal 190 includes a sealing component 240 and an absorbing component 242. The sealing component 240 is located within the housing 146 and coupled to the interface 244. The interface 244 is located within the seam between the first and second plates 108, 110 and traverses the outer perimeter of the housing 146. The sealing component 240 is configured to restrict entry of a gas, e.g., oxygen, from the external environment to the internal cavity. The absorbing component 242 is located within the housing 146 between the sealing component 240 and the internal cavity 112 configured to absorb any gas, e.g., oxygen, that passes the sealing component 240.

The sealing component 240 includes a first cavity 258 within the housing 146. In the illustrated embodiment (see in particular FIG. 7E-1), the first cavity 258 is trench that has a toroidal shape that traverses the outer perimeter of the housing 146. The first cavity or trench 258 is coupled to the interface 244 and surrounds the internal cavity 112. As shown, in the illustrated embodiment the first trench 258 contains a gas blocking material 260, such as grease or vacuum grease.

In one embodiment, the blocking material 260 has an oxygen permeability less than $$5000 \frac{cm^3 \cdot mm}{m^2 \cdot day \cdot atm}$$

at 25° C. and a viscosity less than 1000 Pa·s at 25° C. In another embodiment, hydrocarbon vacuum grease is utilized as the gas (oxygen) blocking material 260. Hydrocarbon vacuum grease is composed of extremely high molecular weight hydrocarbons, and consequently has low vapor pressure. Low vapor pressure enables injection into the first cavity 258 with minimal voids, which if present may create a path for rapid oxygen diffusion. Evacuating the first cavity 258 prior to injecting the gas blocking material 260 minimizes voids, however the cavity 258 may be evacuated to a minimum pressure no lower than the vapor pressure of the blocking material 260.

The viscosity of hydrocarbon vacuum grease decreases significantly with increasing temperature (more so than silicone based vacuum grease). This variation may be employed when the hydrocarbon grease is injected into cavity 258. Decreased viscosity will allow injection at moderate pressure. The grease may be heated for the purpose of mixing in oxygen absorbing materials (see below). The hydrocarbon grease may be heated for mixing and then cooled quickly to create a stable suspension of otherwise immiscible components. The thermal expansion of hydrocarbon grease (approximately 0.1%/° C. may be utilized as a passive actuation mechanism (as discussed below). One suitable hydrocarbon vacuum grease is available from Kurt J Lesker Company under the tradename Apiezon.

The absorbing component 242 includes a second cavity 262 within the housing 146. In the illustrated embodiment, the second cavity 262 is a trench that has a toroidal shape that traverses the outer perimeter of the housing 146. As shown, the second cavity or trench 262 is coupled to the interface 244 and surrounds the internal cavity 112. The second trench 262 of the absorbing component 242 contains a gas absorbing material 264. In one embodiment, the gas absorbing material 264 includes a composition that includes a polyunsaturated fatty acid, e.g., linoleic or oleic acid mixed with a metal catalyst, e.g., iron oleate and a non-organic binder, e.g., magnesium oxide. One suitable gas absorbing material is available from Mitsubishi Gas Chemical America under the trademark RP System®. In another embodiment, a copper-based catalyst may be used, such as the copper-based catalyst R3-11 available from BASF. In yet another embodiment, an oxygen absorbing material including iron powder may be used.

It should be noted that the first and second trenches 258, 262 may be the same trench and the gas blocking material 260 and the gas absorbing material 264 may be mixed and/or combined together.

The sealing component 240 may include an isolating element 266 that extends from the one of the first and second plates 108, 110 into the first trench 258. In the illustrated embodiment, as shown in FIG. 7E, the isolating element 266 forms a gap 268 between the isolating element and the other one of the first and second plates 108, 110. As shown, the gap 268 is filled with the gas blocking material 260.

In one embodiment, the isolating element 266 includes a fin 270 extending from the one of the first and second plates 108,110 and a flange 272 connected to the fin 270. As shown, in the illustrated embodiment, the fin 270 extends from the first plate 108 and the gap 268 is located between the flange 272 and the second plate 110. A plurality of O-rings 274A, 274B, 274C separate the first trench 258 from the external environment, the first and second trenches 258, 262, and the second trench 262 from the internal cavity 112.

The fin 270 provides thermal isolation such that the flange 272 remains cool, with a temperature close to that of the second plate 110. As explained above, the rate of permeation increases exponentially with temperature, so to create an effective gas seal, the temperature of the gas blocking material 260 must be minimized. The gap 268 between the flange 272 and the second plate 110 is the location where the permeation of oxygen is most restricted. It is narrow, long, and has a reduced temperature, thus creating an optimal oxygen seal, while still permitting relative movement of the flange 272 and the second plate 110. In the illustrated embodiment, the fin and flange 270, 272 are machined features of the first plate 108. Alternatively an isolating element may be formed by joining a separate component to the first plate 108 by means of soldering or brazing, mechanical fastening, press fitting, or by pressing the component against the first plate 108 by means of a spring or other elastic component. The isolating element 266 may be a fin made out of the same material as the first plate 108, as illustrated, or alternately, a component formed of a material with low thermal conductivity.

The third O-ring 274C seals a volume of the second trench 262 filled with the oxygen absorbing material 264. The third O-ring 274C causes the oxygen permeating past the sealing component 240 to dwell in the second trench 262 sufficiently long to react with the absorbing material 264.

The first O-ring 274A, the sealing component 240 and the second O-ring 274B create a first oxygen seal that is aimed at eliminating or reducing the amount of oxygen that enters the internal cavity 112 from the external environment. However, a small amount of oxygen may pass this first seal 274A, 240, 274B. In this embodiment, the third O-ring 274C acts as a second oxygen seal that traps the any oxygen that does pass the first oxygen seal 274A, 240, 274B, trapping the oxygen in the absorbing component 242 to allow it to be absorbed by the gas absorbing material 264.

Some variations on the basic design shown in FIG. 7E may be desirable, depending on the requirements of a particular thermal application, e.g., operating temperature, switch size, structural loads, etc. . . . .

Figure 7F:
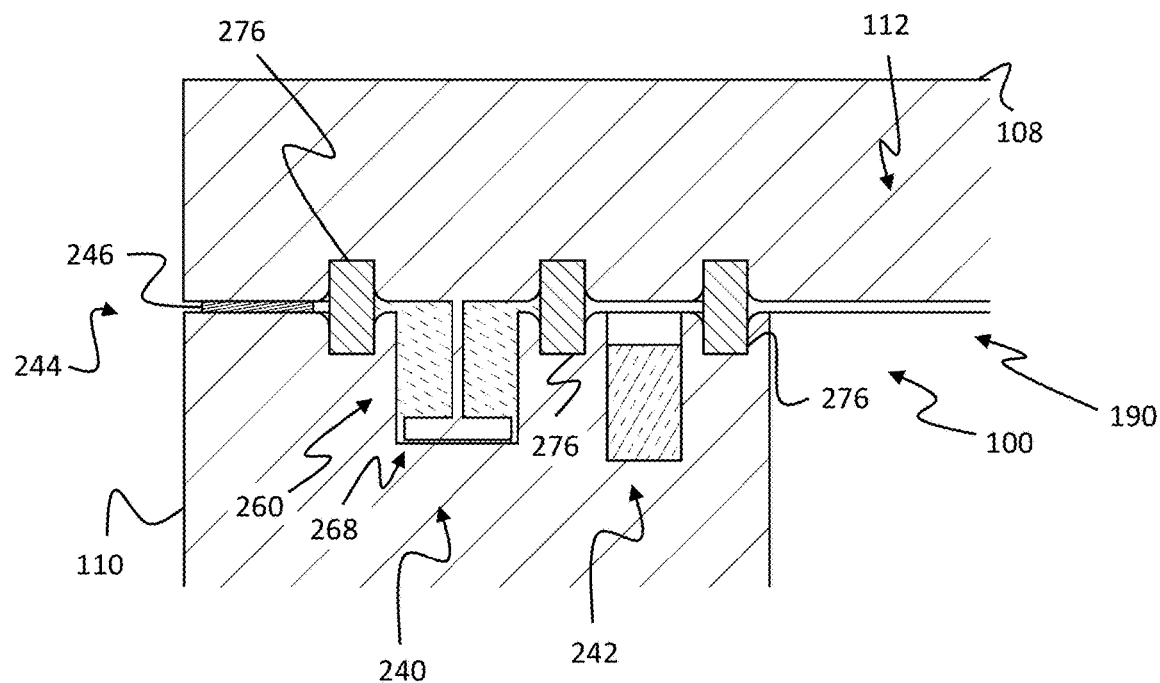
FIG. 7F is a partial cross-sectional view of a seal, according to a fifth embodiment.
Figures 1, 7E:
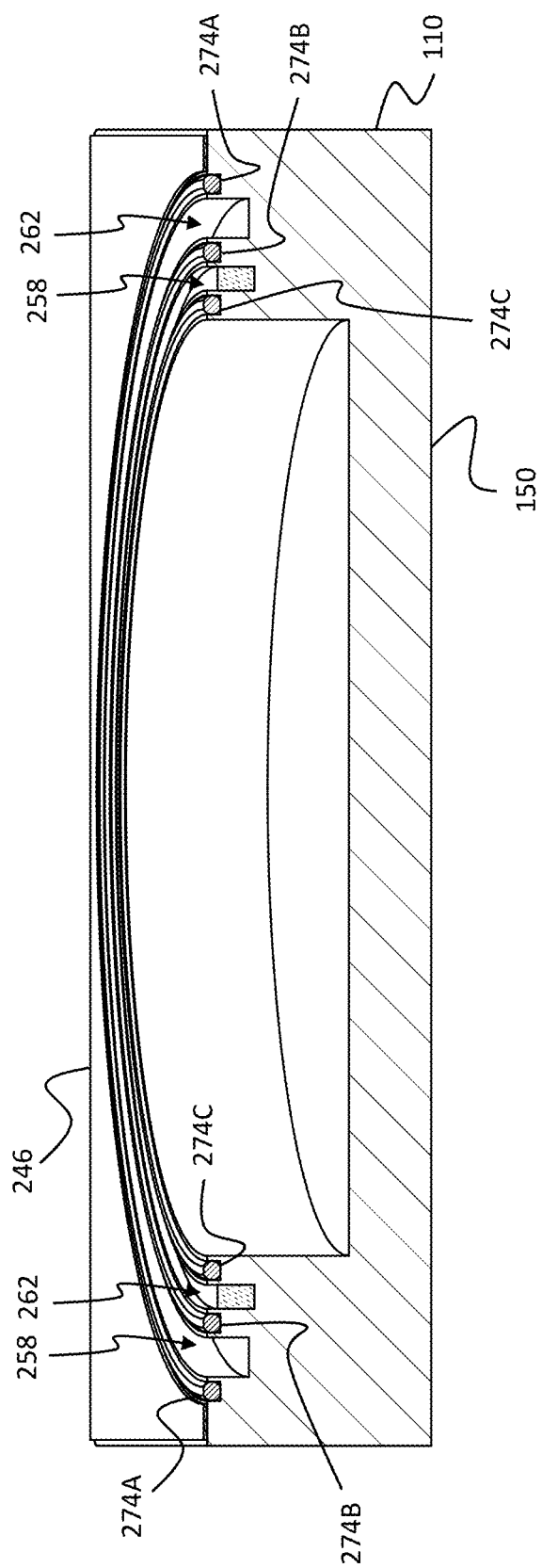

With reference to FIG. 7F, rectangular seal elements 276 may be used in place of the O-rings 274A, 274B, 274C. The advantage of using rectangular seal elements is that the thermal expansion of the first plate 108 may result in flexing of the rectangular seal elements 276 (rather than the O-rings 274A, 274B, 274C sliding on the first plate 108). This may be beneficial in larger switch designs, where the relative movement of the first and second plates 108, 110 is larger and there is a greater risk of grease leaking past the O-ring(s) as a result of the repeated sliding movement. For smaller switches, O-rings may have sufficient lateral flexibility so that sliding would not occur, and thus rectangular seals would be unnecessary. It should also be noted, that as shown in FIG. 7F, the isolating element 266 is physically connected to, or extends from, the first plate 108.

Figure 7G:
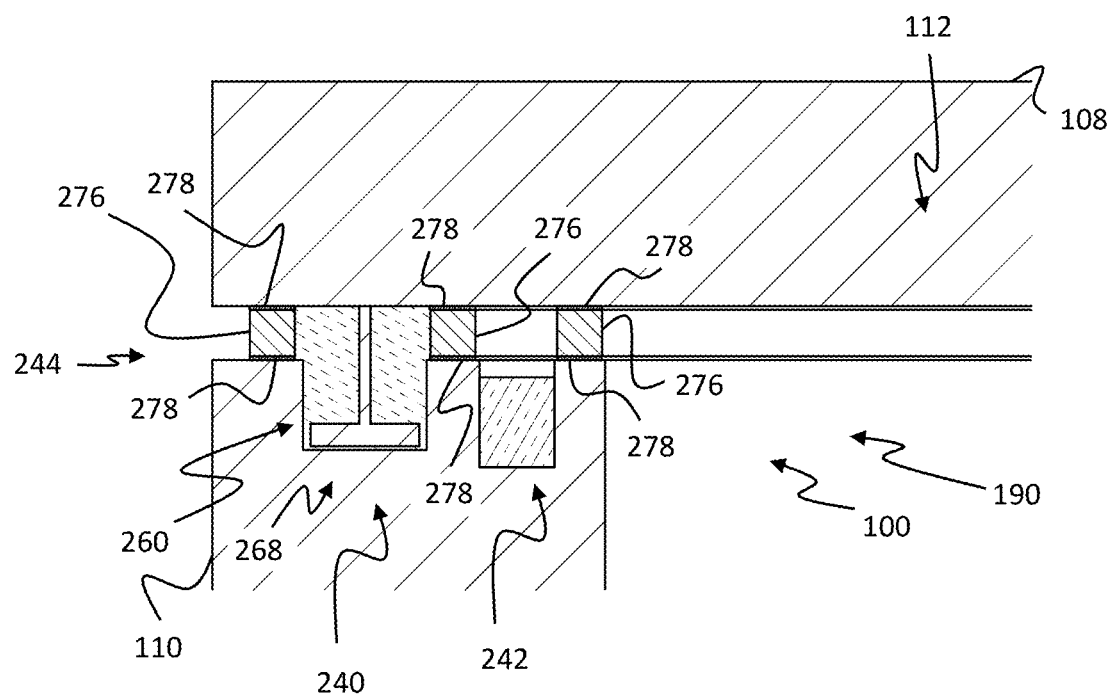
FIG. 7G is a partial cross-sectional view of a seal, according to a sixth embodiment.

With reference to FIG. 7G, in another embodiment, an adhesive material 278 is used to bond the rectangular elastomer seal elements 276 to the first and second plates 108, 110. The rectangular seal elements 276 are capable of supporting a structural load, thus the need for bolts or fasteners to couple the first and second plates 108, 110 may be eliminated. Contact between the first and second plates 108, 110 via the shim 246, could also be eliminated. It should be noted that the embodiment shown in FIG. 7G may result in a lower maximum operating temperature of the thermal switch 100. Adhesives capable of bonding an elastomer to a metal may have a lower maximum operating temperature than the elastomer itself. Additionally, the bonded seal would support less structural load than a bolted design.

In applications where space within the thermal device is limited, it may be desirable to eliminate the second trench 262, i.e., a separate oxygen absorber reservoir, by incorporating the gas (oxygen) absorbing material into the gas (oxygen) blocking material 260. For example, it may be possible to mix a liquid fatty acid, along with a metal catalyst, directly into the grease.

Further, in other embodiments, other materials may be added to the vacuum grease for the purpose of decreasing oxygen permeability, which may allow the cooler side of the thermal switch to be operated at even higher temperatures than otherwise achievable.

Nanoclays are naturally occurring minerals which can be exfoliated into extremely thin plate-like particles and can be used as an additive to polymer materials to decrease gas permeability. Adding a nanoclay to vacuum grease may further decrease gas permeability.

In alternative embodiments, gas or oxygen seals that do not use vacuum grease might be feasible for some applications, particularly those where the diameter of the thermal device is small and the temperature differential between the hot and cold side is relatively small.

Figure 7H:
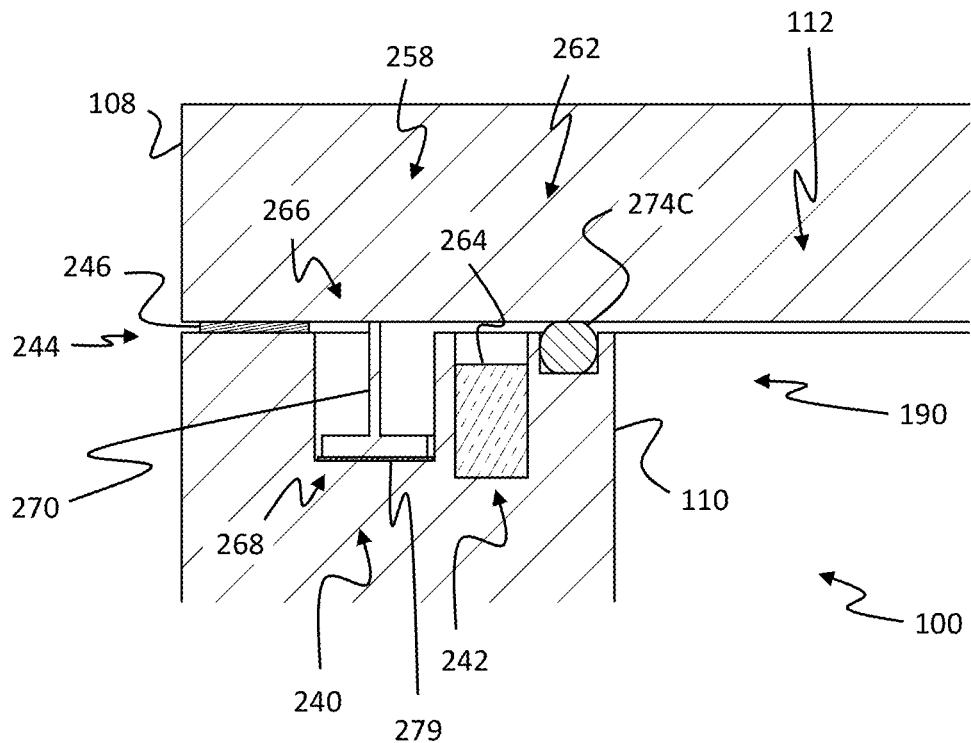

For example, in an aluminum thermal switch 100 with outer diameter 3" with a maximum temperature differential of 60° C., the flange of the oxygen seal would translate by 0.002" relative to the bottom plate. In a seal gap 0.004" high, this creates 50% shear strain in the material between the flange and bottom plate. A sufficiently flexible adhesive 279, as shown in FIG. 7H, may be used as the gas blocking material 260 (in place of the vacuum grease).

The gas seal created by the adhesive 279 may allow the first and second O-rings 274A, 274B to be eliminated.

Figure 7I:
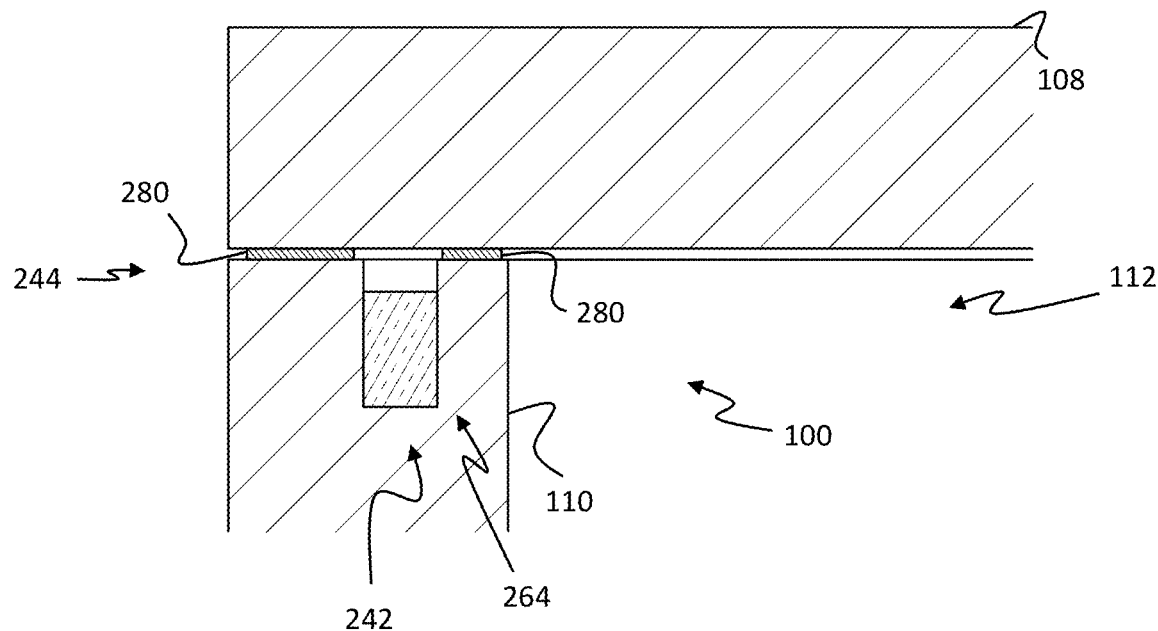
FIG. 7I is a partial cross-sectional view of a thermal seal, according to an eighth embodiment.

With reference to FIG. 7I, for applications operating at relatively low temperatures, thermal isolation of the sealing material may not be necessary. If the thermal device 100 is also of relatively small diameter, then a reasonably thin layer of adhesive 280 could accommodate thermal expansion. Oxygen permeation through the thin adhesive bond may be low enough to be absorbed by a moderate quantity of oxygen absorbing material 264.

INDUSTRIAL APPLICABILITY

With reference to the drawings and in operation, the present invention provides a thermal device 400 that includes a thermal switch 402 (see in particular FIGS. 8-12). In general, the thermal device 400 may be used to control a temperature or temperature profile of a controlled component 404. The controlled component 404 may be any type of component for which thermal control is desirable. For example, the controlled component 404 could be a part of a product during a manufacturing process, a part of a machine used to manufacture another product, a sensor or instrument, or any other component of a thermal system. Non-limiting examples of thermal systems in which the thermal device 400 could be used include vessels for chemical reaction, automotive thermal systems, such as for batteries or fuel cells, HVAC systems, thermoelectric cooling, thermoelectric power generation, power control systems, solid-state lasers and laser diodes, thermal testing equipment, aerospace systems including spacecraft and satellites, thermal energy storage, or a temperature dependent manufacturing process, e.g., a semiconductor manufacturing process. In some embodiments, the controlled component 404 may be the first plate 108 of the thermal switch 402.

Figure 8:
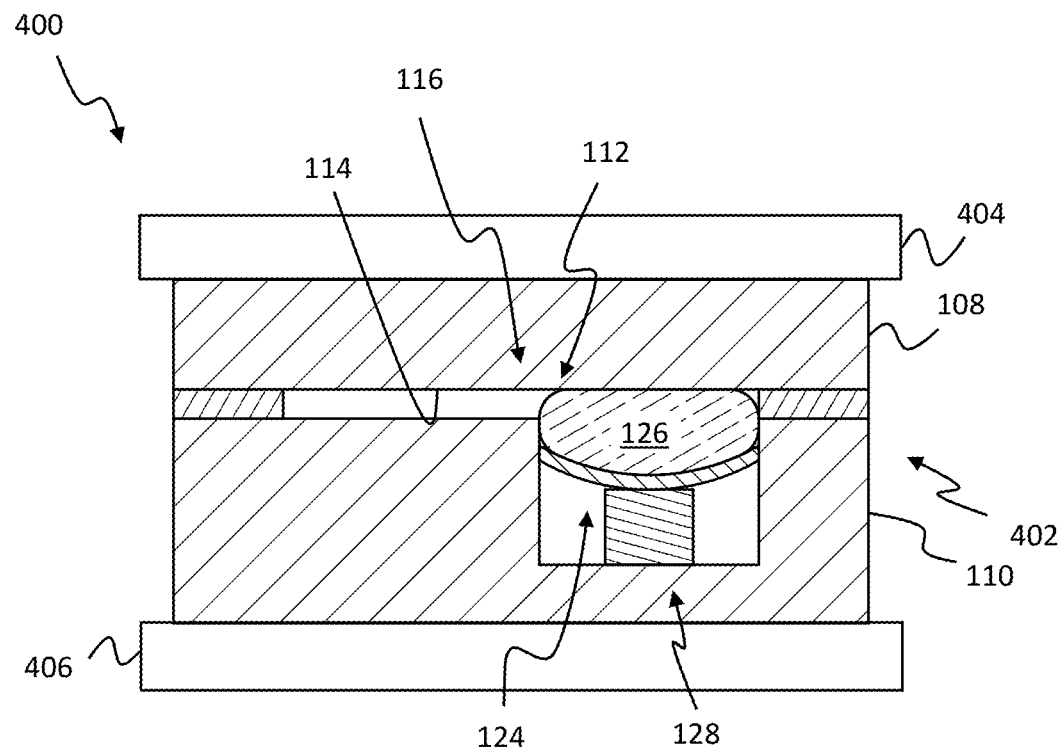
FIG. 8 is a diagrammatic illustration of a thermal device including a thermal switch, according to a first embodiment of the thermal device.

The thermal device 400 includes a thermal switch 402. A suitable thermal switch 402 could be any one of the embodiments of the thermal switch 100, 402, 506, 700, 800, 1100, 1200 disclosed herein or any other suitable switch. With particular reference to FIG. 8, the thermal device 400 controls a temperature associated with the controlled component 404. The thermal switch 402 has an on-state and an off-state and includes a first plate 108 and a second plate 110. The first and second plates 108, 110 are composed from a thermally conductive material such as aluminum. The first plate 108 is thermally coupled to the controlled component 404. The thermal device 400 includes a heat sink 406 coupled to the second plate 110. The first and second plates 108, 110 are connected to form an internal cavity 112 that has a channel 114 defining a gap 120 between the first and second plates 108. 110. The thermal switch 400 includes a first reservoir 124 and an actuator 128. The first reservoir 124 is coupled to the channel 114 and contains a thermally conductive liquid 126. The actuator 128 is coupled to the first reservoir 124 and the channel 114 and is moveable between a first state and a second state corresponding to the on-state and the off-state of the thermal switch 402, respectively. The actuator 128 is configured to allow the thermally conductive liquid 126 to flow from the first reservoir 124 to the channel 114 when the actuator 128 is in the first state and to allow the thermally conductive liquid 126 to flow from the channel 114 to the first reservoir 124 when the actuator 128 is in the second state.

The general thermal device 400 shown in FIG. 8 may be used in a variety of applications. In some applications, the controlled component 404 may be thought of as a heat source and the heat sink 406 may be thought as a second controlled component. The thermal switch 402 may be thermally coupled between these components 404, 406 to control a temperature differential therebetween. For example, one of the two components may be a heat source or sink that cannot be readily turned on and off, such as a heat pipe. Use of the thermal device 400 may be used to control the temperature of such a heat source or heat sink.

Figure 9:
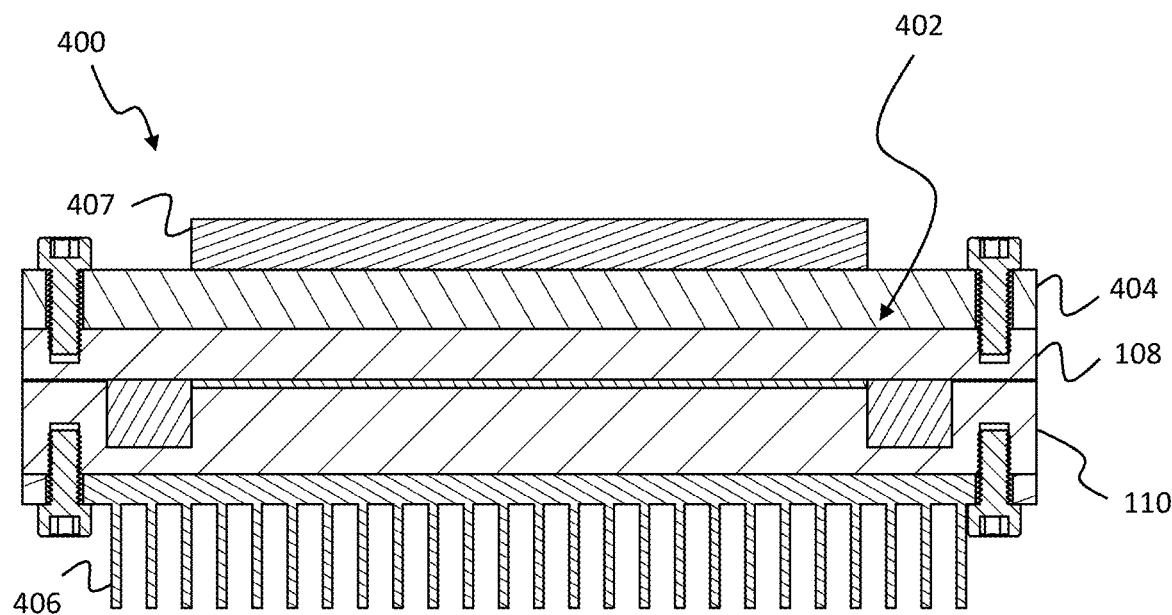
FIG. 9 is a diagrammatic illustration of a thermal device including a thermal switch, according to a second embodiment of the thermal device.

With specific reference to FIG. 9, alternatively, the controlled component 404 may be a thermoelectric cooler. A thermoelectric cooler (also known as a Peltier cooler) is a solid-state heat pump. The Peltier effect—the conversion of an electric voltage to a temperature differential—is utilized to generate heat flux. The thermal device 400 may be used to control a temperature or temperature profile of the thermoelectric cooler 404. In the illustrated embodiment, the thermoelectric cooler 404 is connected to an external surface of the first plate 108. A component 407 (such as a sensor or laser diode) is coupled to the top surface of the thermoelectric cooler 404. The temperature of the component 407 may be controlled by modulation of the thermoelectric cooler 404. The thermal switch 402 controls heat transfer between the thermoelectric cooler 404 and the heat sink 406. When the thermoelectric cooler 404 is unpowered, a thermally conductive path between the component 407 and heat sink 406 would normally be created, resulting in heat flowing backwards from the heat sink 406 to the component 407. The thermal switch 402 may be used to decouple the component 407 and heat sink 406, leading to improved system efficiency. As shown, in the illustrated embodiment, the heat sink 406 is an external air-cooled heat sink that is connected to an external surface of the second plate 110 via, for example, bolts. Alternatively, the external air-cooled heating sink may be unitarily formed, i.e., integral with, the second plate 110. Other types of heat sinks may also be used, for example, a liquid cooled heat sink (see below). Also, as noted above, the thermal switch 402 is similar to the fourth embodiment of the thermal switch 100 discussed above, however, any suitable thermal switch may be used.

Figure 10:
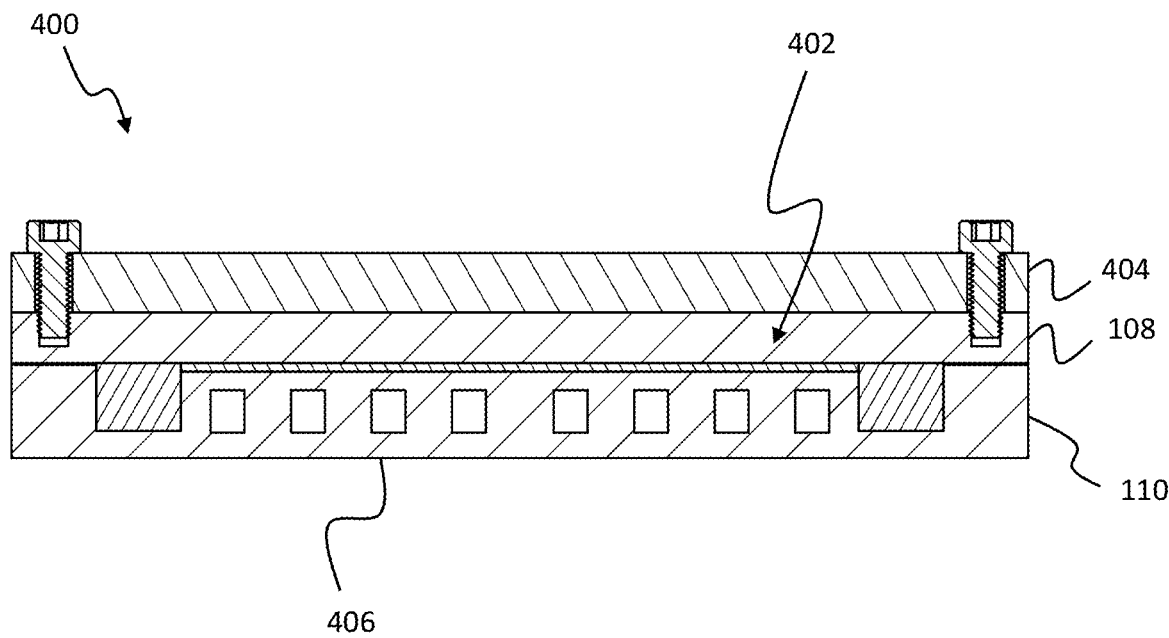
FIG. 10 is a diagrammatic illustration of a thermal device including a thermal switch, according to a third embodiment of the thermal device.

With reference to FIG. 10, the thermal device 400 may be configured to act as a variable cooling plate. In this embodiment, the controlled component 404 may be a heat generating component which is thermally coupled to the first plate 108. The heat sink 406 may be implemented by a plurality of cooling channels within the second plate 110. A variable cooling plate would provide a simple and efficient means of actively controlling the temperature of the heat generating component, as compared to prior art solutions such as varying the temperature or flow rate of a coolant.

Figure 11:
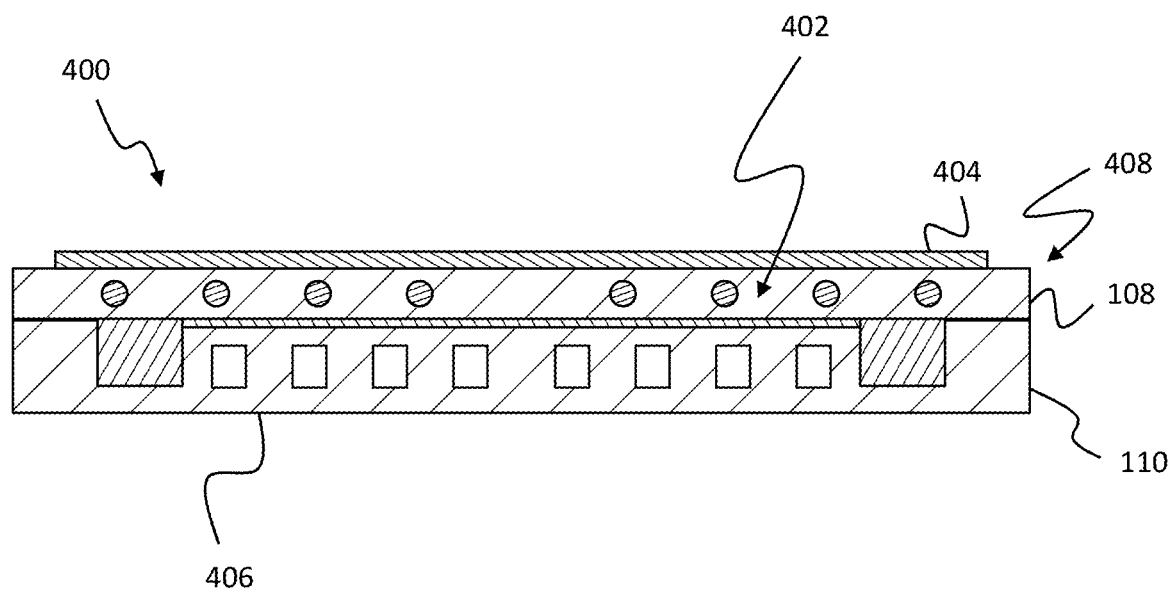
FIG. 11 is a diagrammatic illustration of a thermal device including a thermal switch, according to a fourth embodiment of the thermal device.

With reference to FIG. 11, a heating device 408, for example, a film heater, strip heater, cast heater or the like is integral to the first plate 108, which may be coupled to the controlled component or workpiece 404. Control of the temperature of the heating device 408, and thus the heat transferred to the controlled component or workpiece 404, may be accomplished solely by the thermal switch 402 or by thermal switch 402 in conjunction with modulation of the heating device 408. In either case, efficiency and performance better than control by constant cooling and heater modulation may be achieved (see further examples below).

Figure 12:
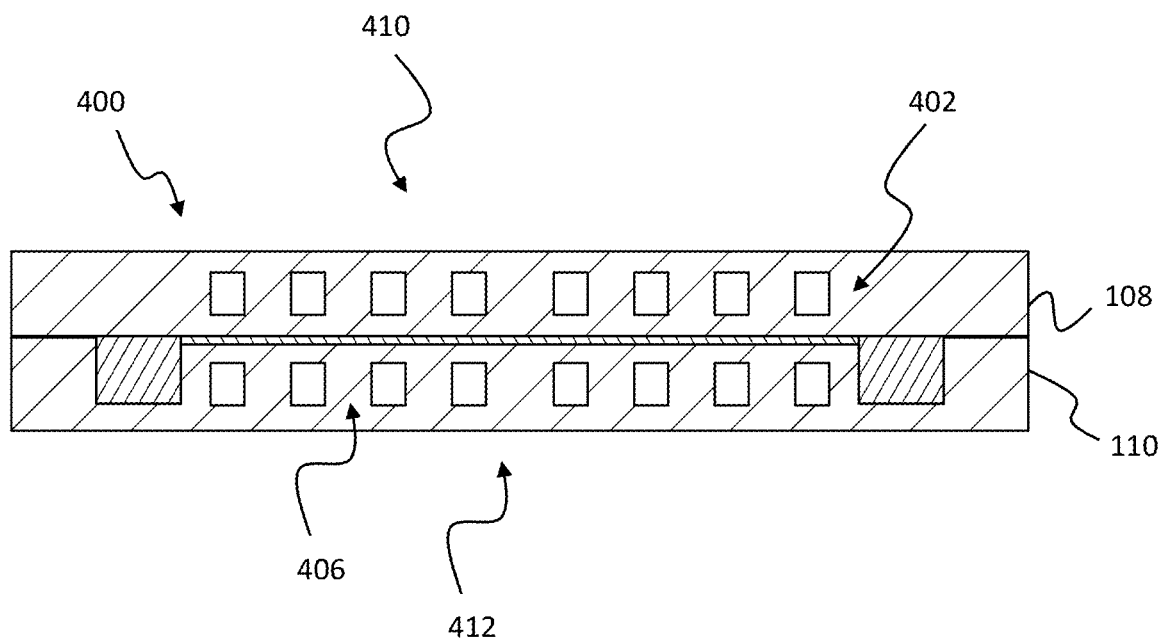
FIG. 12 is a diagrammatic illustration of a thermal device including a thermal switch, according to a fifth embodiment of the thermal device.

With reference to FIG. 12, the thermal device 400 may act as a variable liquid to liquid heat exchanger. In the illustrated embodiment, the controlled component 404 is a first liquid-based thermal coupling device 410. The first liquid-based thermal coupling device 410 includes one or more channels within the first plate 108 through which a liquid is passed. The heat sink 406 is implemented by a second liquid-based thermal coupling device 412. In the illustrated embodiment, the second liquid-based thermal coupling device 412 includes one or more channels within the second plate 110 through which a liquid is passed. The first liquid-based coupling device 410 and the second liquid-based thermal coupling device 412 and the switch 402 form a variable liquid-liquid heat exchanger. A variable liquid to liquid heat exchanger may be used as a simple and compact means of controlling heat transfer between two circulating liquids, avoiding the complexity of flow control valves or variable pumping rates. Similar embodiments may control the heat transfer between gases or air, in thermal systems where the heat sink or source operates by radiative heat transfer, or any combination thereof.

Thermal Switch for Semiconductor Manufacturing
Basic Devices

Thermal control, and its optimization, is uniquely important and valuable in the semiconductor manufacturing industry. During the manufacturing of semiconductor devices such as processors and memory, a silicon wafer goes through dozens of processing steps. These steps (such as deposition and etch steps) typically occur in a process module. The temperature of the wafer and the components of the process module must be precisely controlled during the processing of the wafer to achieve optimal process results. In the context of semiconductor manufacturing "thermal precision" may be considered to include any aspects of temperature control that may affect wafer performance, yield, or throughput. As such, transient temperature control, including control of rapid transients, must be considered, wherein thermal precision would require conforming to a desired transient.

The complex operating conditions of a process module may complicate the control of wafer and component temperature. For example, etch and deposition steps often make use of plasma, which may create large changes in thermal loads as the plasma is switched on and off. Additionally, in some process modules it is desirable to quickly change the temperature of the wafer or a chamber component. The thermal switch of the present invention which utilizes a thermally conductive liquid, such as a liquid metal, is particularly beneficial in semiconductor manufacturing, testing or other related processes.

Figure 13A:
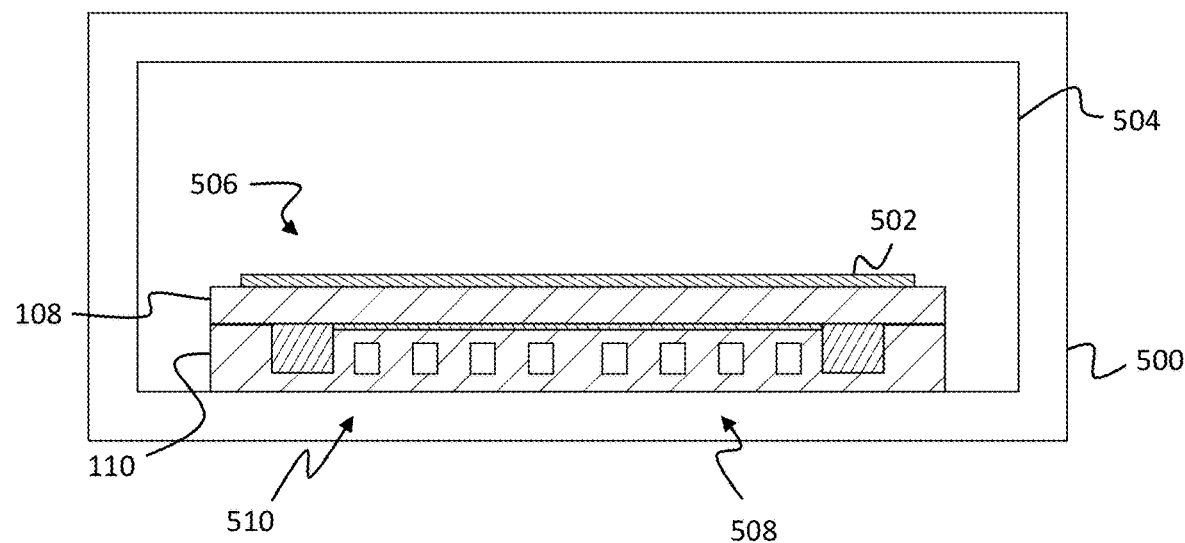
FIG. 13A is a diagrammatic illustration of a process module including a thermal switch, according to a first embodiment.

With reference to FIG. 13A, a diagrammatic representation of an illustrative process module 500 is shown. During a testing, manufacturing or other process, the process module 500 performs a manufacturing step while simultaneously controlling a temperature or temperature profile of a semiconductor wafer 502. The term semiconductor wafer includes, but is not limited to, a silicon wafer, silicon substrate, semiconductor based integrated circuit and the like. The process module 500 includes a processing chamber 504 which is configured to receive the wafer 502. One suitable process module and processing chamber is disclosed in U.S. Pat. No. 8,313,610, issued on Nov. 2, 2012, to Lam Research Corporation, (the '610 patent) which is hereby incorporated by reference. It should be noted, however, that the present invention may be used with any suitable process module and/or process which may benefit from improved thermal control of a wafer or process module component, including but not limited to photoresist development, photoresist strip, ion implantation, wafer anneal, chemical vapor deposition, physical vapor deposition, and atomic layer deposition.

Returning to FIG. 13A, the process module 500 includes at least one thermal switch 506 coupled to the processing chamber 504. The thermal switch 506 may be any suitable thermal switch. In the illustrated embodiment, the thermal switch 506 is a thermally conductive liquid based thermal switch and may be of any one of the embodiments disclosed herein. The thermal switch 506 includes a first plate 108 and a second plate 110 which are composed from a thermally conductive material, such as aluminum. The first and second plates 108, 110 are connected to form an internal cavity 112 (see above). The internal cavity 112 has a channel 114 that defines a gap 120 between the first and second plates 108, 110. The thermal switch 506 also includes a reservoir 124 coupled to the channel 114. The reservoir 124 contains a thermally conductive liquid 126. The actuator 128 is coupled to the reservoir 124 and the channel 114 and is moveable between a first state and a second state corresponding to an on-state and an off-state of the thermal switch 506 respectively. The actuator 128 is configured to allow the thermally conductive liquid 126 to flow from the reservoir 124 to the channel 114 when the actuator 128 is in the first state and to allow the thermally conductive liquid 126 to flow from the channel 114 to the reservoir 124 when the actuator 128 is in the second state. In the illustrated embodiment, during the manufacturing or testing process, heat is applied to the wafer 502 from a heat source (not shown in FIG. 13A). The heat source may be one or more of a plasma, a radiant heater, a hot gas or liquid, a laser, an exothermic chemical reaction, and other suitable source.

The thermal switch 506 may act as an adjustable cooling plate, allowing a temperature associated with the wafer 502 to be controlled. As shown in FIG. 13A, a heat sink 508 acts to direct heat away from the internal cavity 112 (and the first plate 108). In the embodiment shown in FIG. 13A, the heat sink 508 may include one or more cooling channels 510 through which a coolant flows.

Figure 13B:
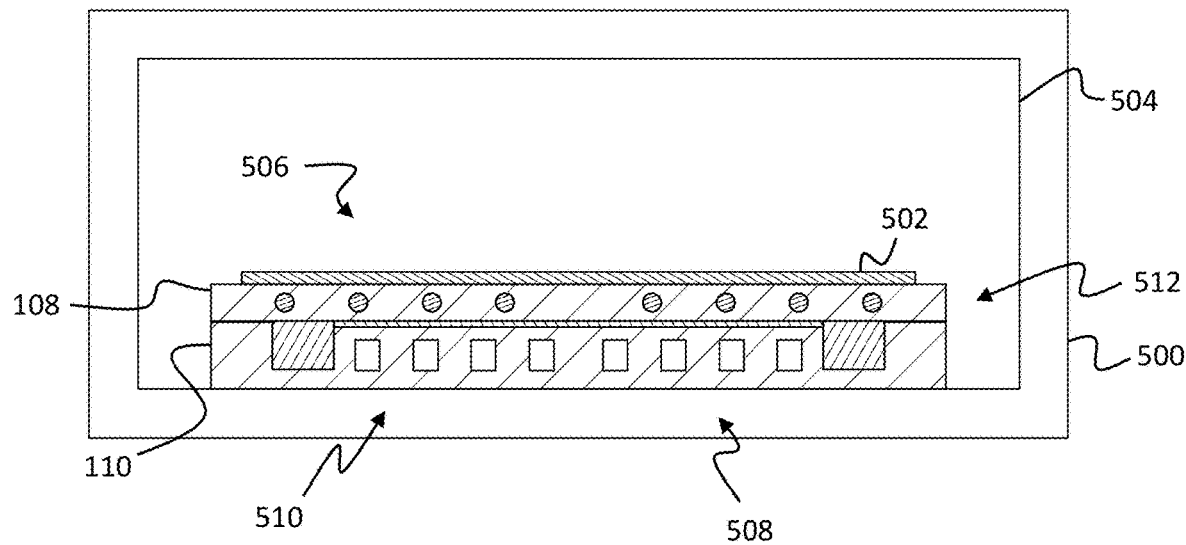
FIG. 13B is a diagrammatic illustration of a process module including a thermal switch, according to a second embodiment.

With reference to FIG. 13B, the thermal switch 506 may include a heat source 512 which is integral with, or coupled to, the first plate 108 for heating the wafer 502. In the illustrated embodiment, the heat source 512 is a cast aluminum heater integral with the first plate 108.

Figure 13C:
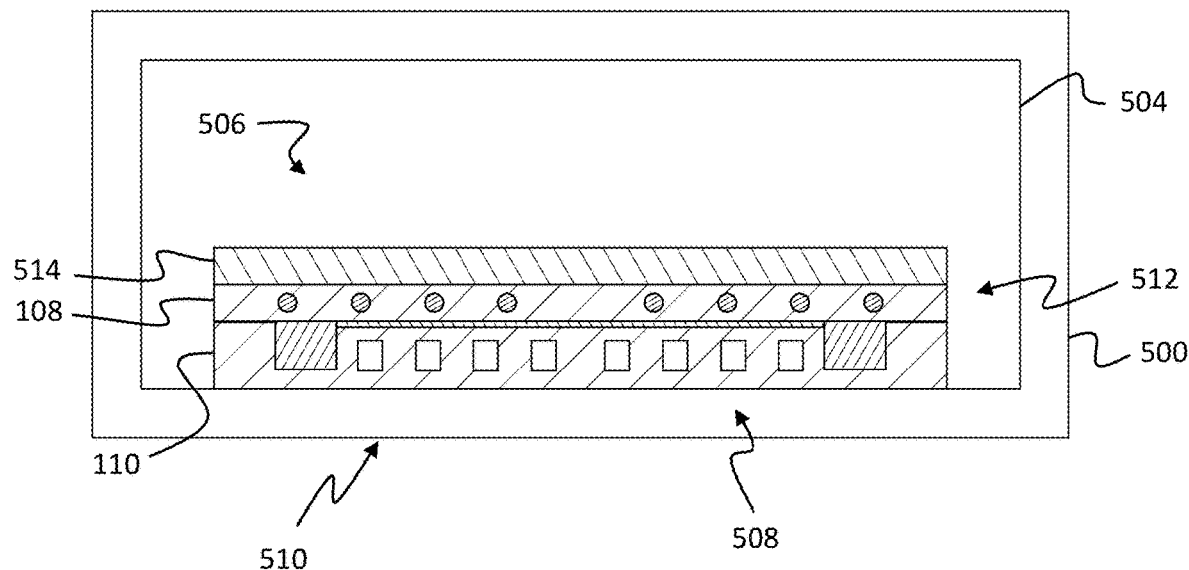
FIG. 13C is a diagrammatic illustration of a process module including a thermal switch, according to a third embodiment.

With reference to FIG. 13C, the heat source 512 is integral with the first plate 108. The thermal switch may be used to alternately heat or cool a controlled component or assembly. As shown, an assembly 514 could be coupled to the first plate 108. For example, in a capacitively coupled plasma etching process module, the assembly 514 and the thermal switch 506 may form a top electrode (see below).

Figure 13D:
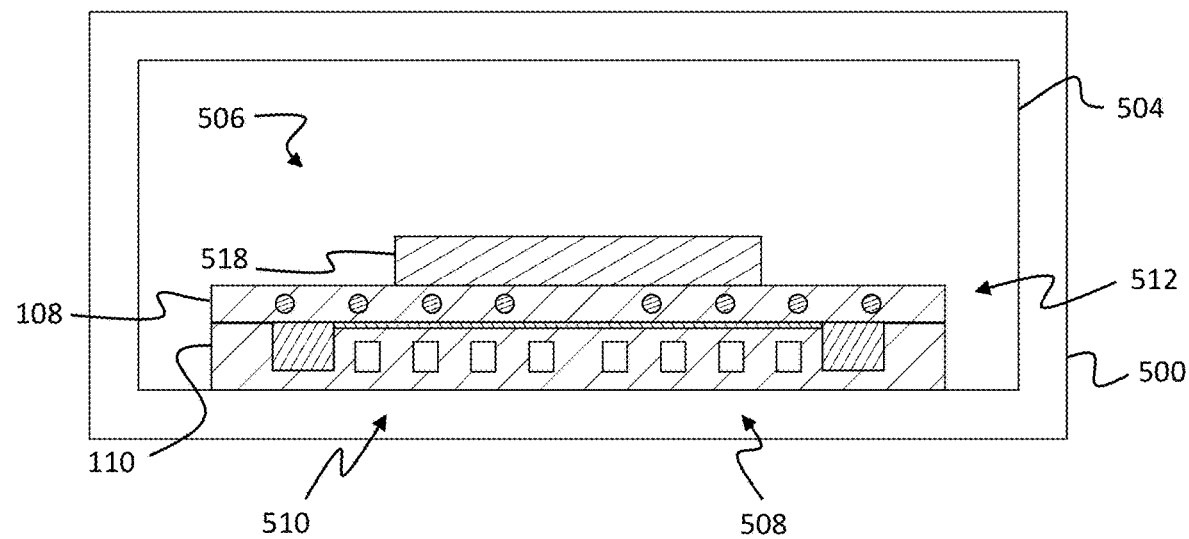
FIG. 13D is a diagrammatic illustration of a process module including a thermal switch, according to a fourth embodiment.

With reference to FIG. 13D, the process module 500 may be configured to control the temperature of a device 518 that is under test. The device 518 may be a heat generating device. It may be desirable to rapidly heat and/or cool the device 518. Rapid heating and cooling may be achieved using the assembly 514 by decreasing the thermal conductivity of the thermal switch 506 while the device 518 is being heated and increasing the thermal conductivity while cooling the device 518.

Figure 13E:
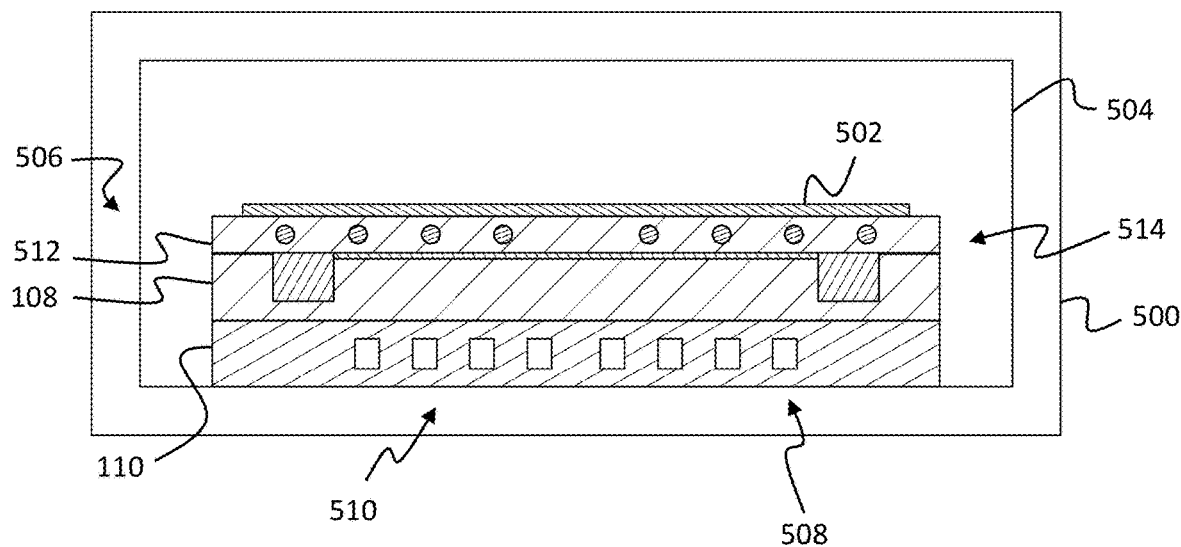
FIG. 13E is a diagrammatic illustration of a process module including a thermal switch, according to a fifth embodiment.

With reference to FIG. 13E, the heat sink 508 may be an external heat sink 508 that is thermally coupled to the second plate 110. In the illustrated embodiment the external heat sink 508 includes cooling channels 510 through which a liquid coolant could be passed. Other possible heat sinks include a heat pipe or the evaporator of a refrigeration system.

Figure 13F:
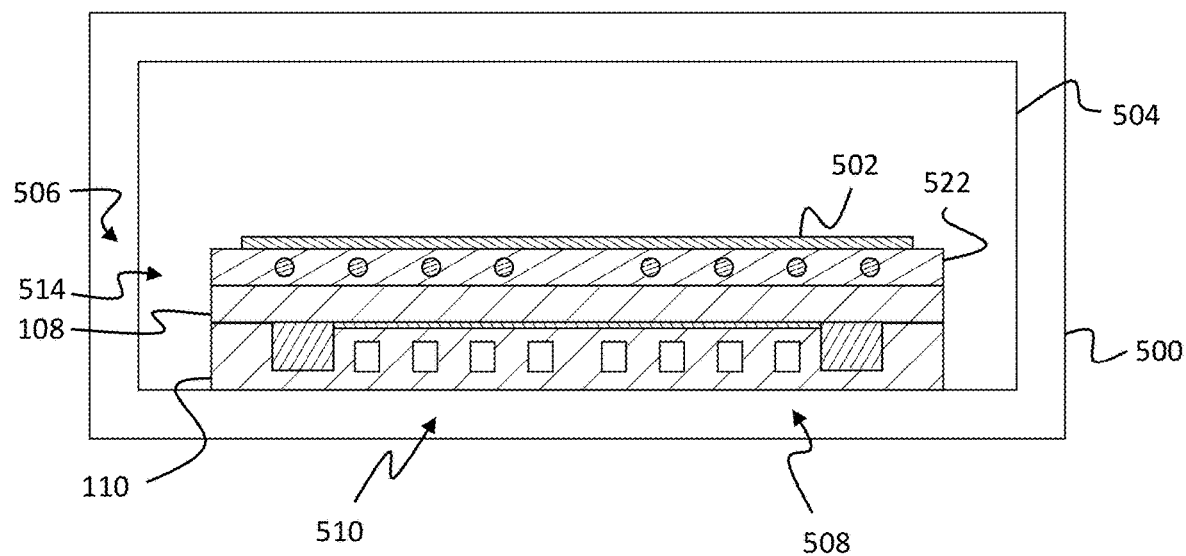
FIG. 13F is a diagrammatic illustration of a process module including a thermal switch, according to a sixth embodiment.

The process module 500 may include a retention device 520, such as an electrostatic chuck (ESC) for supporting and/or holding the wafer 502 in place. In FIG. 13F, a ceramic plate 522 may be bonded to the first plate 108 and serve as a heat source via embedded heating elements and chuck the wafer via an embedded chucking electrode (not shown, see below). While the illustrated embodiment makes reference to an ESC, the retention device 520 may include any means of holding and/or supporting the wafer including, but not limited to vacuum chucks (utilizing gas pressure to secure the wafer) or wafer supports (with the wafer held only by gravity).

Figure 13G:
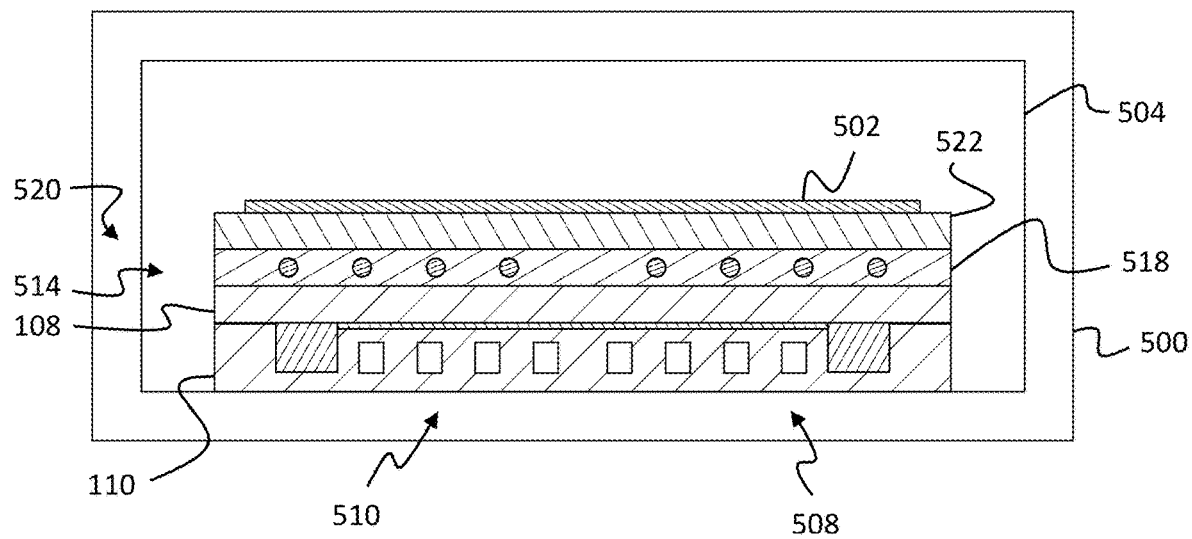
FIG. 13G is a diagrammatic illustration of a process module including a thermal switch, according to a seventh embodiment.

With reference to FIG. 13G, in another embodiment, a separate heater 518 and ceramic plate 522 may be provided.

Figure 13H:
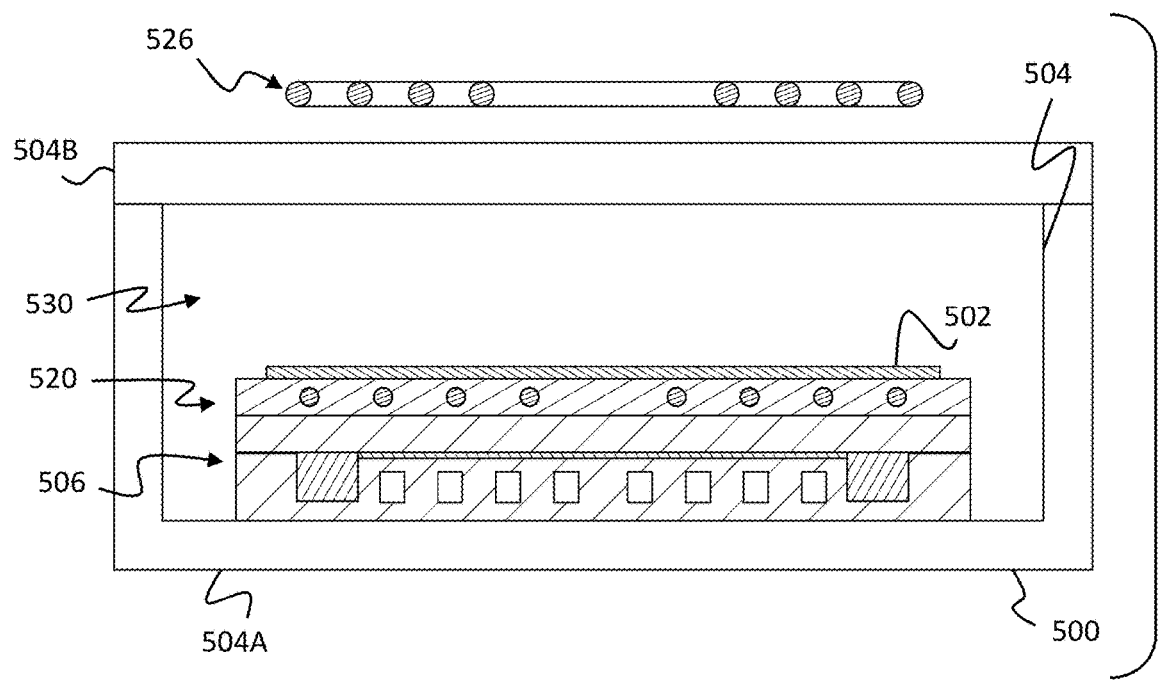
FIG. 13H is a diagrammatic illustration of a processing chamber of an inductively coupled plasma etch process module, according to an eighth embodiment.

With reference to FIG. 13H, in the processing chamber 504 of an inductively coupled plasma etch process module 500, energy from a RF generator is directed into a plasma cavity 530 via a wire coil 526 above the processing chamber 504. The processing chamber 504 includes a vessel 504A that is capped with a ceramic component 504B forming an internal plasma cavity 530. The vessel 504A may be made of any suitable material, including, but not limited to aluminum or stainless steel. In the illustrated embodiment the ceramic component is a plate. In other embodiments the ceramic component may be a dome or a cylinder. The wire coil 526 is positioned above the ceramic component 504B. The ceramic component 504B is electrically non-conductive and allows the electro-magnetic field generated by the wire coil 526 to penetrate the processing chamber 504. Gases enter the plasma cavity 530 where they are converted to reactive species which etch the wafer 502. Volatile etch byproducts are exhausted to a vacuum pump (not shown). As shown, a thermal switch 506 may be coupled to the retention device 520 to control a temperature of the wafer 502. The thermal switch may be of any of the embodiment disclosed herein or any suitable thermally conductive liquid based thermal switch.

Figure 13I:
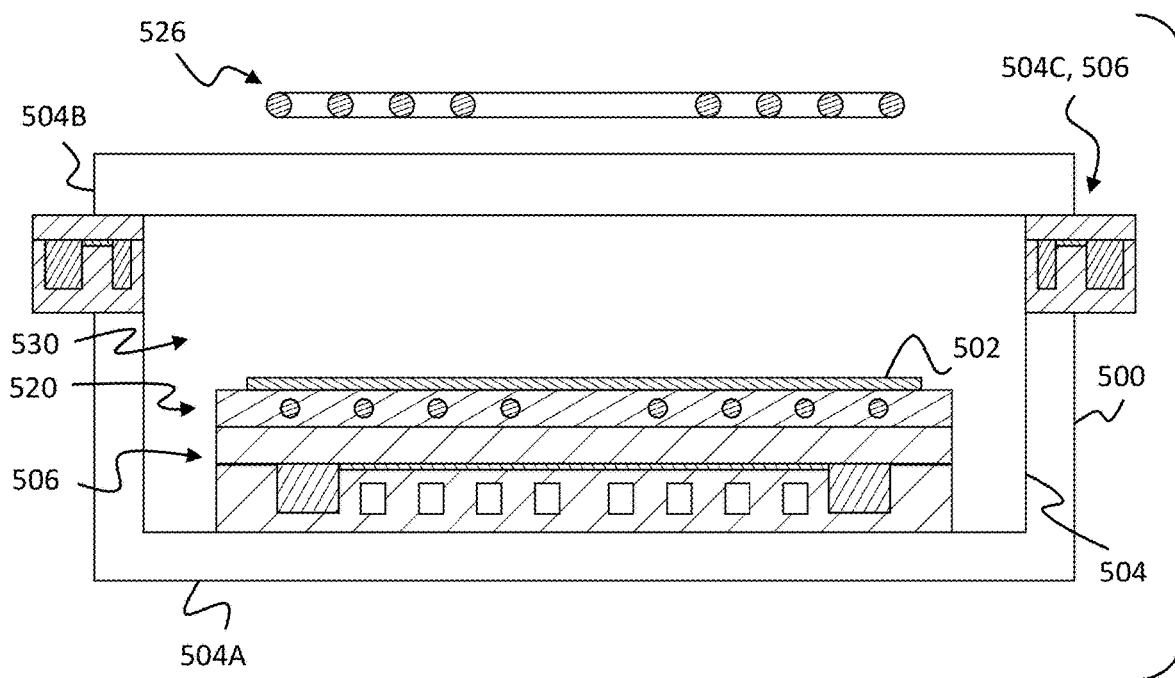
FIG. 13I is a diagrammatic illustration of a processing chamber of an inductively coupled plasma etch process module, according to a ninth embodiment.

With reference to FIG. 13I, a thermal switch 506 may also be located within a junction 504C between the vessel 504A and ceramic component 504B of the processing chamber 504 of an inductively coupled plasma etch process module 500. The thermal switch 506 allows improved, direct control of the thermal interface between the vessel 504A and the ceramic plate 504B.

Figure 13J:
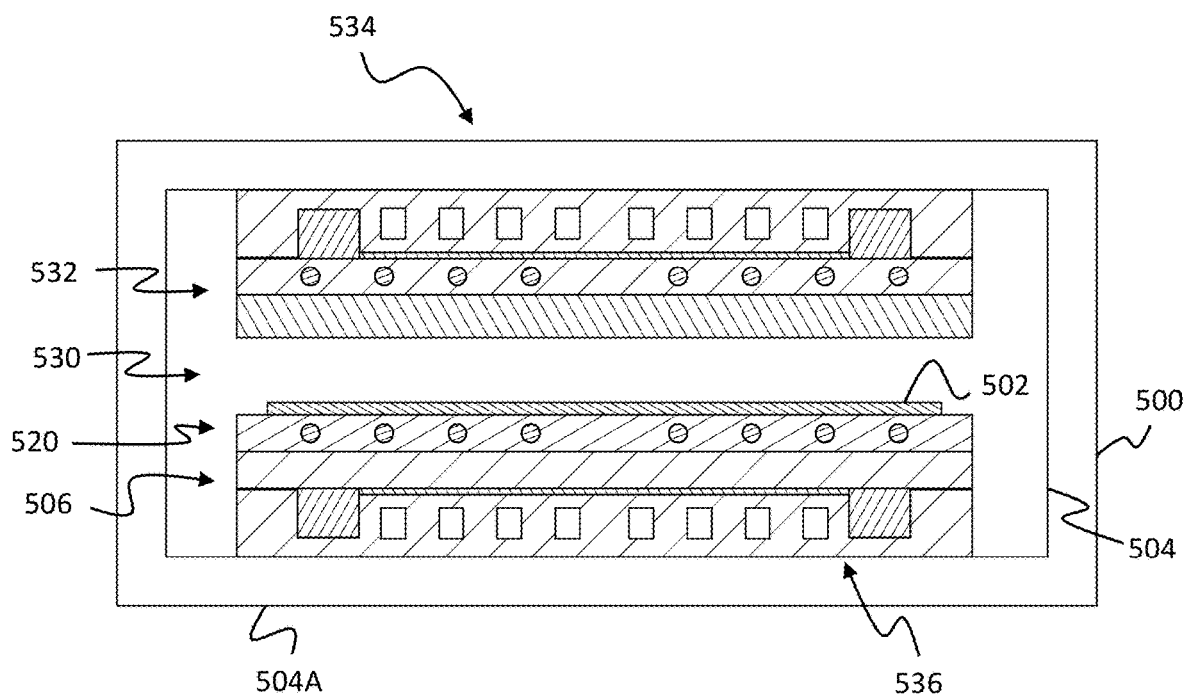
FIG. 13J is a diagrammatic illustration of a processing chamber of a capacitively coupled plasma etch process module, according to a tenth embodiment.

With reference to FIG. 13J, in the processing chamber 504 of a capacitively coupled plasma the process module 500, alternating electric current, which may be in the radio frequency (RF) range, is applied to two electrodes (see below), creating plasma in the cavity 530. The processing chamber 504 may be generally composed from aluminum, forming an internal plasma cavity 530. The processing chamber 504 includes a top electrode 532 and the retention device 520 (which serves as a bottom electrode). In the illustrated embodiment, the retention device 520 is illustrated as an ESC, however, the present invention is not limited to a processing chamber 504 that includes an ESC. Gases flow through the top electrode 532 and are ionized in the plasma cavity 530. The wafer 502 is etched by ion bombardment and etch byproducts are exhausted to a vacuum pump (not shown). The top electrode 532 includes top electrode temperature control assembly 534 and the ESC 520 includes a retention device temperature control assembly 536. The top electrode temperature control assembly 534 and the retention device temperature control assembly 536 each include one or more thermal switches 506. The thermal switch(es) may be of any of the embodiment disclosed herein or any suitable thermally conductive liquid based thermal switch.

Thermal Device with Multiple Switches for Spatial Control

As described above, thermal precision is critical in semiconductor manufacturing. For some components, and particularly with reference to a wafer, thermal precision further includes spatial control of temperature, that is controlling temperature at all points on a surface, sometimes referred to as a temperature profile. For example, it may be desirable to achieve either spatial uniformity or to conform to a prescribed, non-uniform temperature profile on a working surface or wafer. In components such as ceramic components, controlling the temperature profile of the component may be important to minimize stress or wear. Controlling the temperature profile of a wafer is critical to achieving optimal process results. The temperature profile of a wafer may have a radial component (for example vary from center to edge) as well as non-radial components (for example a side-to-side variation). Various temperature profiles may be desirable depending on the specifics of a particular process module and process.

Figure 14A:
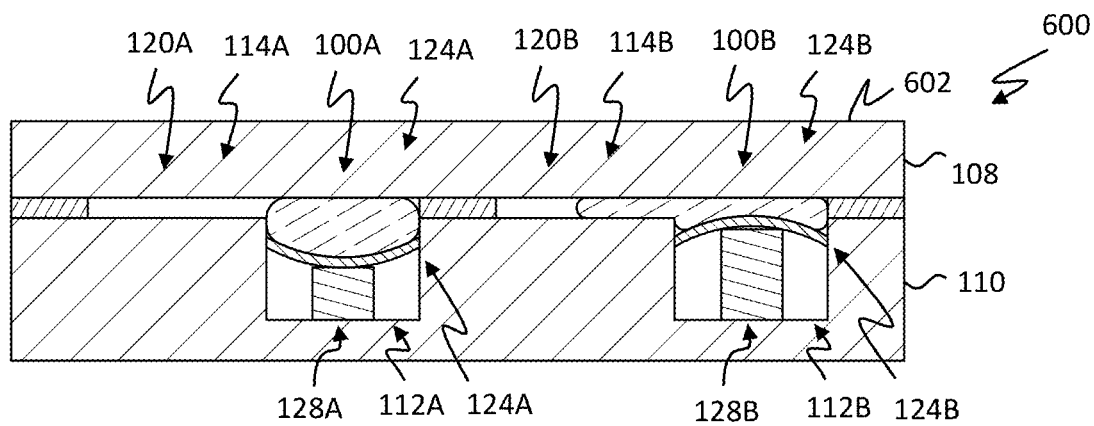
FIG. 14A is a diagrammatic illustration of a thermal device with multiple thermal switches, according to a first embodiment.

Thermal devices with multiple switches may be utilized to control the temperature profile on a working surface or workpiece. With reference to FIG. 14A, the working surface may be a surface of one of the first or second plates 108, 110, a surface of a controlled component, or a surface thermally coupled to a controlled component. The controlled component may be a workpiece, e.g., in a manufacturing or testing process, or a component in a manufacturing or testing apparatus. In one aspect of the present invention, the temperature profile of a working surface may be controlled using independent control of two or more thermal switches.

With reference to FIG. 14A, a thermal device 600 for controlling for controlling a temperature profile of a working surface 602 includes a first and second plates 108, 110. The first and second plates 108, 110 are composed from a thermally conductive material and are connected to form first and second internal cavities 112A, 112B. An outer surface of one of the first and second plates 108, 110 forms the working surface 602. The thermal device 600 includes a thermal switch 100A, 100B located within respective internal cavities 112A, 112B. Each thermal switch 100A, 110B has an on-state and an off-state and includes a channel 114A, 114B, a first reservoir 124A, 124B and an actuator 128A, 128B. Each channel 114A, 114B defines a gap 120 in the respective internal cavity 112A, 112B between the first and second plates 108, 110. The first reservoirs 124A, 124B are coupled to the respective channel 114A, 114B and contain a thermally conductive liquid 126.

Each actuator 128A, 128B is coupled to the respective first reservoir 124A, 124B and respective channel 114A, 114B. The actuators 128A, 128B are moveable between a first state and a second state corresponding to the on-state and the off-state of the respective thermal switch 100A, 100B, respectively, and are configured to allow the thermally conductive liquid 126 to flow from the respective reservoir 124A, 124B to the respective channel 114A, 114B when the actuator 128A, 128B is in the first state and to allow the thermally conductive liquid 126 to flow from the respective channel 114A, 114B to the respective first reservoir 124A, 124B when the actuator 128A, 128B is in the second state.

Each thermal switch 100A, 100B is formed by a portion of the first and second plates 108, 110 and the respective channel 114A, 114B, first reservoir 124A, 124B, actuator 128A, 128B. The thermal switches 100A, 100B, may be of the form or any one of the embodiments disclosed herein.

Figure 14B:
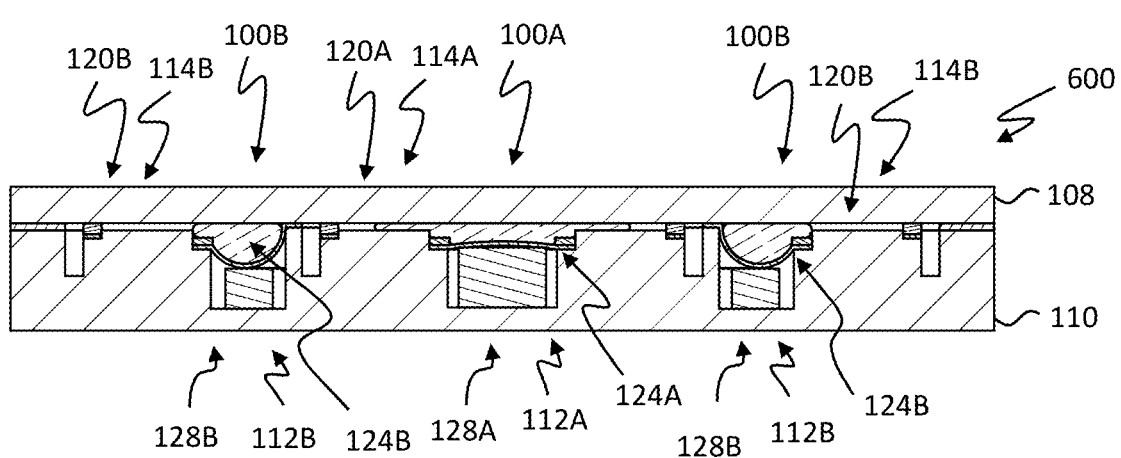
FIG. 14B is a diagrammatic illustration of a thermal device with multiple thermal switches, according to a second embodiment.
Figure 14C:
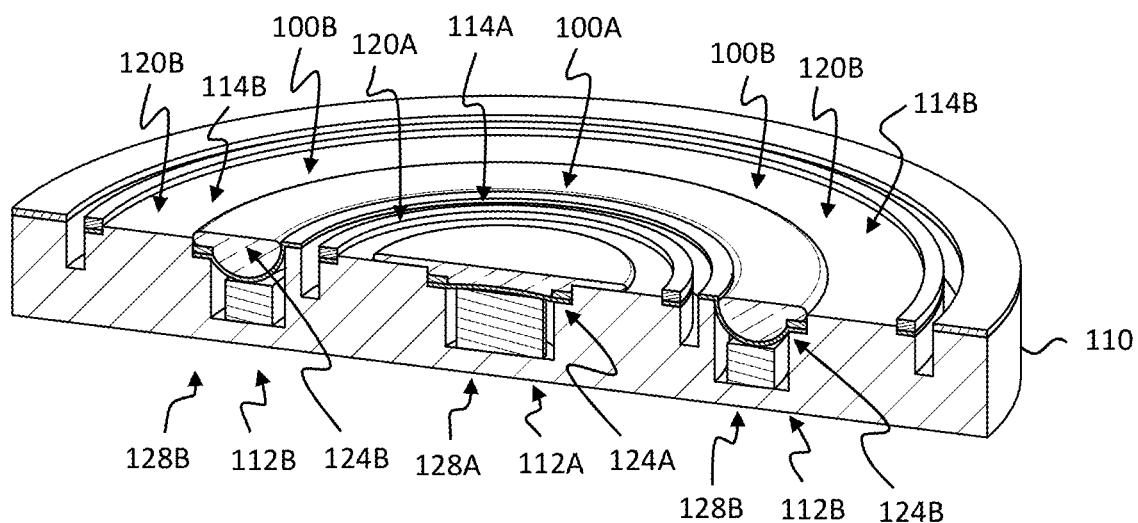
FIG. 14C is a cutaway perspective view of a second plate of the thermal device of FIG. 14C.

With reference to FIGS. 14B and 14C, one or more of the switches 100 in the thermal device 600 may be ring shaped switches (see above). As shown in the illustrated embodiment, the first switch 100A is centrally located with the thermal device 600. The second switch 100B is a ring-shaped switch 100B located within a ring-shaped internal cavity (or trench) 112B. For purposes of illustration, the first switch 100A is shown in the on state, while the second switch 100B is shown in the off-state.

Thermal Switch with Pneumatic Actuator

Figure 15A:
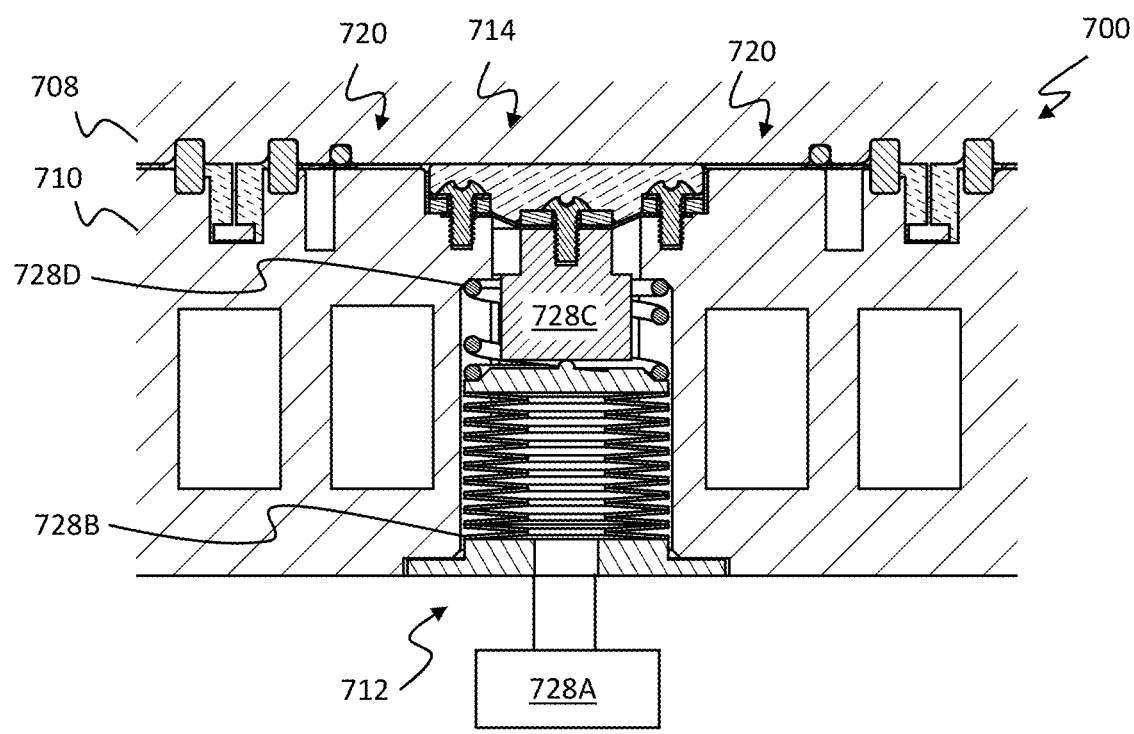
FIG. 15A is a diagrammatic illustration of a thermal switch with a pneumatic actuator in an off-state, according to an embodiment of the present invention.
Figure 15B:
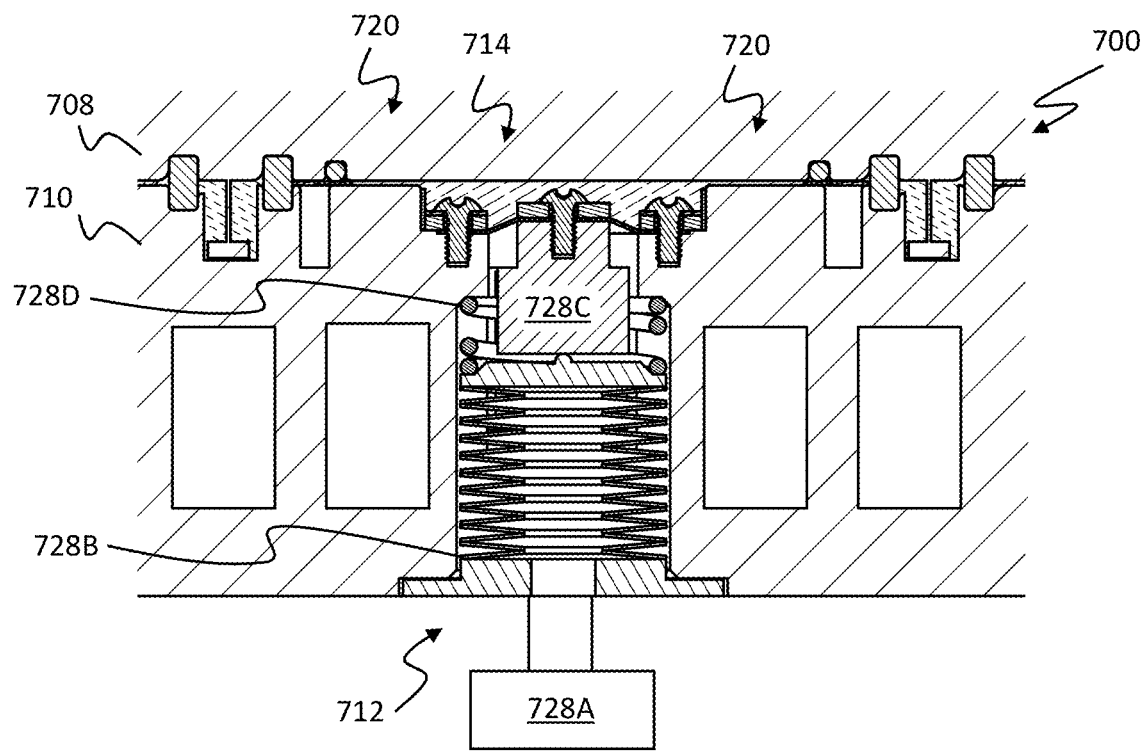
FIG. 15B is a diagrammatic illustration of the thermal switch of FIG. 15A in the on-state.

In some applications, minimizing the separation between adjacent thermal switch gaps may be an important consideration. Wide separation between switch gaps may prevent achieving some desired temperature profiles. In previous embodiments, adjacent switch gaps are separated by at minimum, the width of the plunger and solenoid case. With reference to FIGS. 15A and 15B in another embodiment of the present invention, a thermal switch 700 includes a pneumatic actuator 728. FIGS. 15A and 15B show partial cutaway views of the thermal switch 700 in the open and closed positions, respectively. The illustrated actuator arrangement eliminates the solenoid case and thus the distance between adjacent switch gaps 720 may be smaller.

As shown, the thermal switch 700 includes a first plate 708 and a second plate 710 and a pneumatic actuator 728. The first and second plates 708, 710 are composed from a thermally conductive material. The first and second plates 708, 710 are connected to form an internal cavity 712. The internal cavity 712 has a channel 714 that defines a gap 720 a gap between the first and second plate 708, 710. The thermal switch 700 further includes a reservoir 724 coupled to the channel 714 that contains a thermally conductive liquid 726. As shown, the pneumatic actuator 728 is coupled to the first reservoir 724 and the channel 714 and is moveable between a first state (shown in FIG. 15B) and a second state (shown in FIG. 15A) corresponding to the on-state and the off-state of the thermal switch 700, respectively. The pneumatic actuator 728 is configured to allow the thermally conductive liquid 726 to flow from the reservoir 724 to the channel 714 when the pneumatic actuator 728 is in the first state and to allow the thermally conductive liquid 726 to flow from the channel 714 to the first reservoir 724 when the actuator 728 is in the second state.

The internal cavity 712 of the thermal switch 700 may be located in a central area of a housing formed by the first and second plates 708, 710. Alternatively, the internal cavity 712 may be a trench which surrounds a central post (see above). Other features and/or alternatives may be as is found in any of the other embodiments disclosed herein.

In the illustrated embodiment the pneumatic actuator 728 includes a source of pressurized air 728A, a bellows 728B, and a plunger 728C. The source of pressurized air 728A is controllably coupled to the bellows 728B. The plunger 728C is coupled to the bellows 728B and is moveable between first and second positions corresponding to the first and second states of the pneumatic actuators respectively.

In one embodiment, the bellows 728B acts on the plunger 728C to move the plunger 728C from the second position to the first position when pressurized air from the source of pressurized air 728A is applied to the bellows 728B. Further, a return spring 728D may be coupled to the bellows 728B and configured to move the plunger 728C from the first position to the second position when the source of pressurized air 728A is removed from the bellows.

Exemplary Thermal Switch for Use in a Capacitively Coupled Plasma Process Module As discussed above, in a capacitively coupled plasma process module 500, radio frequency alternating current is applied directly to a top electrode 532 and an electrostatic chuck (ESC) 520, which serves as a bottom electrode. One such process module 500 is disclosed in the '610 patent referenced above. With reference to FIGS. 16A-16F and FIGS. 17A-17H, as discussed in more detail below, thermal switches according to various embodiments of the present invention may be incorporated into the top electrode 532 and the bottom electrode 520.

Generally, the top electrode 532 is bolted to an upper portion of an aluminum vacuum chamber. The ESC 520 is bolted to an assembly known as the "bias housing" which has an internal cavity and includes electrical and gas connections to the ESC 520, as well as actuators for the pins used to lift the wafer. The wafer passes into and out of the chamber via a slot which is connected via a valve to a transfer chamber.

In the prior art top electrode, a temperature control assembly, which may comprise a cooling plate, a heater plate, and thermal choke rings disposed therebetween, serves either to heat or cool the top electrode depending on operating conditions. Coolant circulates through channels in the cooling plate, providing constant cooling. The thermal choke rings create a controlled, but fixed, amount of thermal resistance between the heater plate and cooling plate, such that a large temperature differential may be maintained when desired. Temperature control is achieved by modulating the power delivered to the heater elements in the heater plate. This prior art arrangement has notable shortcomings including inefficiency and limited thermal performance.

Top Electrode with Thermal Switches

In the illustrated embodiment shown in FIGS. 16A-16J, in one embodiment of the present invention, the top electrode 532 includes a top electrode temperature control assembly 534 having a plurality of thermal switches 800. The prior art thermal choke rings (which create a non-varying thermal resistance between a cooling plate and heater plate) are replaced by thermal switches 800 so that thermal resistance between the cooling plate and the heating plate may be varied, enabling improved efficiency and thermal performance. The resistance of the thermal switches may, for example, be decreased to enable faster cooling of the top electrode, or increased to allow faster heating or more efficient operation (i.e. a temperature differential between the cooling plate and heater plate may be maintained with a decreased amount of power delivered to the heater plate).

Figure 16A:
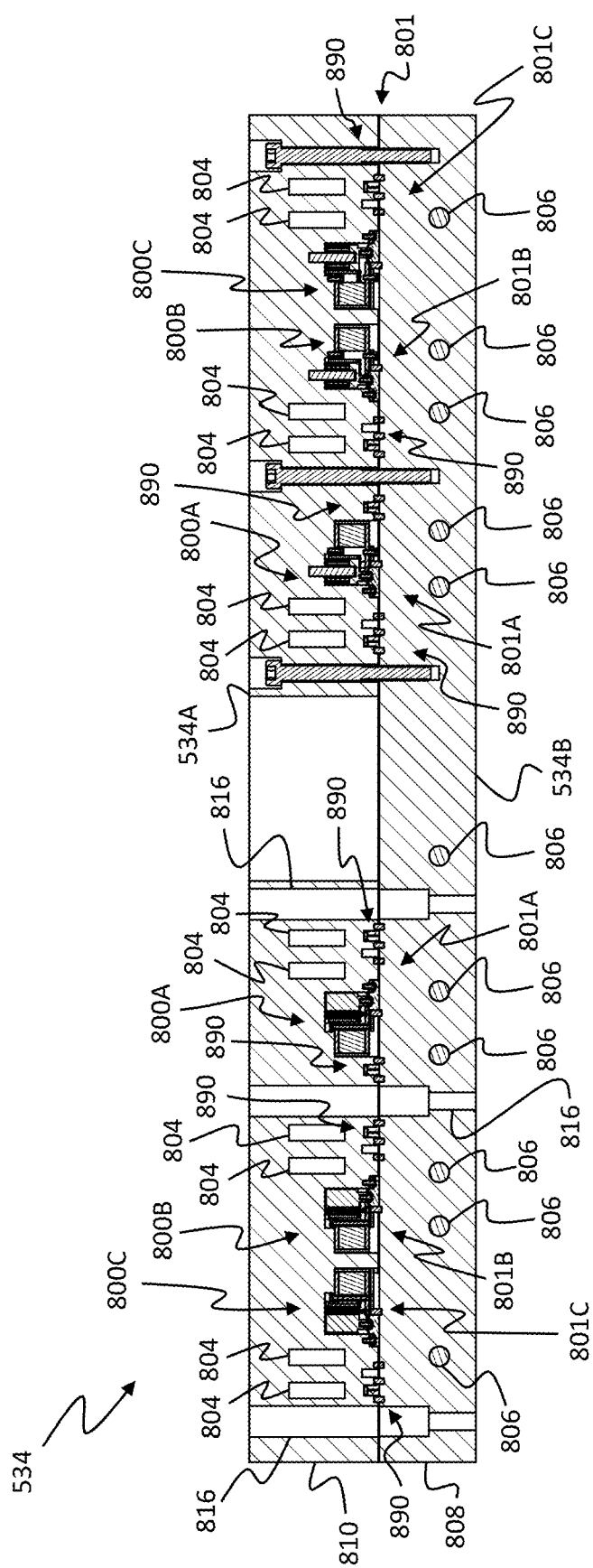
FIG. 16A is a cross-sectional view of a top electrode temperature control assembly with thermal switches, according to an embodiment of the present invention.
Figure 16C:
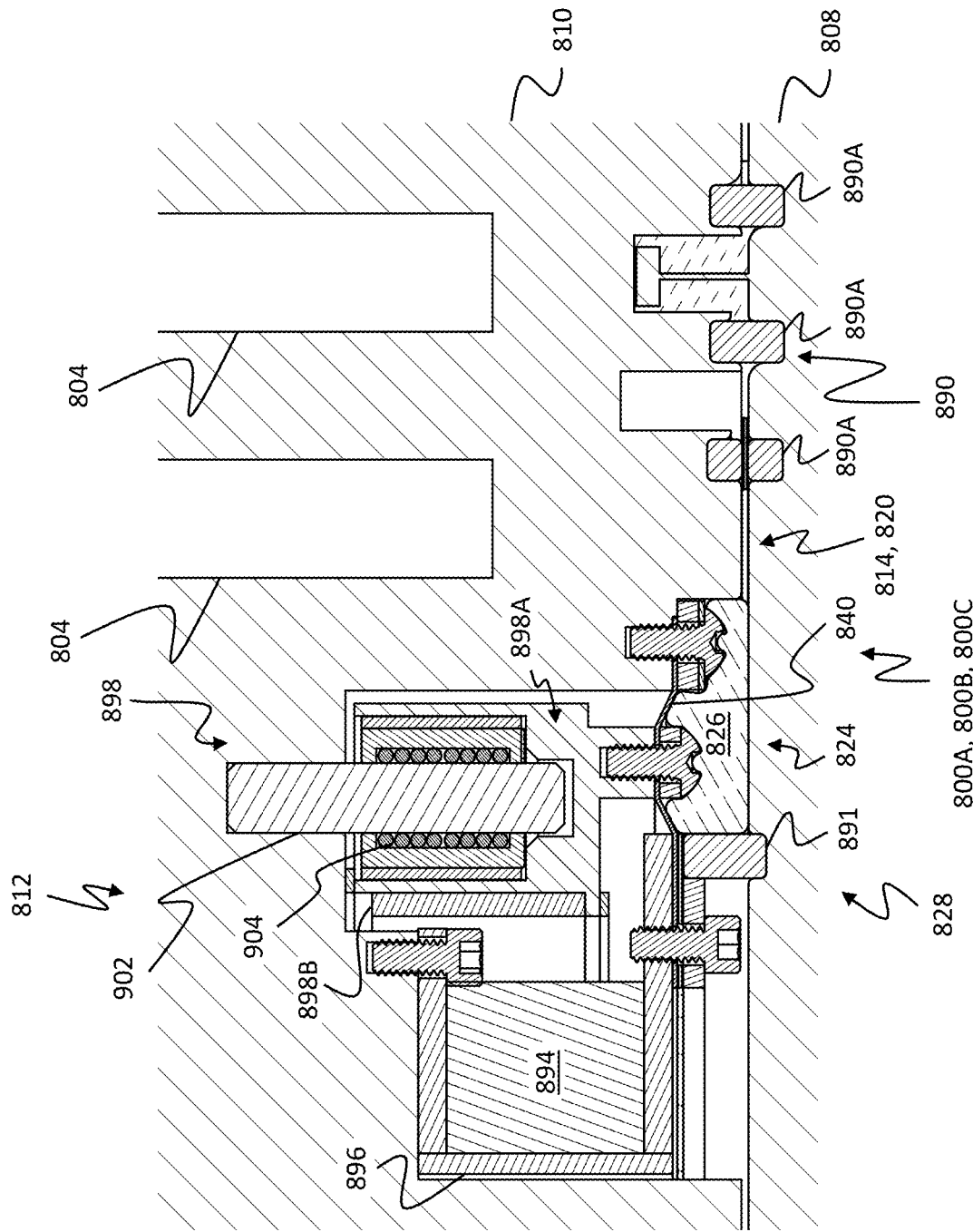
FIG. 16C is a second enlarged view of the thermal switch of FIG. 16B in an off-state.
Figure 16D:
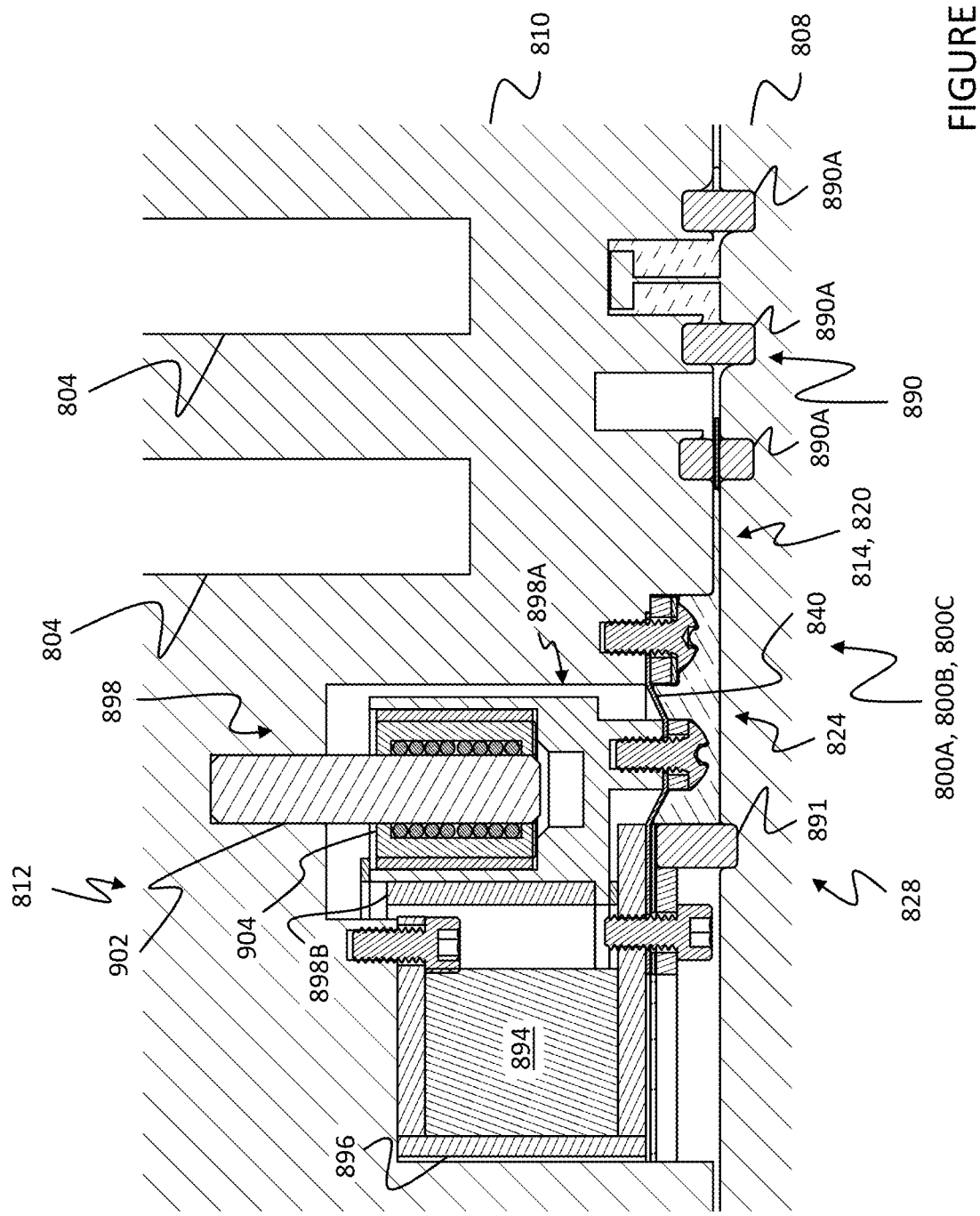
FIG. 16D is a third enlarged view of the thermal switch of FIG. 16B in an on-state.
Figure 16E:
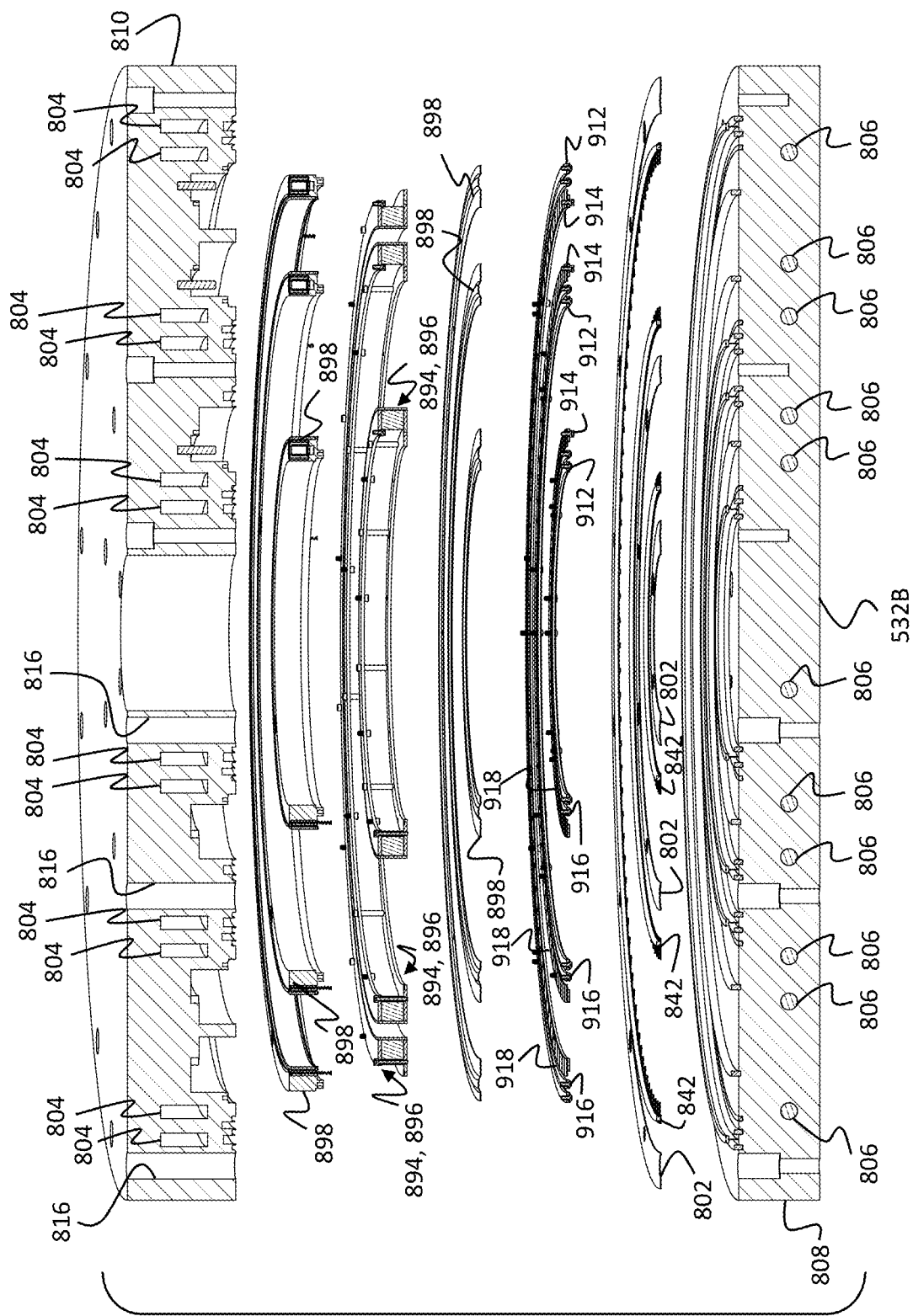
FIG. 16E is an exploded view of the top electrode temperature control assembly of FIG. 16A.

As shown in the cut-away cross section view of FIG. 16A, an exemplary temperature control assembly 534 includes a plurality of thermal switches 800. The temperature control assembly 534 includes a first (or heating) plate 808 and a second (or cooling) plate 810. In the illustrated embodiment, the top electrode temperature control assembly 534 has generally circular top and bottom surfaces 534A, 534B. Each thermal switch 800 is toroidal or ring shaped (similar to the thermal switch in the fourth embodiment discussed above). In the illustrated embodiment, the temperature control assembly 534 includes first, second and third ring shaped concentric thermal switches 800A, 800B, 800C. Each thermal switch 800A, 800B, 800C is located adjacent, and controls the thermal resistance, in a respective ring-shaped portion or zone 801A, 801B, 801C of an interface 801 between the first and second plates 808, 810.

The first plate 808 and the second plate 810 are bolted together with plastic shims 802 therebetween. The second or cooling plate 810 includes cooling channels 804 for circulating coolant. The first or the heater plate 808 has embedded heater elements 806. In the illustrated embodiment, the top electrode includes three thermal switches 800A, 800B, 800C, however, it should be noted that any number of thermal switches 800 may be used. Each thermal switch 800 provides variable thermal resistance in a respective portion of the interface between the first and second plates 808, 810.

The first and second plates 808, 810 are composed from a thermally conductive material, such as aluminum. Each switch 800 has an internal cavity 812, a first reservoir 824, and an actuator 828. The internal cavity 812 includes a channel 814 that defines a gap 820 between the first and second plates 808, 810. The first reservoir 824 is coupled to the channel 814. The first reservoir 824 contains a thermally conductive liquid 826. The actuator 828 is coupled to the first reservoir 824 and the channel 814 and is moveable between a first state and a second state corresponding to the on-state and the off-state of the respective thermal switch 800. The actuator 828 is configured to allow the thermally conductive liquid 826 to flow from the first reservoir 824 to the channel 814 when the actuator 828 is in the first state and to allow the thermally conductive liquid 826 to flow from the channel 814 to the first reservoir 824 when the actuator 828 is in the second state.

In the illustrated embodiment, the actuator 828 is an electric solenoid. However, it should be noted that other types of actuators, for example, a pneumatic actuator, may also be used. Each thermal switch 800 includes a solenoid 892 with a solenoid or wire coil 894 and solenoid case 896. A plunger 898 is held in place by a linear ball bearing 904 sliding on a bearing post 902. The weight of the plunger 898 is supported by a compression spring 908 which push the plunger 898 to the switch open position. The solenoid 892 pulls the plunger 898 to the switch closed position (which forces the thermally conductive liquid 826 into the gap 820). A second (or gas) reservoir 836 accommodates the gas displaced when thermally conductive liquid 826 moves into the gap 820. In the illustrated embodiment, the second reservoir 836 is in the form of a circular channel.

Each thermal switch 800 further includes a diaphragm or membrane 840 retained by clamp rings 912, 914 and connected to the plunger 898 with a rib 916. A vent ring 918 with laser scored slits allow gas, but not the thermally conductive liquid, to vent between the first reservoir 824 and the solenoid/plunger area.

A dividing plate 842 with laser scored vents provides the gas path between the gap 820 and the second reservoir 836. In one embodiment, the dividing plate 842 (and other plastic components of the thermal switches 800) are composed from a polyimide material, such as Kapton film available from Dupont or Cirlex Kapton laminates available from Fralock. Polyimide film has a CTE ($20 \times 10$-6/° C.) similar to the CTE of aluminum ($24 \times 10$-6/° C.). Since the dividing plate 842 (and the other plastic parts) are large (up to 17" diameter, it is critical that thermal expansion be minimized.

It should be noted that in the illustrated embodiment, the gap 820 of each thermal switch 800 does not have subchannels. The required thermal resistance may be achieved with a gap of length less than or equal to 0.2", so a simple implementation as illustration is best suited to this embodiment.

As shown, the temperature control assembly 534 may include a plurality of feedthrough apertures 807 to allow for the passage of bolts (not shown). The bolts are used to secure other components comprising the top electrode, e.g., a backing plate. Other apertures (not shown) accommodate temperature sensors. The presence of the feedthrough apertures 807 require the use of oxygen seals to keep oxygen out of the internal cavities 812 of the thermal switches 800. In the illustrated embodiment, the top electrode 532 includes four ring-shaped oxygen seals 890 as shown.

As shown, rectangular elastomer seals 890A are used in the oxygen seals 890. This allows the larger differential expansion of the first and second plates 808, 810 to be accommodated by flexing of the seals 890 (see above). Further in the illustrated embodiment, rectangular seals 891 seal the first reservoir 824 and square seals 893 are used on both sides of the dividing plate 842.

Precise thermal control of the top electrode 532 is critical, due to its close proximity to the wafer 502. To achieve precise thermal control of the top electrode 532, the local thermal conductivity of the thermal switches 800 must be precisely controlled. A higher thermal conductivity results in a lower thermal resistance (of the switch 800) and a lower thermal conductivity results in a higher thermal resistance (of the switch 800). Thus, a switch 800 in the on-state has a high thermal conductivity and a lower thermal resistance than a switch 800 in the off-state. The largest source of variability in this thermal conductivity is variation in the gap height. The local thermal conductivity of a thermal switch 800 is inversely proportional to gap height.

Practical limitations on achievable machining tolerances of the first and second plates 808, 810 may result in surface flatness tolerances of 0.002" or greater on the gap defining surfaces. Consequently, a gap 820 of nominal height 0.010" may vary locally between 0.008" and 0.012", leading to +/−20% variation in local thermal conductivity.

Figure 16F:
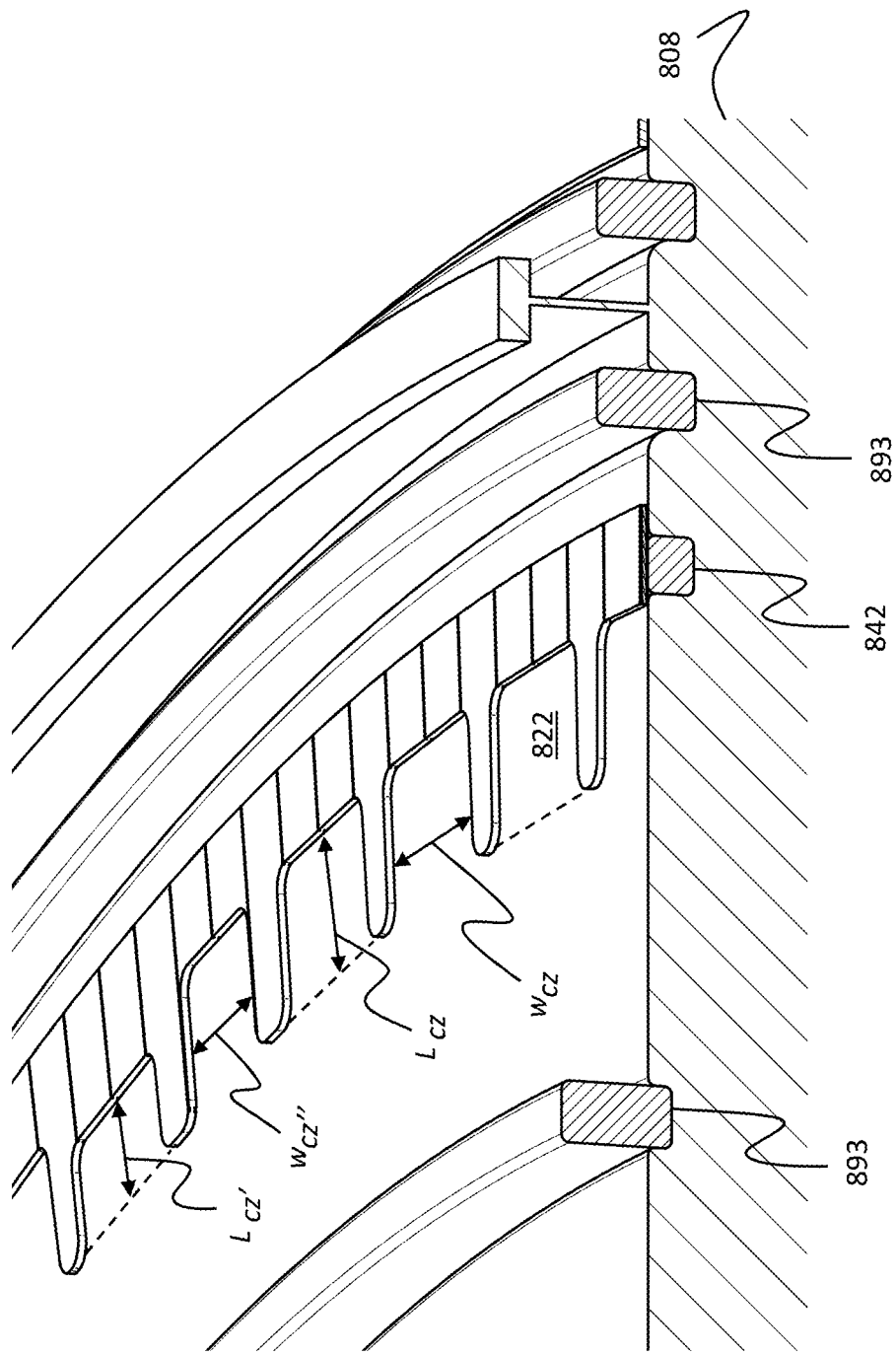
FIG. 16F is a second cutaway perspective view of the top electrode temperature control assembly of FIG. 16A.

To improve the precision of local thermal conductivity of the thermal switches 800, the dividing plates 842 are shaped to create many discrete conduction zones 822. Thermal conduction occurs across the multitude of conduction zones 822 rather than across a single ring-shaped gap. Since the thermal conductivity of each conduction zone 822 is proportional to area, variations of the zone dimensions, $l_{cz}$ and $w_{cz}$, may be used to adjust thermal conductivity and compensate for gap height variation. For example, as shown in FIG. 16F, the dividing plate 842 may have conduction zones 822 with adjusted dimensions $l_{cz'}$ and $w_{cz''}$. The variation in gap height may be determined prior to assembly through measurements of the surfaces of the first and second plates 808, 810 using a coordinate measurement machine.

The method to create a thermally precise top electrode temperature control assembly 532 is:
1. Measure the surface profiles of the gap surfaces of the first and second plates 808, 810 using a Coordinate Measuring Machine (CMM),
2. Compute the as-assembled gap height for each thermal conduction zone,
3. Adjust each zone's dimensions ($l_{cz}$ and $w_{cz}$) to achieve the desired zone thermal conductivity,
4. Laser cut dividing plates 842 with adjusted geometry, and
5. Assemble temperature control assembly 534 with the custom cut dividing plates 842.

In one embodiment, the dividing plate 842 is manufactured by a laser cutting process and can be readily cut to custom dimensions to account for the manufacturing tolerances in each individual top electrode assembly. The dimensions $l_{cz}$ and $w_{cz}$ may be cut with +/−0.001" accuracy using low-cost CO2 laser systems. A cutting accuracy of +/−0.001" may lead to an accuracy of +/−0.8% in thermal conduction of each zone. If greater precision is required, more expensive laser cutting systems such as the Oxford Lasers E-Series laser micro cutting system could be used to achieve dimensional accuracy of +/−0.0002" and thermal conduction accuracy of +/−0.2%.

Electrostatic Chuck with Thermal Switches

The electrostatic chuck (ESC) of a Capacitively Coupled Plasma Process Module has two basic functions: (1) to "chuck" or clamp a silicon wafer to a ceramic plate with electrostatic force and (2) to precisely control the temperature of the silicon wafer temperature to achieve an optimal result during an etch process. Generally, the clamping function is accomplished by applying a high voltage to a chucking electrode which is commonly a thin metal sheet embedded in the ceramic plate. The clamping function holds the silicon wafer in place during etch and allows the backside of the silicon wafer, i.e., the gap between the silicon wafer and the top surface of the ESC) to be filled with helium at a pressure higher than the chamber pressure. The pressurized helium serves to increase the thermal conductivity across this gap.

Figure 17A:
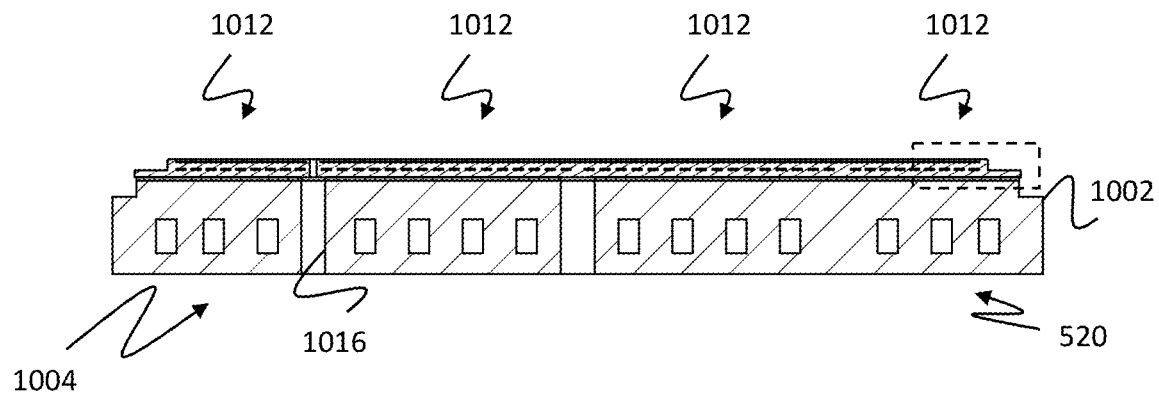
FIG. 17A is a cross-sectional view of an exemplary electrostatic chuck.
Figure 17B:
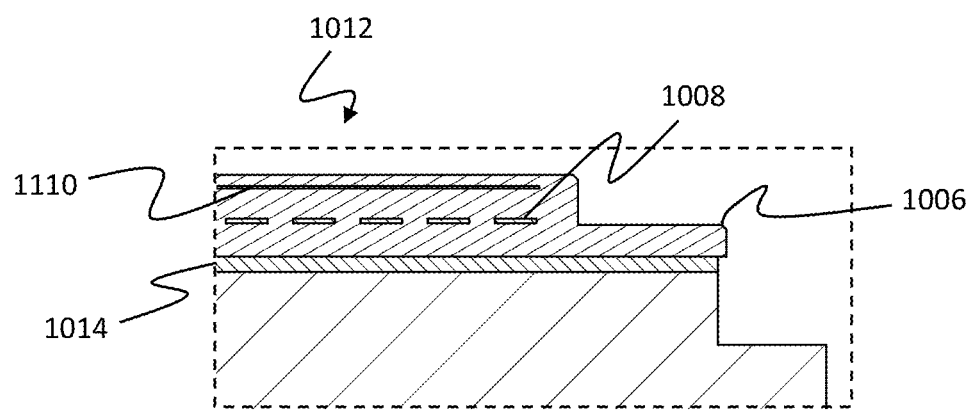
FIG. 17B is an enlarged portion of the cutaway perspective view of FIG. 17A.
Figure 17C:
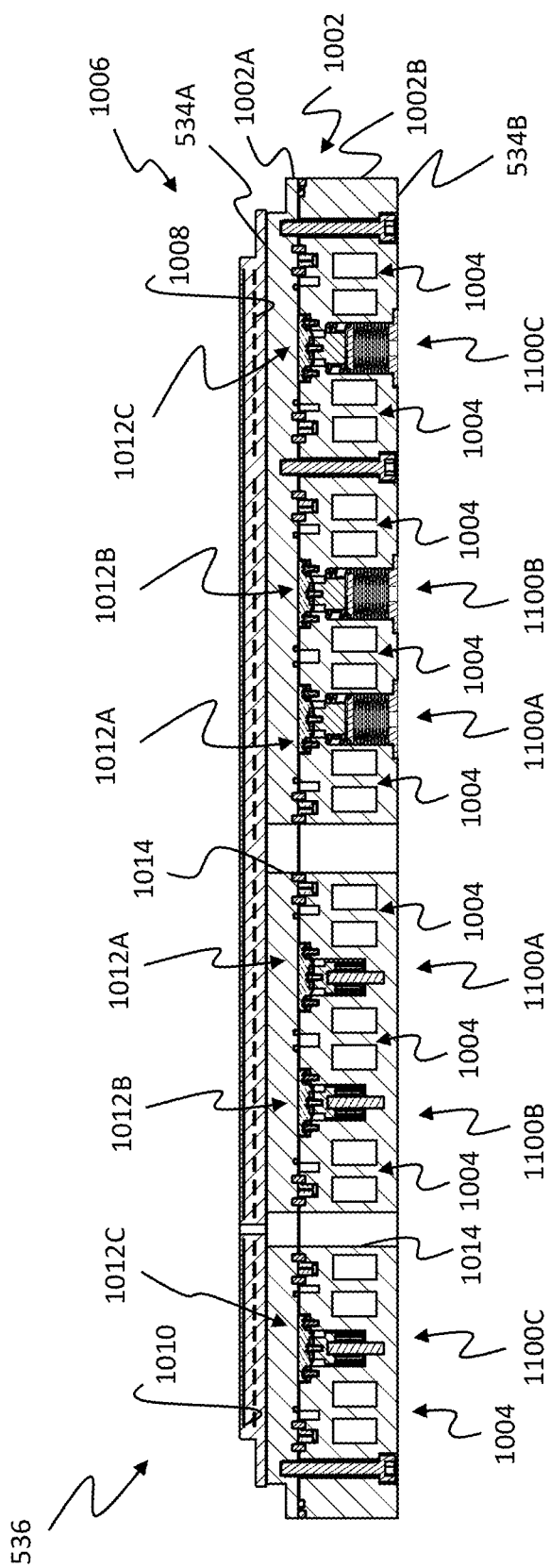
FIG. 17C is a cross-section view of an electrostatic chuck temperature control assembly having a plurality of thermal switches, according to an embodiment of the present invention.

With reference to FIGS. 17A and 17B, the basic structure of an electrostatic chuck (ESC) 520 is shown. Generally, the ESC 520 includes an aluminum cooling plate 1002 having a plurality of cooling channels 1004 for circulating coolant. The aluminum cooling plate 1002 serves as a base for the ESC 520. A ceramic plate 1006 contains embedded heater elements or traces 1008 and a chucking electrode 1010. The heater traces 1008 are commonly divided into ring shaped zones 1012. In the illustrated embodiment, the zones 1012 are powered independently to achieve desired temperature variation (edge hot, center hot, etc.). The ceramic plate 1006 is bonded to the cooling plate 1002 with a layer of thermally conductive adhesive 1014. One or more apertures 1016 in the cooling plate 1002 allow passage of lifting pins (not shown, which may be actuated up and down to lift the wafer), electrical connections, helium supply, etc.

As in the top electrode temperature control assembly 532, an electrostatic chuck 520 controls temperature through a combination of constant cooling and modulated heating. The aluminum cooling plate 1002 is typically maintained at a constant temperature. The thermally conductive adhesive between the cooling plate 1002 and the ceramic plate 1006 creates a prescribed thermal resistance (set by the thickness of the bond) such that a desired temperature differential will be achieved by one or both of the heat generated by the electric heater elements 1008 in the ceramic plate 1002 or heat imparted to the wafer 502 by the plasma etch process.

But importantly, the thermal resistance between the cooling plate 1002 and the ceramic plate 1006 is fixed. This forces compromises in efficiency, maximum plasma heat, rate of temperature change, and operating temperature range.

In some etch processes, it is advantageous to perform a first etch step at a first temperature, and then change the temperature of the wafer 502 to a second lower or higher temperature at which a second etch step is performed.

A retention device 510, such as an ESC 520, with liquid metal thermal switches may achieve faster temperature changes by increasing thermal resistance during heating, so more of the heat generated by the electrical heater goes into increasing the temperature of the ceramic plate, and decreasing thermal resistance during cooling so heat can be drawn more quickly from the ceramic plate.

With reference to FIGS. 17C-17J, an exemplary retention device temperature control assembly 536 with thermal switches 1100 is shown. The retention device temperature control assembly 536 is located within the cooling plate 1002. In the illustrated embodiment, a variable thermal resistance may be achieved in the retention device or ESC 520 by placing thermal switches 1100 within the retention device temperature cooling assembly 536. In the illustrated embodiment, the retention device 520 includes three toroidal or ring-shaped thermal switches 1100A, 1100B, 1100C. Each thermal switch 1100A, 1100B, 1100C controls a respective ring-shaped zone 1012A, 1012B, 1012C.

In the illustrated embodiment, the cooling plate 1002 of the ESC 520 includes a first plate 1002A and a second plate 1002B bolted together with plastic shims 1102 therebetween. The top and bottom plates 1002A, 1002B are composed from a thermally conductive material, such as aluminum. The bottom plate 1002B includes the cooling channels 1004. The ceramic plate 1006 contains the heater traces 1008 and the chucking electrode 1010 and is bonded to the cooling plate 1002 with a thin layer of thermally conductive silicone adhesive 1014. The layer of thermally conductive silicone adhesive may be thinner than the layer of adhesive used in a typical ESC, as the bulk of the thermal resistance between the ceramic and cooling plate is replaced by the thermal resistance of the thermal switches 1100.

In the illustrated embodiment, the retention device temperature control assembly 536 has a generally circular top and bottom surfaces 532A, 532B. Each thermal switch 1100 is toroidal or ring shaped. In the illustrated embodiment, the retention device temperature control assembly 536 includes first, second and third ring shaped concentric thermal switches 1100A, 1100B, 100C. Each thermal switch 1100A, 1100B, 1100C is located adjacent, and controls the thermal resistance, in a respective ring-shaped portion or zone 1012A, 1012B, 1012C.

Each thermal switch 1100 includes first and second plates 1028A, 1028B, formed by, i.e., integral with, the top and bottom plates 1002A, 1002B of the cooling plate 1002, respectively. In the illustrated embodiment, each thermal switch 1100 further includes a respective pneumatic actuator 1128. The first and second plates 1028A, 1028B are composed from a thermally conductive material and form respective internal cavities 1112. The internal cavity 1112 has one or more channels 1114 that defines a gap or gaps 1120 (see below) between the first and second plates 1002A, 1002B. Each thermal switch 1100 further includes a reservoir 1124 coupled to the channel 1114 that contains a thermally conductive liquid 1126. As shown, the pneumatic actuator 1128, of each thermal switch 1100 is coupled to the first reservoir 1124 and the channel 1114 and is moveable between a first state (shown in FIG. 17F) and a second state (shown in FIG. 17E) corresponding to the on-state and the off-state of the thermal switch 1100, respectively. The pneumatic actuator 1128 is configured to allow the thermally conductive liquid 1126 to flow from the reservoir 1124 to the channel 1114 when the pneumatic actuator 1128 is in the first state and to allow the thermally conductive liquid 1126 to flow from the channel 1114 to the first reservoir 1124 when the actuator 1128 is in the second state. As discussed above, use of pneumatic actuators 1128 in place of solenoids allows the separation between adjacent switch gaps to be reduced. In the illustrated embodiment, the bellows 1128B is located within the bottom plate 1002B. To further minimize the space between the switches 1100 in the ESC 520, the bellows 1128B may be moved (or located) outside of the second plate 1002B.

Each pneumatic actuator 1128 includes a bellows 1128B and a plunger 1128C. A source of pressurized air (not shown) is controllably coupled to the bellows 1128B. The plunger 1128C is coupled to the bellows 1128B and is moveable between first and second positions corresponding to the first and second states of the pneumatic actuators 1128, respectively.

In one embodiment, the bellows 1128B acts on the plunger 1128C to move the plunger 1128C from the second position to the first position when pressurized air from the source of pressurized air 1128A is applied to the bellows 1128B. Further, a return spring 1128D may be coupled to the bellows 1128B and configured to move the plunger 1128C from the first position to the second position when the source of pressurized air is removed from the bellows.

Figure 17D:
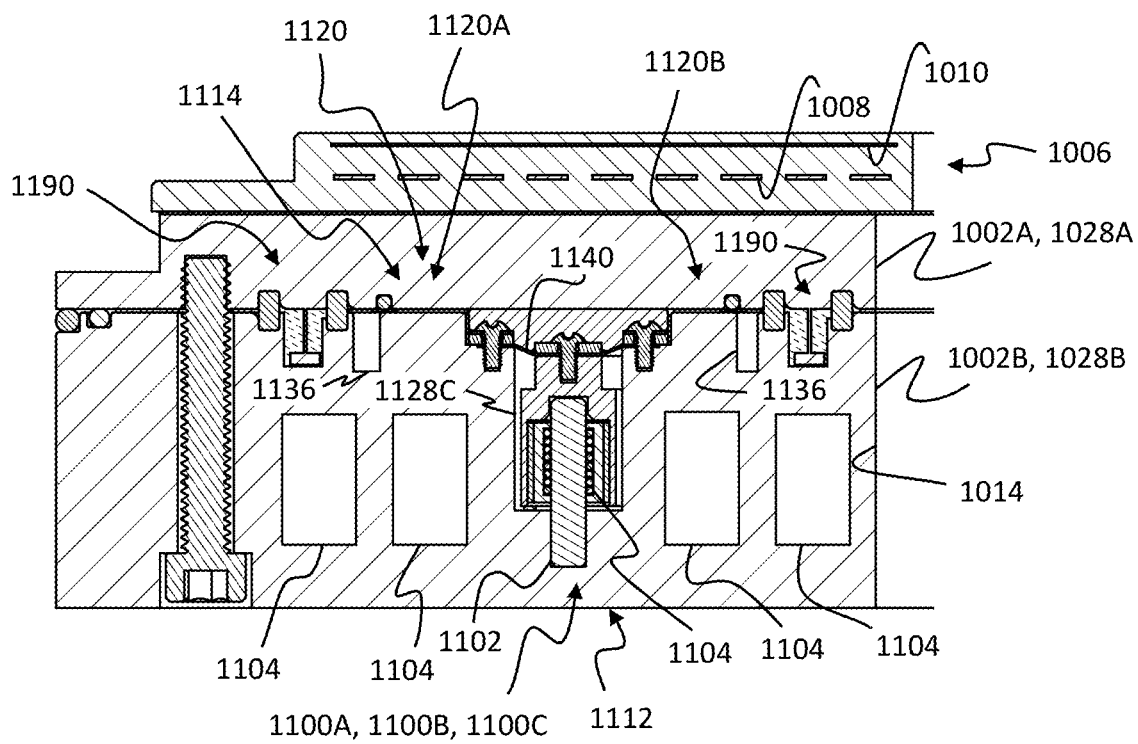
FIG. 17D is a first partial cutaway view of one of the switches of the electrostatic chuck temperature control assembly of FIG. 17C.
Figure 17E:
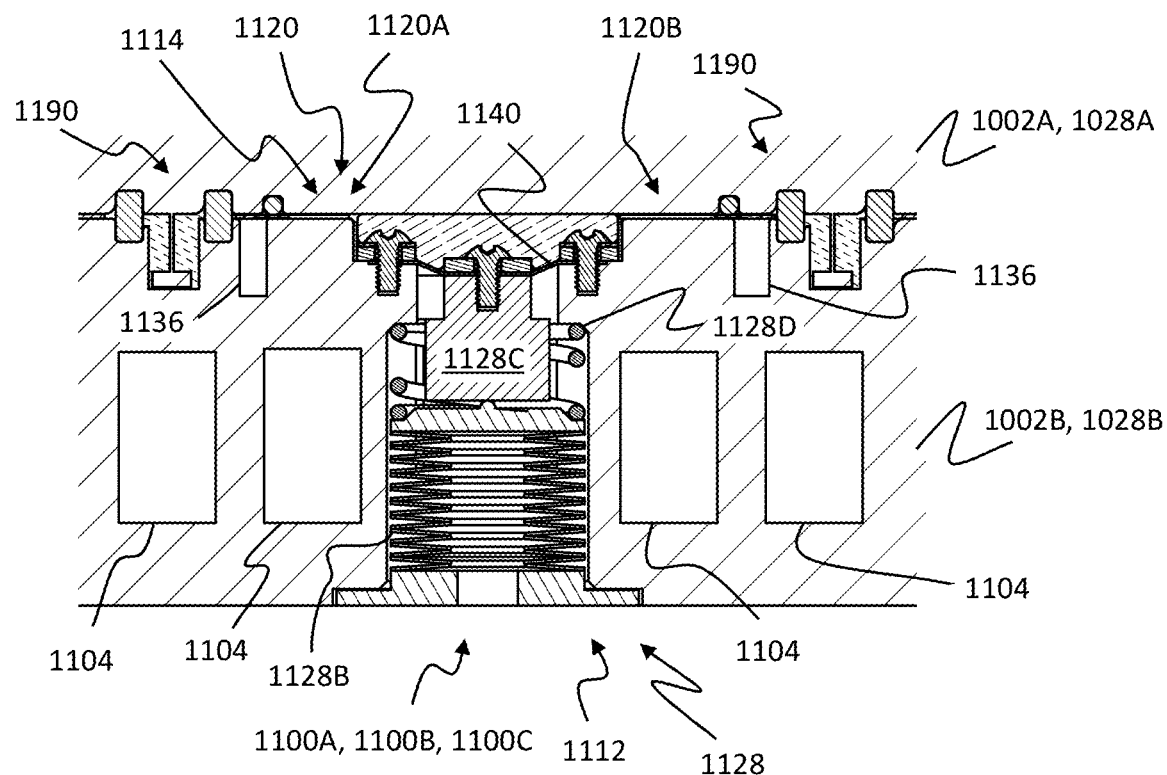
FIG. 17E is a second partial cutaway view of one of the switches of the electrostatic chuck temperature control assembly of FIG. 17C, in an off-state.
Figure 17F:
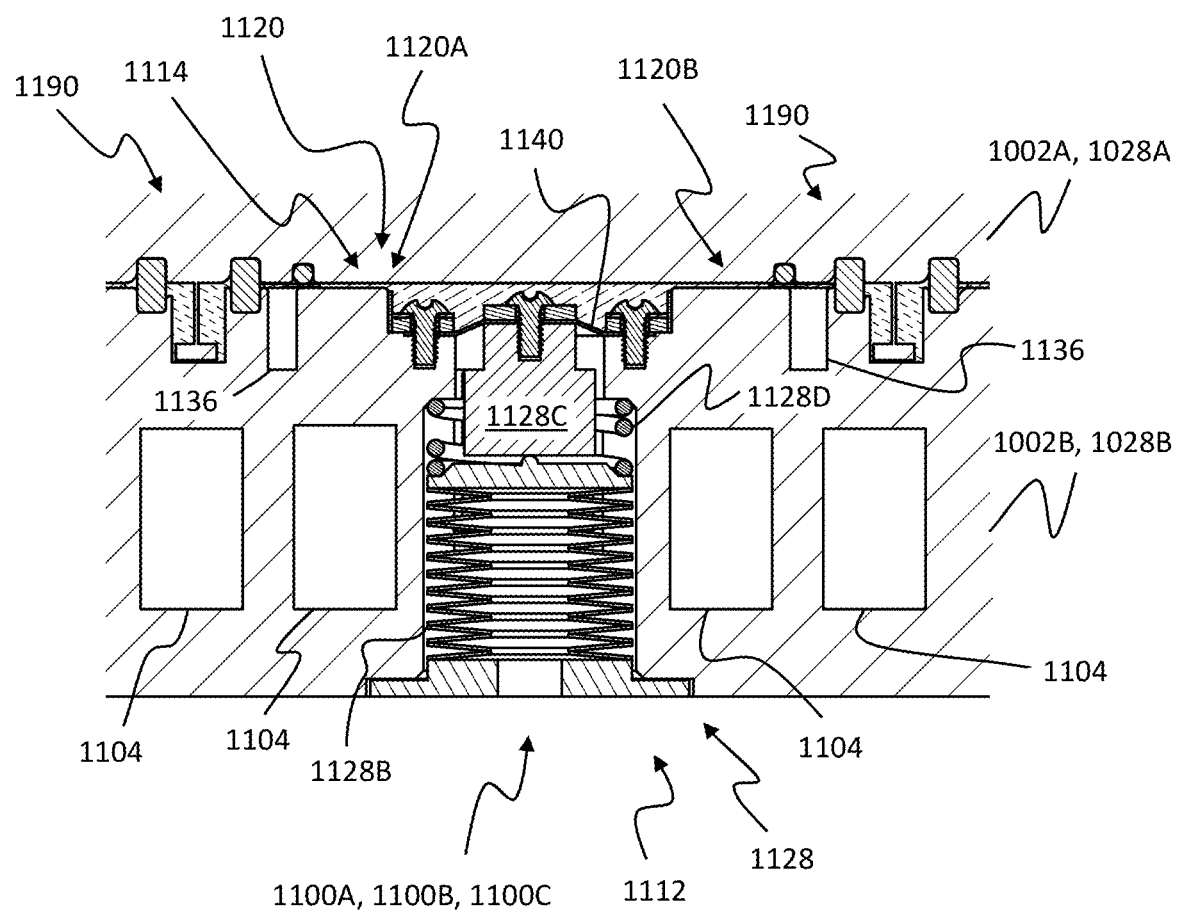
FIG. 17F is a third cutaway view of the switch of FIG. 17E, in an on-state.
Figure 17G:
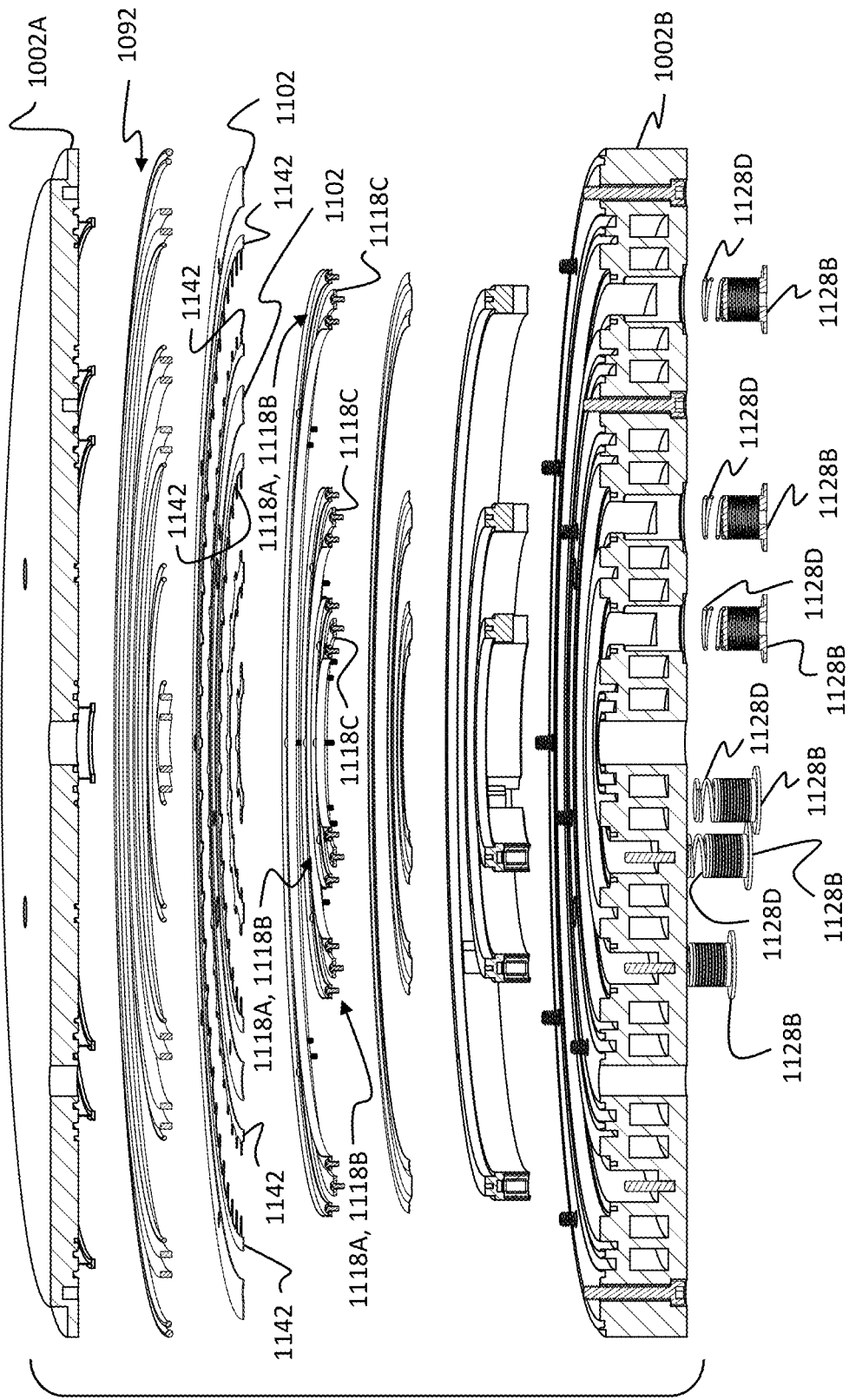
FIG. 17G is an exploded view of the electrostatic chuck temperature control assembly of FIG. 17C.

As shown in FIG. 17D, the plunger 1128C is held in place by linear ball bearings 1104 sliding on bearing posts 1102. Alternatively, the linear ball bearings 1104 may be replaced by sleeve bearings, or the bellows 1002B or the membrane 1140 may be configured to center the plunger 1128C. The pneumatic actuator 1128 pushes the plunger 1128C to the first position (which forces the thermally conductive liquid 1126 into the gaps 1120A and 1120B). A pair of second (or gas) reservoirs 1136 accommodate the gas displaced when thermally conductive liquid 1126 moves into respective gaps 1120A and 1120B. In the illustrated embodiment, the second reservoirs 1136 are in the form of a circular channels. Configuring each of the thermal switches 1100 with a pair of gaps 1120A and 1120B allows a further reduction in the separation between adjacent thermal switch gaps.

Each thermal switch 1100 further includes a diaphragm or membrane 1140 retained by clamp rings 1118A, 1118B and connected to the plunger 1198 with a rib 1118C.

A dividing plate 1142 with laser scored vents provides the gas path between the gap 1120 and the second reservoir 1136. In one embodiment, the dividing plate 1142 (and other plastic components of the thermal switches 800) are composed from a polyimide material, such as Kapton film available from 3M. Polyimide film has a CTE (20×10-6/° C.) close to the CTE of aluminum (24×10-6/° C.). Since the dividing plate 1142 (and the other plastic parts) are large (up to 12" diameter, it is critical that thermal expansion be minimized.

It should be noted that in the illustrated embodiment, the gap 1120 of each thermal switch 1100 does not have sub-channels. The required thermal resistance may be achieved with a gap of length less than or equal to 0.2", so a simple implementation as illustrated is best suited to this embodiment. Oxygen seals 1190 and O-rings and/or square rings 1192 are used to seal channels and cavities as needed.

In the illustrated embodiment, a plurality of feedthrough apertures 1016 may be provided through the cooling plate 1002, and in some cases through the ceramic plate 1006 to permit passage of various features including, e.g., lift pins (not shown) which move the wafer up and down and electrical connections (not shown) to the chucking electrode 1010 and/or heater traces 1008, and passage for gas (helium).

Precise control of local thermal conduction across the gaps 1120 is achieved using the same method as previously described for the top electrode temperature control assembly. The dividing plates 1142 split the thermal switch gaps 1120 into a plurality of conduction zones 1122 as shown in FIG. 17H.

Figure 17H:
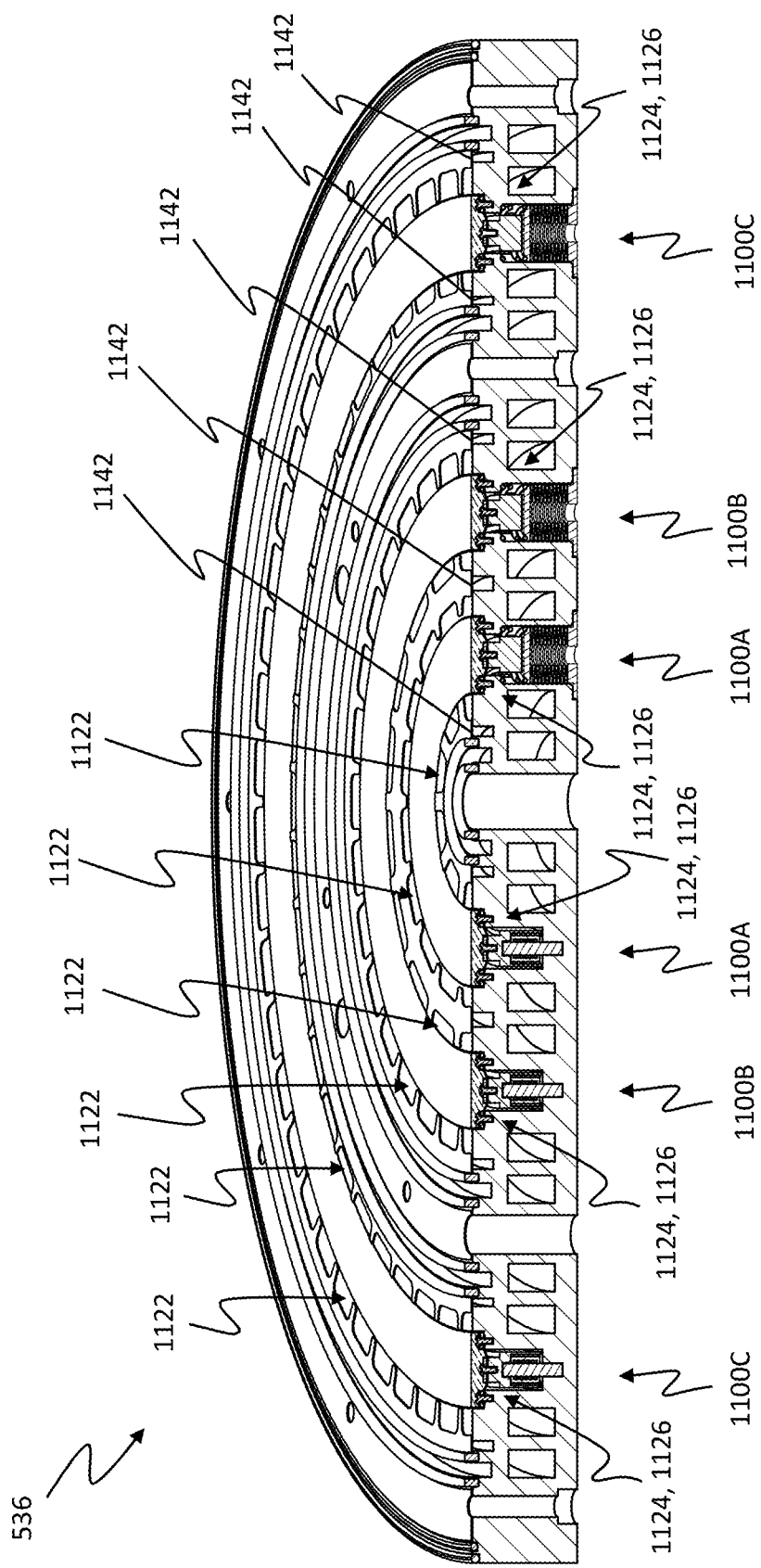
FIG. 17H is a cutaway view of the electrostatic chuck temperature control assembly of FIG. 17C.

In FIG. 17H, the retention device temperature control assembly 536 (without the first plate 1002A) is show. In this view the plunger 1128C of all three switches 1100A, 1100B, 1100C is down and the thermal switches 1100A, 1100B, 1100C are all in the open position.

The size of the conduction zones is adjusted by modifying the dimensions of the dividing plates. As previously discussed, the conduction zones may be adjusted to compensate for local variations in the thermal switch gap height. Further adjustments may be made to compensate for other thermal variation, which in an ESC may be caused by:

Non-uniformity of cooling due to feedthroughs in the cooling plate and the geometry of the cooling channels.

Manufacturing variation in heater elements, which lead to deviation from the desired heater watt density and corresponding hot or cold spots.

Variation in the thickness of the adhesive layer between the ceramic plate and cooling plate.

In the illustrated embodiment of a retention device temperature control assembly 536 with thermal switches 1100, all three of these variations can be corrected by adjusting thermal conduction zones using the method:

1. Characterize the thermal resistance of the cooling plate. This may, for example, be accomplished via thermal simulation.
2. Measure the thermal response of the as-manufactured ceramic plate. For example, the embedded heater may be operated while the ceramic plate is monitored with an infrared camera.
3. Measure the surfaces of the first, second, and ceramic plates with a CMM.
4. Calculate the as-assembled switch gap.
5. Bond the ceramic to the first plate.
6. Measure the top surface of the bonded ceramic/first plate assembly with a CMM.
7. Calculate the adhesive thickness.
8. Compute the required thermal conductivity of each conduction zone.
9. Calculate the corresponding dimensions $l_{cz}$ and $w_{cz}$ of each conduction zone.
10. Laser cut the dividing plates 1142 to the calculated dimensions.
11. Assemble the retention device temperature control assembly 536.

Through use of this method, an ESC with thermal switches according to the above embodiment may be able to achieve thermal precision superior to that of a conventional ESC. Further, precise control of a prescribed spatial variation of local thermal conductivity could be achieved if desired, a capability not readily achieved using prior art.

For some embodiments of an ESC or other components which may benefit from thermal switches, it may be of further benefit that an intermediate thermal switch state has a distinct controlled spatial variation. A gap configured as shown in FIGS. 3P-R may be used to achieve a definitive intermediate state (as opposed to intermediate states achieved through pulsing). Further, multiple dividing plates (one additional dividing plate per intermediate state) may be implemented. In this fashion the spatial variation of thermal conductivity in the intermediary state may be controlled.

Figure 17I:
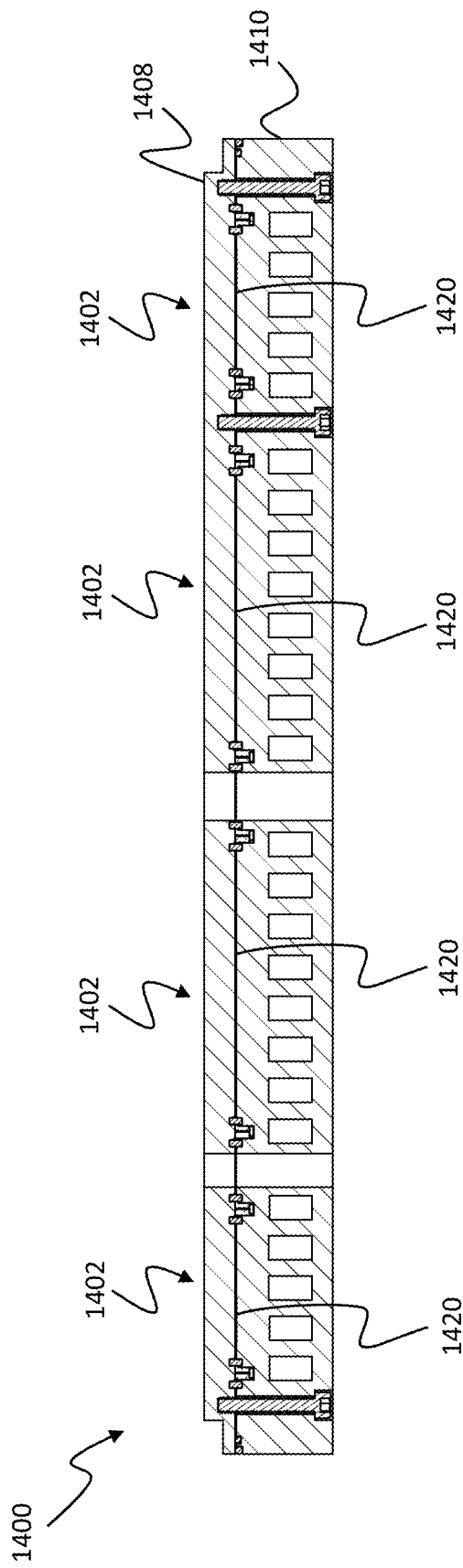
FIG. 17I is a cutaway view of a temperature control assembly configured with a liquid metal thermal interface.
Figure 17J:
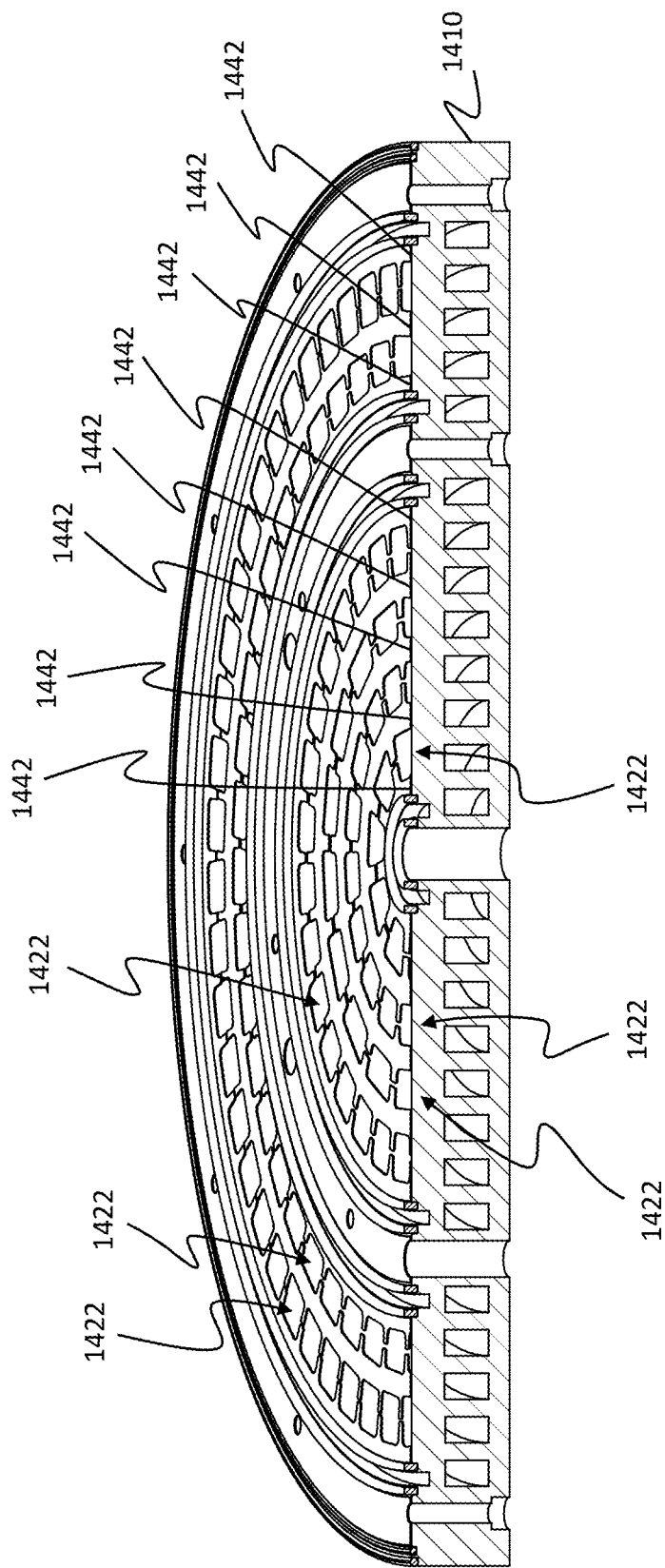
FIG. 17J is a cutaway view of the temperature control assembly of FIG. 17I.

In another embodiment as shown in FIGS. 17I and 17J, a temperature control assembly 1400 is configured with an un-switched (or always-on) thermal interface 1402. The temperature control assembly 1400 includes a first plate 1408 and a second plate 1410. The first and second plates 1408, 1410 are made from a thermally conductive material such as aluminum. The thermal interface 1402 is formed by one or more gaps 1420 filled with a thermally conductive liquid (not shown). Multiple dividing plates 1442 in the gaps 1420 may be configured to achieve a desired spatial variation of thermal resistance for the purposes of achieving a desired temperature profile of a working surface or workpiece. The desired dimensions of the conduction zones 1422 may be determined using procedures as described above. In the illustrated embodiment, the second plate 1410 may include a plurality of cooling channels 1414. The temperature control assembly 1400 of FIGS. 17I and 17J may include one or more of the features of the various devices described herein.

Passively Actuated Thermal Switch

In some thermal control applications, the requirements of a thermal switch are such that passive actuation is sufficient or desirable. For example, in aerospace systems the available supply of electrical power may be limited, making the power requirement of an active actuator prohibitive. Other applications may require lower weight or cost than that achievable with an actively actuated thermal switch.

In some applications, a thermal control system needs only to maintain a component temperature in a relatively wide operating range. For example, acceptable operating temperatures for the battery of an electric vehicle may be as wide as 10° C. to 60° C. This wide range combined with a greater emphasis on minimizing weight and cost may make a passively actuated switch, such as the embodiment illustrated in FIGS. 18A-18I, desirable. This embodiment might be employed in automotive thermal systems including components such as a battery, battery charger, electric motor, power electronics, internal combustion engine, catalytic converter, cabin HVAC, fuel cell, or thermoelectric generator.

In consideration of additional performance requirements in automotive applications, the illustrated embodiment includes design features to address:

(1) Operating temperatures below the freezing point of the thermally conductive liquid—Gallium and alloys containing gallium are known to expand when frozen and the thermal switch must accommodate this expansion.

(2) Dynamic loading—Movement of the vehicle could cause the thermally conductive liquid to slosh around within the switch, resulting in an undesired increase in the thermal conductivity of the switch if thermally conductive liquid is not withdrawn from the gap.

It should be understood that these design features may be employed in actively actuated switches and in other types of thermal systems. The thermal switch 1200 has a square housing and a toroidal or ring-shaped gap 1220, however, it should be noted that any shape, including a non-ring shaped gap 1220 may be used (similar to FIGS. 3A-3S).

With reference to FIGS. 18A-18I, a passively actuated thermal switch 1200 with an on-state and an off-state has a first plate 1208 and a second plate 1210 according to one embodiment of the present invention. The first and second plates 1208, 1210 are composed of a thermally conductive material, such as aluminum. The first and second plates 1208, 1210 of the thermal switch 1200 of the illustrated embodiment form a housing that has a height of 0.7" and a length and width of 3.5". The housing 1208, 1210 includes apertures 1288 for mounting the thermal switch 1200 and an exterior seal 1206 to keep out dirt and moisture.

The first and second plates 1208, 1210 are connected to form an internal cavity 1212 having a channel 1214 that forms a gap 1220 between the first and second plates 1208, 1210. The passively actuated thermal switch 1200 includes a first reservoir 1224 coupled to the channel 1214. The first reservoir 1224 contains a thermally conductive liquid, such as mercury or an alloy of gallium, indium and tin. An actuating reservoir 1202 contains an actuating material 1204 which expands with increasing temperature. The choice of actuating material 1204 is dependent upon the desired thermal performance of a specific switch design. The actuating material 1204 may be a material which expands on heating—such as a hydrocarbon grease, or a material which expands when melting—such as paraffin wax. A membrane 1240 is connected to the first and/or second plates 1208, 1210. The membrane 1240 separates the first reservoir 1224 from the actuating reservoir 1202 and is moveable between a first state and a second state corresponding to the on-state and the off-state of the thermal switch 1200, respectively. The actuating material 1204 expands when heated. Expansion of the actuating material 1204 causes the membrane 1240 to move from the second state to the first state. The thermally conductive liquid 1226 flows from the first reservoir 1224 to the channel 1214 when the membrane 1240 is in the first state and the thermally conductive liquid 1226 flows from the channel 1214 to the first reservoir 1224 when the membrane 1240 is in the second state.

As shown, the channel 1214 has a first end and a second end. The first reservoir 1224 is coupled to the first end of the channel 1214. The thermal switch 1200 includes a second reservoir 1236 coupled to the second end of the channel 1214. The second reservoir 1236 contains a gas (see above). A gas entry/exit point between the second reservoir 1236 and the channel 1214 has a height of the entry/exit point that is less than a height of the gap 1220 (see above).

With particular reference to FIG. 18A-18F, the first plate 1208 is fastened to the second plate 1210 by a plurality of fasteners 1258. e.g., bolts. A plurality of plastic shims 1262 disposed between the first and second plates 1208, 1210 provide thermal isolation and allow thermal expansion of the first plate 1208 (relative to the second plate 1210).

The membrane 1240 is composed of a suitable elastomer and separates the thermally conductive liquid 1226 from the actuating material 1204. The membrane 1240 is secured to the second plate 1210 with a clamp ring 1280. The clamp ring 1280 is secured with screws and clamps the membrane 1240 to the second plate 1210. A support ring 1282 rests on a ledge in the second plate 1210 and pushes the membrane 1240 diaphragm against the first plate 1208 when the thermal switch 1200 is assembled. A plurality of seals 1284 (which may be O-rings or of rectangular or square cross section) provide sealing at various locations in the thermal switch 1200.

Figure 18A:
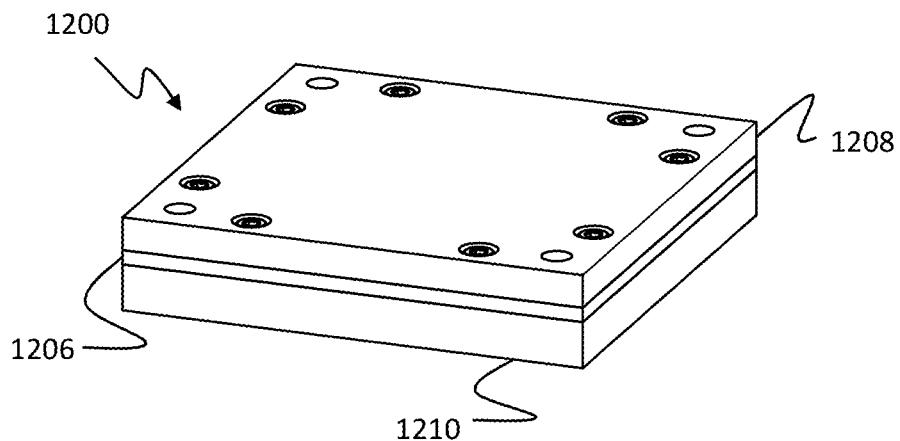
FIG. 18A is a first perspective view of a passively actuated thermal switch having first and second plates, according to an embodiment of the present invention.
Figure 18B:
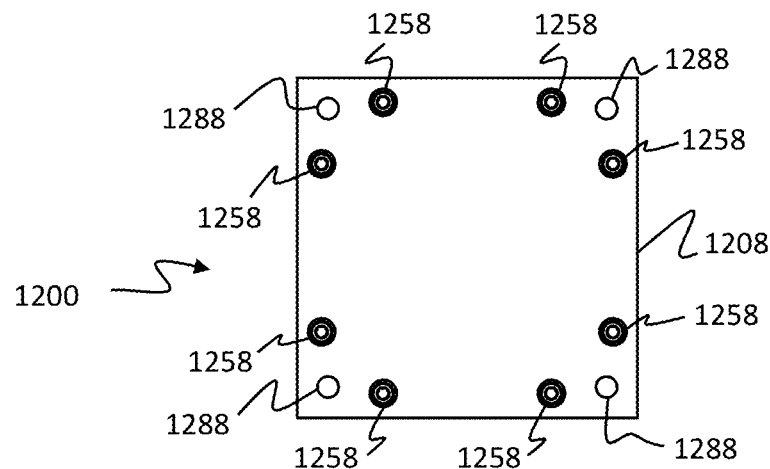
FIG. 18B is a top view of a first plate of the thermal switch of FIG. 18A.
Figure 18C:
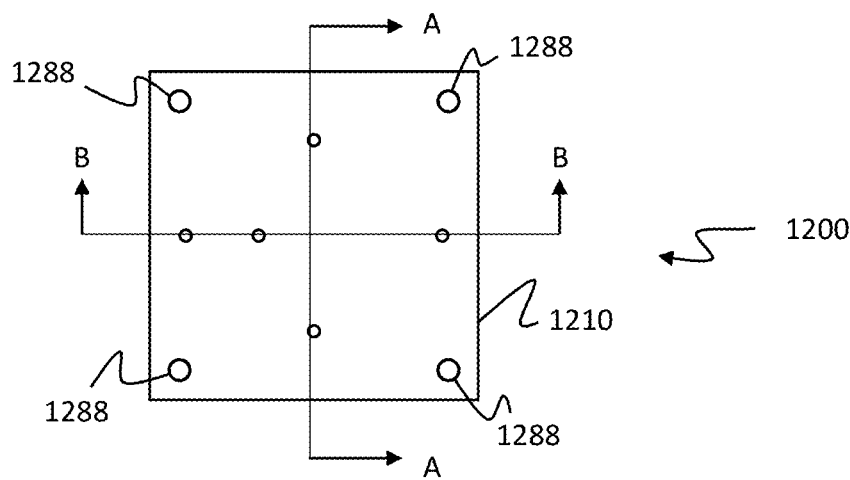
FIG. 18C is a bottom view of the thermal switch of FIG. 18A.
Figure 18D:
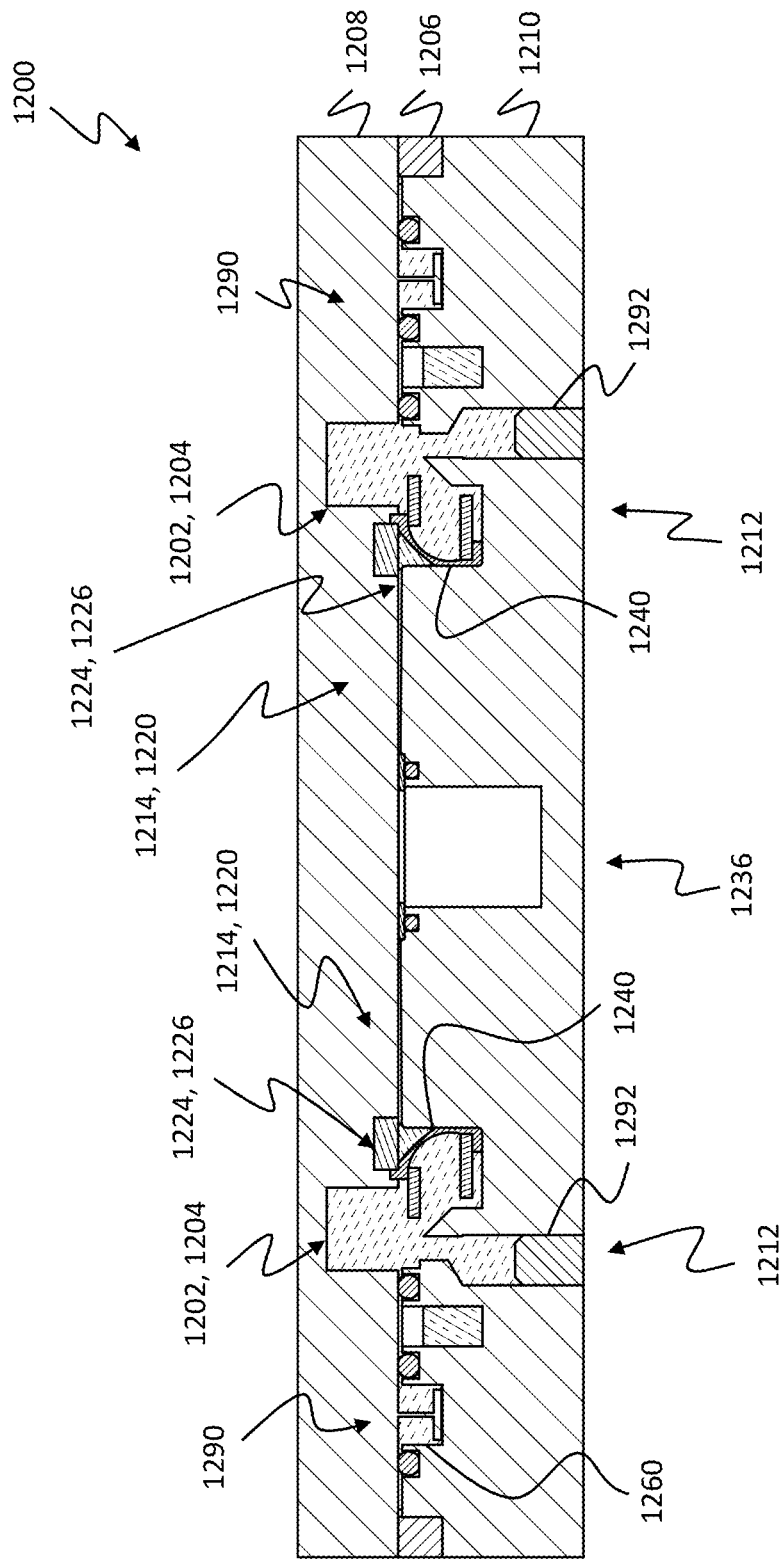
FIG. 18D is a first cross-sectional view of the thermal switch of FIG. 18A.
Figure 18E:
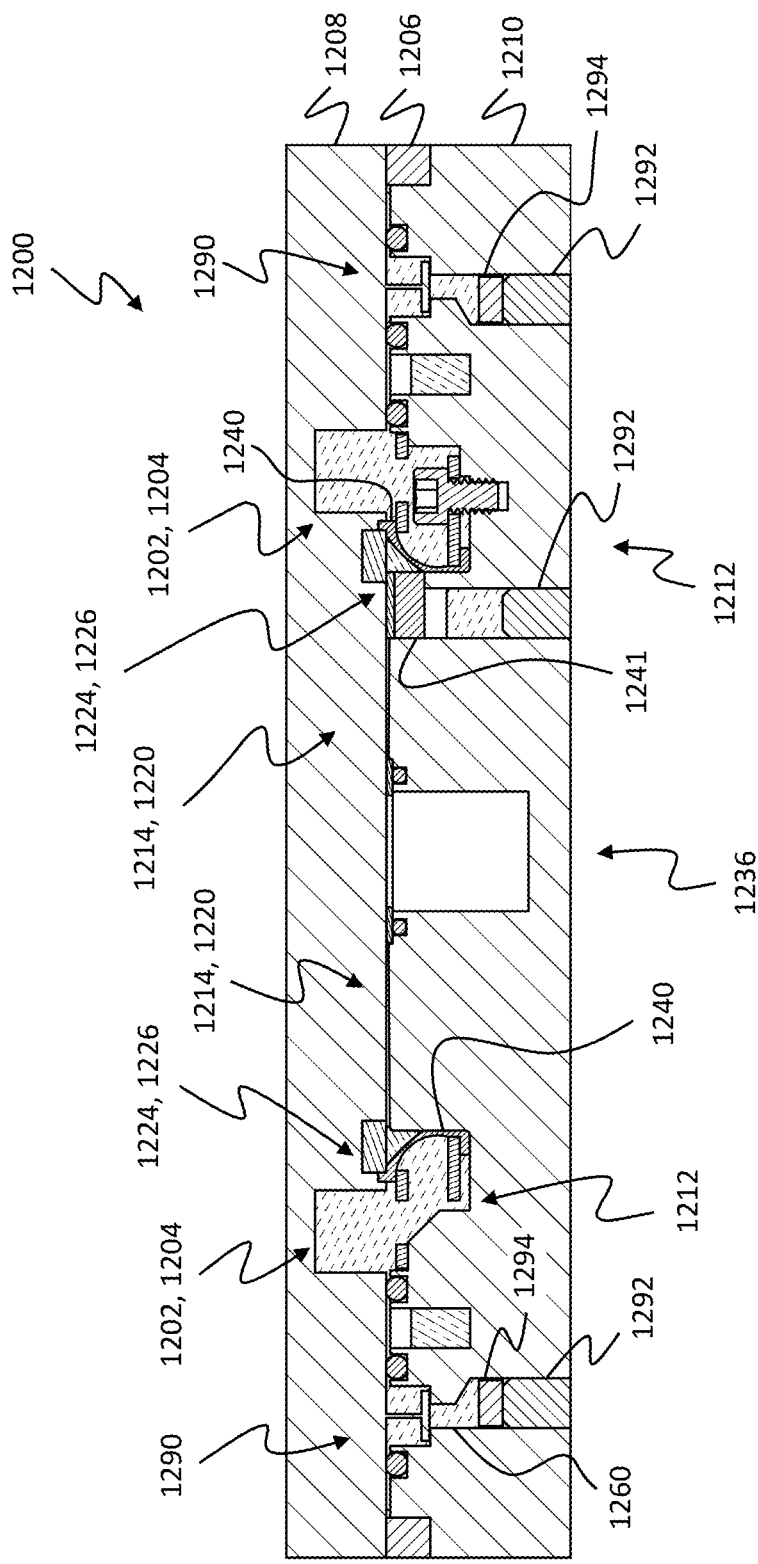
FIG. 18E is a second cross-sectional view of the thermal switch of FIG. 18A.
Figure 18F:
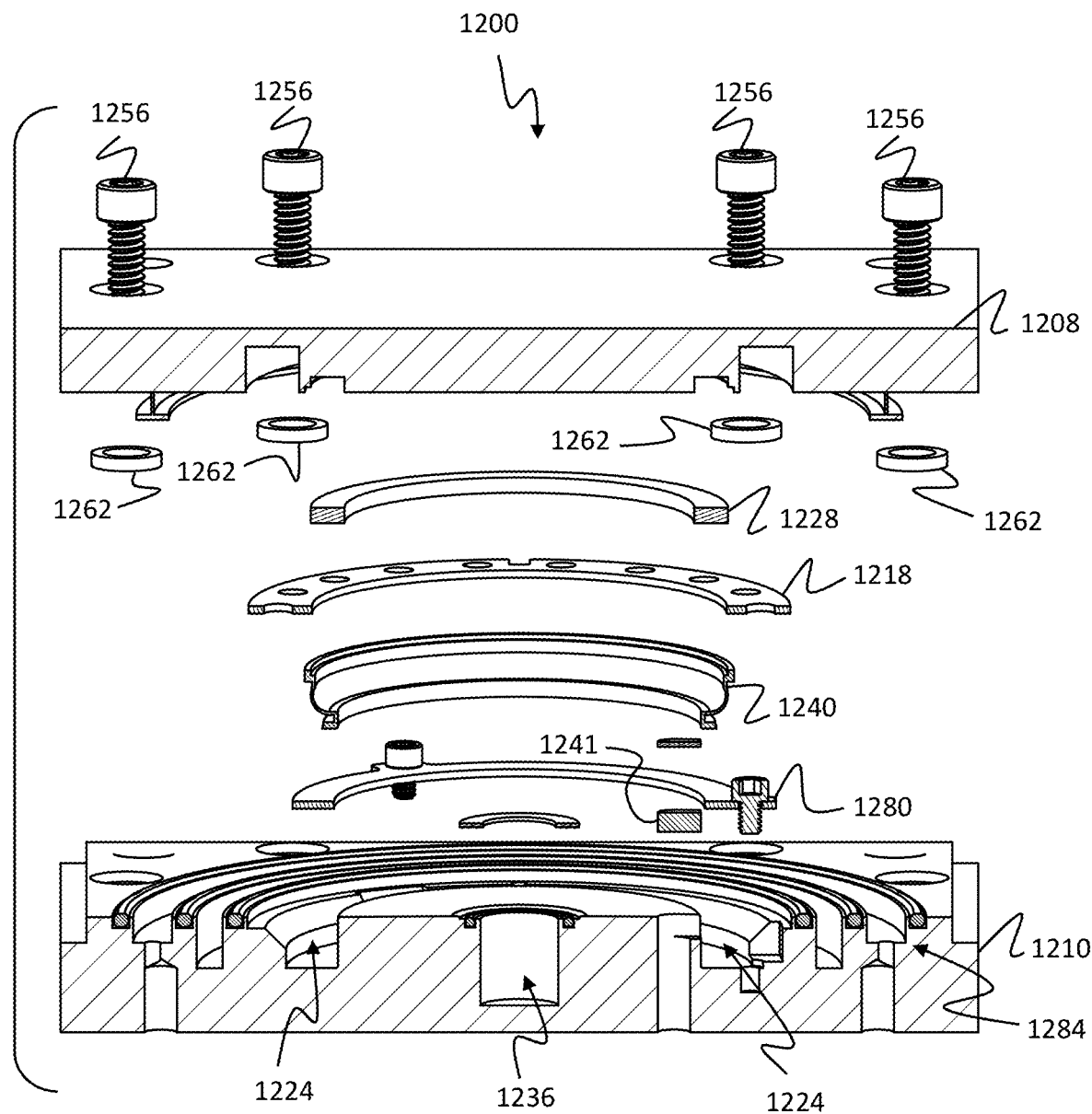
FIG. 18F is an exploded view of the passively actuated thermal switch of FIG. 18A.
Figure 18G:
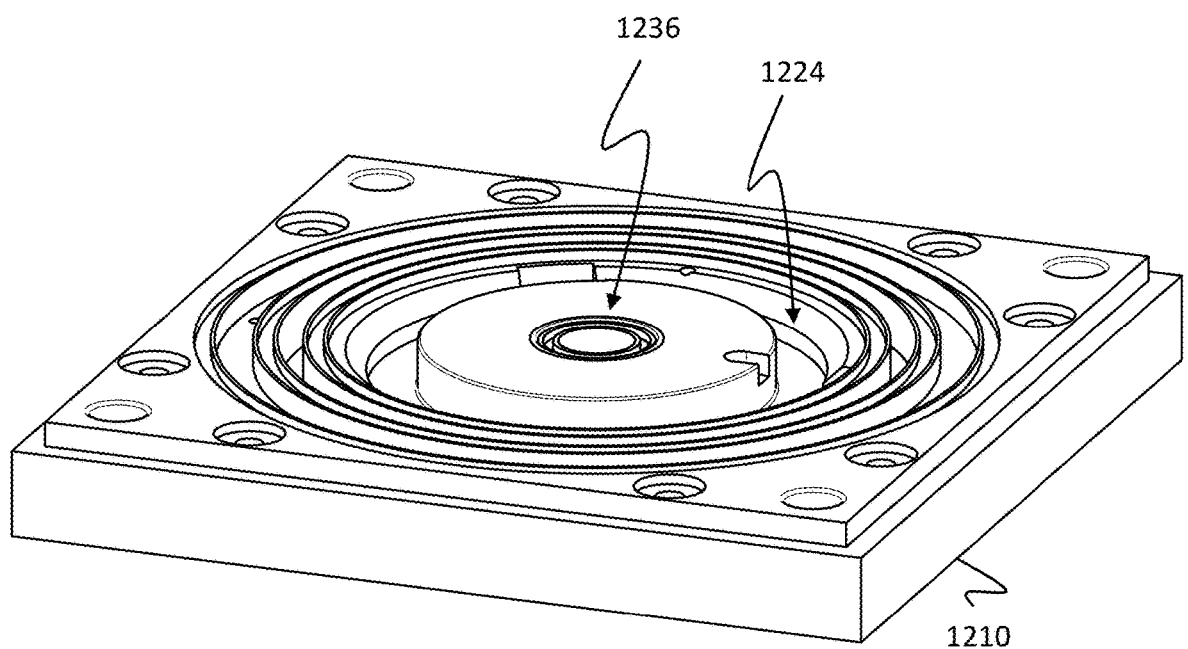
FIG. 18G is a perspective view of the second plate of the thermal switch of FIG. 18A.

FIG. 18D is a cross-sectional view of the thermal switch 1200 along A-A (see FIG. 18C) and FIG. 18E is a cross-sectional view of the thermal switch 1200 along B-B (see FIG. 18C). In the illustrated embodiment, the thermally conductive material 1226 is injected prior to the injection of the actuating material 1204. As shown in FIG. 18F, in the illustrated embodiment, the second plate 1210 includes two actuating material ports 1203. The actuating material is injected through one of the ports 1203, while a vacuum pump evacuates the actuating reservoir via the other one of the ports 1202 to minimize voids or gas pockets. As shown in FIG. 18G, the first reservoir 1224 is filled with the thermally conductive liquid 1226 using a port 1205.

Figure 18H:
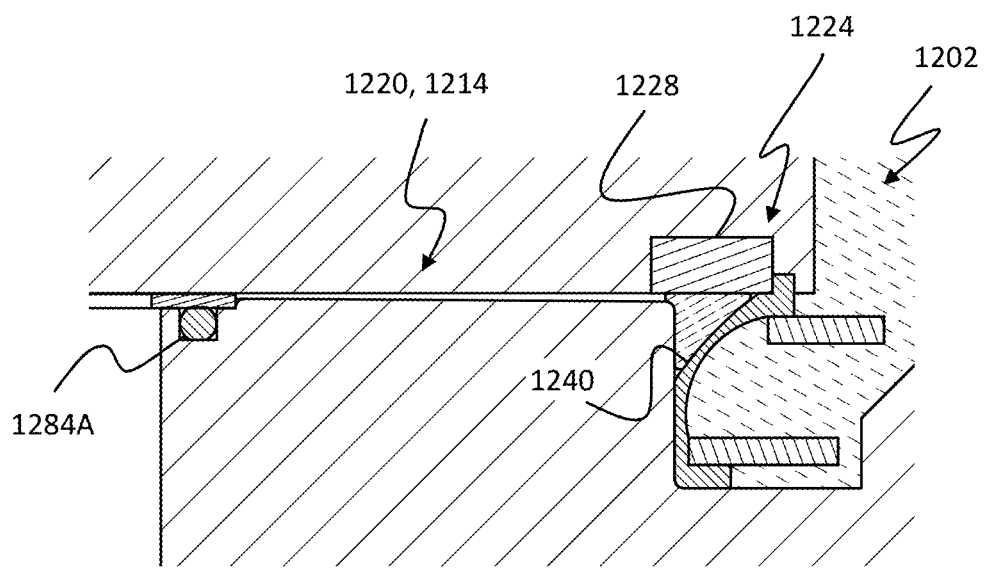
FIG. 18H is a third cross-sectional view of the thermal switch of FIG. 18A in an off-state.
Figure 18I:
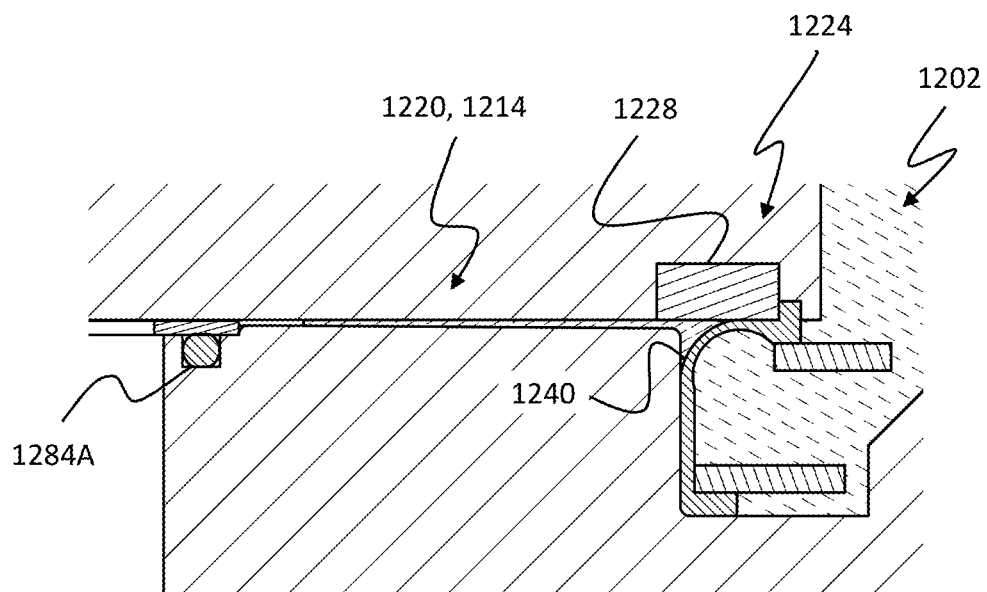
FIG. 18I is a fourth cross-sectional view of the thermal switch of FIG. 18A in an on-state.

Cross-sectional views of the thermal switch 1200 with the actuating reservoir 1202 filled with the actuating material 1204 and the first reservoir 1224 filled with the thermally conductive liquid 1226 are shown in FIGS. 18I and 18J. In the illustrated embodiment the thermally conductive liquid 1226 is an alloy of gallium, indium and tin. The thermal switch 1200 may include an oxygen seal 1290 (see above). As discussed above, the oxygen seal 1290 may use a hydrocarbon vacuum grease. The same grease may be used as the actuating material 1204. The illustrated embodiment includes a separate trench for an oxygen absorbing material. In other embodiments this trench may be omitted and an oxygen absorbing material may be added to the actuating material 1204 or the gas blocking material 1260 of the oxygen seal.

In the illustrated embodiment the actuating reservoir 1202 is in the first plate 1208 which, in operation, has a higher temperature than the second plate 1210. Expansion of the grease causes pressure on the membrane 1240, which forces the thermally conductive liquid 1226 into the gap 1220 and creates a higher thermal conductivity across the switch 1200. With the actuating reservoir 1202 located in the hotter plate, the switch 1200 begins to close (to a higher thermal conductivity, on-state) when the first plate 1208 is heated to a critical temperature. The critical temperature of a particular design may be set by choosing the volume of the actuating reservoir 1202 and the volume of the actuating material 1204 in the actuating reservoir 1202.

It should be noted that the action of the switch 1200 closing and opening will be gradual and occur over a temperature range rather than as an instantaneous change. Design parameters may be set to influence the rate of change, including the ratio of gap volume to grease reservoir volume, or by adjusting the fill volume of actuating grease. A phase changing material (such as melting paraffin wax or a boiling refrigerant) may be used as an actuator if an abrupt switch actuation is desired.

Aluminum plugs 1292 may be used to seal the actuating material or grease, the gas blocking material 1260, and thermally conductive liquid in the respective reservoirs or volumes. Foam discs 1294 allow the sealing grease to expand and contract with temperature change. An external seal 1206, which may be composed from an adhesive or an elastomer, has the purpose of keeping dirt out of the gap between the top and bottom plates 1208, 1210.

With reference to FIGS. 18H and 18I, the thermal switch 1200 is shown in the off and on-states, respectively. A plastic or insulating ring 1228 is positioned to reduce heat flow in the off-state from the first plate 1208 through the thermally conductive liquid 1226 outside the gap 1220, and down to the pedestal of the second plate 1210. This heat flow would increase the thermal conductivity in the off-state, which may be undesirable.

A plastic vent ring 1218 with laser-cut vent slits provides a gas path from the gap 1220 to the second reservoir 1236. As discussed above, the second or gas reservoir 1236 may have a volume much larger than the gap 1220. Thus, the increase in gas pressure as the thermally conductive liquid 1226 advances into the gap 1220 is relatively small. In the actively actuated embodiments, this was done to reduce the required actuator force. The expansion of the actuating material 1204 can generate very high pressure if constrained, but it may be desirable to minimize the actuating pressure, as this pressure would also act on the seal at the perimeter of the actuating reservoir and on the first and second plates 1208, 1210 potentially creating a high bolt load.

In one embodiment, to make the switch 1200 capable of operation below the freezing point of the thermally conductive liquid, the thermally conductive liquid 1226 is confined to a toroidal volume bounded by the first plate 1208, pedestal of the second plate 1210, and diaphragm 1240. When the thermally conductive liquid 1226 freezes, it is free to expand outwards. The membrane 1240 may flex outwards to accommodate the expansion. Cooling of the actuating material 1204 to the freeze temperature of the thermally conductive liquid 1226 will have created sufficient empty volume to accommodate expansion of the thermally conductive liquid 1226. The elastomer cap 1241 keeps the thermally conductive liquid 1226 out of the fill port 1225.

The thermal switch 1200 will be subjected to dynamic loading which may cause the pressure in the thermally conductive liquid in contact with the gas entry/exit point to increase. To prevent the thermally conductive liquid from flowing into the second reservoir, achieving a minimum gap height at the gas exit/entry point is important. Compression of a backing ring 1284A forces the vent ring 1218 firmly against the first plate 1208. This ideally means only the laser cut slits (or gas vents) are available as flow paths.

Dynamic loading may also lead to the thermally conductive liquid 1226 sloshing in the gap 1220. In some circumstances this may lead to a portion of liquid becoming separated from the remaining liquid in the first reservoir. In the illustrated embodiment, the gap 1220 is sloped. As explained above and illustrated in FIGS. 3M-3O, in a sloped gap surface tension will always exert a net expelling force on any thermally conductive liquid 1226. Thus, the sloped gap ensures both consistent actuation of the switch and that no liquid will be in the gap if the switch freezes.

The embodiment described above is an example of a thermal switch passively actuated by the expansion of a liquid or grease. In light of all of the previously discussed embodiments, features of various embodiments may be combined or modified to achieve passive actuation by other means. Shape memory alloy springs may be employed to actuate the plunger, in place of the solenoid, in an embodiment similar to FIG. 6A-6N. Shape memory alloys are materials which may generate force from a crystallographic phase change occurring at a critical temperature. If the compression springs 208 are replaced with shape memory alloy springs, the force applied by the spring would vary depending on the temperature of the spring, with actuating force being achieved at the phase transformation temperature of the particular shape memory alloy chosen. With reference to the embodiment of FIGS. 5A and 5B, a bimetallic element (two metals of dissimilar thermal expansion joined to form a thermostatic structure) such as a prestrained Belleville washer, a stack of bimetallic washers, a bimetallic strip or ring, may be configured as actuator 128. The actuating temperature could be chosen by appropriate selection of bimetal materials. With reference to the embodiment of FIG. 15A-15B, the bellows 728B may be sealed and charged with a refrigerant. Actuation of the switch would occur at the boiling temperature of the refrigerant.

Generally, the embodiments discussed in detail above are normally open switches, i.e., the switches are open, i.e., have lower thermal conductivity when the actuator is inactive (not actuated). It should be noted that each of the embodiments may be configured as normally closed switches, i.e., have lower thermal conductively when the actuator is active (actuated).

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale. Several (or different) elements discussed below, and/or claimed, are described as being "coupled" or "connected" or the like. This terminology is intended to be non-limiting.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

It is to be appreciated that the terms "include," "includes," and "including" have the same meaning as the terms "comprise," "comprises," and "comprising."

Several embodiments have been discussed in the foregoing description. However, the embodiments discussed herein are not intended to be exhaustive or limit the invention to any particular form. The terminology which has been used is intended to be in the nature of words of description rather than of limitation. Many modifications and variations are possible in light of the above teachings and the invention may be practiced otherwise than as specifically described.

Obviously, many modifications and variations of the present invention are possible in light of the above teachings. The invention may be practiced otherwise than as specifically described within the scope of the appended claims.

What is claimed is:

1. A thermal switch having an on-state and an off-state, comprising:

a first plate being composed from a thermally conductive material;

a second plate being composed from a thermally conductive material, the first and second plates being connected to form an internal cavity having a channel defining a gap between the first and second plate;

a first reservoir coupled to the channel, the first reservoir containing a thermally conductive liquid; and, an actuator coupled to the first reservoir and the channel, the actuator being moveable between a first state and a second state corresponding to the on-state and the off-state of the thermal switch, respectively, and being configured to allow the thermally conductive liquid to flow from the first reservoir to the channel when the actuator is in the first state and to allow the thermally conductive liquid to flow from the channel to the first reservoir when the actuator is in the second state.

2. A thermal switch, as set forth in claim 1, wherein the gap is configured such that the thermally conductive liquid flows from the channel to the first reservoir at least in part by surface tension of the thermally conductive liquid.

3. A thermal switch, as set forth in claim 1, wherein the gap is configured such that the thermally conductive liquid flows from the channel to the first reservoir primarily as a result of surface tension in the thermally conductive liquid.

4. A thermal switch, as set forth in claim 1, wherein the first reservoir and the channel form part of a closed system, wherein the thermally conductive liquid is pushed into the channel from the first reservoir as the actuator is moved from the second state to the first state.

5. A thermal switch, as set forth in claim 1, wherein the channel has a first end and a second end, the actuator being coupled to the first end of the channel, further comprising a second reservoir coupled to the second end of the channel, the second reservoir containing a gas.

6. A thermal switch, as set forth in claim 5, further comprising a gas entry/exit point between the second reservoir and the channel, wherein a height of the entry/exit point is less than a height of the gap.

7. A thermal switch, as set forth in claim 5, further comprising a membrane positioned between the actuator and the channel and having a first position and a second position associated with the first and second states of the actuator, respectively, the membrane being moveable between the first and second positions in response to the actuator being switched from the first state to the second state.

8. A thermal switch, as set forth in claim 7, wherein the first reservoir, the second reservoir and the channel form part of a closed system, wherein the thermally conductive liquid is pushed into the channel from the first reservoir as the membrane is moved from the second position to the first position.

9. A thermal switch, as set forth in claim 8, wherein the thermally conductive liquid flows from the channel to the first reservoir and the gas in the second reservoir flows into the channel in response to the membrane being moved from the position to the second position.

10. A thermal switch, as set forth in claim 1, wherein the gap defines at least one conduction zone within the channel.

11. A thermal switch, as set forth in claim 10, wherein the at least one conduction zone has a length of less than or equal to 0.5 inches.

12. A thermal switch, as set forth in claim 10, wherein the at least one conduction zone has a length of less than or equal to 0.2 inches.

13. A thermal switch, as set forth in claim 10, wherein the at least one conduction zone has a length of less than or equal to 0.1 inches.

14. A thermal switch, as set forth in claim 10, wherein the at least one conduction zone has a width of less than 1 inch.

15. A thermal switch, as set forth in claim 1, wherein the gap has a height of less than or equal to 0.2 inches.

16. A thermal switch, as set forth in claim 1, wherein the gap has a height of less than or equal to 0.1 inches.

17. A thermal switch, as set forth in claim 1, wherein the gap has a height of less than or equal to 0.02 inches.

18. A thermal switch as set forth in claim 1, further comprising a dividing plate positioned between the first and second plates and configured to divide the channel into a plurality of conduction zones, each conduction zone having at least one gas entry/exit point, each of the at least one gas entry/exit points configured to minimize entry of the thermally conductive liquid into the at least one gas entry/exit point.

19. A thermal switch, as set forth in claim 1, wherein the thermally conductive liquid is a liquid metal.

20. A thermal switch, as set forth in claim 19, wherein the liquid metal is mercury.

21. A thermal switch, as set forth in claim 19, wherein the liquid metal is a eutectic alloy.

22. A thermal switch, as set forth in claim 19, wherein the liquid metal is an alloy composed of gallium, indium and tin.

23. A thermal switch, as set forth in claim 22, wherein the alloy is 68.5% gallium, 21.5% indium and 10% tin.

24. A thermal switch, comprising:

a first plate being composed from a thermally conductive material;

a second plate being composed from a thermally conductive material, the first and second plates being connected to form an internal cavity having a channel forming a gap between the first and second plates, the channel having a first end and a second end;

a dividing plate positioned between the first and second plates and being configured to divide the channel into a plurality of conduction zones, each conduction zone having at least one gas entry/exit point;

a first reservoir coupled to the first end of the channel, the first reservoir containing a liquid metal;

a second reservoir coupled to the channel, the second reservoir containing a gas;

an actuator coupled to the first reservoir and the first end of the channel, the actuator being moveable between first and second states, the first reservoir, second reservoir and the channel forming part of a closed system; and, a membrane positioned between the actuator and the channel and having a first position and a second position associated with the first and second states of the actuator, respectively, the membrane being moveable between the first and second positions in response to the actuator being switched from the first state to the second state, wherein the liquid metal is pushed into the conduction zones from the first reservoir as the membrane is moved from the second position to the first position, wherein the liquid metal flows from the conduction zones to the first reservoir and the gas in the second reservoir flows into the conduction zones in response to the membrane being moved from the first position to the second position.

25. A thermal switch, as set forth in claim 24, wherein each conduction zone has a length of less than or equal to 0.5 inches.

26. A thermal switch, as set forth in claim 24, wherein each conduction zone has a width of less than or equal to 0.2 inches.

27. A thermal switch, as set forth in claim 24, wherein the gap has a height of less than or equal to 0.02 inches.

28. A thermal switch, as set forth in claim 24, wherein the liquid metal is mercury.

29. A thermal switch, as set forth in claim 24, wherein the liquid metal is an alloy composed of gallium, indium and tin.

30. A thermal switch, as set forth in claim 29, wherein the alloy is 68.5% gallium, 21.5% indium and 10% tin.

31. A thermal switch, as set forth in claim 24, wherein a height of the entry/exit point is less than a height of the gap.

32. A method, including the steps of:
providing a thermal switch, the thermal switch includes a first plate, a second plate, a first reservoir and an actuator, the first and second plates composed from a thermally conductive material and being connected to form an internal cavity having a channel defining a gap between the first and second plate, the first reservoir coupled to the channel and containing a thermally conductive liquid, the actuator coupled to the first reservoir and the channel and being moveable between first and second states;
switching the actuator from the second state to the first state to push the thermally conductive liquid to flow from the first reservoir to the channel; and
switching the actuator from the first state to the second state to allow the thermally conductive liquid to flow from the channel to the first reservoir.

* * * * *